US010741772B2

(12) United States Patent
Lee et al.

(10) Patent No.: US 10,741,772 B2
(45) Date of Patent: Aug. 11, 2020

(54) ORGANIC LIGHT-EMITTING DEVICE

(71) Applicant: Samsung Electronics Co., Ltd., Suwon-si, Gyeonggi-do (KR)

(72) Inventors: Sangyeob Lee, Hwaseong-si (KR); Sangdong Kim, Seoul (KR); Jiwhan Kim, Seoul (KR); Banglin Lee, Suwon-si (KR); Seungyeon Kwak, Yongin-si (KR); Hyeonho Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 456 days.

(21) Appl. No.: 14/838,987

(22) Filed: Aug. 28, 2015

(65) Prior Publication Data

US 2016/0072078 A1 Mar. 10, 2016

(30) Foreign Application Priority Data

Aug. 29, 2014 (KR) ........................ 10-2014-0114518
Aug. 27, 2015 (KR) ........................ 10-2015-0120784

(51) Int. Cl.
*H01L 51/00* (2006.01)
*H01L 51/50* (2006.01)
(Continued)

(52) U.S. Cl.
CPC ........ *H01L 51/0072* (2013.01); *C09K 11/025* (2013.01); *C09K 11/06* (2013.01);
(Continued)

(58) Field of Classification Search
CPC ................................................ H01L 2251/552
See application file for complete search history.

(56) References Cited

U.S. PATENT DOCUMENTS 6,614,176 B2 9/2003 Kim et al.
8,324,800 B2 12/2012 Royster, Jr. et al.
(Continued)

FOREIGN PATENT DOCUMENTS

JP 2013168649 A 8/2013
JP 2013236058 A 11/2013
(Continued)

OTHER PUBLICATIONS

Park, et al. "Energy transfer from exciplexes to dopants and its effect on efficiency of organic light-emitting diodes", Journal of Applied Physics, vol. 10, pp. 124519-1-124519-6 (2011).
(Continued)

*Primary Examiner* — Jennifer A Chriss
*Assistant Examiner* — Sean M DeGuire
(74) *Attorney, Agent, or Firm* — Harness, Dickey & Pierce, P.L.C.

(57) ABSTRACT

An organic light-emitting device (OLED) includes a first electrode, a second electrode, an emission layer between the first electrode and the second electrode and including an electron-transporting host and a hole-transporting host, a hole transport region between the first electrode and the emission layer and including a hole transport layer, and an electron transport region between the emission layer and the second electrode and including an electron transport layer, wherein the OLED satisfies Equations 1 and 2 below:

$$0.75\ \text{eV} \leq |LUMO_{H(ET)} - LUMO_{H(HT)}| \leq 0.90\ \text{eV}$$ <Equation 1>

$$|E(S_{1,H(ET)}) - E(S_{1,H(HT)})| < 0.15\ \text{eV}$$ <Equation 2> wherein in Equations 1 and 2, $LUMO_{H(ET)}$ refers to a lowest unoccupied molecular orbital (LUMO) energy level of the electron-transporting host, $LUMO_{H(HT)}$ refers to an LUMO energy level of the hole-transporting host, $E(S_{1,\ H(ET)})$ refers to a singlet energy level of
(Continued)

the electron-transporting host, and $E(S_{1,H(HT)})$ refers to a singlet energy level of the hole-transporting host.

15 Claims, 2 Drawing Sheets

(51) Int. Cl.
*C09K 11/02* (2006.01)
*C09K 11/06* (2006.01)

(52) U.S. Cl.
CPC ...... *H01L 51/0067* (2013.01); *H01L 51/0071* (2013.01); *H01L 51/5004* (2013.01); *H01L 51/5056* (2013.01); *H01L 51/5072* (2013.01); *H01L 2251/552* (2013.01)

(56) References Cited

U.S. PATENT DOCUMENTS

| | | | | |
|---|---|---|---|---|
| 8,367,850 | B2 | 2/2013 | Ma et al. | |
| 9,288,869 | B2 | 3/2016 | Han et al. | |
| 9,299,944 | B2 | 3/2016 | Seo et al. | |
| 9,525,138 | B2 | 12/2016 | Moon et al. | |
| 9,911,925 | B2 | 3/2018 | Lee et al. | |
| 2012/0217487 | A1 | 8/2012 | Yamazaki et al. | |
| 2013/0168649 | A1 | 7/2013 | Kim | |
| 2013/0207082 | A1 | 8/2013 | Cho et al. | |
| 2013/0248830 | A1* | 9/2013 | Welsh | H01L 51/0067 257/40 |
| 2013/0292656 | A1* | 11/2013 | Seo | H05B 33/14 257/40 |
| 2014/0061604 | A1* | 3/2014 | Seo | C09K 11/06 257/40 |
| 2015/0069352 | A1 | 3/2015 | Kim et al. | |
| 2016/0322585 | A1 | 11/2016 | Kim et al. | |
| 2016/0372688 | A1* | 12/2016 | Seo | H01L 51/0085 |
| 2017/0025615 | A1* | 1/2017 | Seo | H01L 51/5004 |
| 2017/0170408 | A1* | 6/2017 | Park | H01L 51/0072 |
| 2017/0200903 | A1* | 7/2017 | Park | H01L 51/0071 |

FOREIGN PATENT DOCUMENTS

| | | | |
|---|---|---|---|
| KR | 20010092905 | A | 10/2001 |
| KR | 20120100751 | A | 9/2012 |
| KR | 10-2013-0051807 | A | 5/2013 |
| KR | 10-2014-0047478 | A | 4/2014 |
| KR | 10-2015-0094398 | A | 8/2015 |
| KR | 10-2015-0105906 | A | 9/2015 |
| WO | WO-2013154342 | A1 | 10/2013 |

OTHER PUBLICATIONS

Extended European Search Report dated Feb. 1, 2016.
Lee, et al. "Highly efficient and lifetime-enhanced phosphorescent organic light emitting diode using exciplex-forming mixed host," Organic Materials Lab., SAIT, SEC, Samsung Best Paper Award, pp. 1-2 (2014).
Office Action dated Jun. 4, 2019, issued in corresponding Japanese Patent Application No. 2015-169002.

* cited by examiner

ORGANIC LIGHT-EMITTING DEVICE

CROSS REFERENCE TO RELATED APPLICATION

This application claims the benefit of Korean Patent Application No. 10-2014-0114518, filed on Aug. 29, 2014, and Korean Patent Application No. 10-2015-0120784, filed on Aug. 27, 2015, in the Korean Intellectual Property Office, the disclosure of each of which is incorporated herein in its entirety by reference.

BACKGROUND

1. Field

Example embodiments relate to an organic light-emitting device.

2. Description of the Related Art

Organic light-emitting devices are self-emission devices that have relatively wide viewing angles, relatively high contrast ratios, relatively short response time, and improved brightness, driving voltage, and response speed characteristics, and produce multi-colored images.

As an example, an organic light-emitting device includes an anode, a cathode, and an organic layer that includes an emission layer and is disposed between the anode and the cathode. A hole transport region may be formed between the anode and the emission layer, and an electron transport region may be formed between the emission layer and the cathode. Holes provided from the anode may move toward the emission layer through the hole transport region, and electrons provided from the cathode may move toward the emission layer through the electron transport region. Carriers, e.g., holes and electrons, may be recombined in the emission layer to produce excitons. These excitons may change from an excited state to a ground state, thereby generating light.

SUMMARY

Example embodiments provide an organic light-emitting device characterized by relatively low driving voltage, relatively high efficiency, relatively high brightness, and relatively long lifespan.

Additional aspects will be set forth in part in the description which follows and, in part, will be apparent from the description, or may be learned by practice of example embodiments.

According to example embodiments, an organic light-emitting device (OLED) includes a first electrode, a second electrode, an emission layer between the first electrode and the second electrode, a hole transport region between the first electrode and the emission layer and including a hole transport layer, and an electron transport region between the emission layer and the second electrode and including an electron transport layer, wherein the emission layer includes an electron-transporting host and a hole-transporting host, the hole transport layer includes a hole transport material, the electron transport layer includes an electron transport material, and the OLED satisfies <Equation 1> and <Equation 2> below:

$$0.75\ \text{eV} \le |LUMO_{H(ET)} - LUMO_{H(HT)}| \le 0.90\ \text{eV} \qquad \text{<Equation 1>}$$

$$|E(S_{1,H(ET)}) - E(S_{1,H(HT)})| < 0.15\ \text{eV} \qquad \text{<Equation 2>}$$

In <Equation 1> and <Equation 2>, $LUMO_{H(ET)}$ refers to a lowest unoccupied molecular orbital (LUMO) energy level of the electron-transporting host, $LUMO_{H(HT)}$ refers to an LUMO energy level of the hole-transporting host, $E(S_{1,\ H(ET)})$ refers to a singlet energy level of the electron-transporting host, and $E(S_{1,\ H(HT)})$ refers to a singlet energy level of the hole-transporting host.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of example embodiments, taken in conjunction with the accompanying drawings in which.

DETAILED DESCRIPTION

Figure 1:
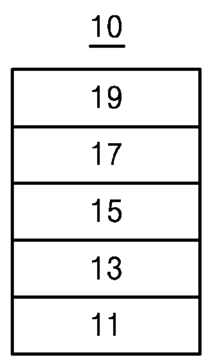
FIG. 1 illustrates a schematic view of an organic light-emitting device according to example embodiments.

Reference will now be made in detail to example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed. Equations such as "at least one of," when preceding a list of elements, modify the entire list of elements and do not modify the individual elements of the list.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 illustrates a schematic cross-sectional view of an organic light-emitting device 10 according to example embodiments. Hereinafter, a structure and a preparation method of an organic light-emitting according to example embodiments are described in detail with reference to FIG. 1 as follows. The organic light-emitting device 10 has a structure of a first electrode 11, a hole transport region 13, an emission layer 15, an electron transport region 17, and a second electrode 19 that are sequentially stacked in the stated order.

A substrate (not shown) may be additionally disposed under the first electrode 11 or on top of the second electrode 19. For use as the substrate, any substrate that is used in general organic light-emitting devices may be used, and the substrate may be a glass substrate or a transparent plastic substrate, each of which has improved mechanical strength, thermal stability, transparency, surface smoothness, ease of handling, and waterproofness.

The first electrode 11 may be formed by, e.g., depositing or sputtering a material for forming the first electrode 11 on top of the substrate. When the first electrode 11 is an anode, the material for forming the first electrode 11 may be selected from materials having a relatively high work function to facilitate hole injection. The first electrode 11 may be a reflective electrode, a semi-transmissive electrode, or a transmissive electrode. Examples of the material for forming the first electrode 11 may include indium tin oxide (ITO), indium zinc oxide (IZO), tin oxide (SnO2), and zinc oxide (ZnO). In example embodiments, the material for forming the first electrode 11 may be a metal, e.g., magnesium (Mg), aluminum (Al), aluminum-lithium (Al—Li), calcium (Ca), magnesium-indium (Mg—In), or magnesium-silver (Mg—Ag).

The first electrode 11 may have a single-layer structure or a multi-layer structure including two or more layers.

The hole transport region 13, the emission layer 15, and the electron transport region 17 may be sequentially stacked in the stated order on top of the first electrode 11. The hole transport region 13 may include a hole transport layer, and the electron transport region 17 may include an electron transport layer.

The emission layer 15 may include an electron-transporting host and a hole-transporting host. The hole transport layer included in the hole transport region 13 may include a hole transport material, and the electron transport layer included in the electron transport region 17 may include an electron transport material.

In example embodiments, the organic light-emitting device 10 may satisfy <Equation 1> and <Equation 2> below:

$$0.75\text{ eV} \leq |LUMO_{H(ET)} - LUMO_{H(HT)}| \leq 0.90\text{ eV} \qquad \text{<Equation 1>}$$

$$|E(S_{1,H(ET)}) - E(S_{1,H(HT)})| < 0.15\text{ eV} \qquad \text{<Equation 2>}$$

In <Equation 1> and <Equation 2>, $LUMO_{H(ET)}$ refers to a lowest unoccupied molecular orbital (LUMO) energy level of the electron-transporting host included in the emission layer 15, $LUMO_{H(HT)}$ refers to a LUMO energy level of the hole-transporting host included in the emission layer 15, $E(S_{1,\ H(ET)})$ refers to a singlet energy level of the electron-transporting host included in the emission layer 15, and $E(S_{1,\ H(HT)})$ refers to a singlet energy level of the hole-transporting host included in the emission layer 15.

When the organic light-emitting device 10 satisfies <Equation 1> above, the electron-transporting host and the hole-transporting host included in the emission layer 15 may form an exciplex in an efficient manner, and accordingly, the organic light-emitting device 10 may have improved efficiency, brightness, and lifespan.

In addition, when the organic light-emitting device 10 satisfies <Equation 2> above, the stability of the exciplex formed by the electron-transporting host and the hole-transporting host included in the emission layer 15 is increased, and thus, upon non-radiative decay, cold excitons having improved thermal stability may be produced. Accordingly, the organic light-emitting device 10 may be able to have a relatively long lifespan.

In example embodiments, the organic light-emitting device 10 may further satisfy <Equation 3> and <Equation 4> below:

$$|HOMO_{H(HT)} - HOMO_{HTL}| < 0.3\text{ eV} \qquad \text{<Equation 3>}$$

$$0.15\text{ eV} \leq |HOMO_{H(HT)} - HOMO_{H(ET)}| \leq 2.0\text{ eV} \qquad \text{<Equation 4>}$$

In <Equation 3> and <Equation 4>, $HOMO_{H(HT)}$ refers to a highest occupied molecular orbital (HOMO) energy level of the hole-transporting host included in the emission layer, $HOMO_{HTL}$ refers to a HOMO energy level of the hole transport material of the hole transport layer included in the hole transport region 13, and $HOMO_{H(ET)}$ refers to a HOMO energy level of the electron-transporting host included in the emission layer 15.

In example embodiments, the organic light-emitting device 10 may further satisfy <Equation 5> below.

$$|LUMO_{H(ET)}-LUMO_{ETL}|<0.2\text{ eV}$$ <Equation 5>

In <Equation 5>, $LUMO_{ETL}$ refers to a LUMO energy level of the electron transport material of the electron transport layer included in the electron transport region 17.

In example embodiments, the organic light-emitting device 10 may satisfy <Equation 6> and <Equation 7> below:

$$\min\{E(S_{1,H(HT)}),E(S_{1,H(ET)})\}-E(S_{1,EX})>0.15\text{ eV}$$ <Equation 6>

$$E(S_{1,EX})-E(T_{1,EX})<0.15\text{ eV}$$ <Equation 7>

In <Equation 6> and <Equation 7>, $E(S_{1,H(HT)})$ refers to a singlet energy level of the hole-transporting host included in the emission layer 15, $E(S_{1,H(ET)})$ refers to a singlet energy level of the electron-transporting host included in the emission layer 15, $\min\{E(S_{1,H(HT)}), E(S_{1,H(ET)})\}$ refers to the smallest value between values of $E(S_{1,H(HT)})$ and $E(S_{1,H(ET)})$, $E(S_{1,EX})$ refers to a singlet energy level of the exciplex formed by the electron-transporting host and the hole-transporting host included in the emission layer 15, and $E(T_{1,EX})$ refers to a triplet energy level of the exciplex formed by the electron-transporting host and the hole-transporting host included in the emission layer 15.

When the organic light-emitting device 10 satisfies <Equation 3> to <Equation 6>, the formation of the exciplex may be carried out in an efficient manner by the electron-transporting host and the hole-transporting host included in the emission layer 15.

In addition, when the organic light-emitting device 10 satisfies <Equation 7>, an overlap between an S1 orbital and an S0 orbital of the exciplex, which is formed by the electron-transporting host and the hole-transporting host included in the emission layer 15, is reduced, and accordingly, decay time of the exciplex is increased, resulting in efficient energy transfer. Accordingly, the organic light-emitting device 10 may have an improved lifespan.

For example, the organic light-emitting device 10 may satisfy, but not limited to, all of <Equation 3> to <Equation 7> in addition to <Equation 1> and <Equation 2>.

In the organic light-emitting device 10, the electron-transporting host included in the emission layer 15 may include a compound represented by Formula 1 below:

<Formula 1>

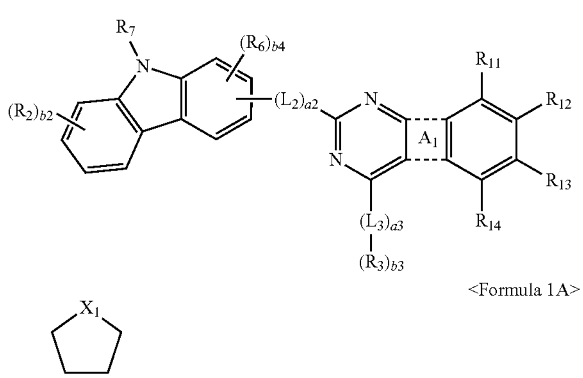

<Formula 1A>

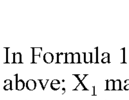

In Formula 1, a ring $A_1$ may be represented by Formula 1A above; $X_1$ may be $N-[(L_1)_{a1}-(R_1)_{b1}]$, S, O, S(═O), $S(═O)_2$, C(═O), $Si(R_4)(R_5)$, $P(R_4)$, $P(═O)(R_4)$, or $C═N(R_4)$; each of $L_1$ to $L_3$ may be independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group; and each of a1 to a3 may be independently an integer of 1 to 5. When a1 is 2 or more, 2 or more $L_1$s may be identical to or different from each other, when a2 is 2 or more, 2 or more $L_2$s may be identical to or different from each other, and when a3 is 2 or more, 2 or more $L_3$s may be identical to or different from each other. Each of $R_1$ to $R_7$ and $R_{11}$ to $R_{14}$ may be independently selected from a hydrogen, a deuterium, a fluoro group (—F), a chloro group (—Cl), a bromo group (—Br), an iodo group (—I), a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, and $—B(Q_6)(Q_7)$; each of b1 to b4 may be independently an integer of 1 to 3; at least one of substituents of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$); a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein each of $Q_1$ to $Q_7$, $Q_{11}$ to $Q_{17}$, $Q_{21}$ to $Q_{27}$, and $Q_{31}$ to $Q_{37}$ may be independently selected from a hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In example embodiments, $X_1$ in Formula 1A above may be one of N-[$(L_1)_{a1}$-$(R_1)_{b1}$], S, O, and Si($R_4$)($R_5$).

In example embodiments, $X_1$ in Formula 1A above may be S, O, or Si($R_4$)($R_5$), but $X_1$ is not limited thereto.

In example embodiments, $X_1$ in Formula 1A above may be one of S and O, but $X_1$ is not limited thereto.

The ring $A_1$ in Formula 1 above is a ring that is fused with two neighboring 6-membered rings by sharing its carbon atom.

For example, each of $L_1$ to $L_3$ in Formula 1 may be independently selected from a single bond, a phenylene group, a naphthylene group, a fluorenylene group, a spiro-fluorenylene group, a phenanthrenylene group, an anthracenylene group, a triphenylenylene group, a pyrenylene group, a chrysenylene group, a pyridinylene group, a pyrimidinylene group, a quinolinylene group, an isoquinolinylene group, a triazinylene group, and a carbazolylene group; and a phenylene group, a naphthylene group, a fluorenylene group, a spiro-fluorenylene group, a phenanthrenylene group, an anthracenylene group, a triphenylenylene group, a pyrenylene group, a chrysenylene group, a pyridinylene group, a pyrimidinylene group, a quinolinylene group, an isoquinolinylene group, a triazinylene group, and a carbazolylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, a quinazolinyl group, a carbazolyl group, and —Si($Q_{33}$)($Q_{34}$)($Q_{35}$), wherein each of $Q_{33}$ to $Q_{35}$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group.

For example, each of $L_1$ to $L_3$ in Formula 1 may be independently selected from groups selected from Formulae 2-1 to 2-17 below:

Formula 2-1

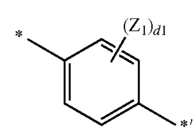

Formula 2-2

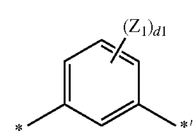

Formula 2-3

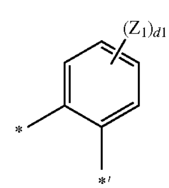

Formula 2-4

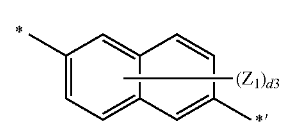

Formula 2-5

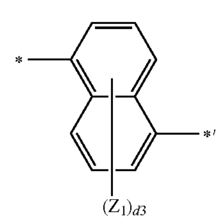

-continued

Formula 2-6

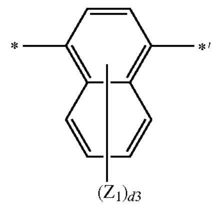

Formula 2-7

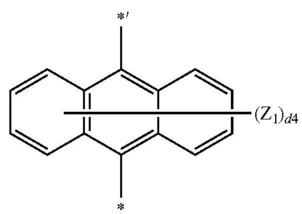

Formula 2-8

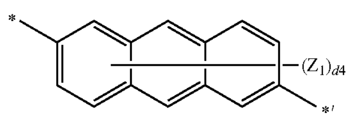

Formula 2-9

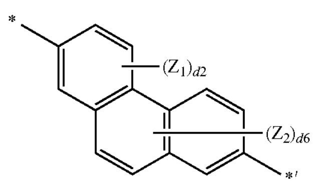

Formula 2-10

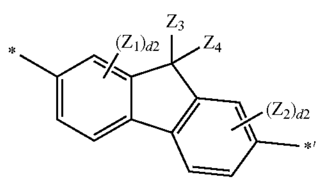

Formula 2-11

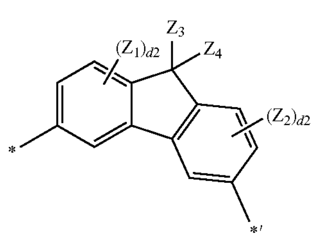

Formula 2-12

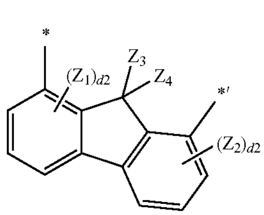

-continued

Formula 2-13

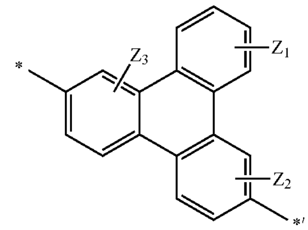

Formula 2-14

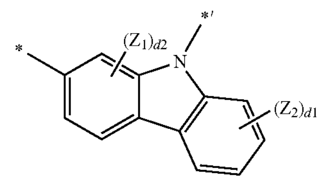

Formula 2-15

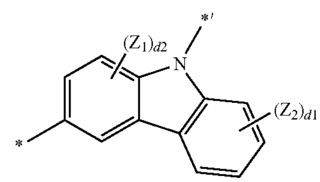

Formula 2-16

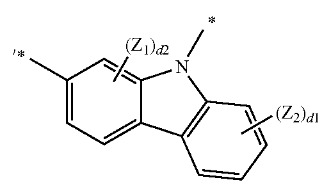

Formula 2-17

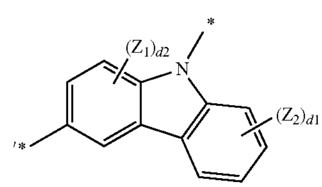

In Formulae 3-1 to 3-12, * and *' may indicate a binding site to a neighboring atom.

In Formulae 2-1 to 2-17, each of $Z_1$ to $Z_4$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a triphenylenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, a quinoxalinyl group, a biphenyl group, and —Si($Q_{33}$)($Q_{34}$)($Q_{35}$), wherein each of $Q_{33}$ to $Q_{35}$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group; d1 may be an integer of 1 to 4, d2 may be an integer of 1 to 3, d3 may be an integer of 1 to 6, d4 may be an integer of 1 to 8, d6 may be an integer of 1 to 5, and * and *' may indicate a binding site to a neighboring atom.

For example, each of $L_1$ to $L_3$ in Formula 1 may be independently a group represented by one of Formulae 3-1 to 3-12 below, but $L_1$ to $L_3$ are not limited thereto:

Formula 3-1

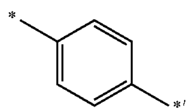

Formula 3-2

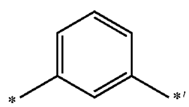

Formula 3-3

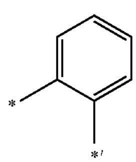

Formula 3-4

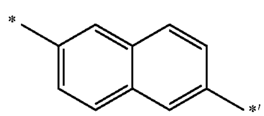

Formula 3-5

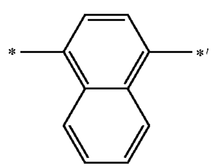

Formula 3-6

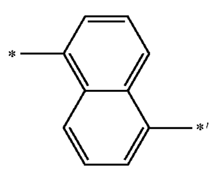

Formula 3-7

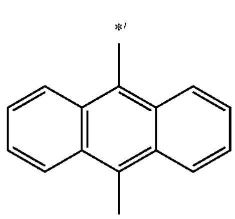

Formula 3-8

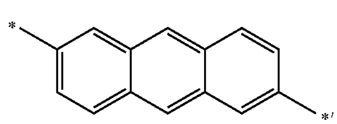

-continued

Formula 3-9

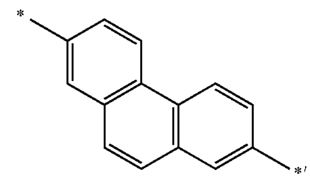

Formula 3-10

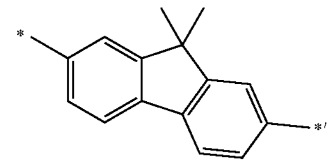

Formula 3-11

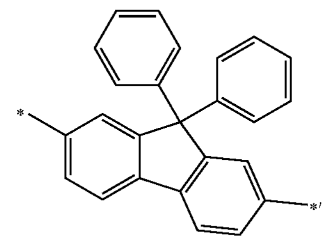

Formula 3-12

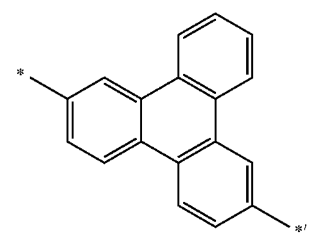

In Formula 1, a1 may indicate the number of $L_1$ and may be 1, 2, 3, 4, or 5, e.g., 1 or 2. In example embodiments, a1 in Formula 1 may be 1. When a1 is 2 or more, 2 or more $L_1$s may be identical to or different from each other. Descriptions of a2 and a3 may be understood by referring to the description provided in connection with a1 and the structure of Formula 1.

In example embodiments, each of a1, a2, and a3 may be independently one of 1 and 2.

In Formula 1, i) at least one of $R_2$ and $R_3$ and ii) $R_1$ and $R_7$ may be independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{33}$)($Q_{34}$)($Q_{35}$), a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, and a biphenyl group.

In example embodiments, each of $R_1$ to $R_7$ in Formula 1 may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group; a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{33}$)($Q_{34}$)($Q_{35}$), a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group; and —Si($Q_3$)($Q_4$)($Q_5$) (but, $R_4$ and $R_5$ are not —Si($Q_3$)($Q_4$)($Q_5$)), wherein each of $Q_3$ to $Q_5$ and $Q_{33}$ to $Q_{35}$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group, and at least one of i) $R_2$ and $R_3$ and ii) $R_1$ and $R_7$ may be independently selected from a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group; and a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{33}$)($Q_{34}$)($Q_{35}$), a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group.

In example embodiments, each of $R_1$ to $R_7$ in Formulae above may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; one of Formulae 4-1 to 4-31; and —Si($Q_3$)($Q_4$)($Q_5$) (but, $R_4$ to $R_5$ are not —Si($Q_3$)($Q_4$)($Q_5$)), wherein at least one of i) $R_2$ and $R_3$ and ii) $R_1$ and $R_7$ may be independently a group represented by one of Formulae 4-1 to 4-31 below:

Formula 4-1

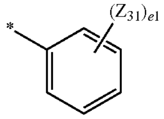

Formula 4-2

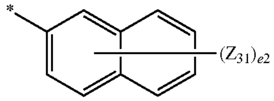

Formula 4-3

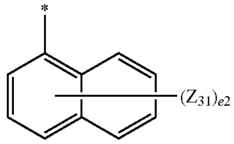

-continued

Formula 4-4

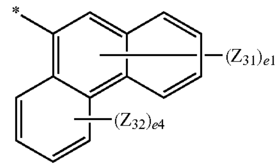

Formula 4-5

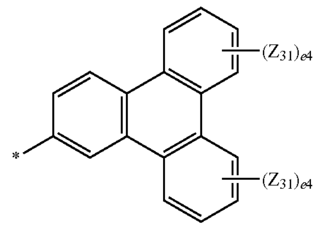

Formula 4-6

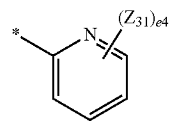

Formula 4-7

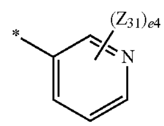

Formula 4-8

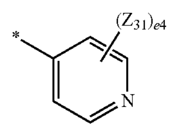

Formula 4-9

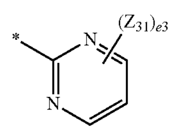

Formula 4-10

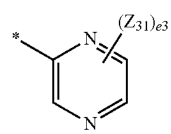

Formula 4-11

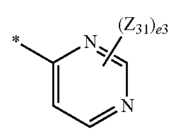

Formula 4-12

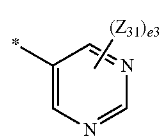

Formula 4-13

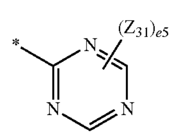

Formula 4-14

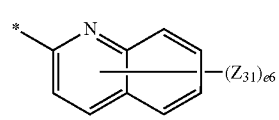

-continued

Formula 4-15

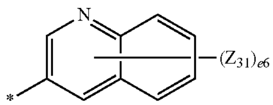

Formula 4-16

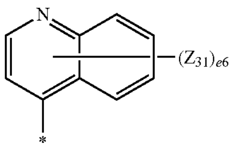

Formula 4-17

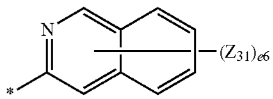

Formula 4-18

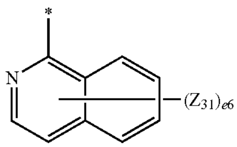

Formula 4-19

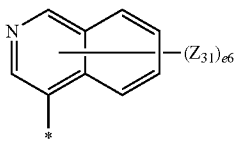

Formula 4-20

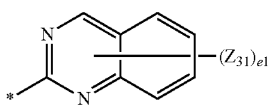

Formula 4-21

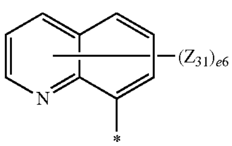

Formula 4-22

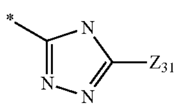

Formula 4-23

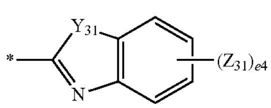

Formula 4-24

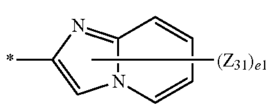

Formula 4-25

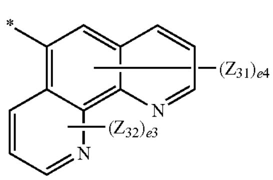

-continued

Formula 4-26

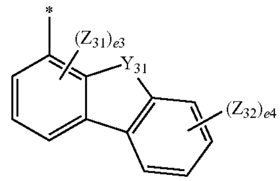

Formula 4-27

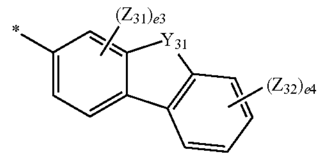

Formula 4-28

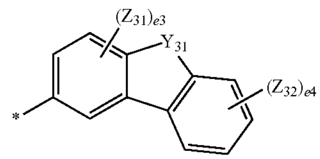

Formula 4-29

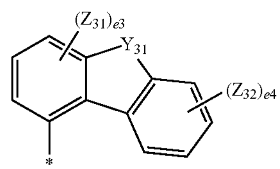

Formula 4-30

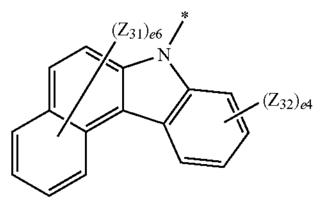

Formula 4-31

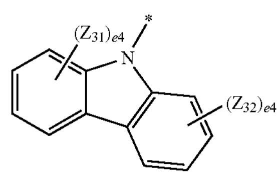

In Formulae 4-1 to 4-31, $Y_{31}$ may be 0, S, $C(Z_{33})(Z_{34})$, $N(Z_{35})$, or $Si(Z_{36})(Z_{37})$ (wherein $Y_{31}$ in Formula 4-23 is not NH); each of $Z_{31}$ to $Z_{37}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, a quinoxalinyl group, a biphenyl group, and —Si$(Q_{33})(Q_{34})(Q_{35})$, wherein each of $Q_3$ to $Q_5$ and $Q_{33}$ to $Q_{35}$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group; e1 may be an integer of 1 to 5, e2 may be an integer of 1 to 7, e3 may be an integer of 1 to 3, e4 may be an integer of 1 to 4, e5 may be an integer of 1 or 2, e6 may be an integer of 1 to 6, and * indicates a binding site to a neighboring atom.

In example embodiments, each of $R_1$ and $R_7$ may be independently selected from a phenyl group, a naphthyl group, a phenalenyl group, a phenanthrenyl group, an anthracenyl group, a fluoranthenyl group, a triphenylenyl group, a pyrenyl group, a chrysenyl group, and a perylenyl group; and a phenyl group, a naphthyl group, a phenalenyl group, a phenanthrenyl group, an anthracenyl group, a fluoranthenyl group, a triphenylenyl group, a pyrenyl group, a chrysenyl group, and a perylenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a phenalenyl group, a phenanthrenyl group, an anthracenyl group, a fluoranthenyl group, a triphenylenyl group, a pyrenyl group, a chrysenyl group, and a perylenyl group.

In example embodiments, at least one of $R_2$ and $R_3$ in Formula 1 may be selected from a triphenylenyl group, a carbazolyl group, a dibenzofuranyl group, a dibenzothiophenyl group, and a benzocarbazolyl group; and a triphenylenyl group, a carbazolyl group, a dibenzofuranyl group, a dibenzothiophenyl group, and a benzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{33}$)($Q_{34}$)($Q_{35}$), a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group.

In example embodiments, at least one of $R_2$ and $R_3$ in Formula 1 may be selected from a triphenylenyl group and a carbazolyl group; and a triphenylenyl group and a carbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{33}$)($Q_{34}$)($Q_{35}$), a phenyl group, a naphthyl group, a phenalenyl group, a phenanthrenyl group, an anthracenyl group, a fluoranthenyl group, a triphenylenyl group, a pyrenyl group, a chrysenyl group, a perylenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, a benzocarbazolyl group, and a dibenzocarbazolyl group.

In Formula 1, each of $R_{11}$ to $R_{14}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_1$)($Q_2$), —Si($Q_3$)($Q_4$)($Q_5$), and —B($Q_6$)($Q_7$).

For example, each of $R_{11}$ to $R_{14}$ in Formula 1 may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —Si($Q_3$)($Q_4$)($Q_5$), wherein each of $Q_3$ to $Q_5$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group.

For example, each of $R_{11}$ to $R_{14}$ in Formula 1 may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; a phenyl group, a naphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a thiophenyl group, a furanyl group, a pyridinyl group, a pyrazinyl group, a pyrimidinyl group, a pyridazinyl group, a quinolinyl group, an isoquinolinyl group, a quinoxalinyl group, a quinazolinyl group, a benzofuranyl group, a benzothiophenyl group, an isobenzothiazolyl group, a triazinyl group, a dibenzofuranyl group, a dibenzothiophenyl group, a benzocarbazolyl group, and a dibenzocarbazolyl group; and —Si($Q_3$)($Q_4$)($Q_5$), wherein each of $Q_3$ to $Q_5$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group.

For example, each of $R_{11}$ to $R_{14}$ in Formula 1 may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group, but $R_{11}$ to $R_{14}$ are not limited thereto.

For example, all of $R_{11}$ to $R_{14}$ in Formula 1 may be hydrogen.

In example embodiments, each of $R_1$ to $R_7$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; one of Formulae 5-1 to 5-85 below; and —Si($Q_3$)($Q_4$)($Q_5$) (bur, $R_4$ and $R_5$ are not —Si($Q_3$)($Q_4$)($Q_5$)); at least one of i) $R_2$ and $R_3$ and ii) $R_1$ and $R_7$ may be independently a group represented by one of Formulae 5-1 to 5-85 below; and each of $R_{11}$ to $R_{14}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; Formulae 5-1 to 5-4, 5-10 to 5-17, 5-26 to 5-31, 5-39, 5-40, 5-42, 5-44, 5-47, and 5-48; and —Si($Q_3$)($Q_4$)($Q_5$), wherein each of $Q_3$ to $Q_5$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group, but $Q_3$ to $Q_5$ are not limited thereto:

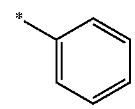
Formula 5-1

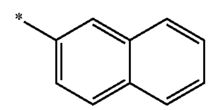
Formula 5-2

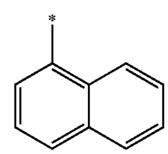
Formula 5-3

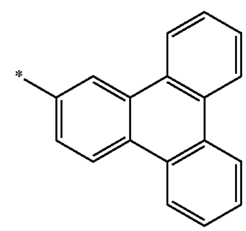
Formula 5-4

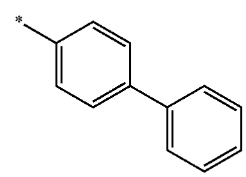
Formula 5-5

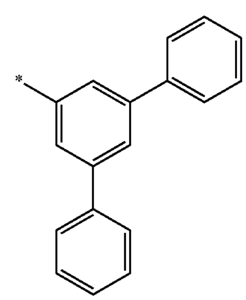
Formula 5-6

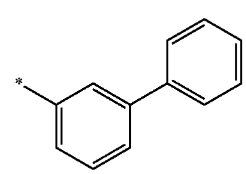
Formula 5-7

-continued
Formula 5-8
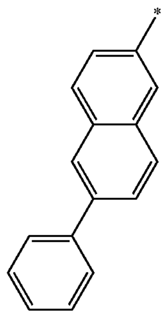
Formula 5-9
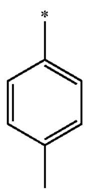
Formula 5-10
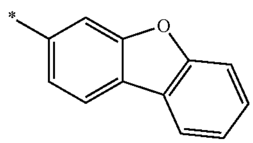
Formula 5-11
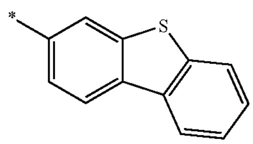
Formula 5-12
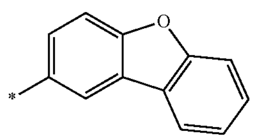
Formula 5-13
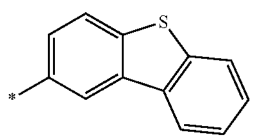
Formula 5-14
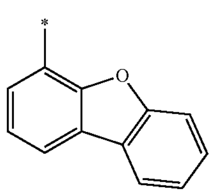
Formula 5-15
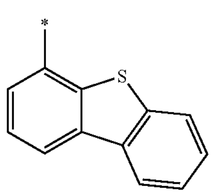
Formula 5-16
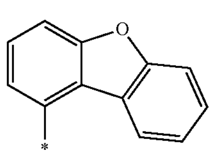
-continued
Formula 5-17
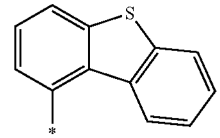
Formula 5-18
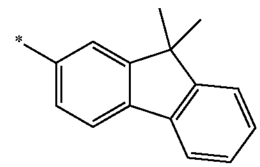
Formula 5-19
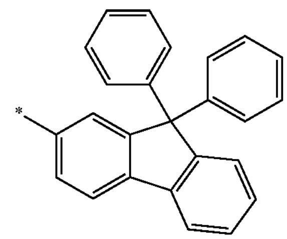
Formula 5-20
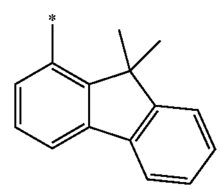
Formula 5-21
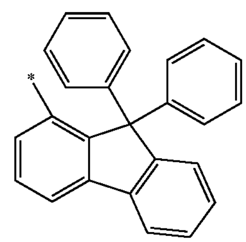
Formula 5-22
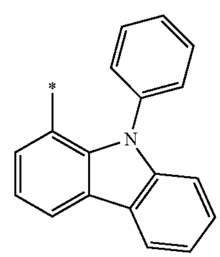
Formula 5-23
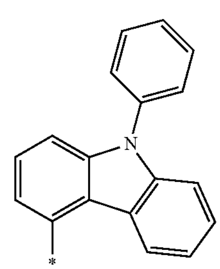

-continued
Formula 5-24
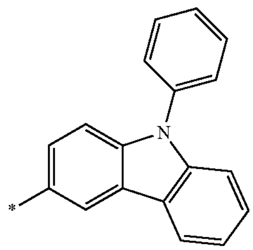
Formula 5-25
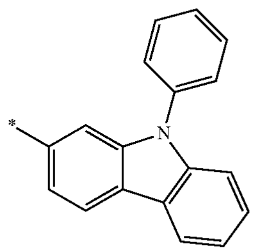
Formula 5-26
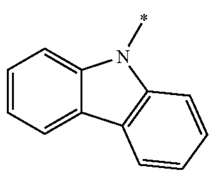
Formula 5-27
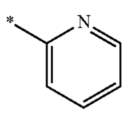
Formula 5-28
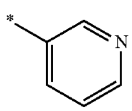
Formula 5-29
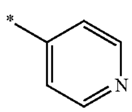
Formula 5-30
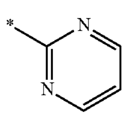
Formula 5-31
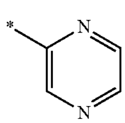
Formula 5-32
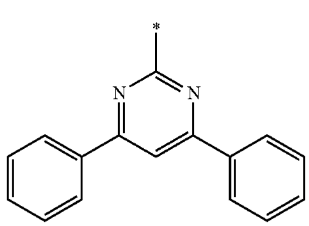
-continued
Formula 5-33
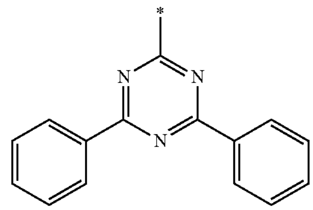
Formula 5-34
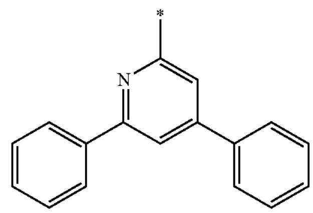
Formula 5-35
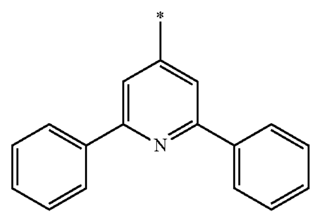
Formula 5-36
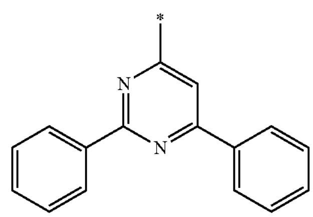
Formula 5-37
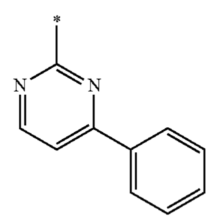
Formula 5-38
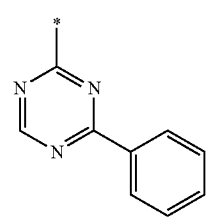
Formula 5-39
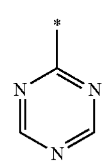
Formula 5-40
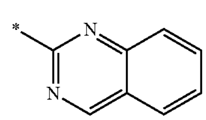

-continued
Formula 5-41
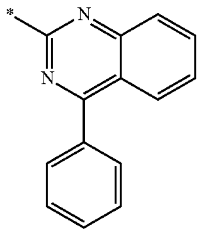
Formula 5-42
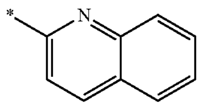
Formula 5-43
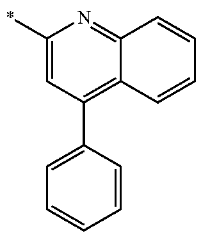
Formula 5-44
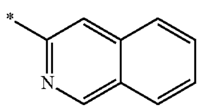
Formula 5-45
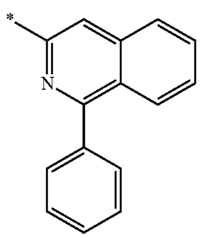
Formula 5-46
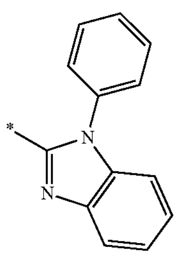
Formula 5-47
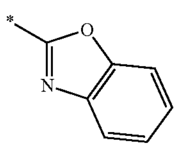
Formula 5-48
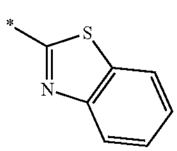
-continued
Formula 5-49
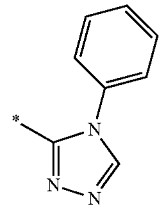
Formula 5-50
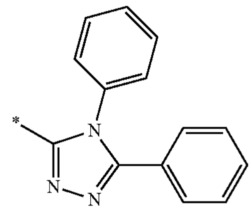
Formula 5-51
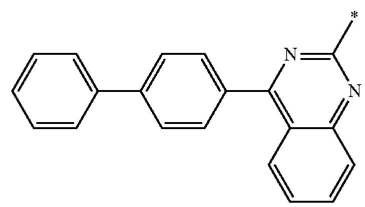
Formula 5-52
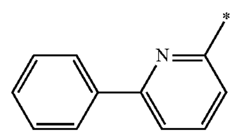
Formula 5-53
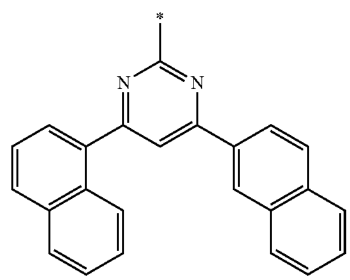
Formula 5-54
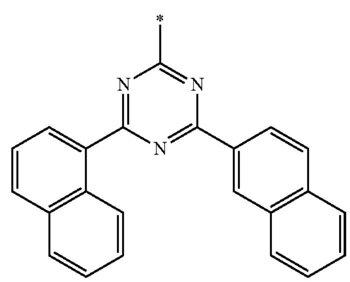
Formula 5-55
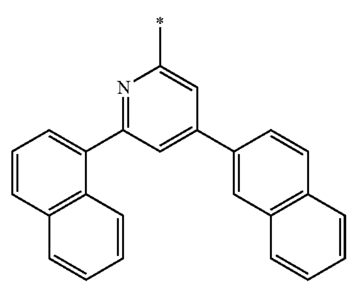

-continued
Formula 5-56
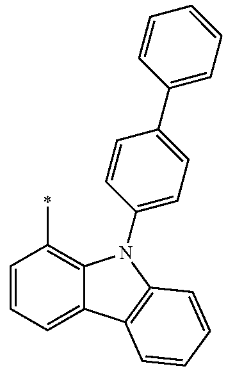
Formula 5-57
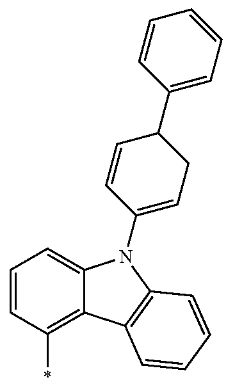
Formula 5-58
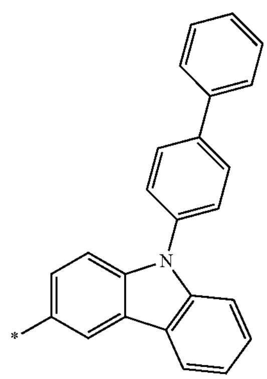
Formula 5-59
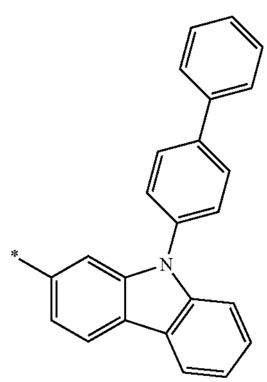
-continued
Formula 5-60
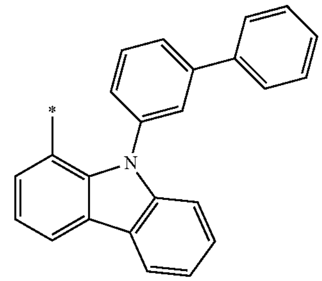
Formula 5-61
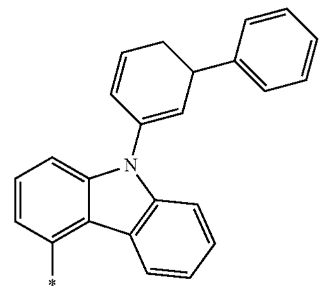
Formula 5-62
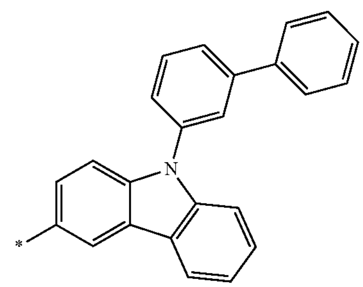
Formula 5-63
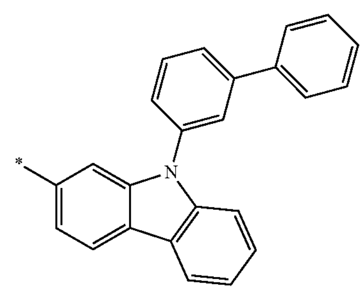
Formula 5-64
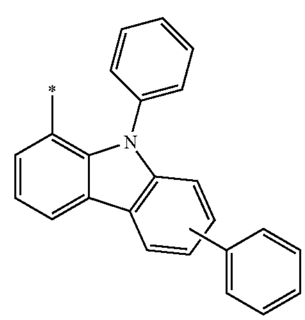

Formula 5-65
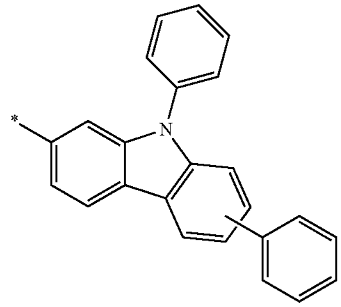
Formula 5-66
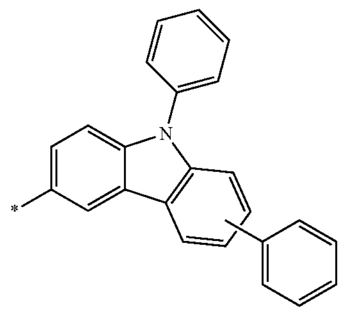
Formula 5-67
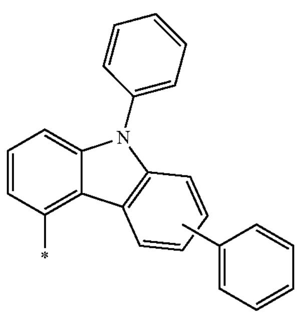
Formula 5-68
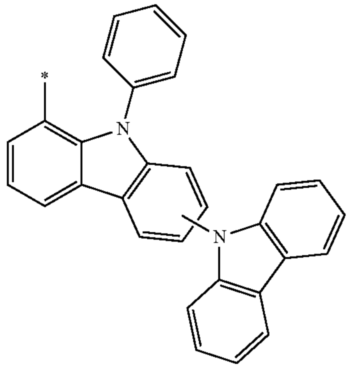
Formula 5-69
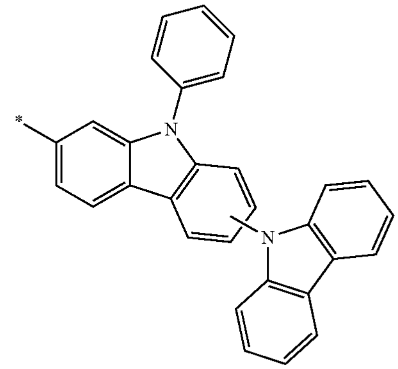
Formula 5-70
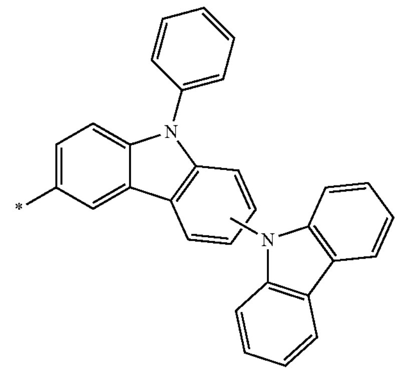
Formula 5-71
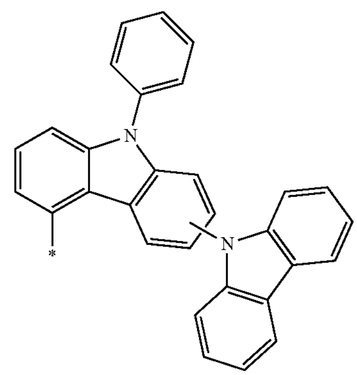
Formula 5-72
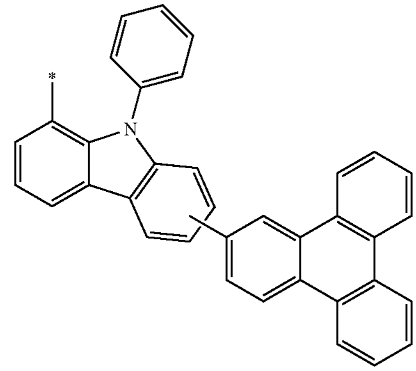

-continued
Formula 5-73
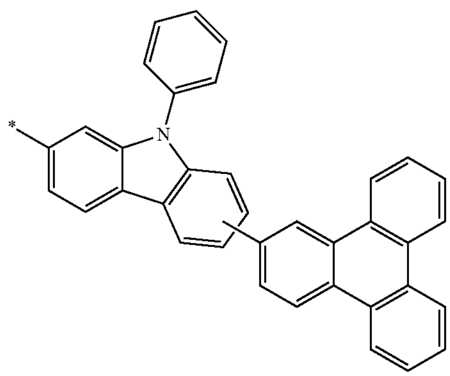
Formula 5-74
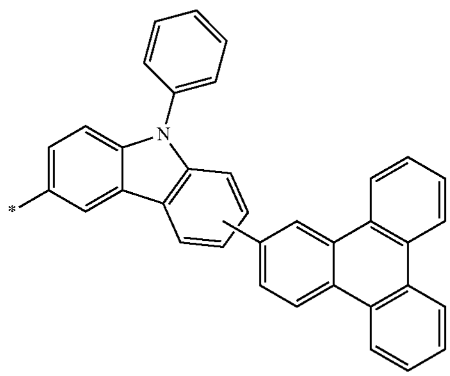
Formula 5-75
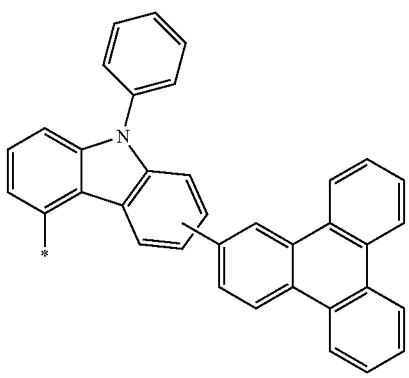
Formula 5-76
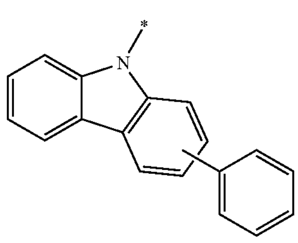
Formula 5-77
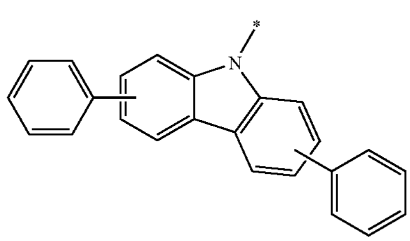
-continued
Formula 5-78
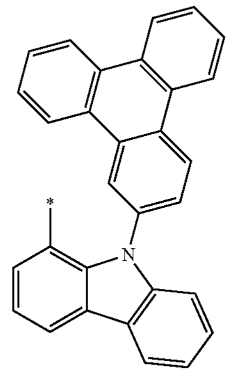
Formula 5-79
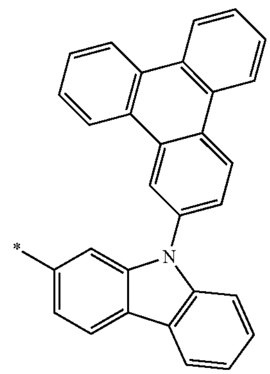
Formula 5-80
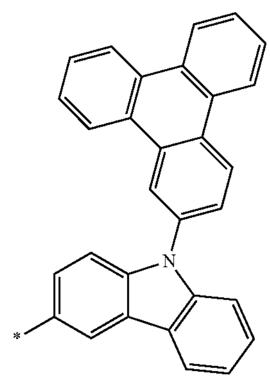
Formula 5-81
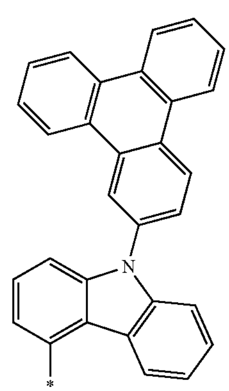

-continued

Formula 5-82

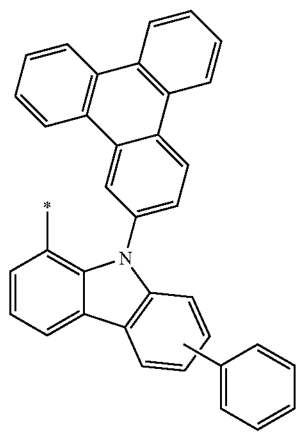

Formula 5-83

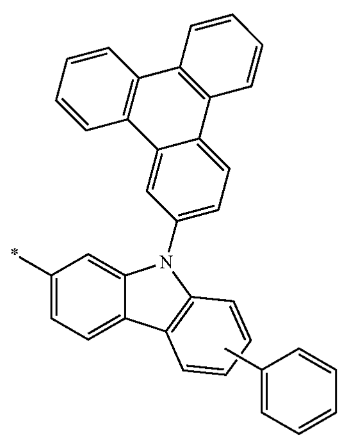

Formula 5-84

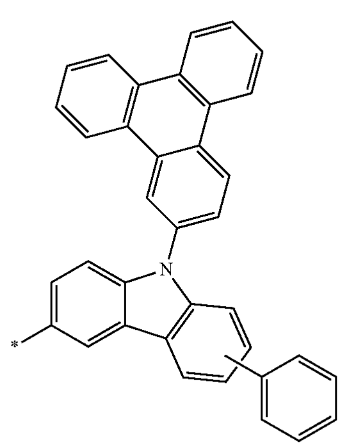

-continued

Formula 5-85

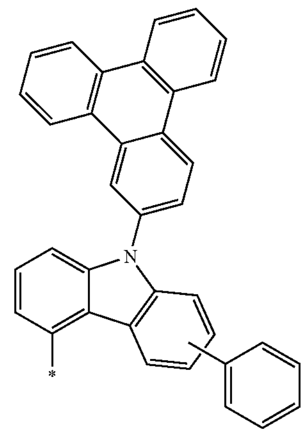

In Formulae 5-1 to 5-85, * may indicate a binding site to a neighboring atom.

For example, but not limited to, $L_2$ in Formula 1 may be represented by one of Formulae 2-2 and 2-14 to 2-16 above, a2 may be 1, $R_2$ may be selected from a hydrogen and groups represented by Formulae 4-1 to 4-5 and 4-31, b2 may be 1 or 2, $R_6$ may be a hydrogen, and $R_7$ may be selected from groups represented by Formulae 4-1 to 4-5.

In example embodiments, the electron-transporting host may include at least one of Compounds EH1-401 to EH1-415 and EH2-1 to EH2-30 below:

EH1-401

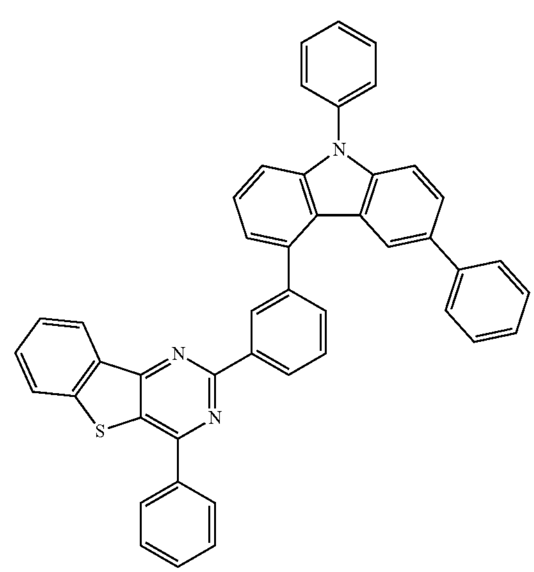

EH1-402
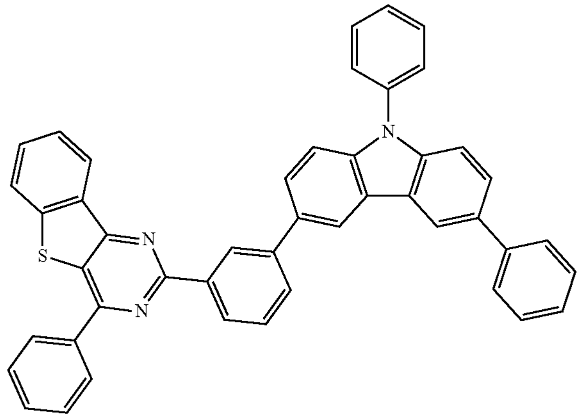
EH1-403
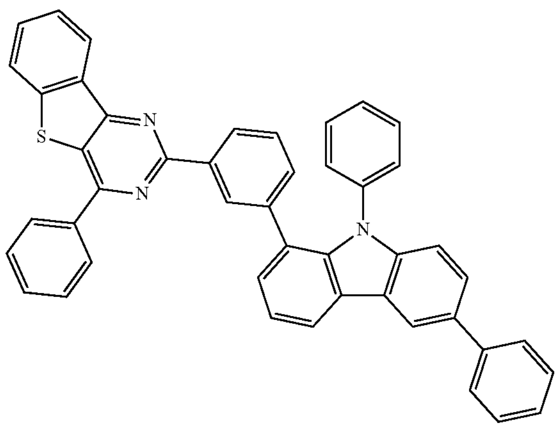
EH1-404
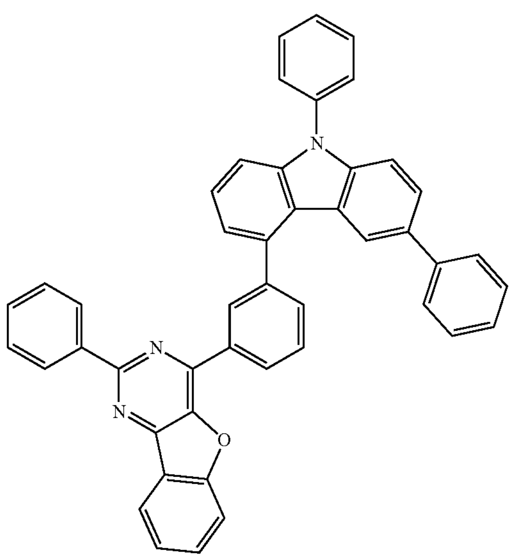
EH1-405
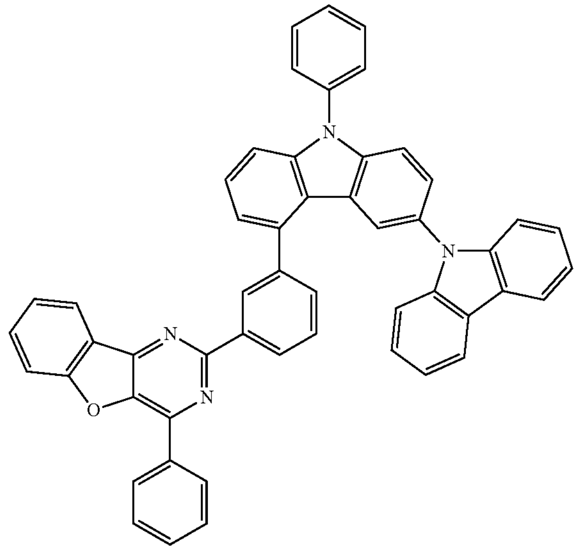
EH1-406
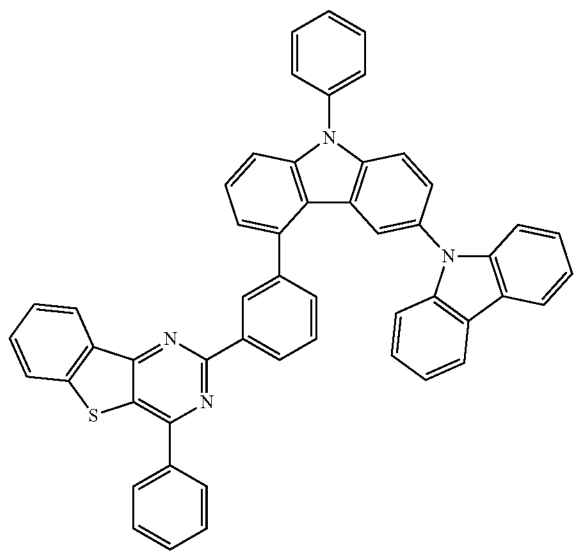
EH1-407
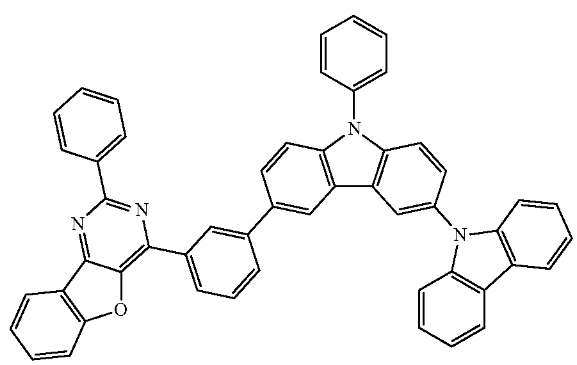

-continued
EH1-408
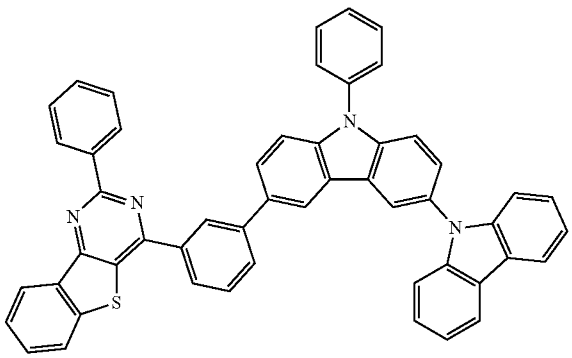
EH1-409
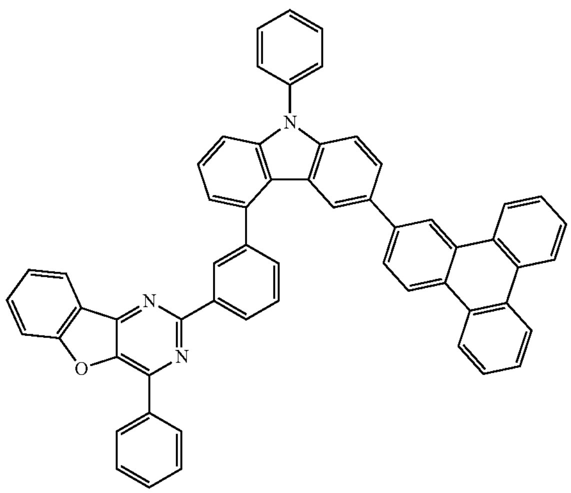
EH1-410
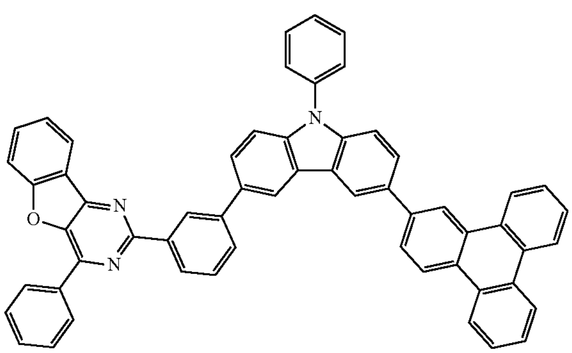
EH1-411
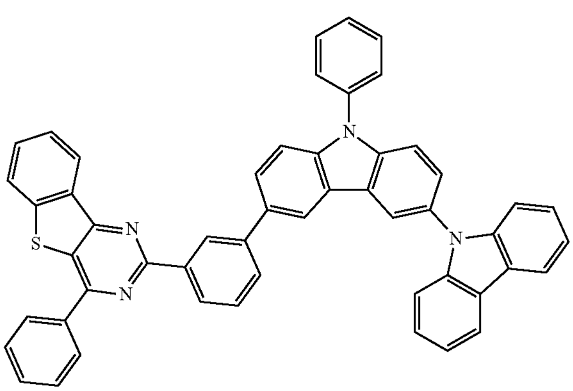
-continued
EH1-412
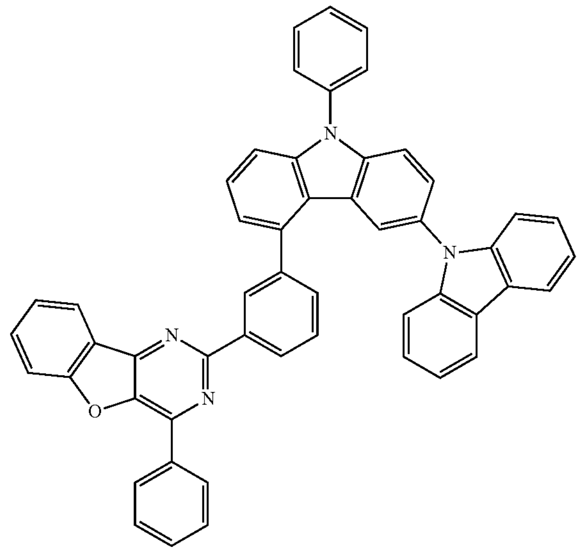
EH1-413
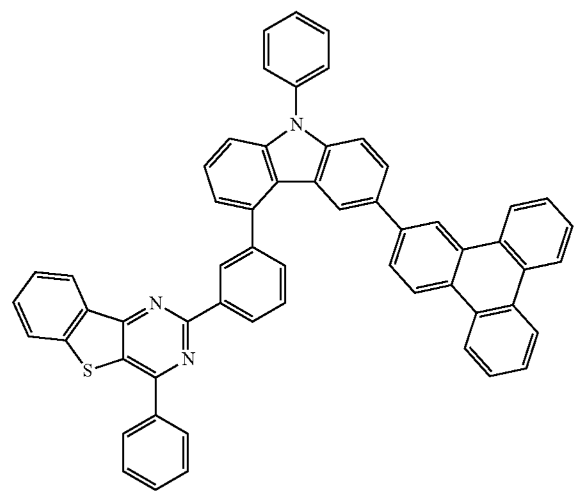
EH1-414
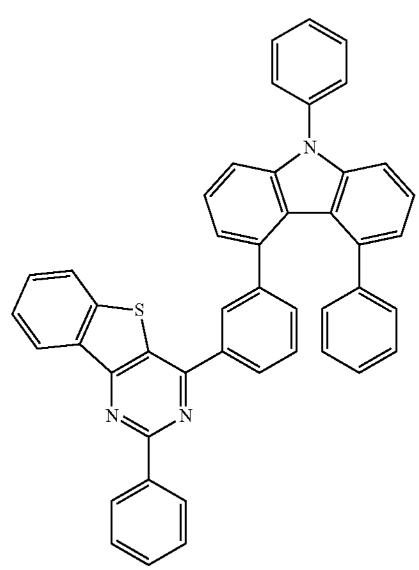

-continued
EH1-415
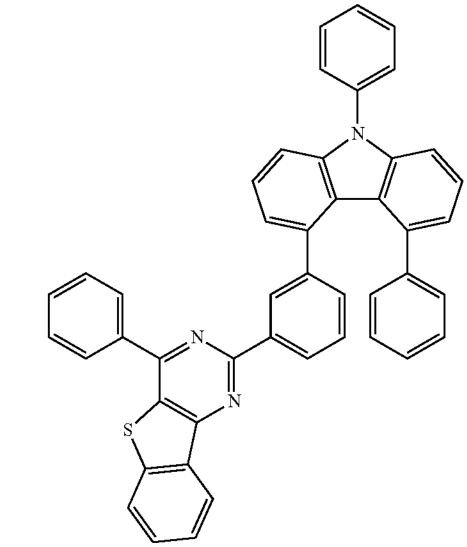
EH2-1
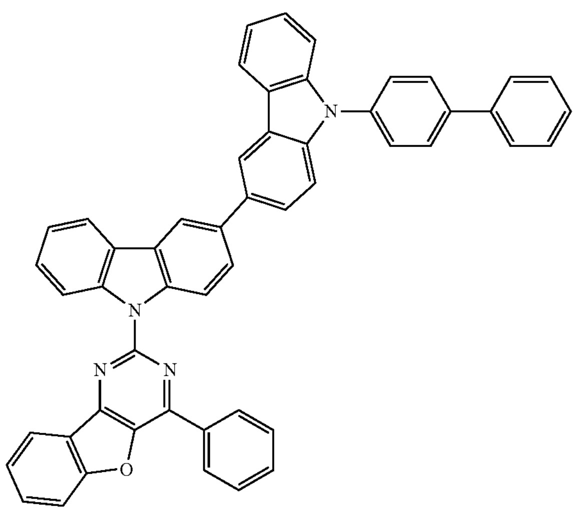
EH2-2
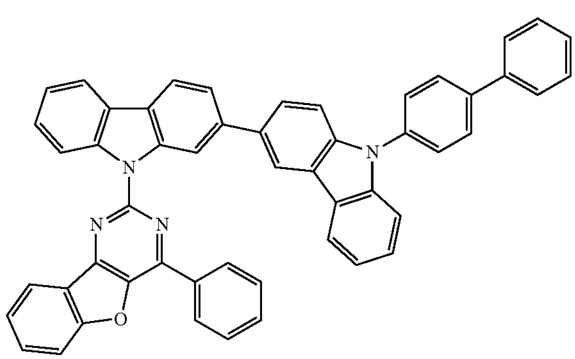
-continued
EH2-3
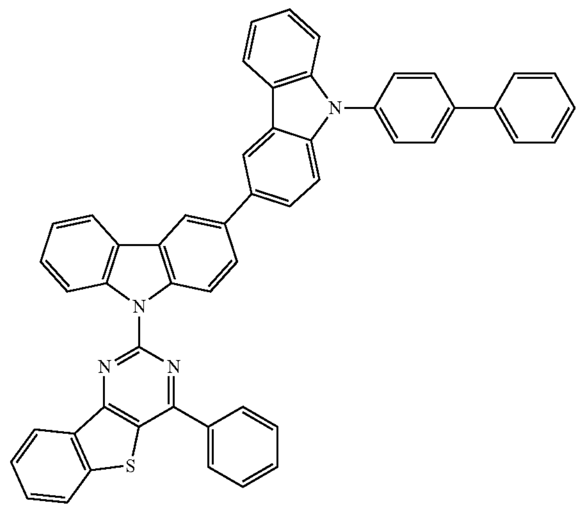
EH2-4
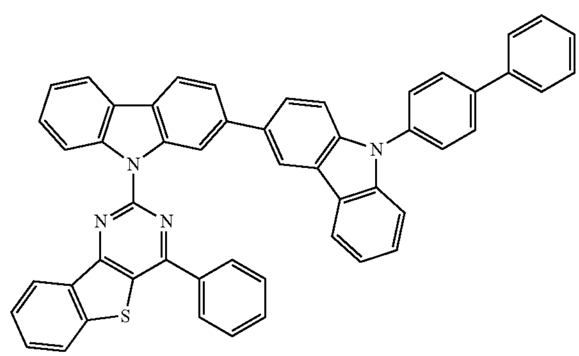
EH2-5
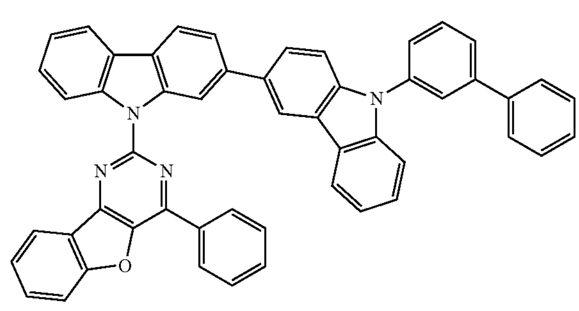

-continued
EH2-6
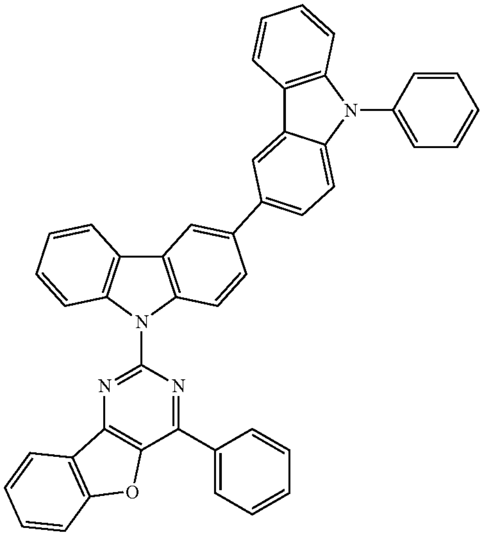
EH2-7
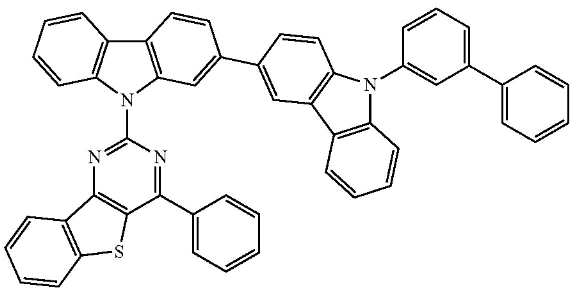
EH2-8
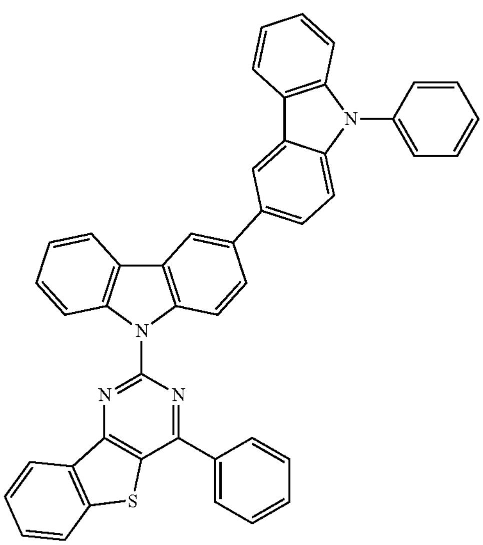
-continued
EH2-9
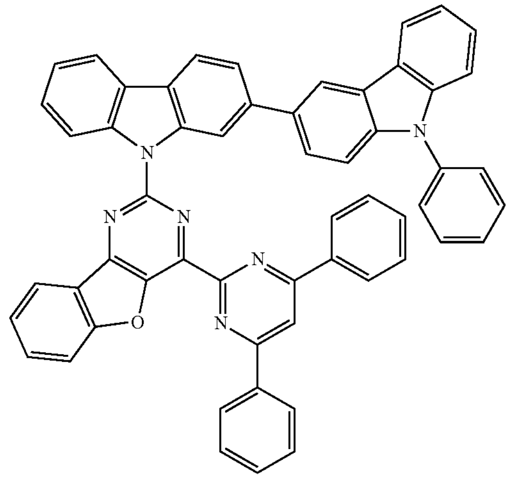
EH2-10
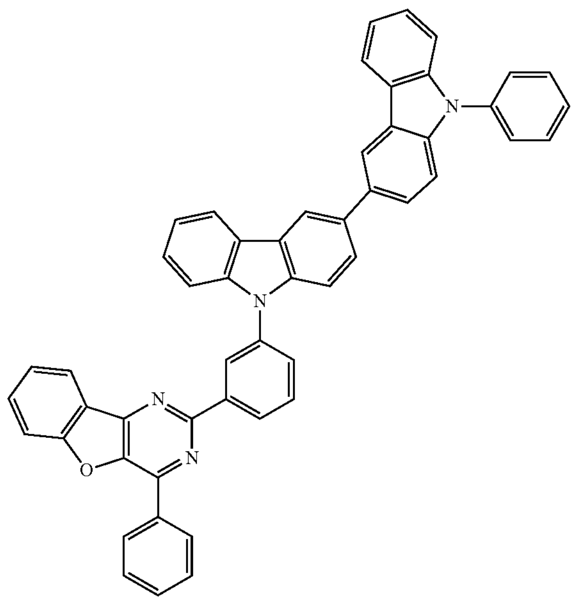
EH2-11
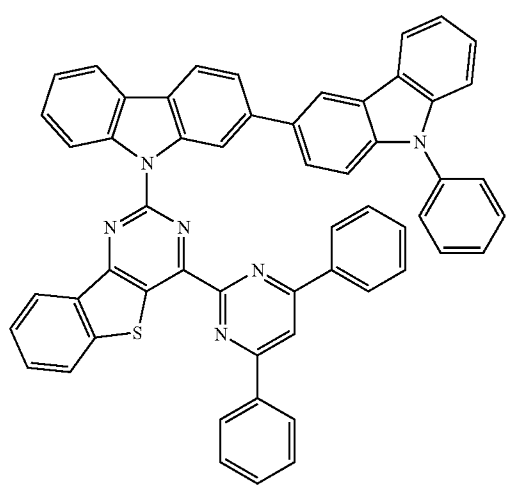

EH2-12
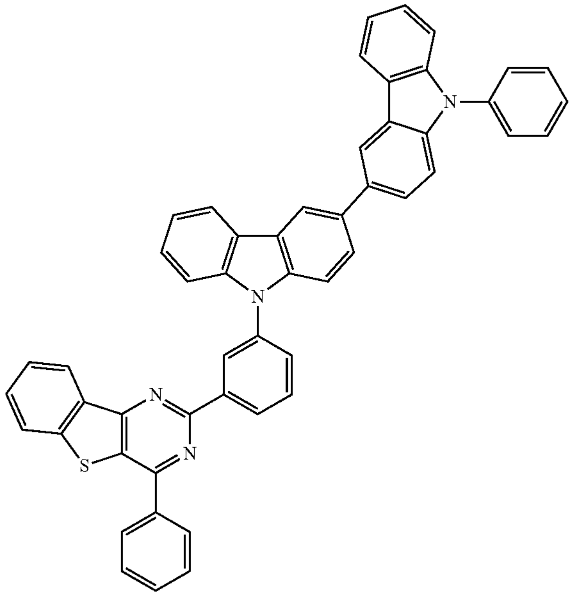
EH2-13
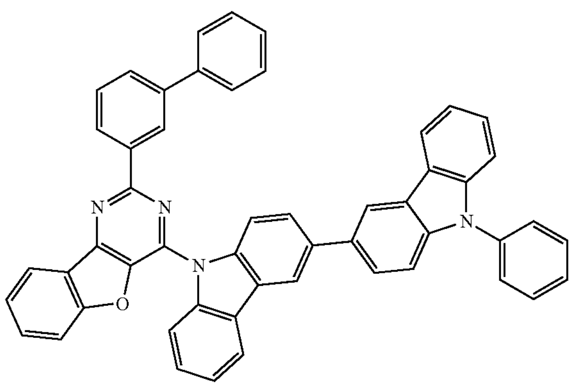
EH2-14
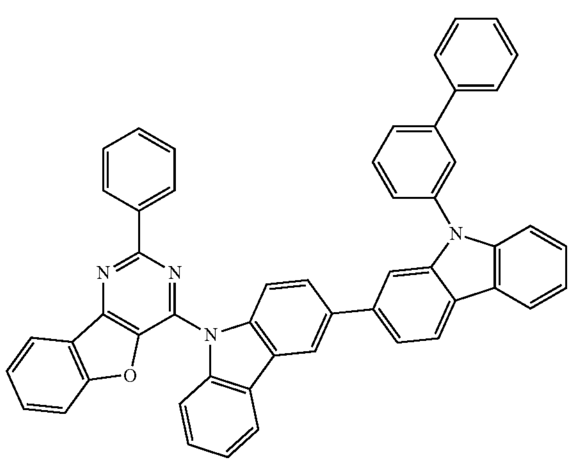
EH2-15
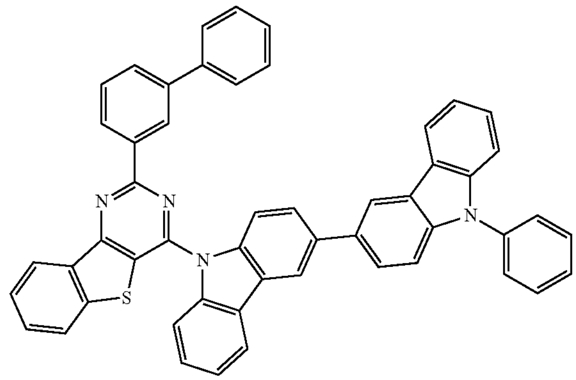
EH2-16
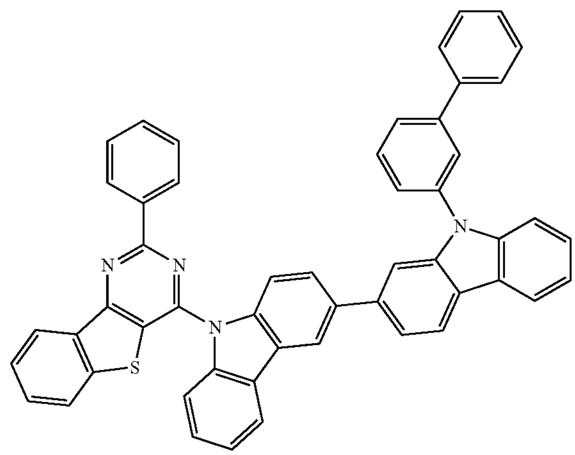
EH2-17
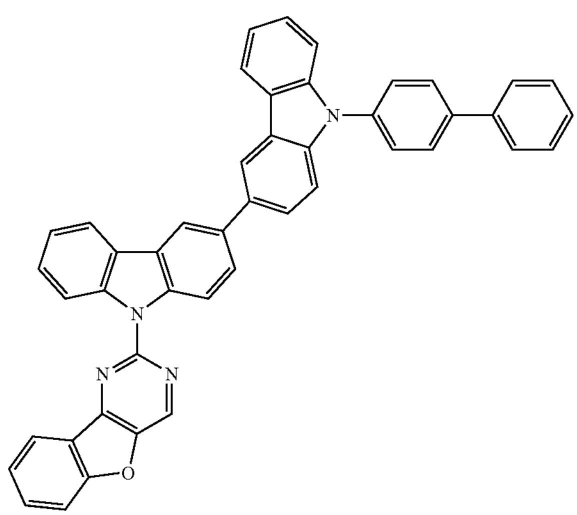

-continued
EH2-18
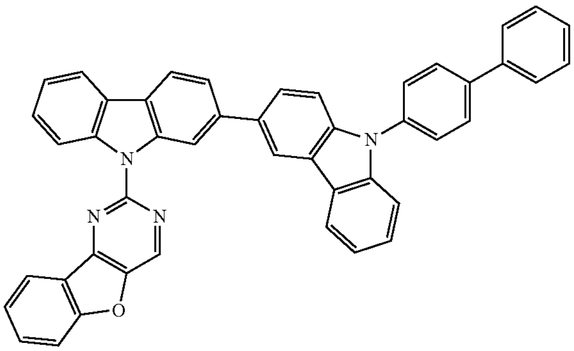
EH2-19
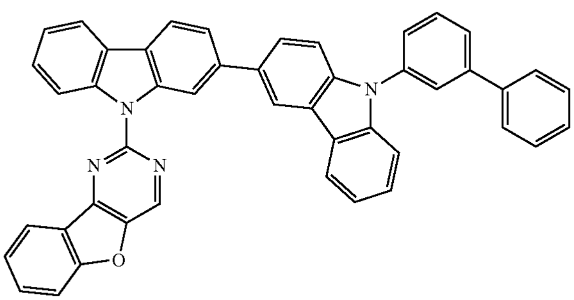
EH2-20
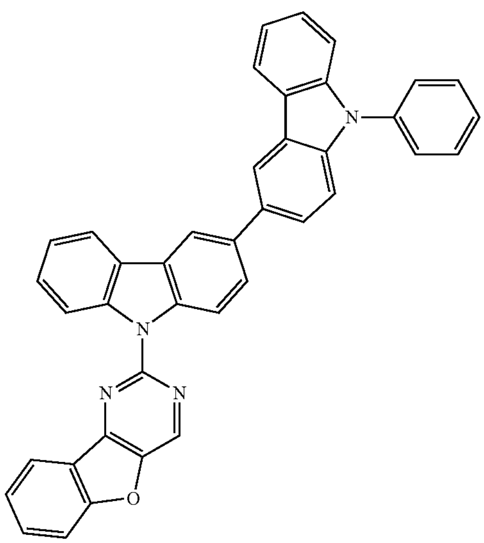
EH2-21
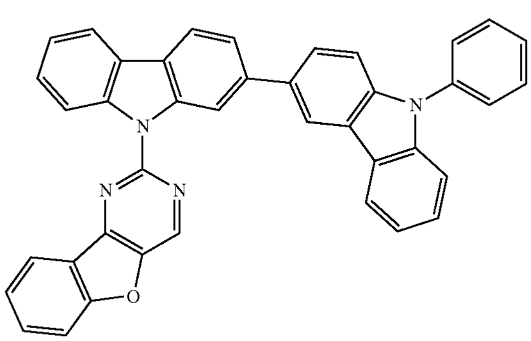
-continued
EH2-22
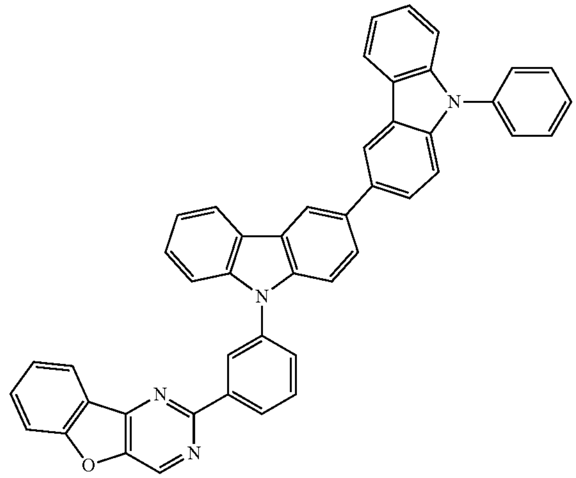
EH2-23
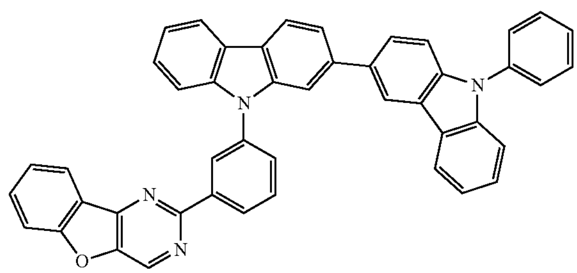
EH2-24
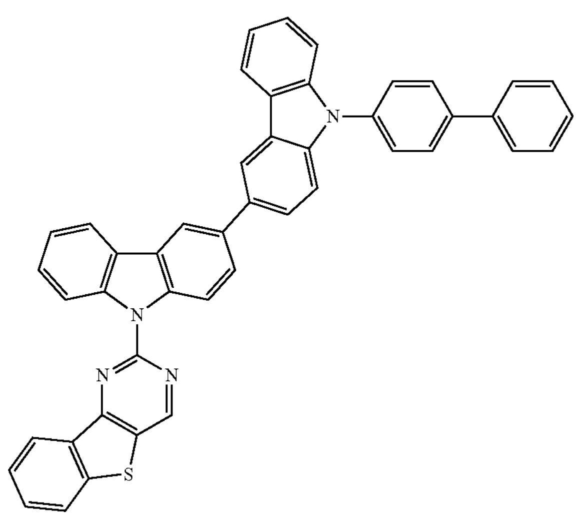

-continued

EH2-25

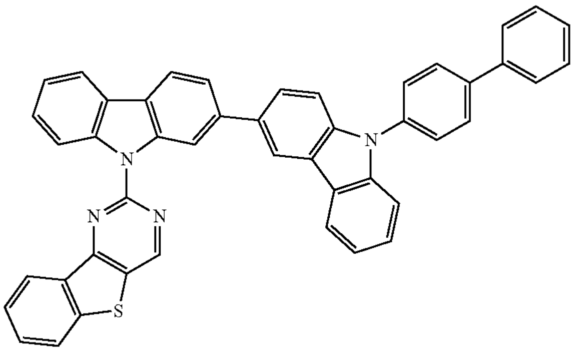

EH2-26

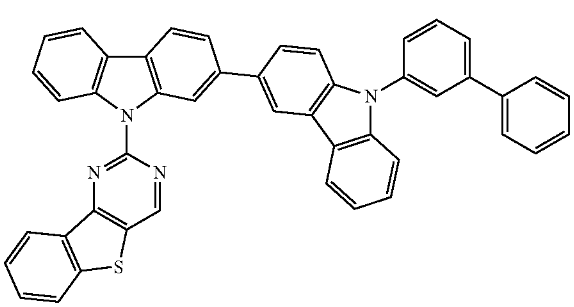

EH2-27

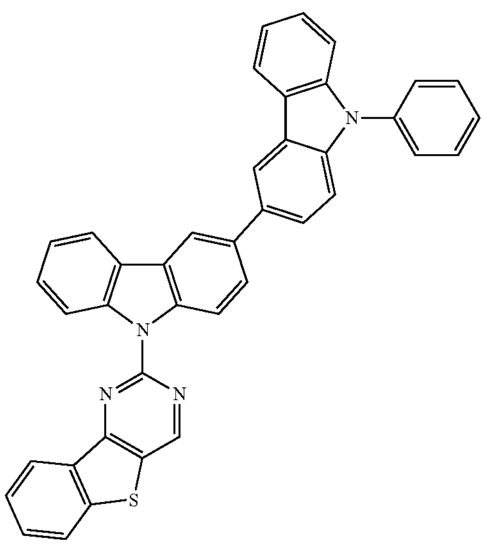

EH2-28

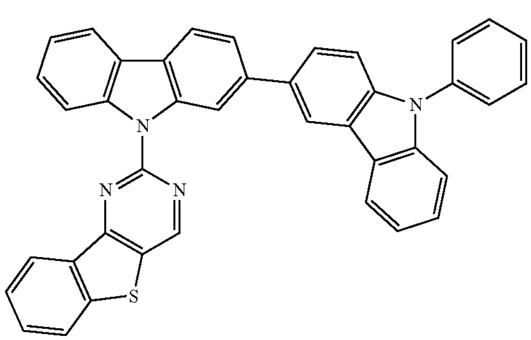

-continued

EH2-29

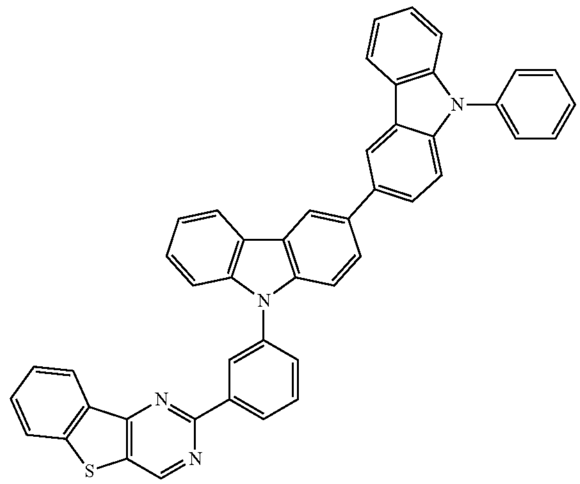

EH2-30

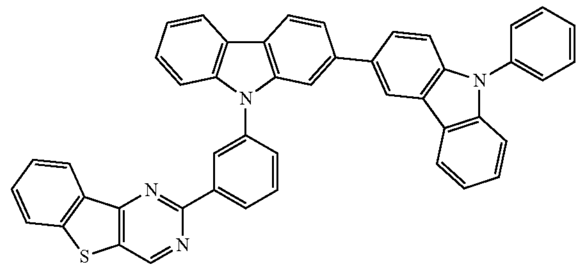

In example embodiments, the electron-transporting host included in the emission layer 15 of the organic light-emitting device 10 may include a compound represented by Formula 10 below:

<Formula 10>

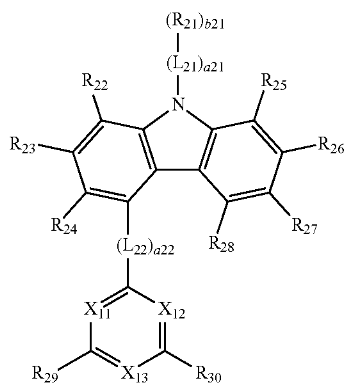

In Formula 10, each of $L_{21}$ and $L_{22}$ may be independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, each of a21 and a22 may be independently an integer of 0 to 3, $X_{11}$ may be N or $C(R_{51})$, $X_{12}$ may be N or $C(R_{52})$, $X_{13}$ may be N or $C(R_{53})$, and at least two of $X_{11}$ to $X_{13}$ may be N, each of $R_{21}$ to $R_{30}$ and $R_{51}$ to $R_{53}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —$Si(Q_{41})(Q_{42})(Q_{43})$, each of b21 and b22 may be independently an integer of 1 to 5, at least one of $R_{25}$ to $R_{28}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; at least one of substituents of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{51})(Q_{52})(Q_{53})$, and —$B(Q_{54})(Q_{55})$; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{61})(Q_{62})(Q_{63})$, and —$B(Q_{64})(Q_{65})$; and —$Si(Q_{71})(Q_{72})(Q_{73})$ and —$B(Q_{74})(Q_{75})$, wherein each of $Q_{41}$ to $Q_{43}$, $Q_{51}$ to $Q_{55}$, $Q_{61}$ to $Q_{65}$, and $Q_{71}$ to $Q_{75}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

For example, each of $L_{21}$ and $L_{22}$ in Formula 10 may be independently selected from a phenylene group, a naphthylene group, a phenalenylene group, a phenanthrenylene group, a triphenylenylene group, an anthracenylene group, a pyrrolylene group, a pyridinylene group, a pyrazinylene group, a pyrimidinylene group, a pyridazinylene group, an isoindolylene group, an indolylene group, a furanylene group, a benzofuranylene group, a thiophenylene group, a benzothiophenylene group, and a triazinylene group; a phenylene group, a naphthylene group, a phenalenylene group, a phenanthrenylene group, a triphenylenylene group, an anthracenylene group, a pyrrolylene group, a pyridinylene group, a pyrazinylene group, a pyrimidinylene group, a pyridazinylene group, an isoindolylene group, an indolylene group, a furanylene group, a benzofuranylene group, a thiophenylene group, a benzothiophenylene group, and a triazinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group; and groups represented by Formulae 11-1 to 11-6 below:

Formulal 11-1

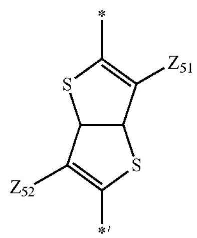

Formula 11-2

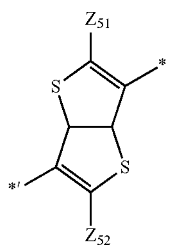

Formula 11-3

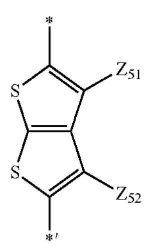

Formula 11-4

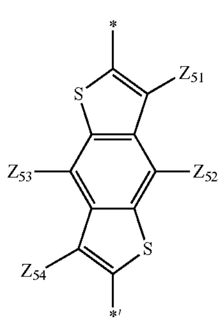

-continued

Formula 11-5

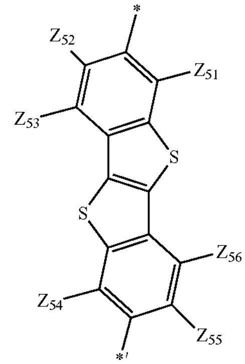

Formula 11-6

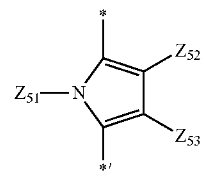

in Formulae 11-1 to 11-6, each of $Z_{51}$ to $Z_{56}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group, and * * may indicate a binding site to a neighboring atom.

For example, each of $L_{21}$ and $L_{22}$ in Formula 10 may be independently selected from groups represented by Formulae 12-1 to 12-15 below and Formulae 11-1 to 11-6 above, but $L_{21}$ and $L_{22}$ are not limited thereto:

Formula 12-1

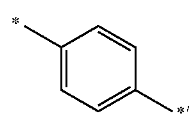

Formula 12-2

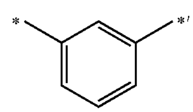

Formula 12-3

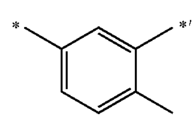

Formula 12-4

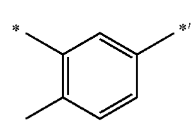

-continued

Formula 12-5

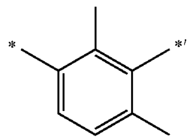

Formula 12-6

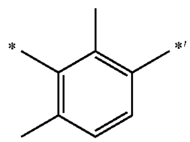

Formula 12-7

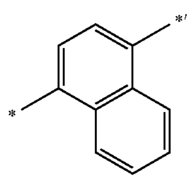

Formula 12-8

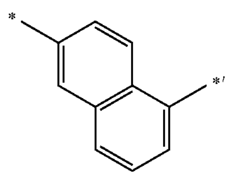

Formula 12-9

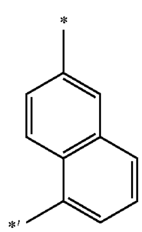

Formula 12-10

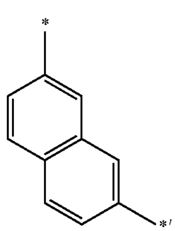

Formula 12-11

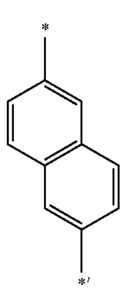

-continued

Formula 12-12

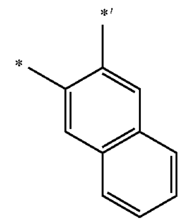

Formula 12-13

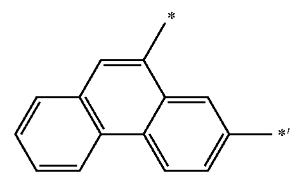

Formula 12-14

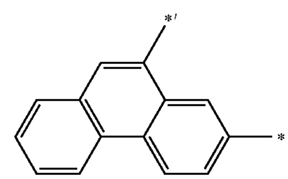

Formula 12-15

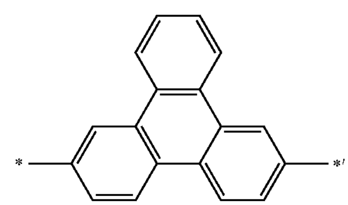

In Formulae 12-1 to 12-15, * and *' may indicate a binding site to a neighboring atom.

In Formula 10, a21 may indicate the number of L21 and may be an integer of 0 to 3. For example, a21 may be 0, 1, or 2. When a21 is 0, -(L21)a21- is a single bond. When a21 is 2 or more, 2 or more L21s may be identical to or different from each other. A description a22 may be understood by referring to the description provided in connection with a1 and the structure of Formula 10.

In Formula 10, each of a21 and a22 may be independently one of 0, 1, and 2, but a21 and a22 are not limited thereto.

In example embodiments, in Formula 10, $X_{11}$ to $X_{13}$ may be N; or $X_{11}$ and $X_{12}$ may be N and $X_{13}$ may be C(R53), are not limited thereto.

In example embodiments, in Formula 10, R21 may be selected from groups represented by Formulae 15-1 to 15-40 and —Si($Q_{41}$)($Q_{42}$)($Q_{43}$) (wherein each of $Q_{41}$ to $Q_{43}$ may be independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group); each of $R_{22}$ to $R_{24}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; each of $R_{25}$ to $R_{30}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and groups represented by Formulae 15-1 to 15-40 below; at least one of $R_{25}$ to $R_{28}$ may be independently selected from groups represented by Formulae 15-1 to 15-40 below; and at least one of $R_{29}$ and $R_{30}$ may be independently selected from groups represented by Formulae 15-1 to 15-40 below:

Formula 15-1

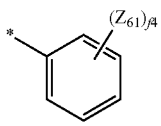

Formula 15-2

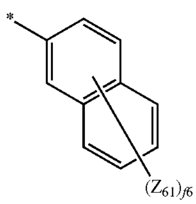

Formula 15-3

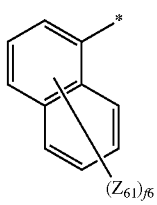

Formula !5-4

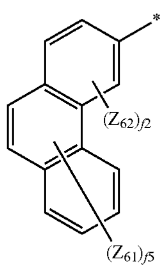

Formula 15-5

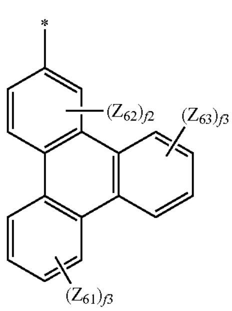

-continued

Formula 15-6

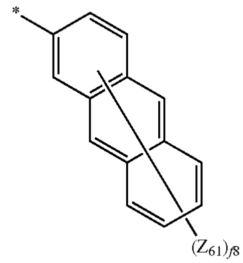

Formula 15-7

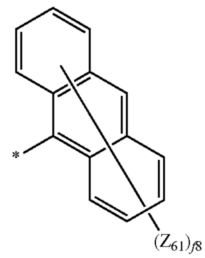

Formula 15-8

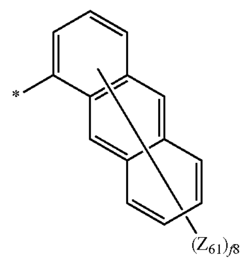

Formula 15-9

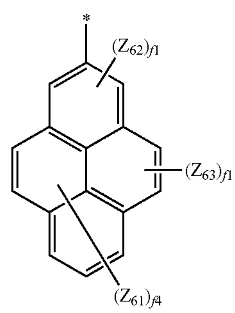

Formula 15-10

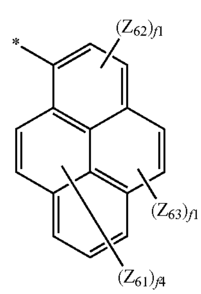

Formula 15-11

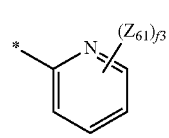

-continued
Formula 15-12
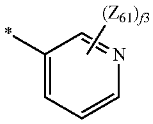
Formula 15-13
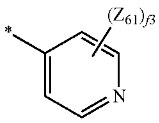
Formula 15-14
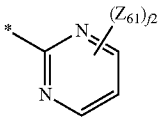
Formula 15-15
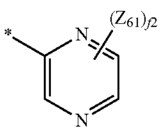
Formula 15-16
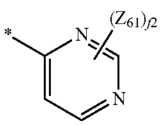
Formula 15-17
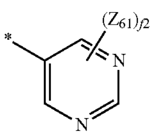
Formula 15-18
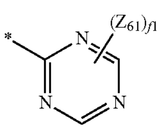
Formula 15-19
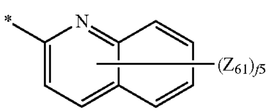
Formula 15-20
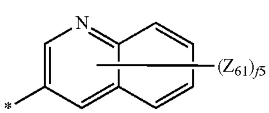
Formula 15-21
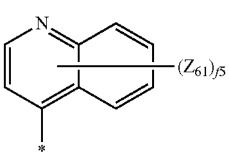
Formula 15-22
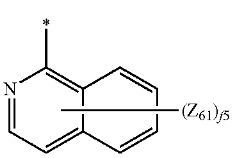
Formula 15-23
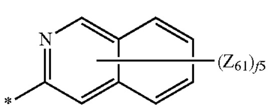
-continued
Formula 15-24
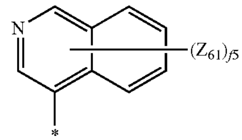
Formula 15-25
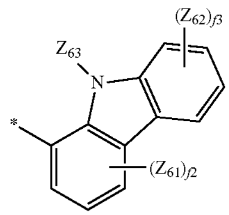
Formula 15-26
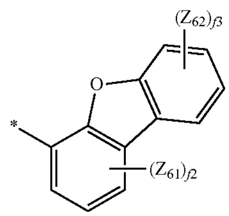
Formula 15-27
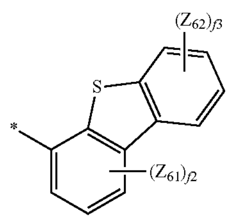
Formula 15-28
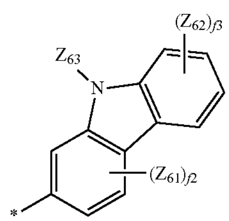
Formula 15-29
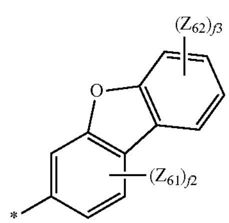
Formula 15-30
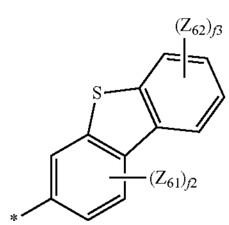

-continued

Formula 15-31

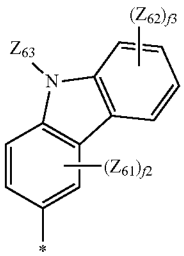

Formula 15-32

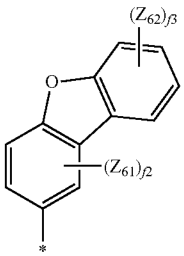

Formula 15-33

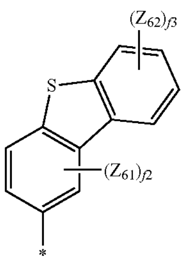

Formula 15-34

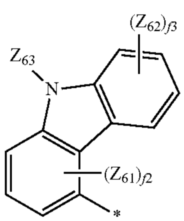

Formula 15-35

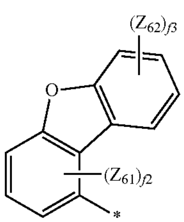

Formula 15-36

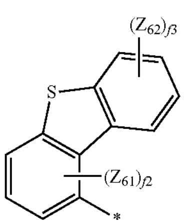

-continued

Formula 15-37

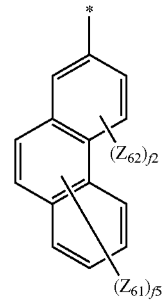

Formula 15-38

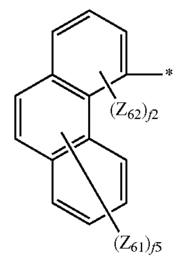

Formula 15-39

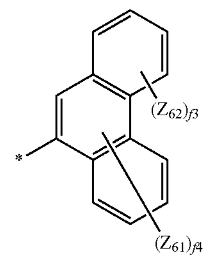

Formula 15-40

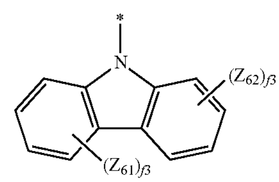

In Formulae 15-1 to 15-40, each of $Z_{61}$ to $Z_{63}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, an anthracenyl group, a pyrenyl group, a phenanthrenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group; f1 may be 1 or 2, f2 may be an integer of 1 to 3, f3 may be an integer of 1 to 4, f4 may be an integer of 1 to 5, f5 may be an integer of 1 to 6, f6 may be an integer of 1 to 7, f7 may be an integer of 1 to 8, and f8 may be an integer of 1 to 9; and * indicates a binding site to a neighboring atom.

In example embodiments, each of $R_{21}$ to $R_{28}$ in Formula 10 may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; a phenyl group, a naphthyl group, an anthracenyl group, a triphenylenyl group, a pyrenyl group, a phenanthrenyl group, a phenylenyl group, a fluorenyl group, a carbazolyl group, a dibenzofuranyl group, and a dibenzothiophenyl group; a phenyl group, a naphthyl group, an anthracenyl group, a triphenylenyl group, a pyrenyl group, a phenanthrenyl group, a phenylenyl group, a fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a phenylenyl group, a fluorenyl group, a carbazolyl group, a dibenzofuranyl group, and a dibenzothiophenyl group; and —Si($Q_{41}$)($Q_{42}$)($Q_{43}$) (wherein each of $Q_{41}$ to $Q_{43}$ may be independently a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a triphenylenyl group, a fluorenyl group, a carbazolyl group, a benzocarbazolyl group, a dibenzocarbazolyl group, a pyridinyl group, a pyrimidinyl group, a pyrazinyl group, a pyridazinyl group, a triazinyl group, a quinolinyl group, an isoquinolinyl group, a phthalazinyl group, a quinoxalinyl group, a cinnolinyl group, and a quinazolinyl group); and at least one of $R_{25}$ to $R_{28}$ may be independently selected from a phenyl group, a naphthyl group, an anthracenyl group, a triphenylenyl group, a pyrenyl group, a phenanthrenyl group, a phenylenyl group, a fluorenyl group, a carbazolyl group, a dibenzofuranyl group, and a dibenzothiophenyl group; and a phenyl group, a naphthyl group, an anthracenyl group, a triphenylenyl group, a pyrenyl group, a phenanthrenyl group, a phenylenyl group, a fluorenyl group, a carbazolyl group, a dibenzofuranyl group, and a dibenzothiophenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a phenylenyl group, a fluorenyl group, a carbazolyl group, a dibenzofuranyl group, and a dibenzothiophenyl group.

In example embodiments, the electron-transporting host included in the emission layer 15 may be represented by Formula 10 above, but in Formula 10, each of $L_{21}$ and $L_{22}$ may be independently selected from groups represented by Formulae 12-1 to 12-15 above, each of a21 and a22 may be independently one of 0 and 1, $X_{11}$ to $X_{13}$ may be N, $R_{22}$ to $R_{26}$ and $R_{28}$ may be hydrogen, each of $R_{27}$, $R_{29}$, and $R_{30}$ may be independently a compound represented by Formulae 15-1 to 15-40 above.

In example embodiments, the electron-transporting host included in the emission layer 15 of the organic light-emitting device 10 may include at least one of Compounds EH3-1 to EH3-102 below, but the electron-transporting host is not limited thereto:

EH3-1

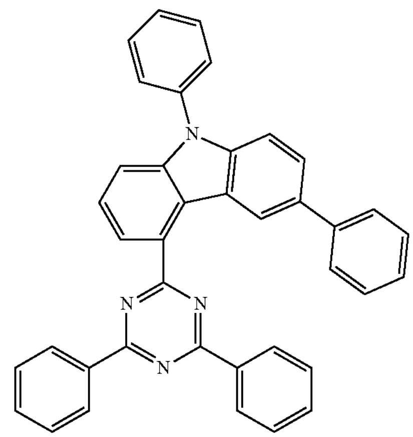

EH3-2

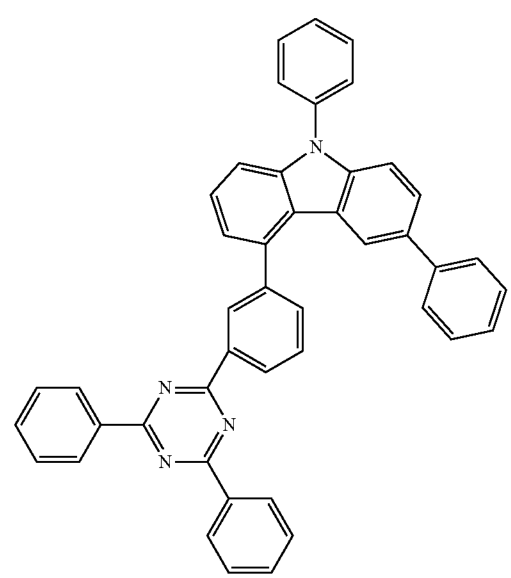

-continued
EH3-3
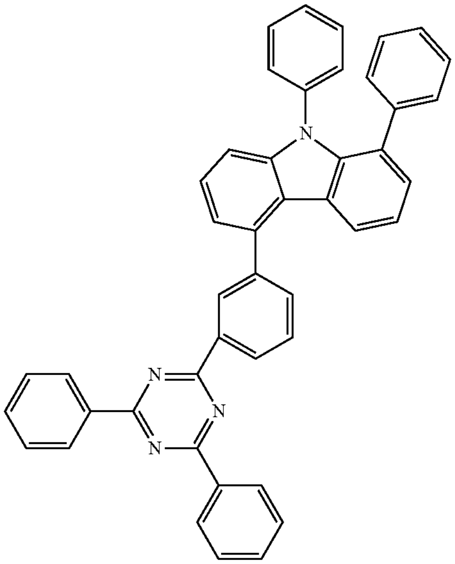
EH3-4
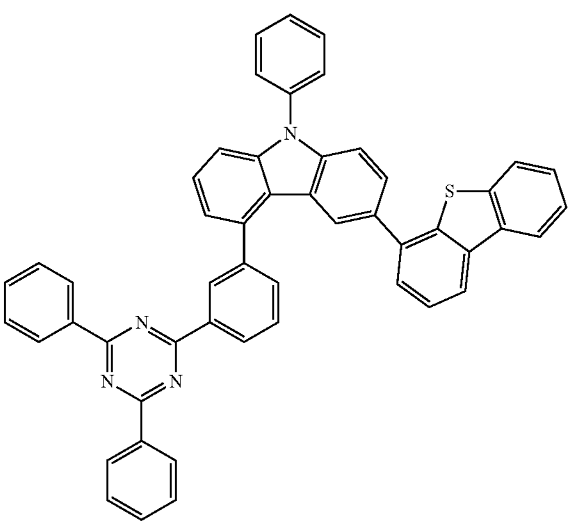
-continued
EH3-5
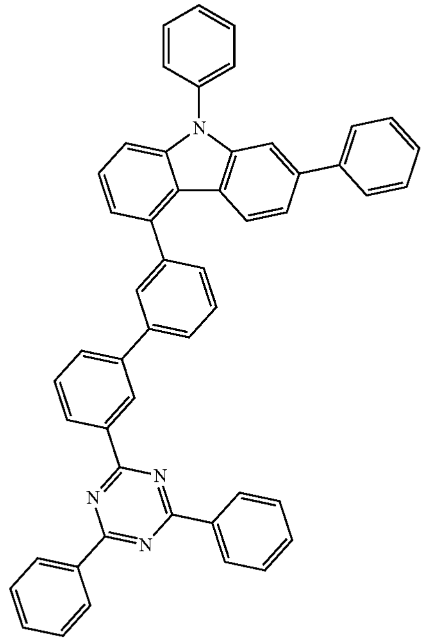
EH3-6
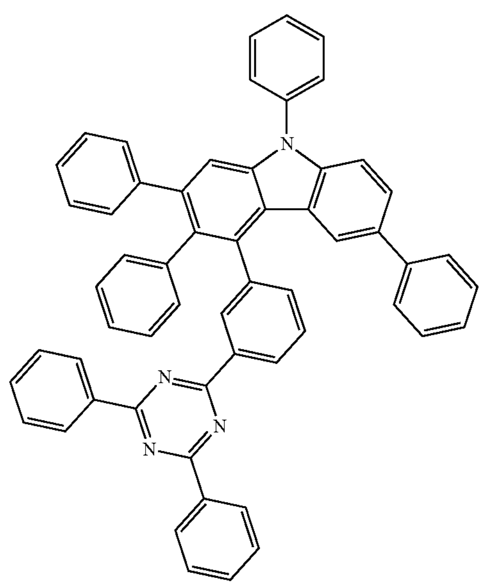

-continued
EH3-7
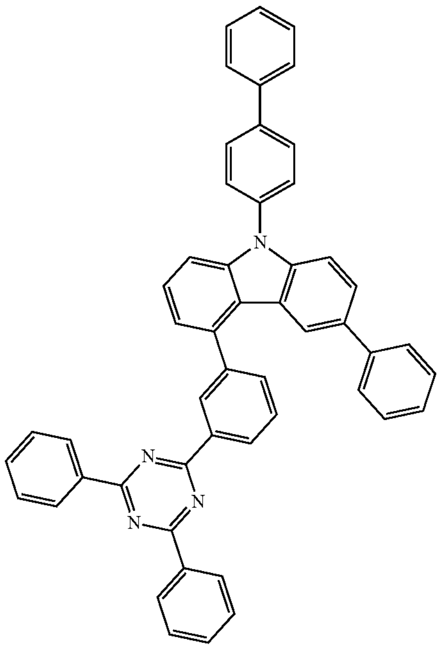
EH3-8
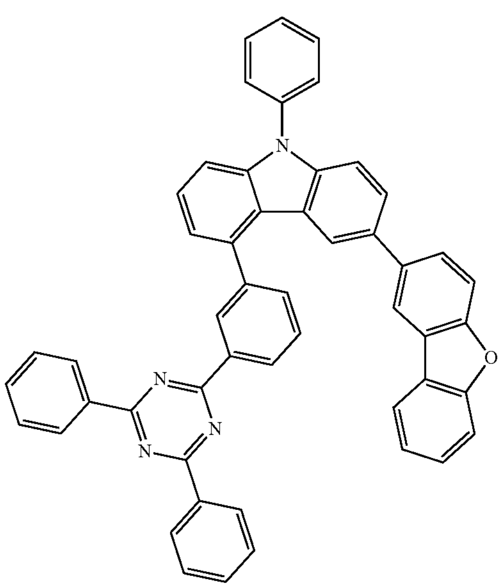
-continued
EH3-9
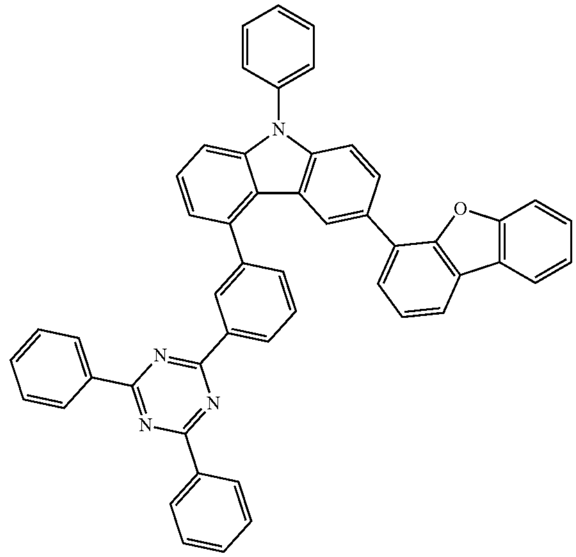
EH3-10
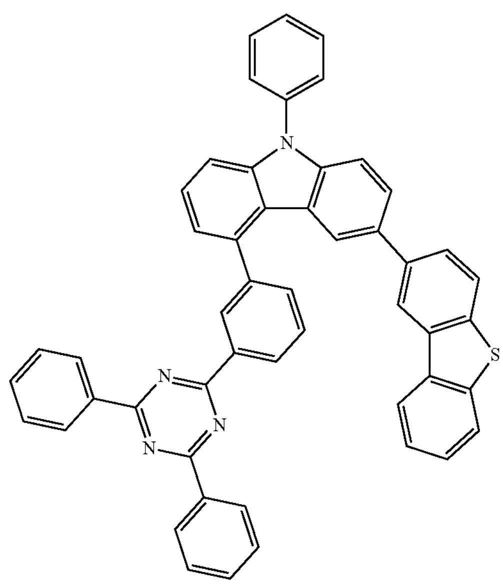

-continued
EH3-11
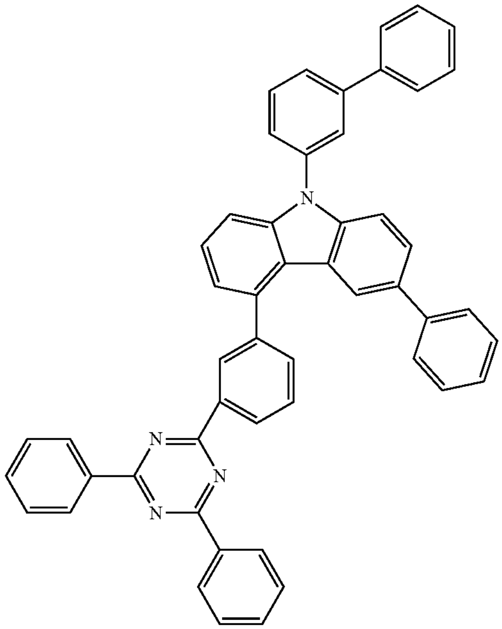
EH3-12
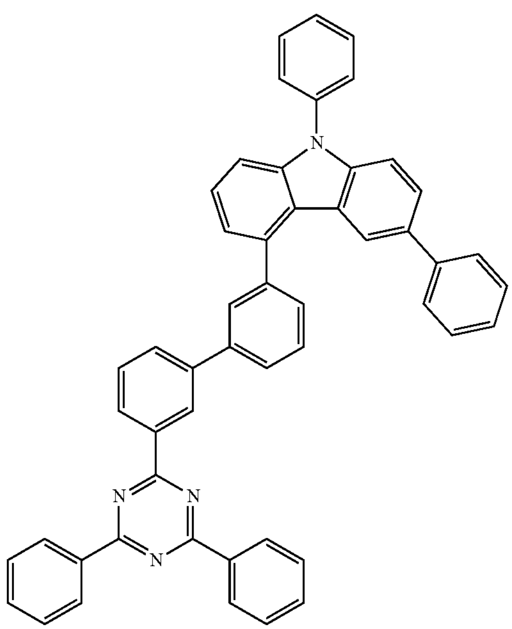
-continued
EH3-13
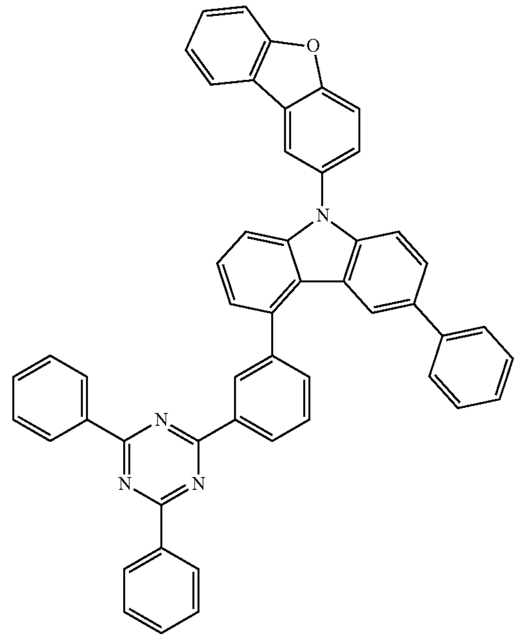
EH3-14
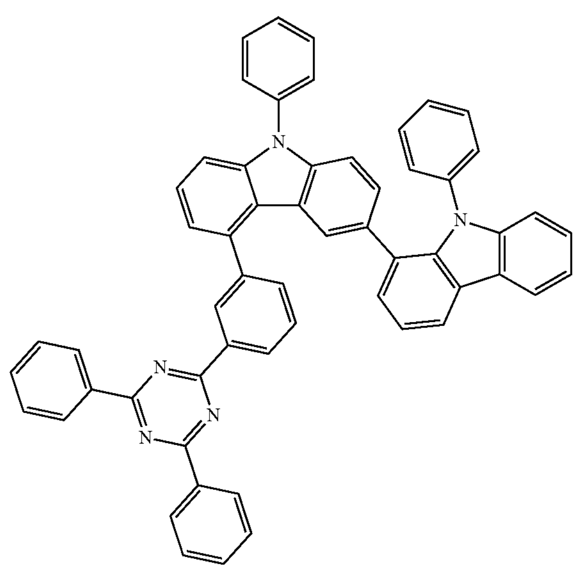

-continued
EH3-15
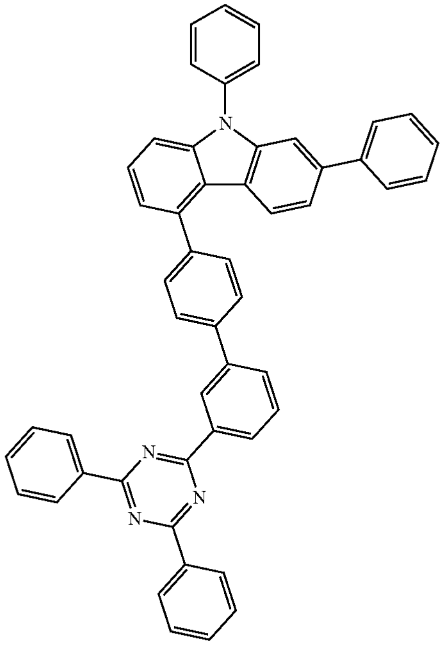
EH3-16
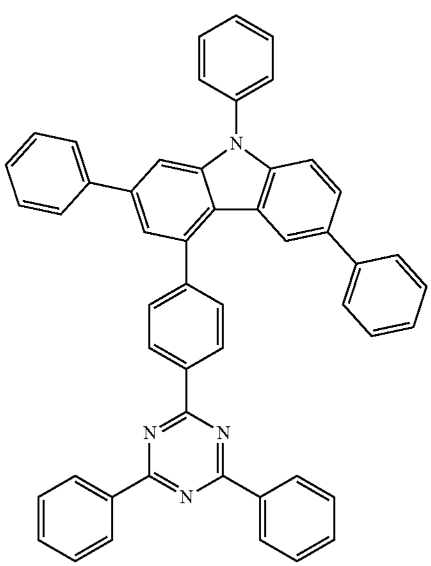
-continued
EH3-17
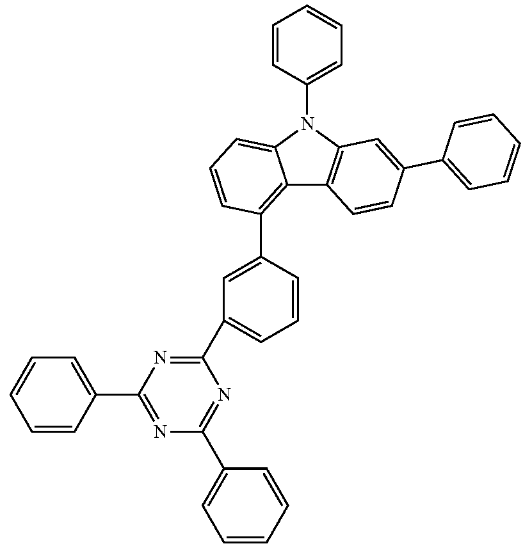
EH3-18
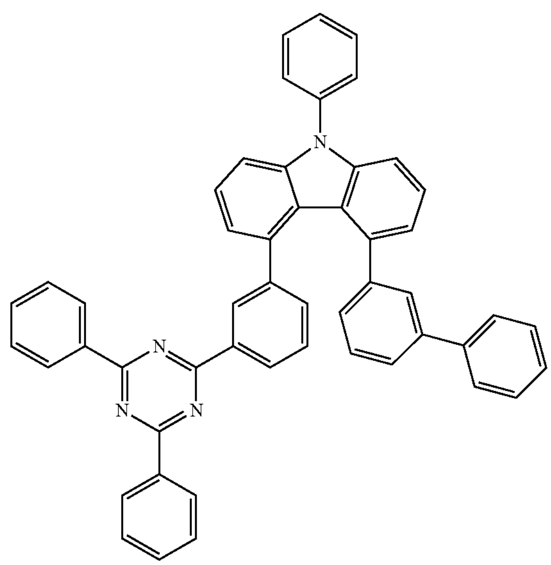

-continued
EH3-19
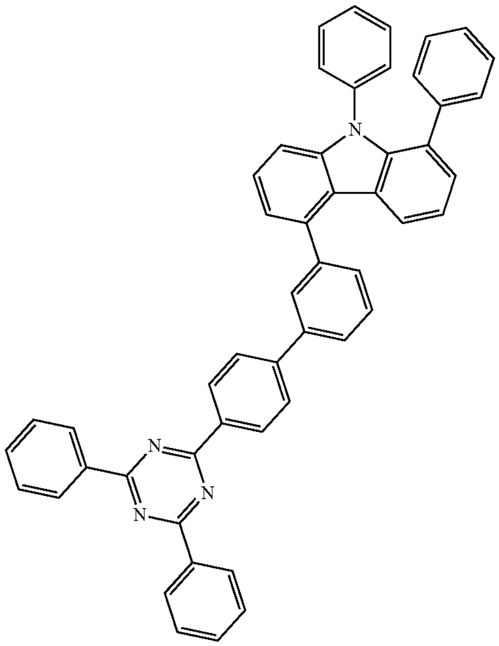
EH3-20
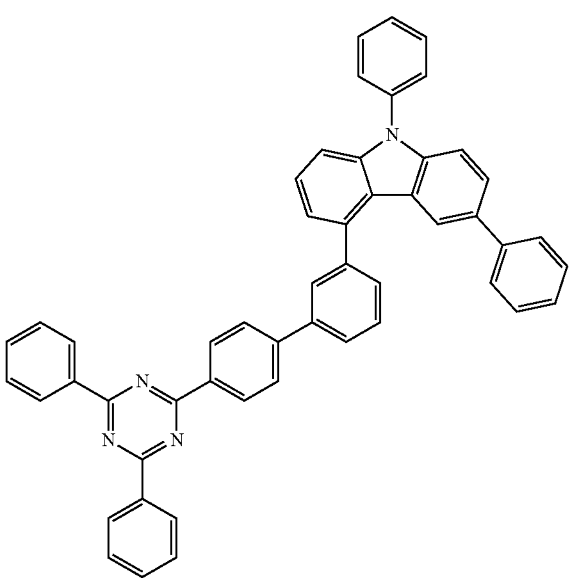
-continued
EH3-21
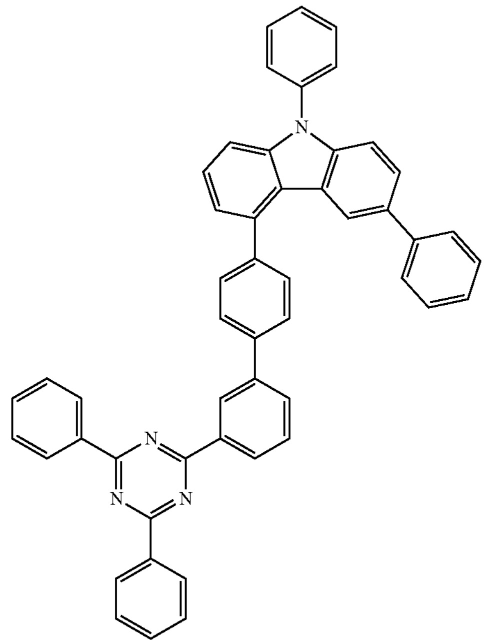
EH3-22
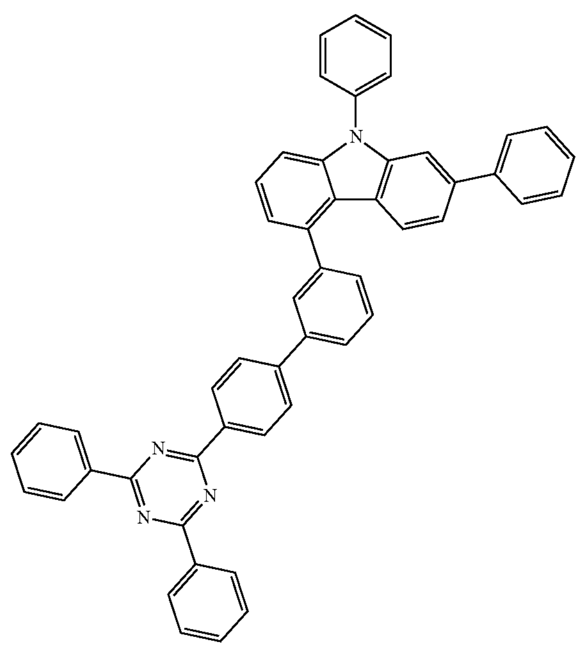

-continued
EH3-23
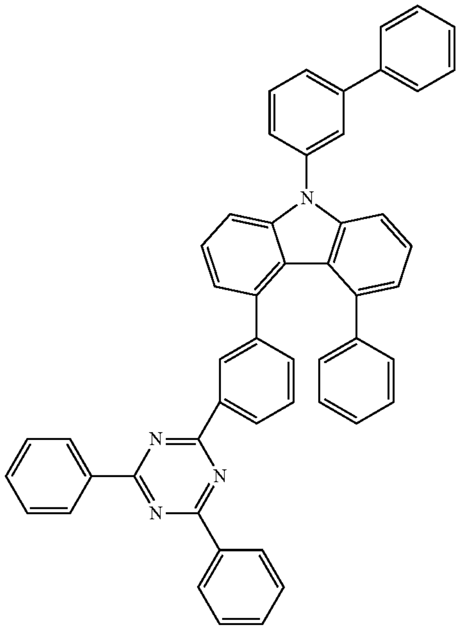
EH3-24
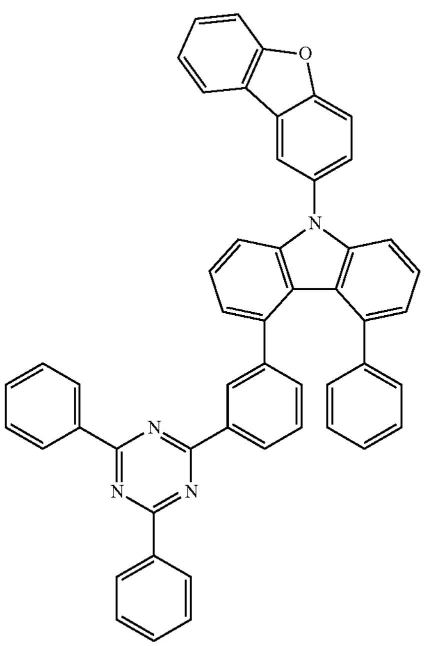
-continued
EH3-25
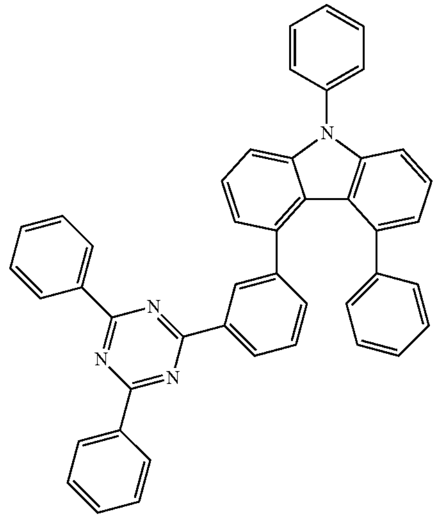
EH3-26
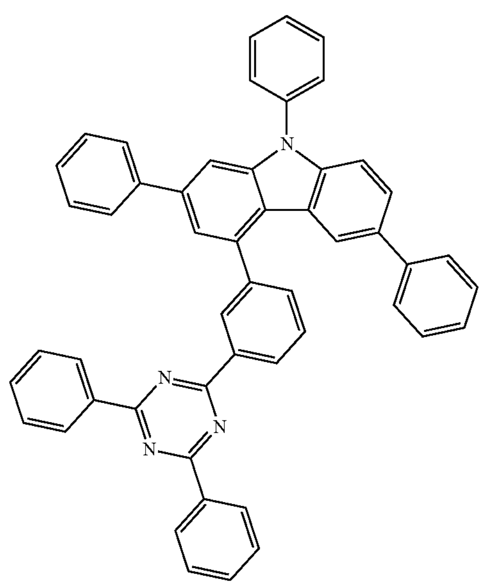

EH3-27
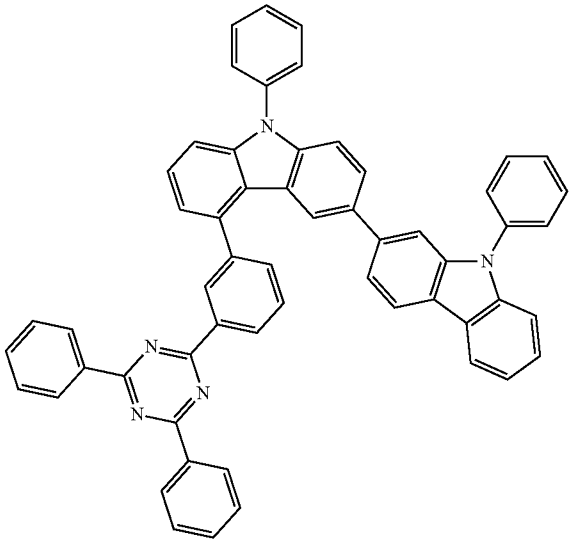
EH3-28
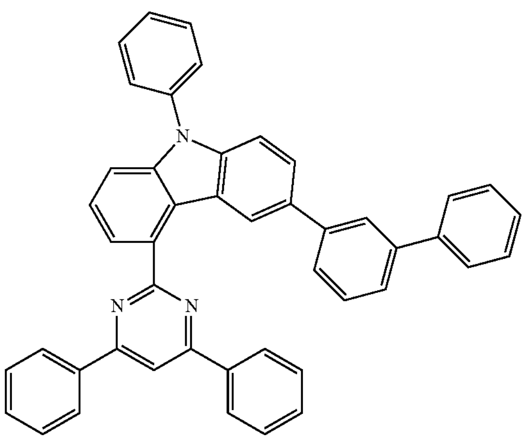
EH3-29
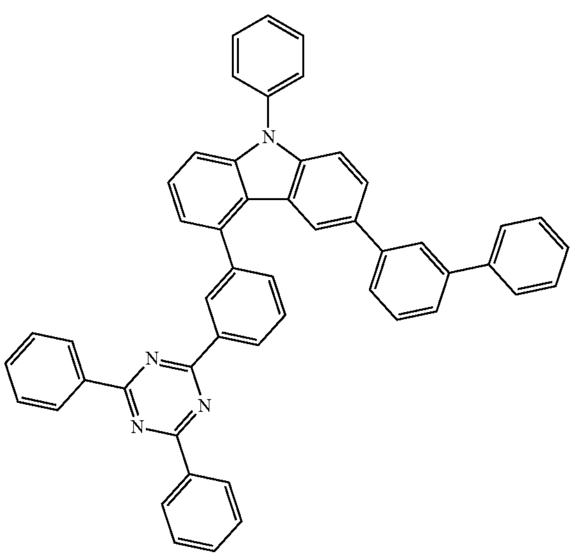
EH3-30
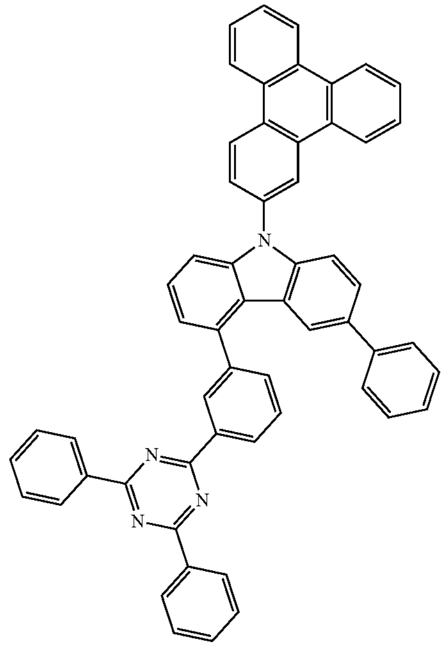
EH3-31
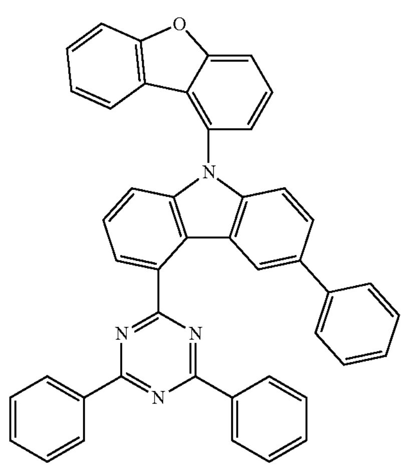

EH3-32
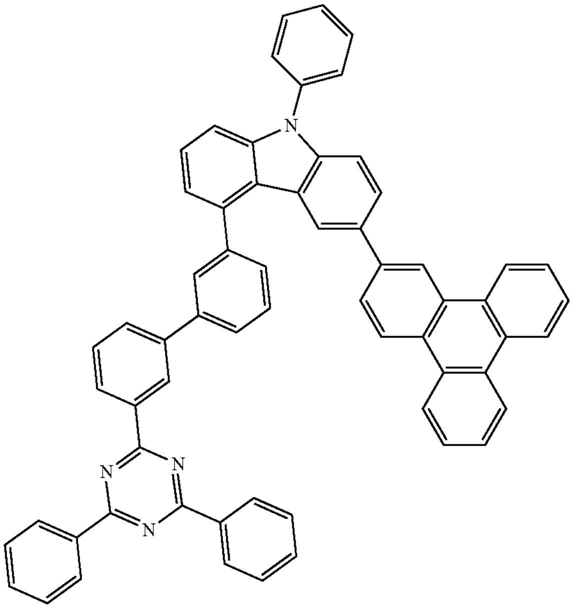
EH3-33
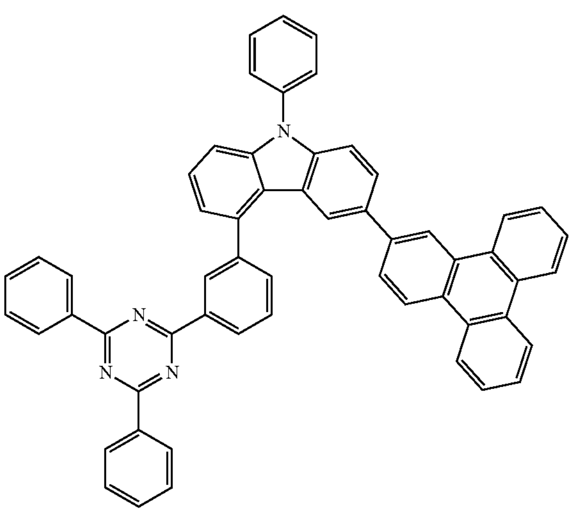
EH3-34
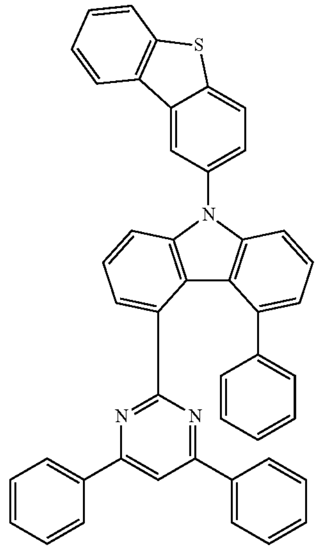
EH3-35
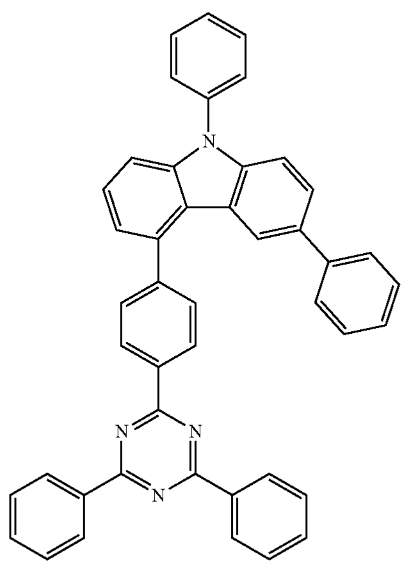

-continued
EH3-36
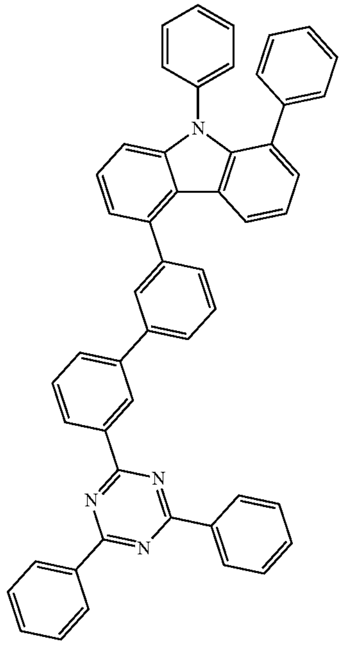
EH3-37
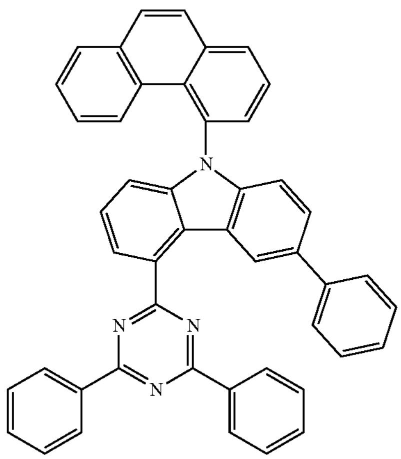
EH3-38
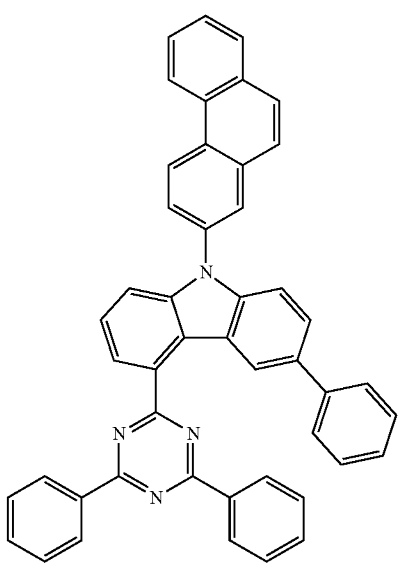
-continued
EH3-39
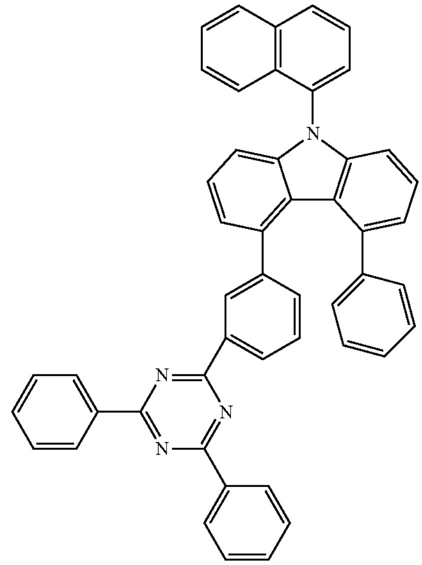
EH3-40
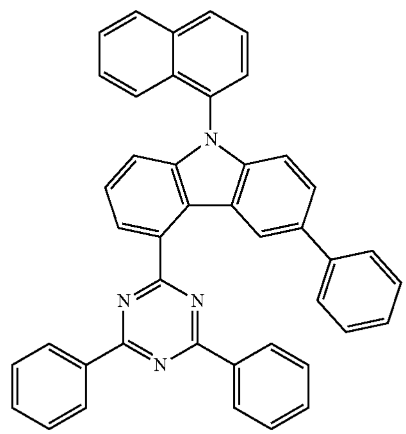
EH3-41
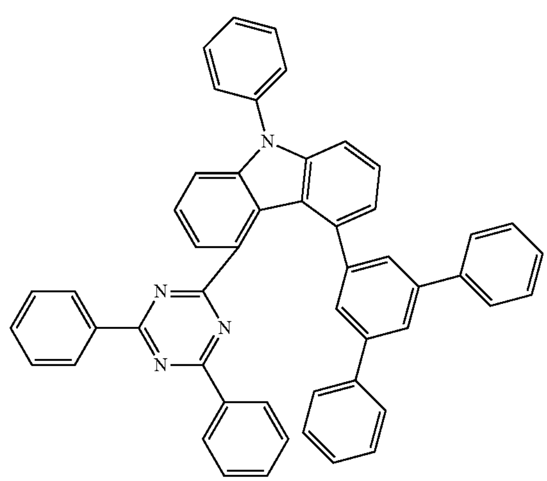

-continued
EH3-42
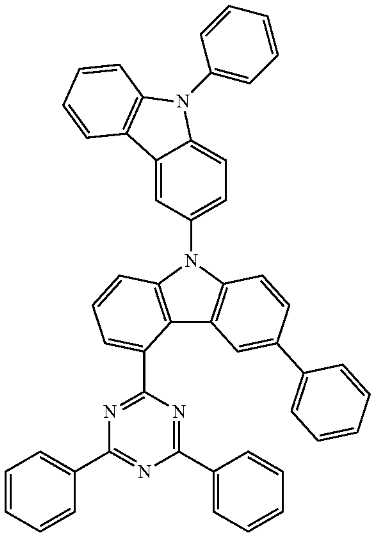
EH3-43
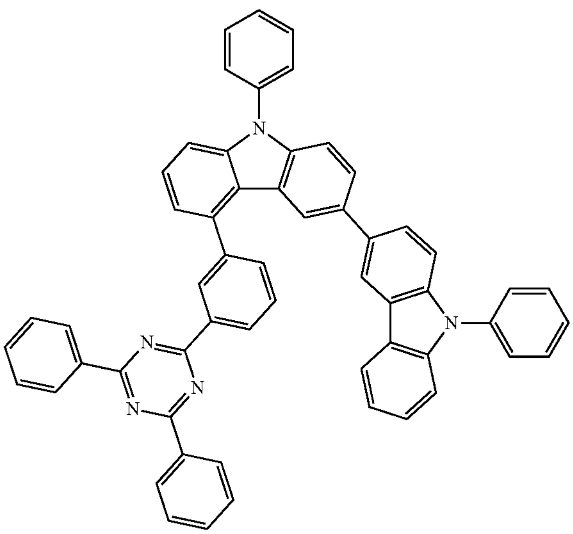
EH3-44
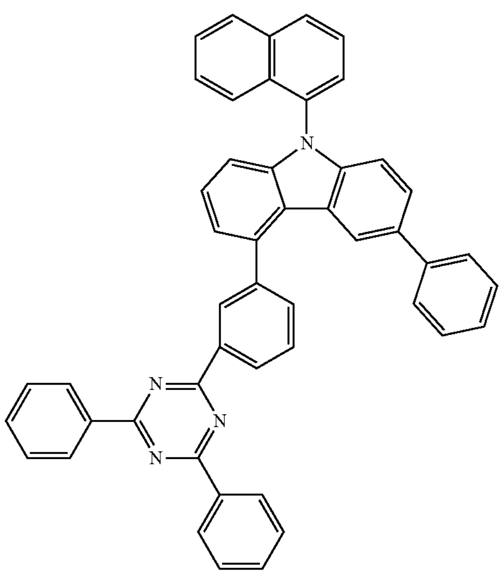
-continued
EH3-45
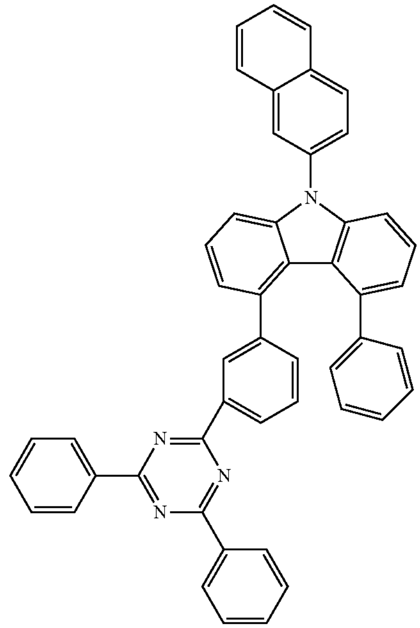
EH3-46
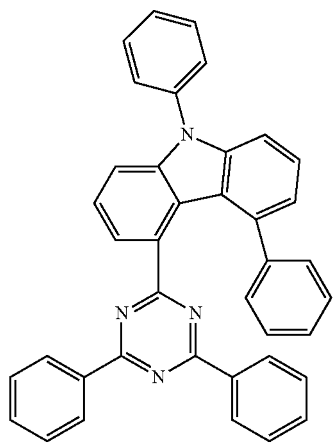
EH3-47
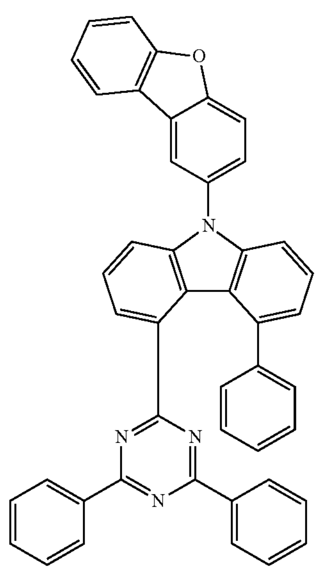

-continued
EH3-48
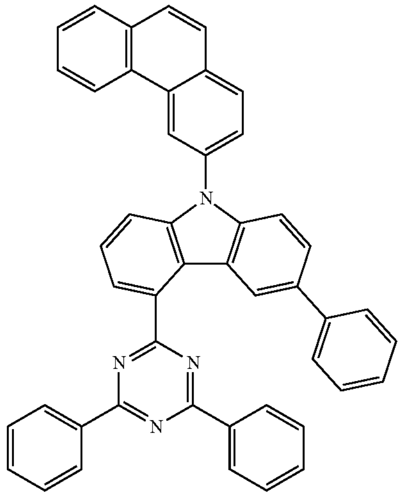
EH3-49
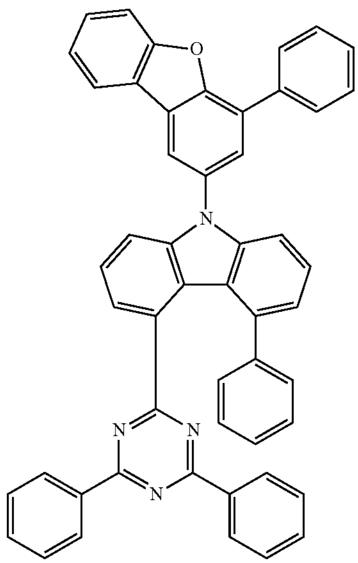
EH3-50
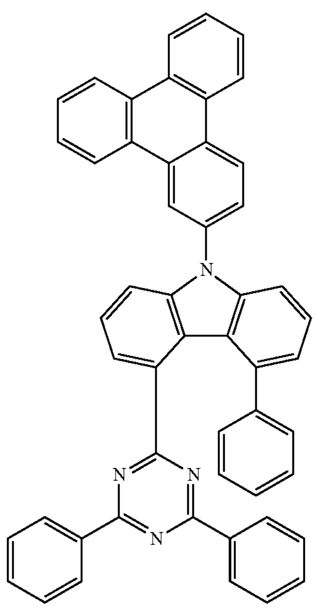
-continued
EH3-51
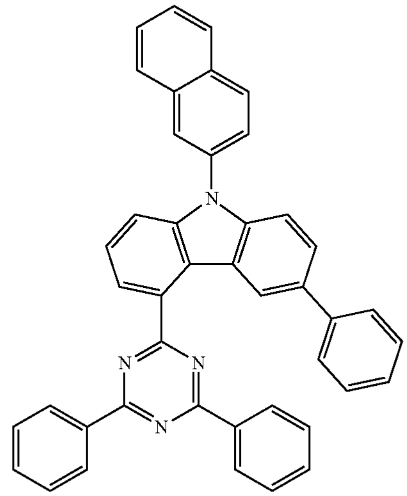
EH3-52
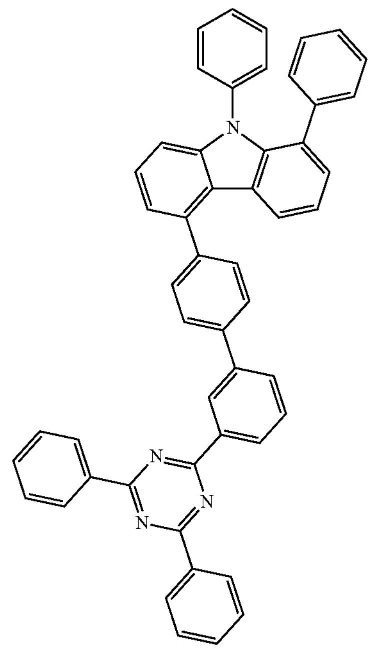
EH3-53
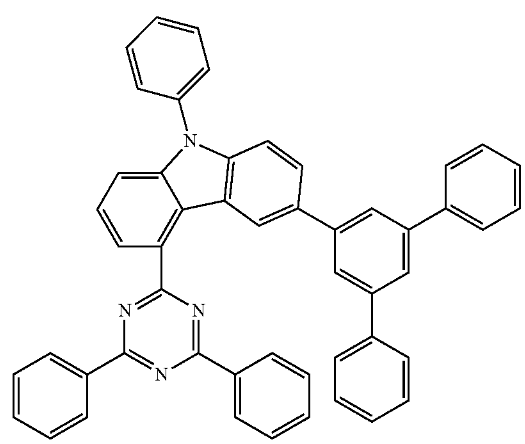

-continued
EH3-54
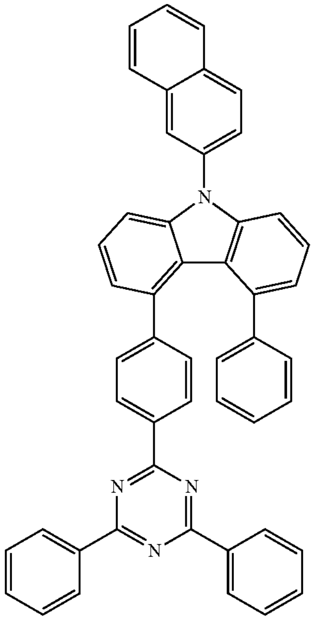
EH3-55
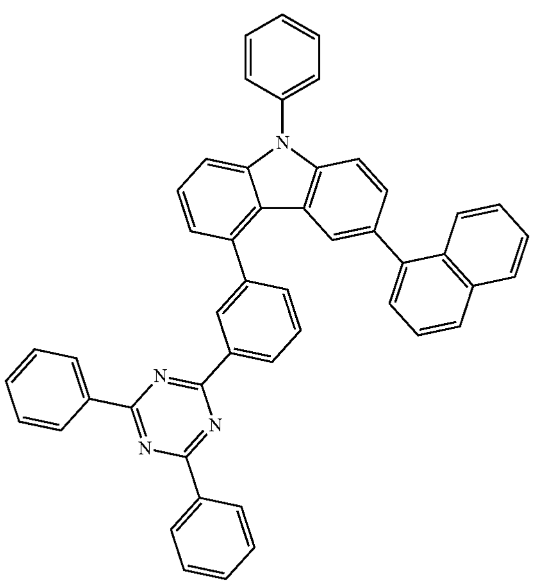
-continued
EH3-56
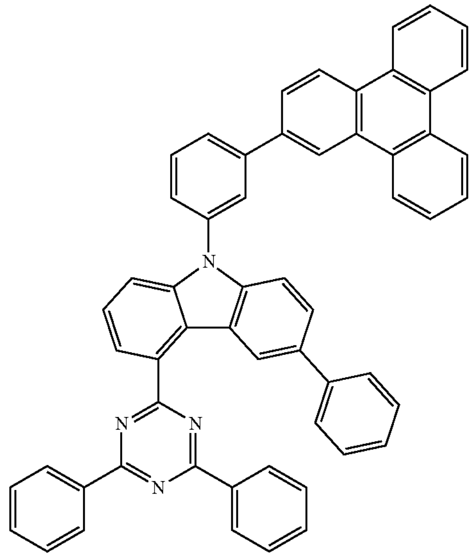
EH3-57
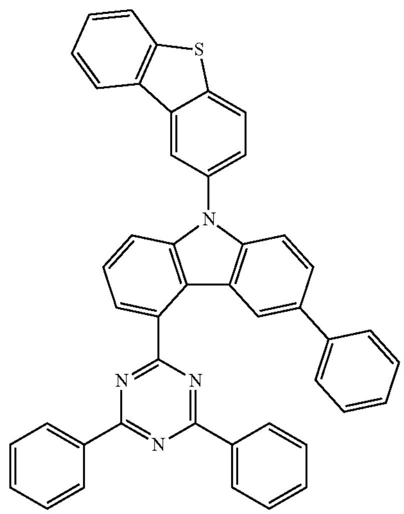
EH3-58
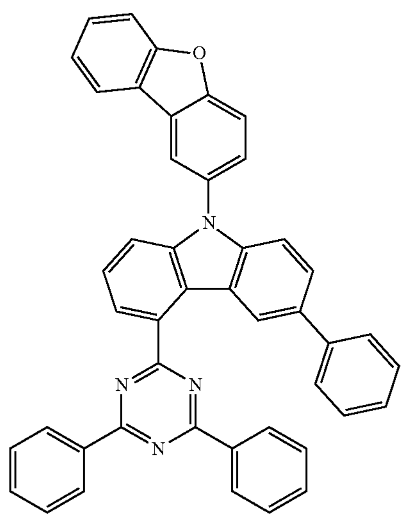

EH3-59
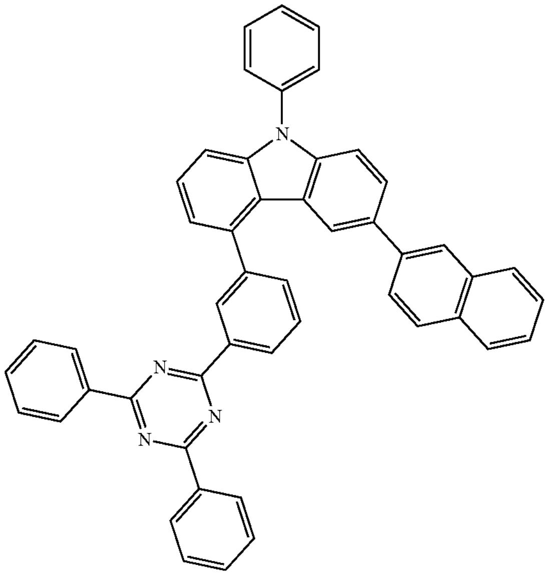
EH3-60
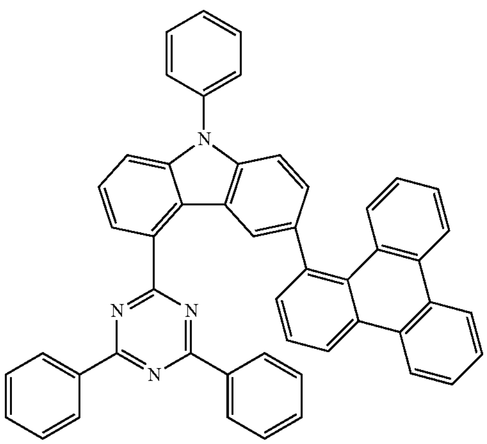
EH3-61
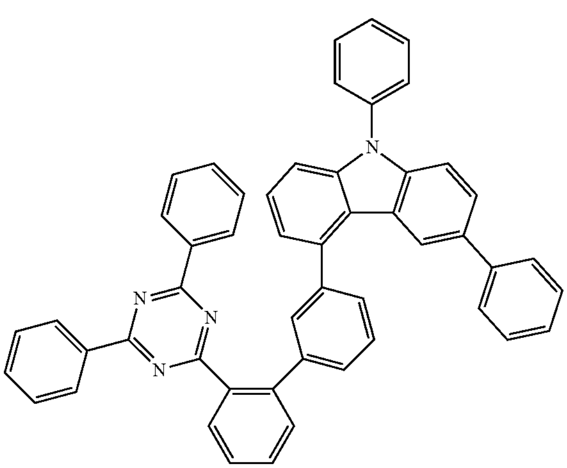
EH3-62
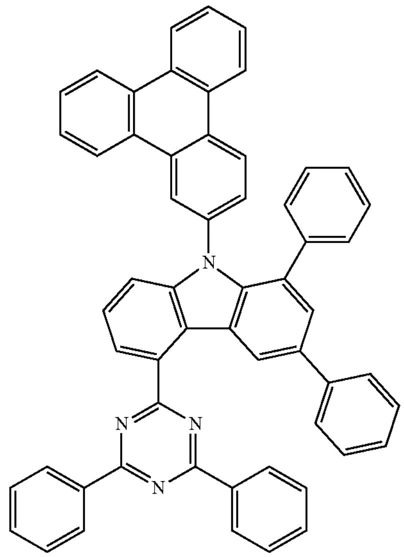
EH3-63
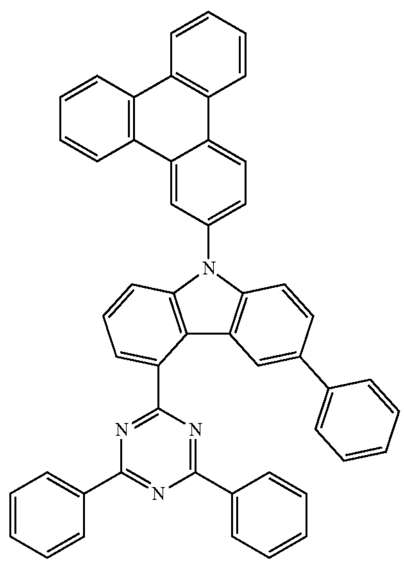
EH3-64
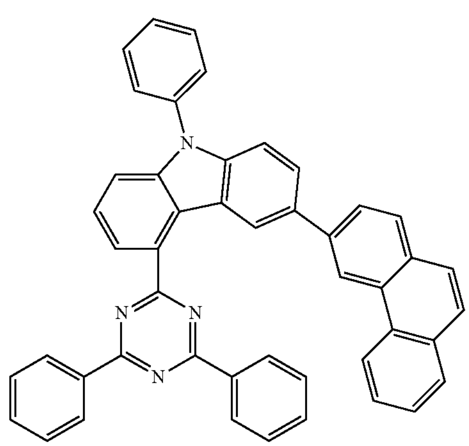

-continued
EH3-65
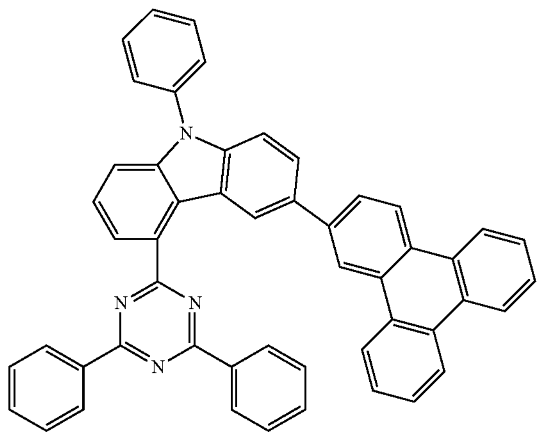
EH3-66
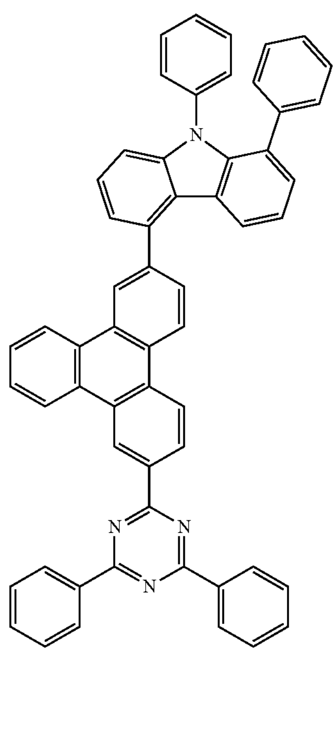
-continued
EH3-67
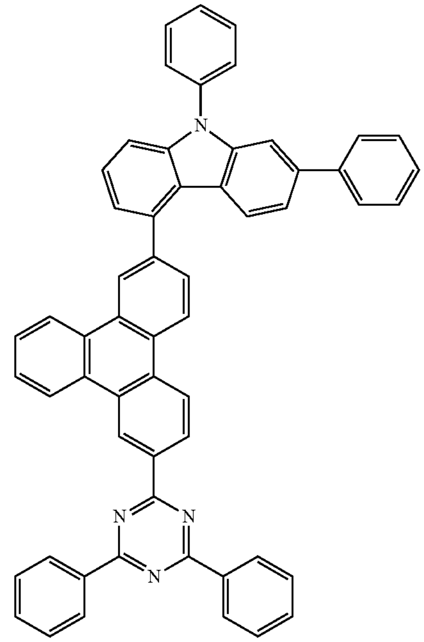
EH3-68
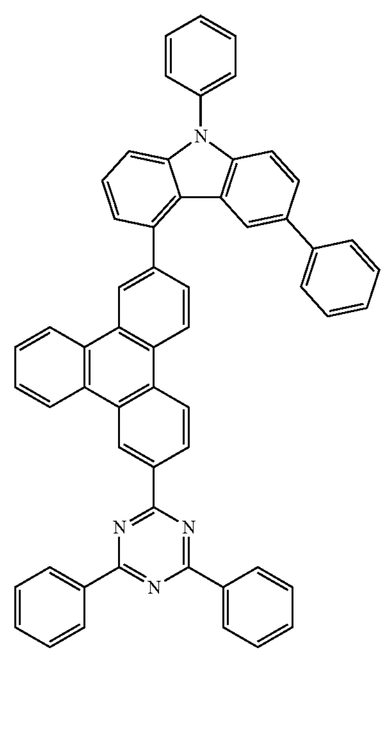

-continued
EH3-69
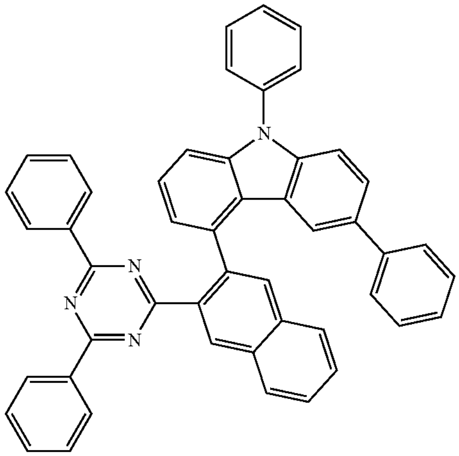
EH3-70
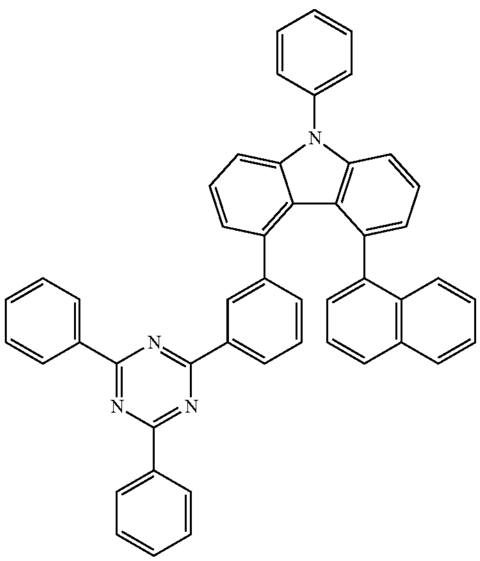
EH3-71
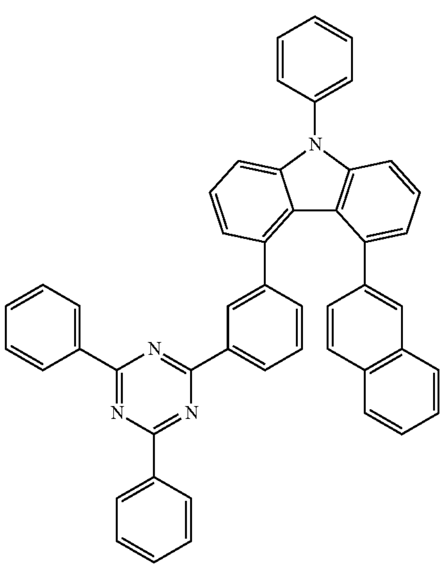
-continued
EH3-72
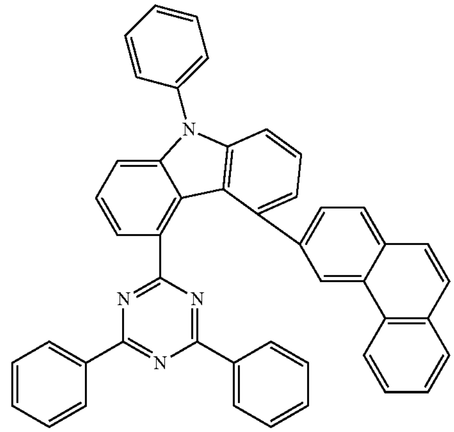
EH3-73
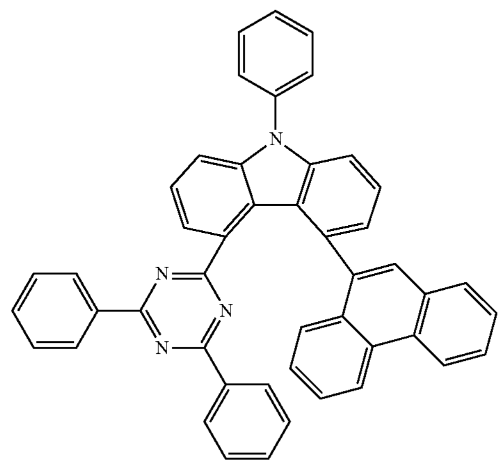
EH3-74
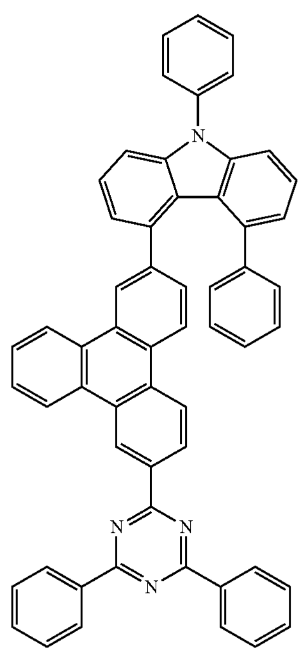

-continued
EH3-75
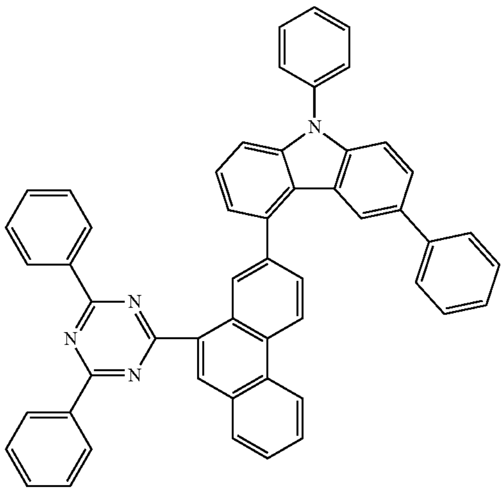
EH3-76
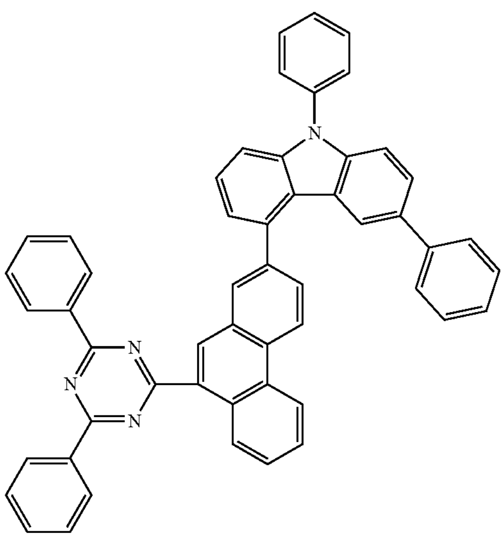
EH3-77
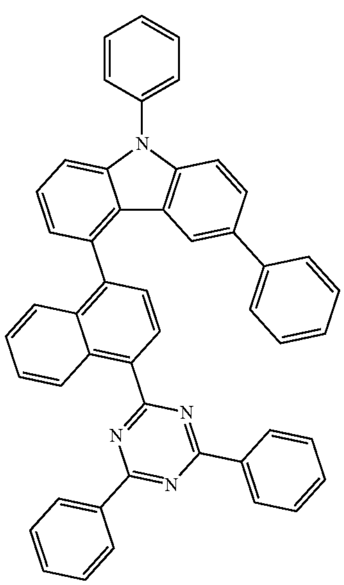
-continued
EH3-78
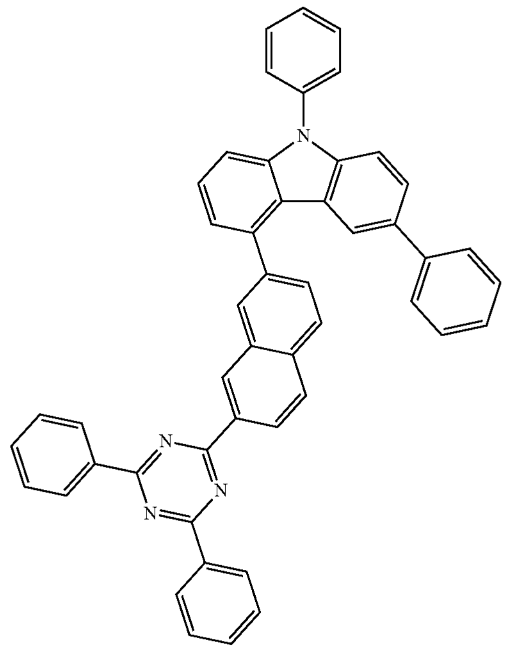
EH3-79
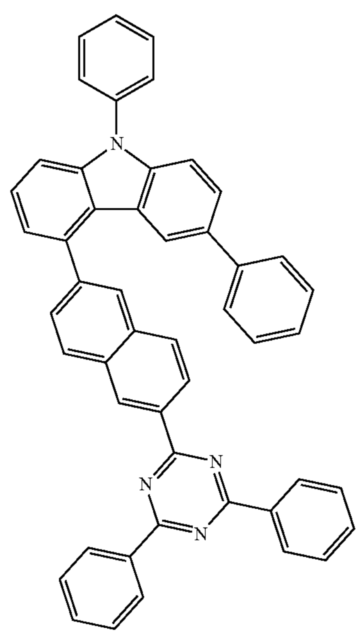

-continued
EH3-80
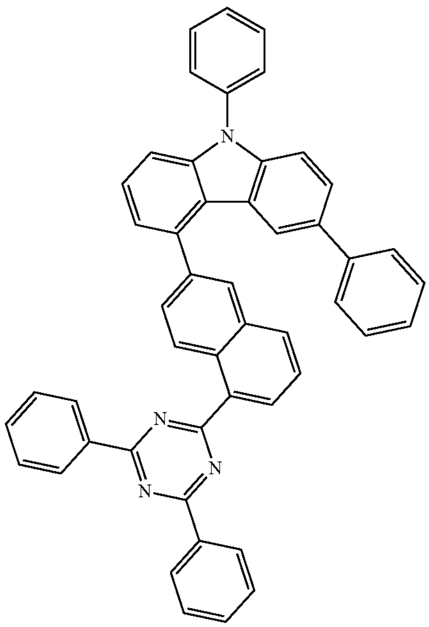
EH3-81
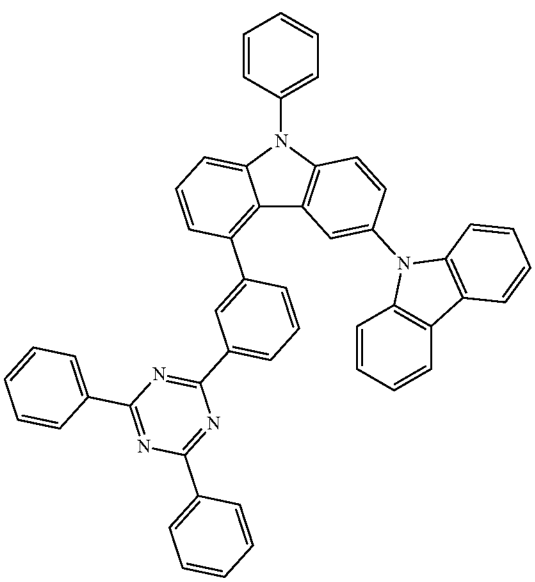
EH3-82
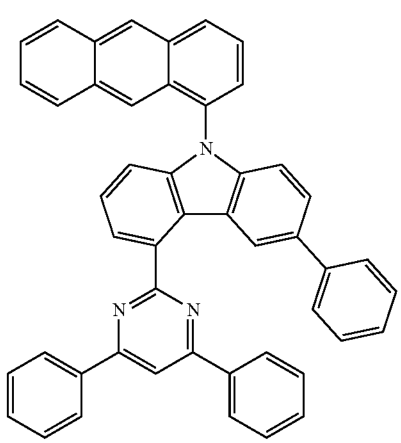
-continued
EH3-83
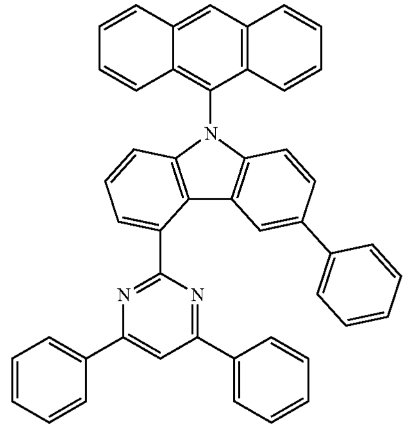
EH3-84
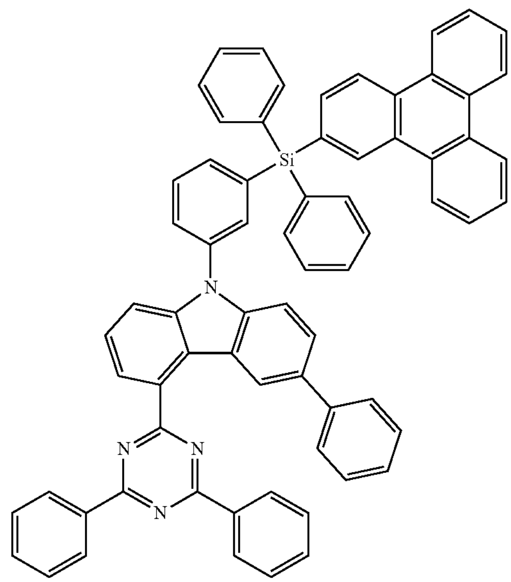
EH3-85
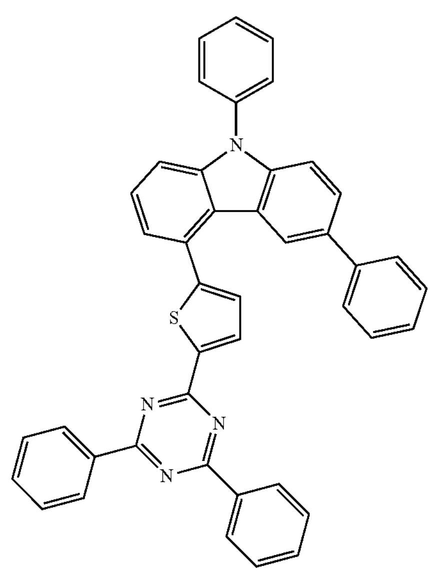

-continued
EH3-86
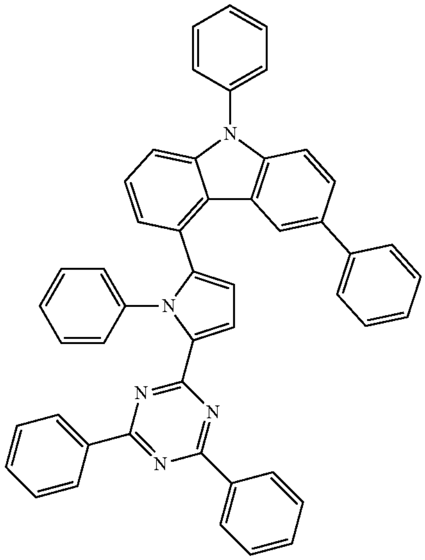
EH3-88
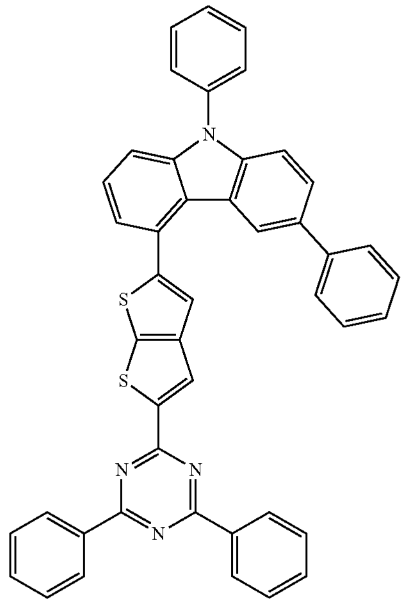
EH3-87
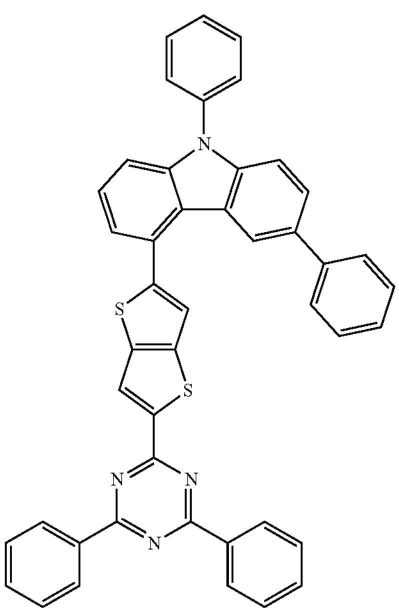
EH3-89
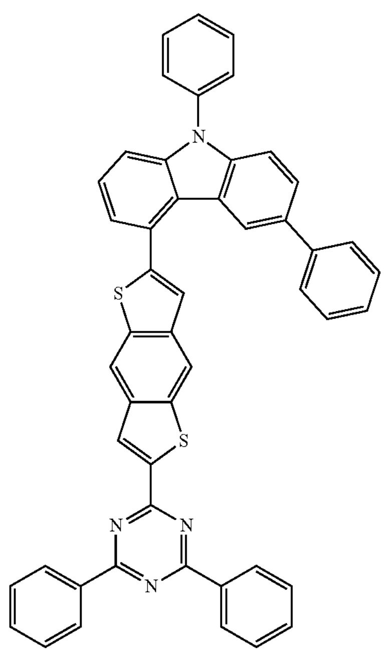

-continued
EH3-90
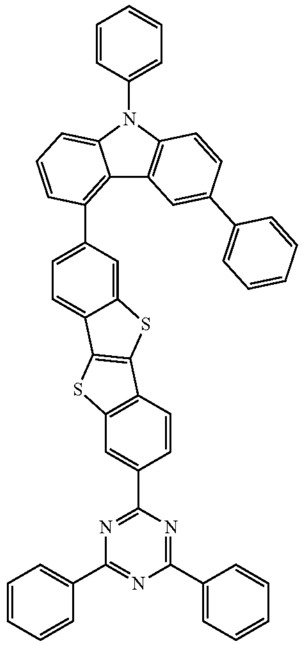
EH3-91
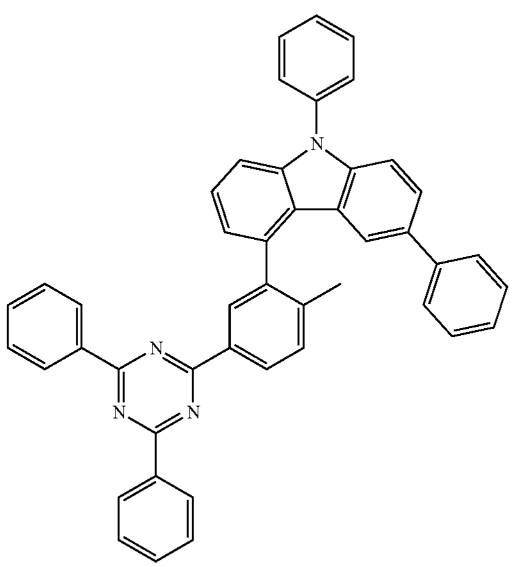
-continued
EH3-92
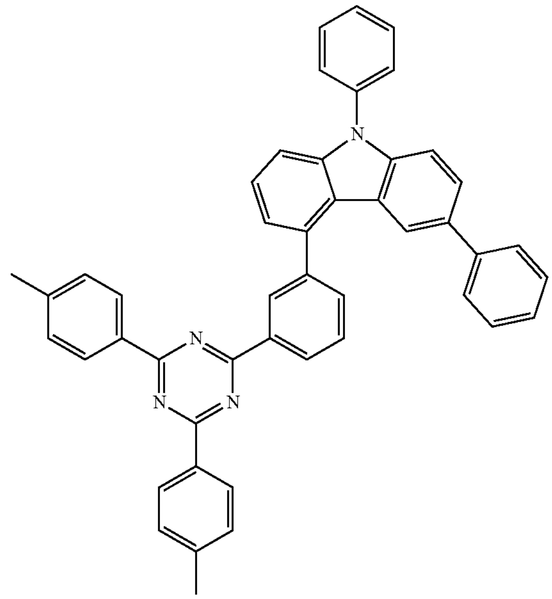
EH3-93
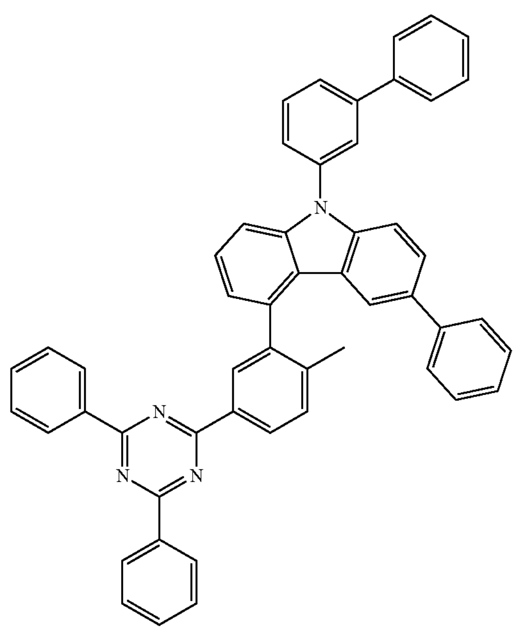

-continued
EH3-94
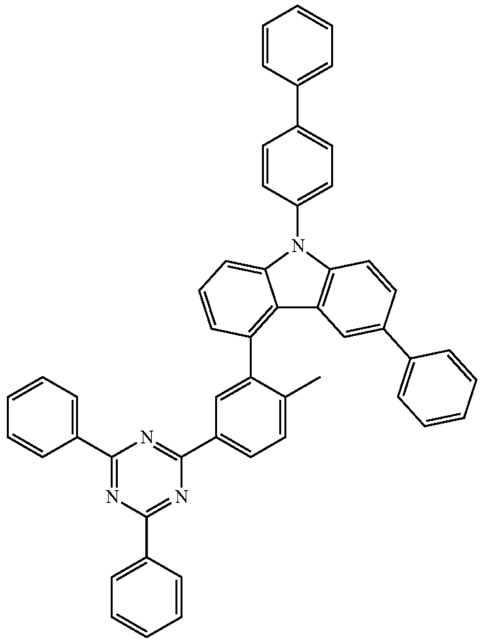
EH3-95
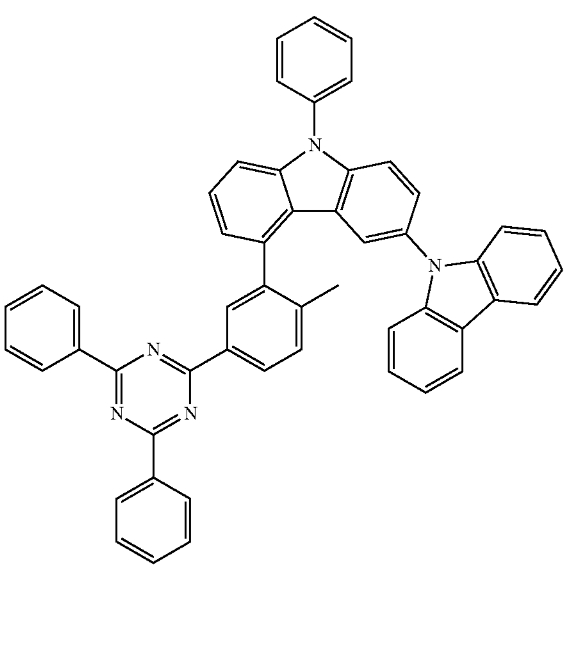
-continued
EH3-96
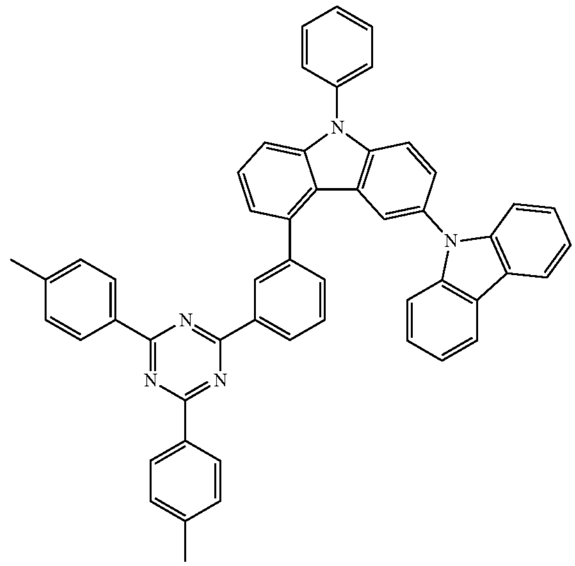
EH3-97
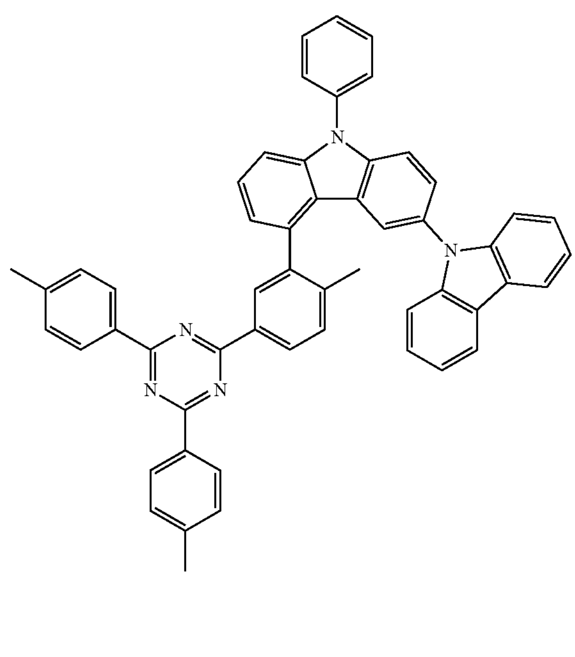

-continued
EH3-98
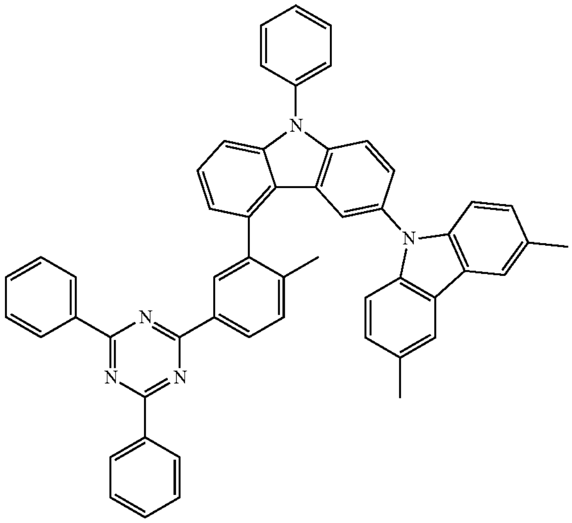
EH3-99
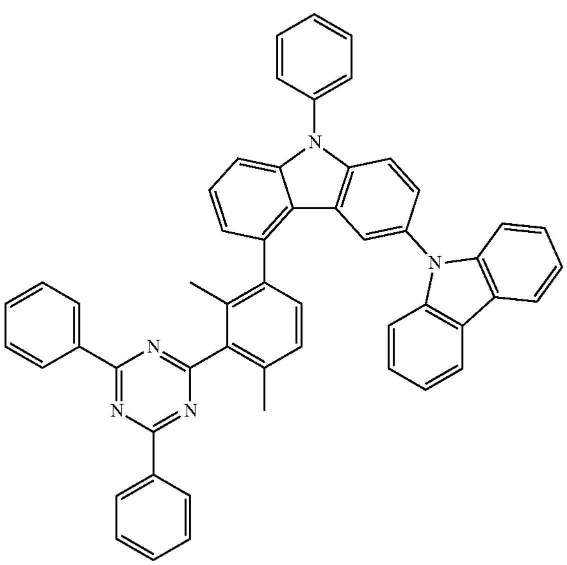
-continued
EH3-100
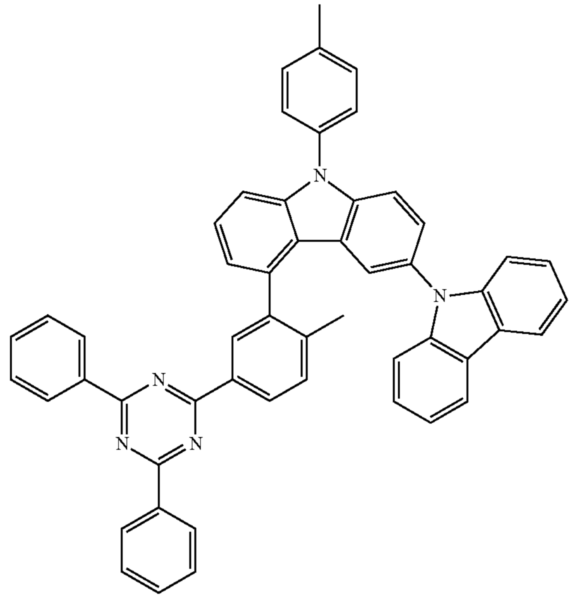
EH3-101
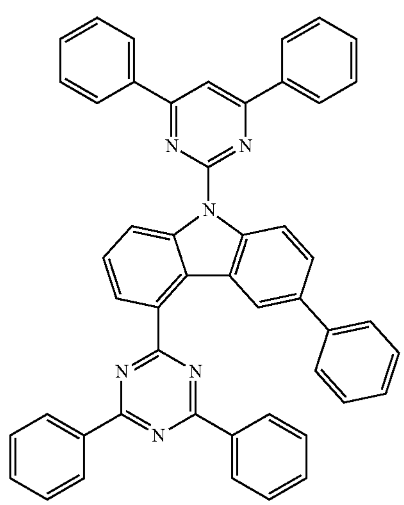

-continued

EH3-102

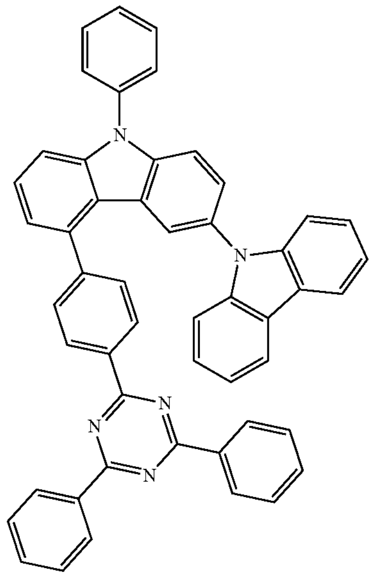

Meanwhile, the hole-transporting host included in the emission layer 15 of the organic light-emitting device 10 may include a compound represented by Formula 20 below:

<Formula 20>

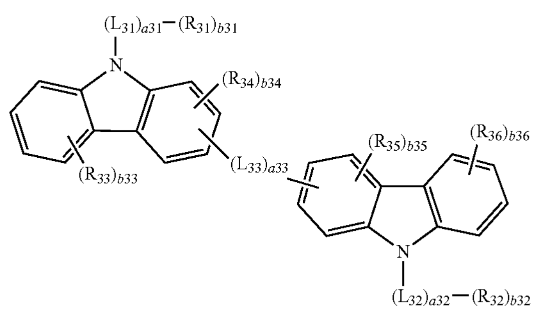

In Formula 20, each of $L_{31}$ to $L_{33}$ may be independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, and a substituted or unsubstituted divalent non-aromatic condensed polycyclic group; each of a31 to a33 may be independently an integer of 0 to 5; each of $R_{31}$ and $R_{32}$ may be independently selected from a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, and a substituted or unsubstituted monovalent non-aromatic condensed polycyclic group; each of $R_{33}$ to $R_{36}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, and a substituted or unsubstituted monovalent non-aromatic condensed polycyclic group; each of b31 to b36 may be independently an integer of 1 to 3; and at least one of substituents of the substituted $C_3$-$C_{10}$ cycloalkylene group, the substituted $C_3$-$C_{10}$ cycloalkenylene group, the substituted $C_6$-$C_{60}$ arylene group, the substituted divalent non-aromatic condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ cycloalkenyl group, the substituted $C_6$-$C_{60}$ aryl group, and the substituted monovalent non-aromatic condensed polycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group.

In Formula 20, each of $L_{31}$ to $L_{33}$ may be independently selected from a phenylene group, a naphthylene group, a fluorenylene group, a spiro-fluorenylene group, a phenalenylene group, a phenanthrenylene group, an anthracenylene group, a fluoranthrenylene group, a triphenylenylene group, a pyrenylene group, and a chrysenylene group; and a phenylene group, a naphthylene group, a fluorenylene group, a spiro-fluorenylene group, a phenalenylene group, a phenanthrenylene group, an anthracenylene group, a fluoranthrenylene group, a triphenylenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a phenyl group substituted with a phenyl group (i.e., a biphenyl group), a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group; each of a31 to a33 may be independently one of 0, 1, and 2; each of $R_{31}$ and $R_{32}$ may be independently selected from a phenyl group, a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group; and a phenyl group, a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group substituted with a phenyl group (i.e., a biphenyl group), a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group; each of $R_{33}$ to $R_{36}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group; and each of b31 to b36 may be independently one of 1 and 2, but b31 to b36 are not limited thereto.

In example embodiments, in Formula 20, each of $L_{31}$ and $L_{32}$ may be independently selected from a phenylene group and a naphthylene group; and a phenylene group and a naphthylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a phenyl group substituted with a phenyl group (i.e., a biphenyl group), and a naphthyl group; each of a31 and a32 may be independently one of 0, 1, and 2, and a33 may be 0; each of $R_{31}$ and $R_{32}$ may be independently selected from a phenyl group and a naphthyl group; and a phenyl group and a naphthyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a phenyl group substituted with a phenyl group (i.e., a biphenyl group), and a naphthyl group; each of $R_{33}$ to $R_{36}$ may be independently hydrogen; and each of b31 to b36 may be independently 1, but b31 to b36 are not limited thereto.

For example, the hole-transporting host included in the emission layer 15 of the organic light-emitting device 10 may include a compound represented by one of Formulae 20-1 to 20-7 below, but the hole-transporting host is not limited thereto:

<Formula 20-1>

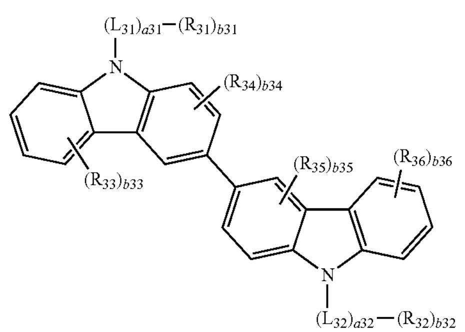

<Formula 20-2>

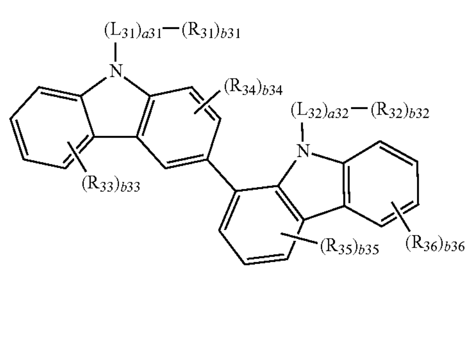

-continued

<Formula 20-3>

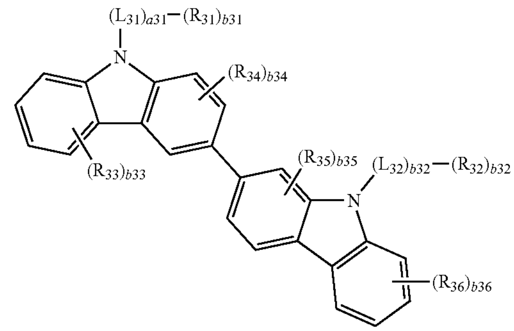

<Formula 20-4>

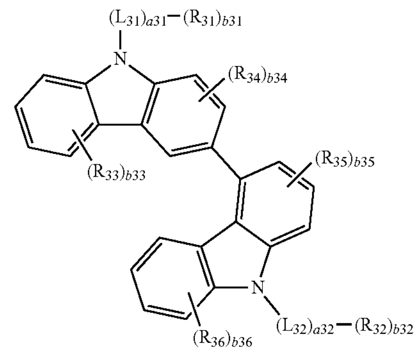

<Formula 20-5>

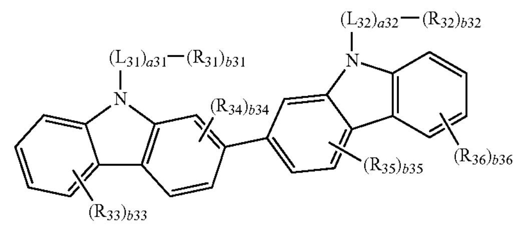

<Formula 20-6>

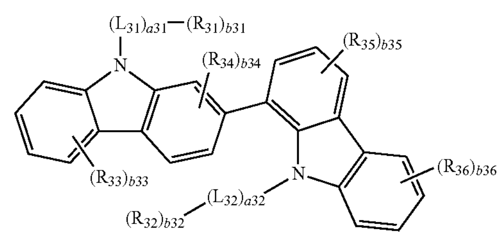

<Formula 20-7>

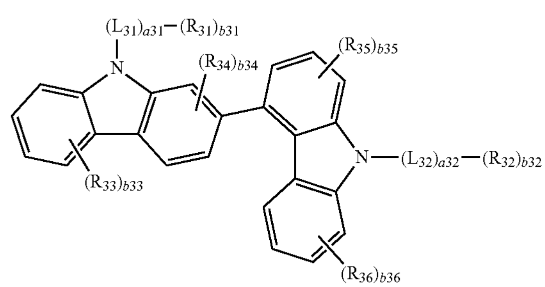

In Formulae 20-1 to 20-7, descriptions of $L_{31}$, $L_{32}$, a31, a32, $R_{31}$ to $R_{36}$, and b31 to b36 may be understood by referring to the description provided in the present specification.

In example embodiments, the hole-transporting host included in the emission layer 15 of the organic light-emitting device may include at least one of Compounds HH1-2 to HH1-51 below, but the hole-transporting host is not limited thereto:
HH1-2
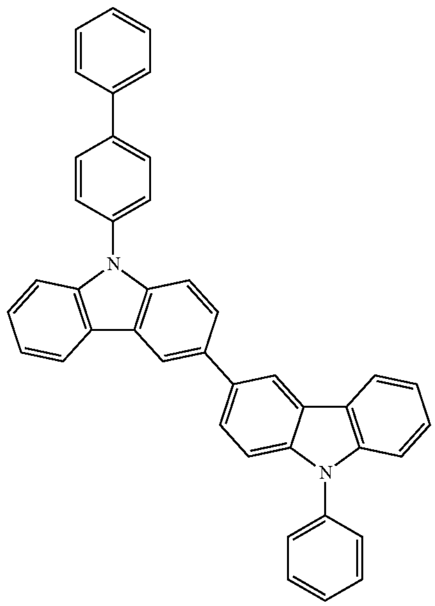
HH1-3
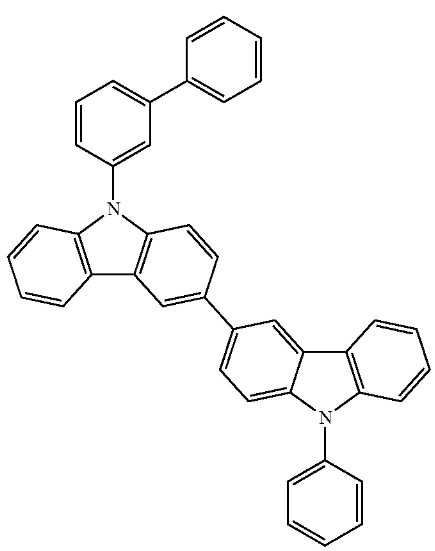
-continued
HH1-4
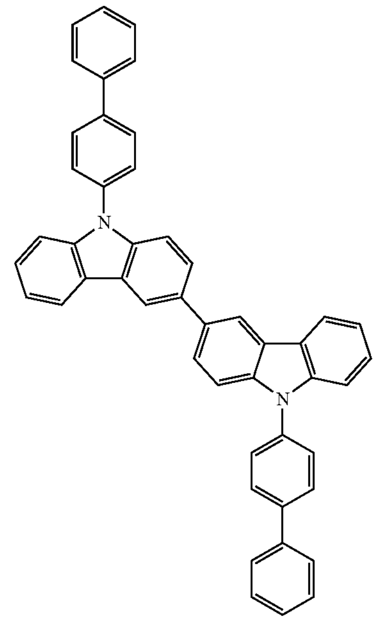
HH1-5
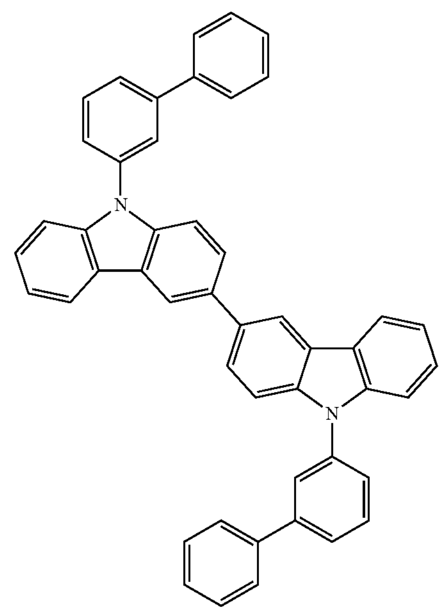
HH1-6
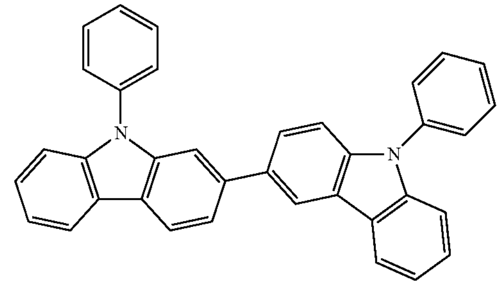

-continued
HH1-7
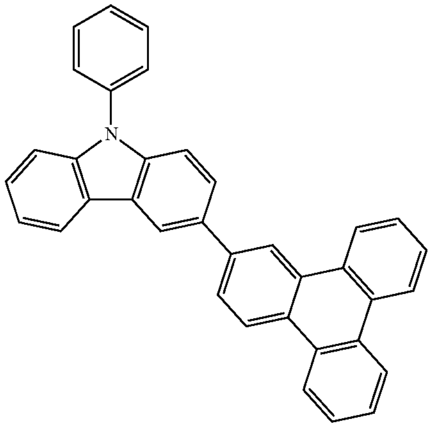
HH1-8
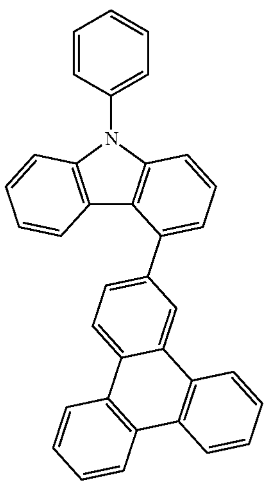
HH1-9
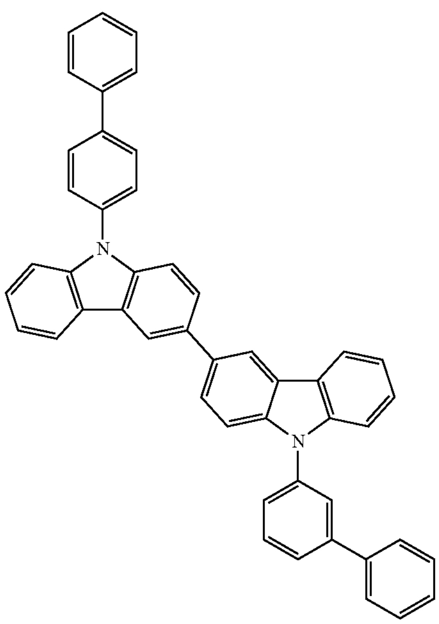
-continued
HH1-10
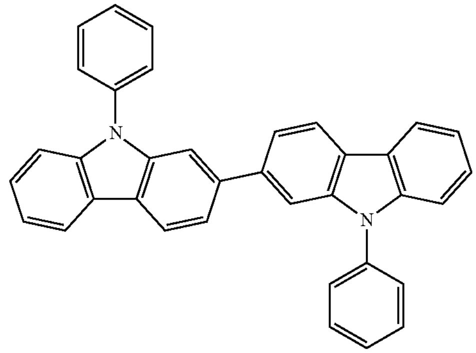
HH1-11
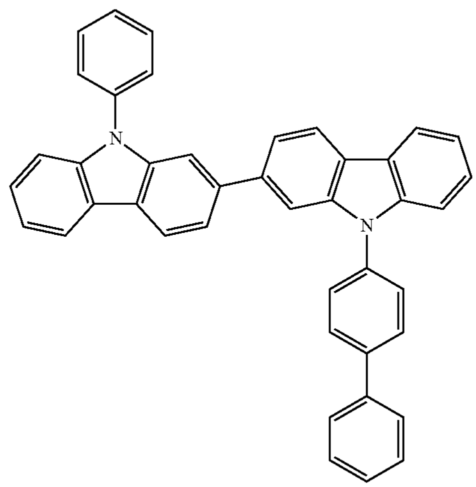
HH1-12
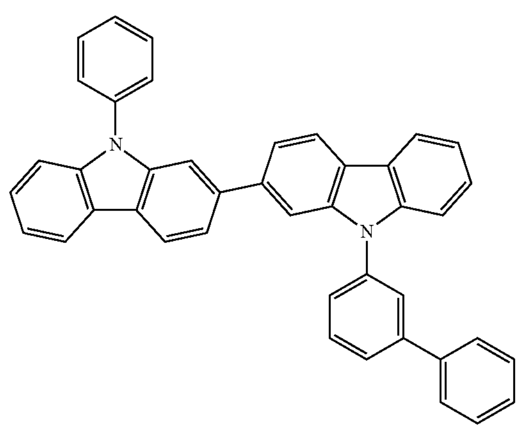

-continued
HH1-13
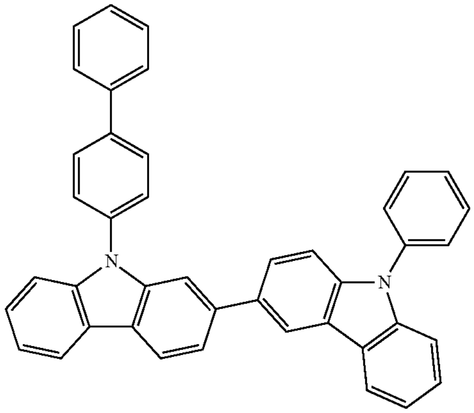
HH1-14
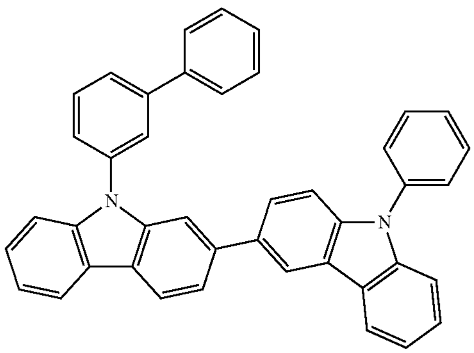
HH1-15
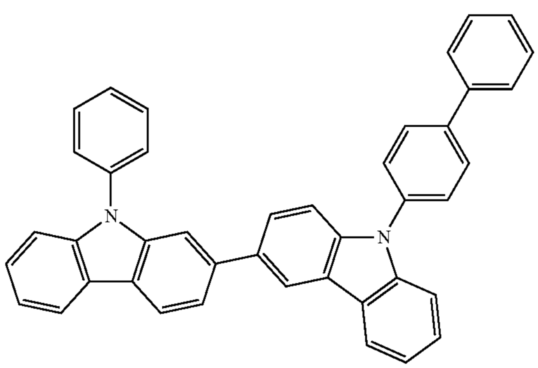
HH1-16
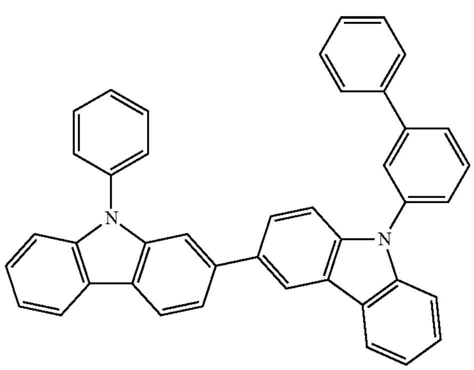
-continued
HH1-17
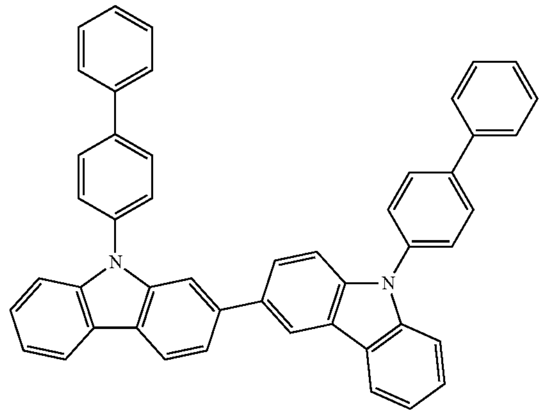
HH1-18
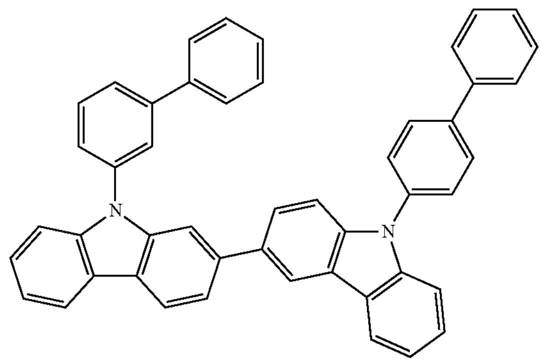
HH1-19
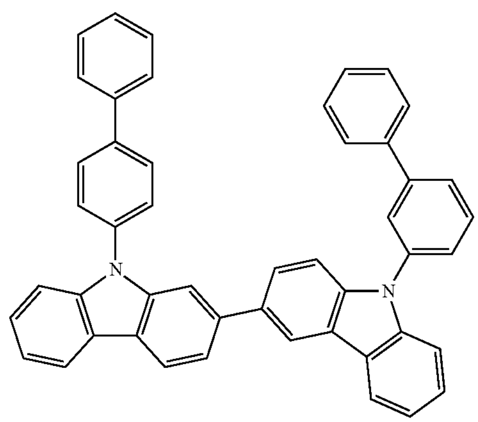
HH1-20
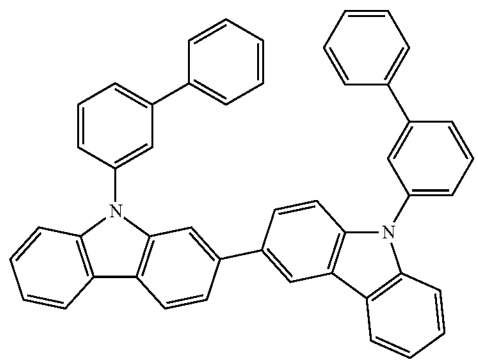

HH1-21
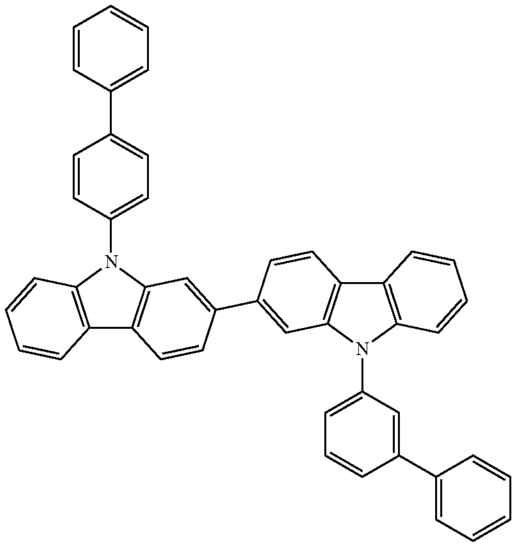
HH1-22
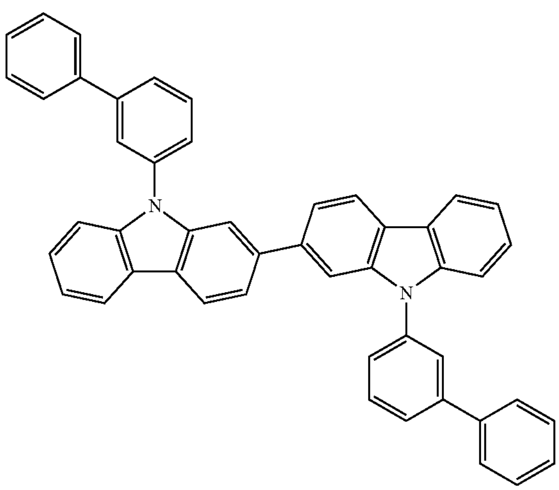
HH1-23
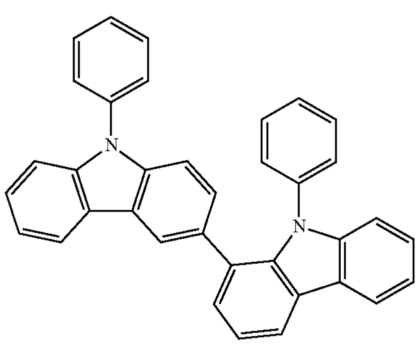
HH1-24
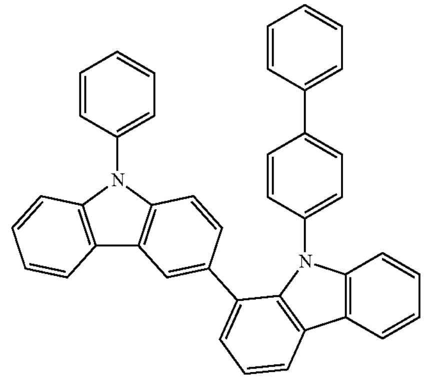
HH1-25
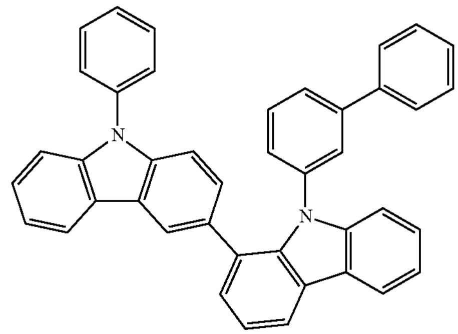
HH1-26
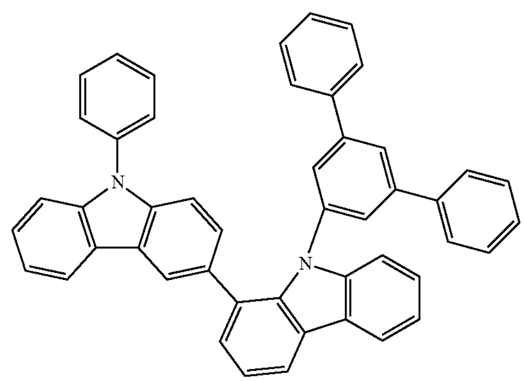
HH1-27
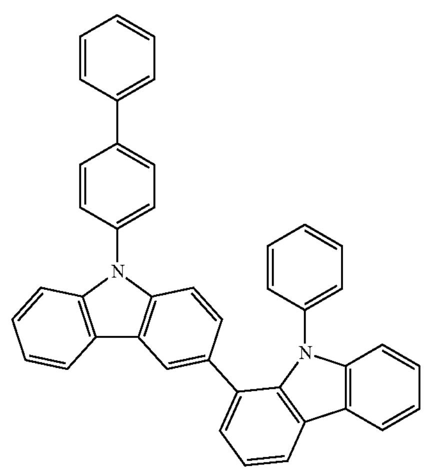

-continued
HH1-28
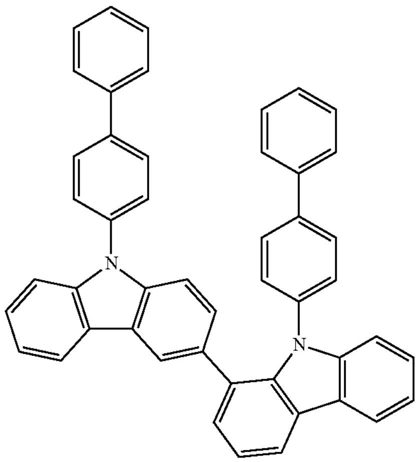
HH1-29
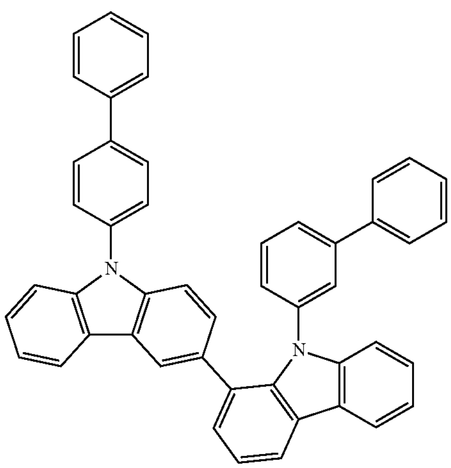
HH1-30
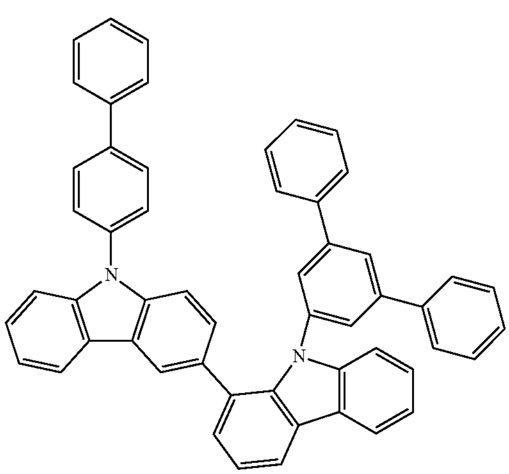
-continued
HH1-31
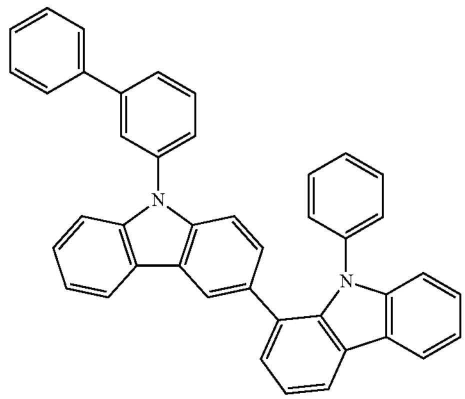
HH1-32
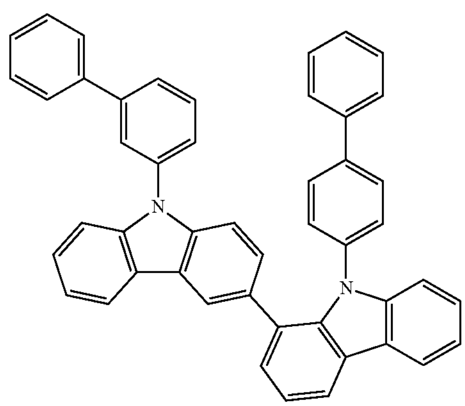
HH1-33
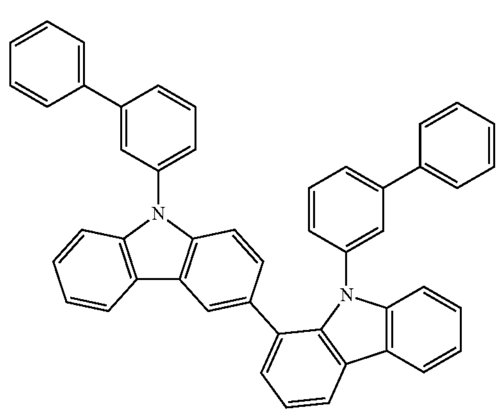

-continued
HH1-34
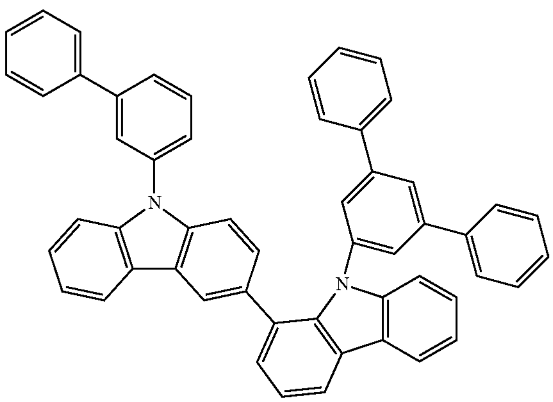
HH1-35
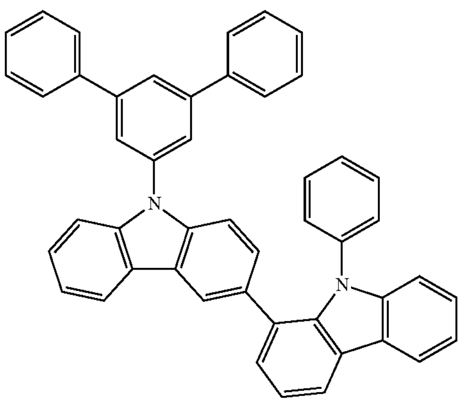
HH1-36
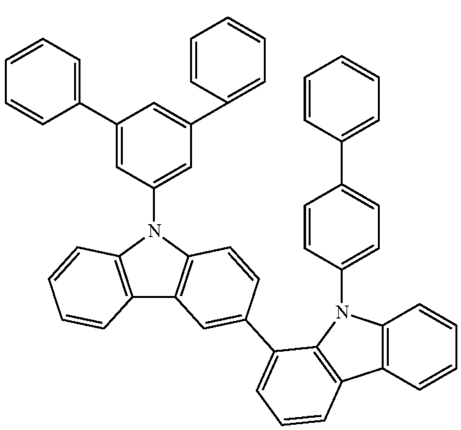
-continued
HH1-37
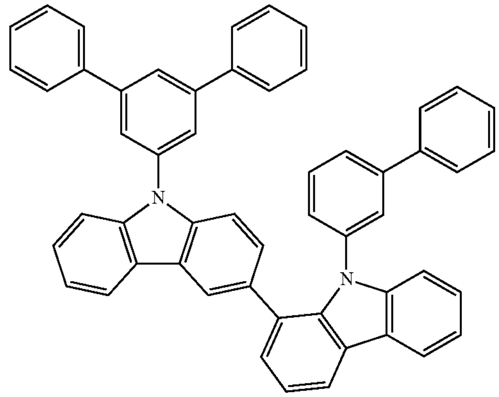
HH1-38
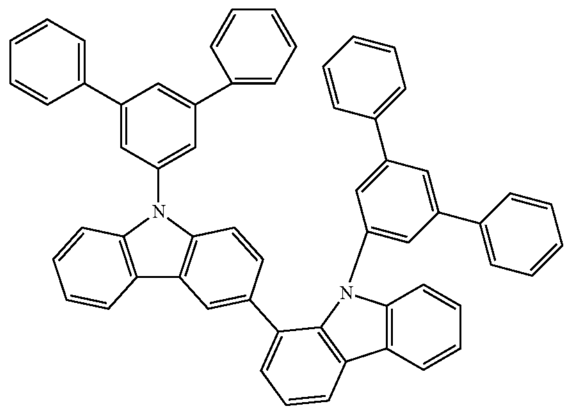
HH1-39
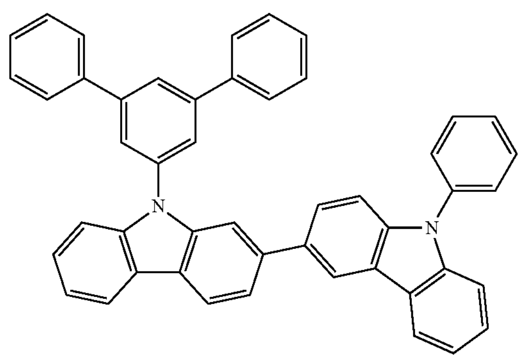
HH1-40
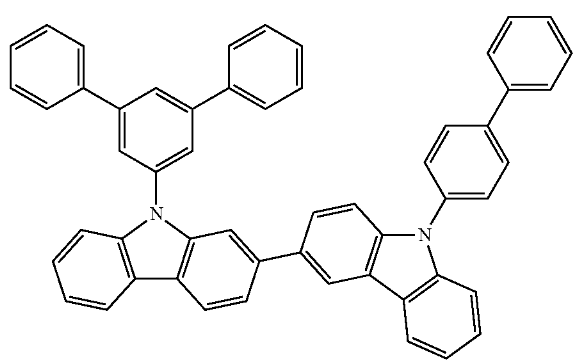

-continued
HH1-41
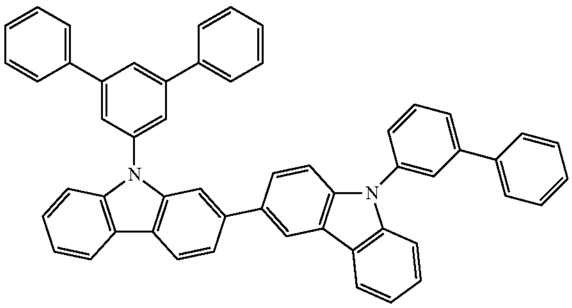
HH1-42
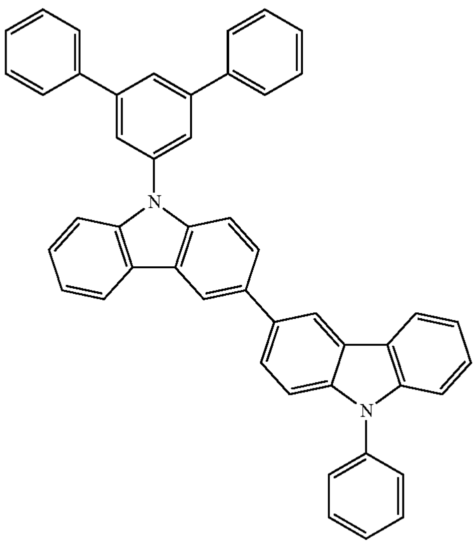
HH1-43
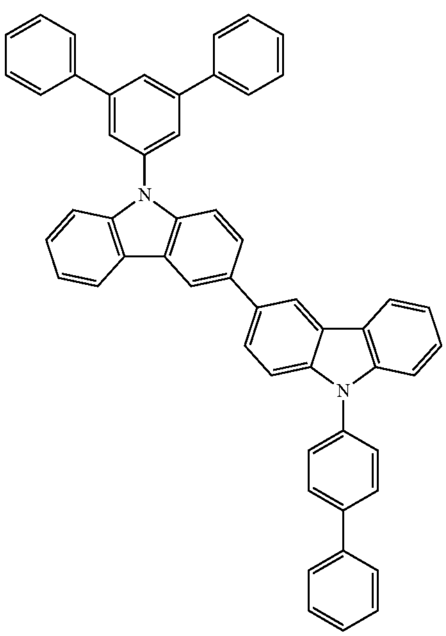
-continued
HH1-44
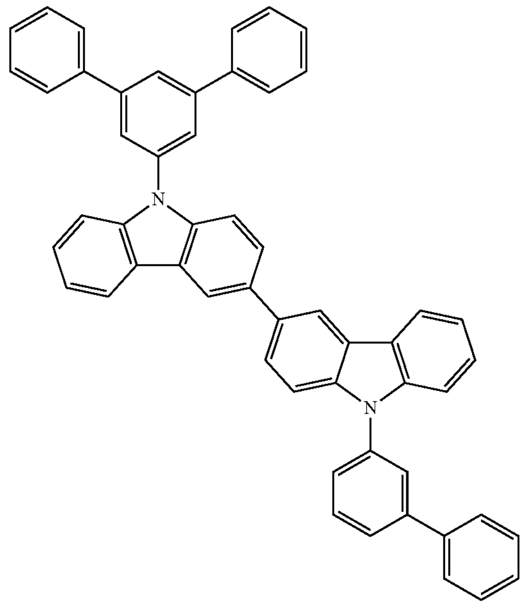
HH1-45
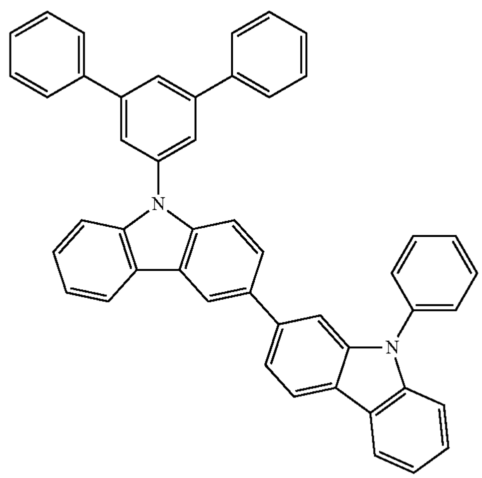
HH1-46
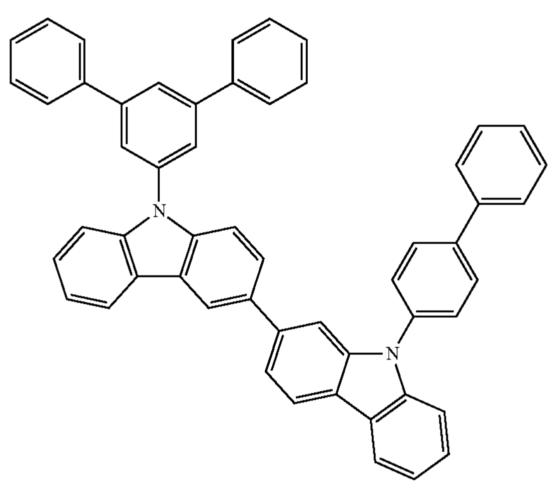

-continued
HH1-47
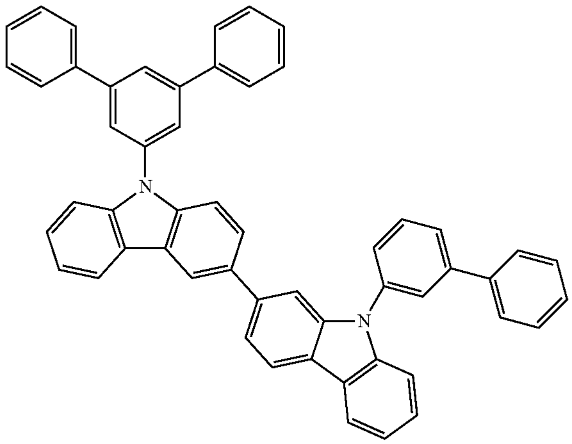
HH1-48
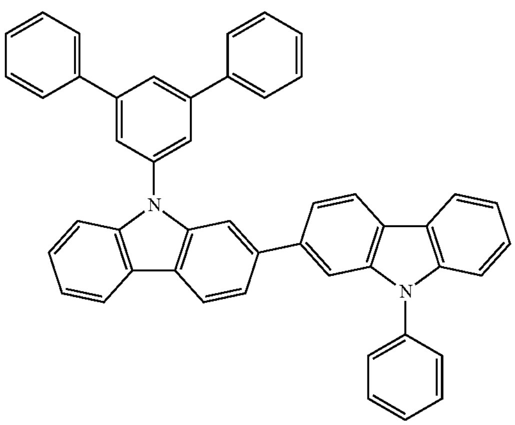
HH1-49
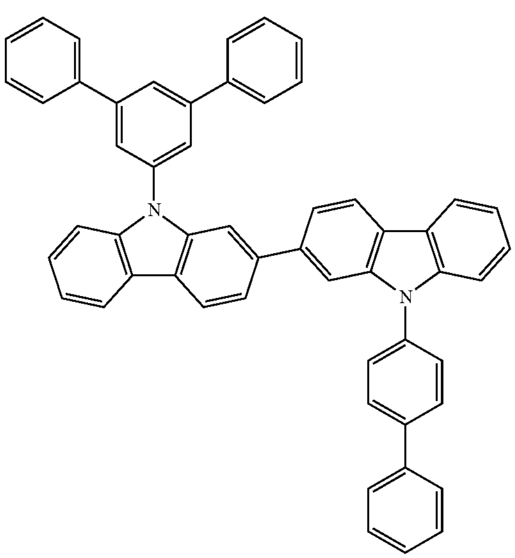
-continued
HH1-50
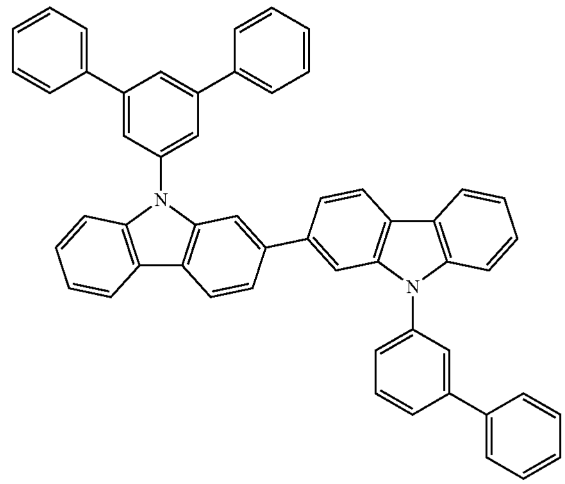
HH1-51
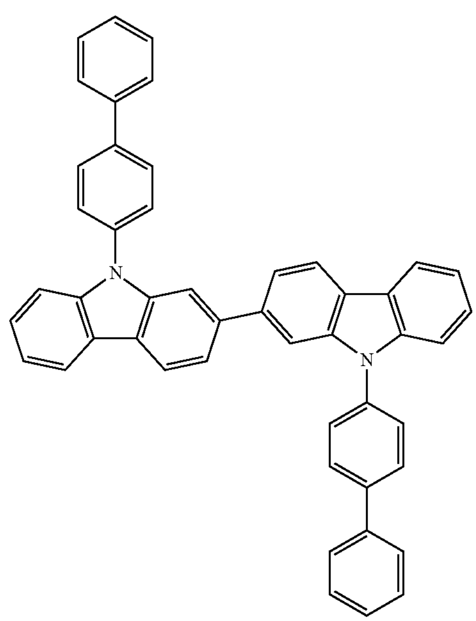

Here, the hole-transporting host may not include Compound HH-1-1 below:

HH1-1

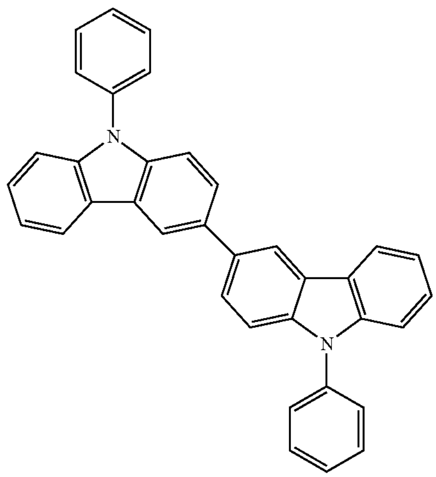

A weight ratio of the electron-transporting host to the hole-transporting host included in the emission layer 15 may be about 1:9 to about 9:1, e.g., about 3:7 to about 7:3. For example, but not limited to, a weight ratio of the electron-transporting host to the hole-transporting host included in the emission layer 15 may be about 4:6 to about 6:4. When the weight ratio of the electron-transporting host to the hole-transporting host is within these ranges, the formation of the exciplex made by the electron-transporting host and the hole-transporting host included in the emission layer 15 of the organic light-emitting device 10 may be effectively achieved.

In example embodiments, in the emission layer 15 of the organic light-emitting device 10, the electron-transporting host is Compound EH1-401, the hole-transporting host comprises a compound satisfying −0.1≤Type (Compound EH1-401)≤0.6 (e.g., 0.1≤Type (Compound EH1-401)≤0.3), wherein a volume ratio of the electron-transporting host to the hole-transporting host may be selected from a range of −0.1≤Type (Compound EH1-401)≤0.6 (e.g., 0.1≤Type (Compound EH1-401)≤0.3), and Type (Compound EH1-401) is defined by Equation 10 below:

$$\text{Type(Compound } EH1\text{-401)} = \log(J_{HOD}(\text{at 11.5 V})/J_{EOD}(\text{at 4 V}))$$ <Equation 10>

In Equation 10, $J_{HOD}$ (at 11.5 V) refers to a current density value (mA/cm$^2$) at a voltage of 11.5 V of a hole-only device having a structure of ITO (1,500 Å)/Compound HT3:TCNPQ (3 wt %) (100 Å)/Compound HT3 (1,000 Å)/host: Compound PD79 (10 wt %) (600 Å)/Compound ET1 (100 Å)/Al (100 Å) (wherein the host consists of Compound EH1-401 and the hole-transporting host), and $J_{EOD}$ (at 4 V) refers to a current density value (mA/cm$^2$) at a voltage of 4 V of an electron-only device having a structure of ITO (1,500 Å)/Mg:Ag (10 wt %) (300 Å)/Liq (10 Å)/Compound ET16:Liq (50 wt %) (200 Å)/host:Compound PD79 (10 wt %) (600 Å)/Compound ET16:Liq (50 wt %) (200 Å)/Liq (10 Å)/Mg:Ag (10 wt %) (300 Å) (wherein the host consists of Compound EH1-401 and the hole-transporting host).

HT3

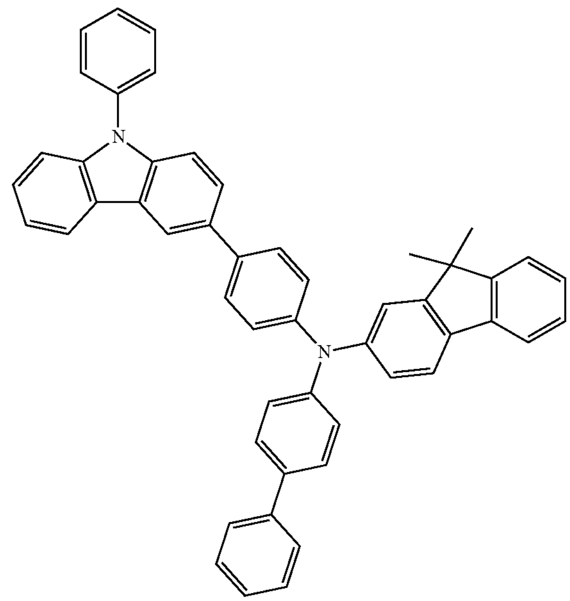

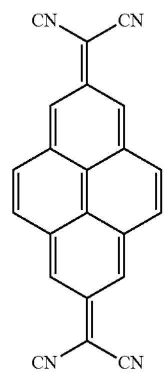

TCNPQ

EH1-401

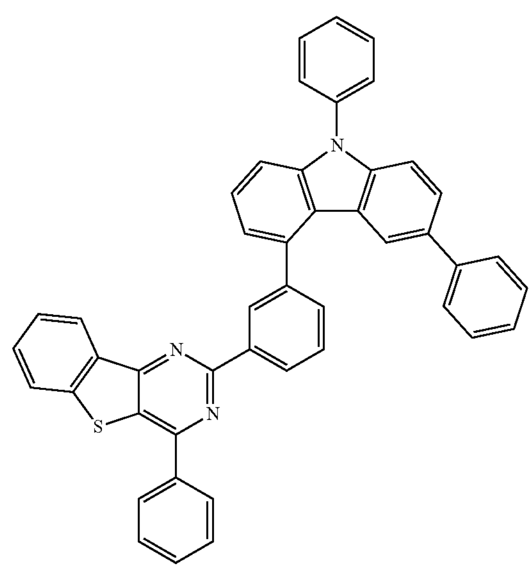

-continued

PD79

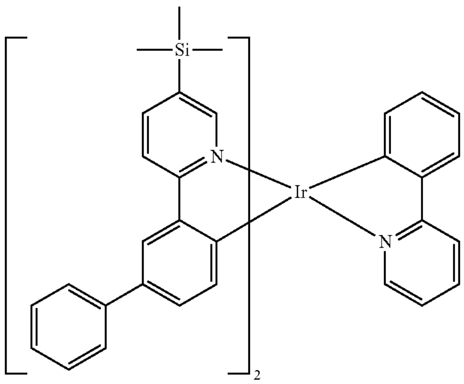

ET1

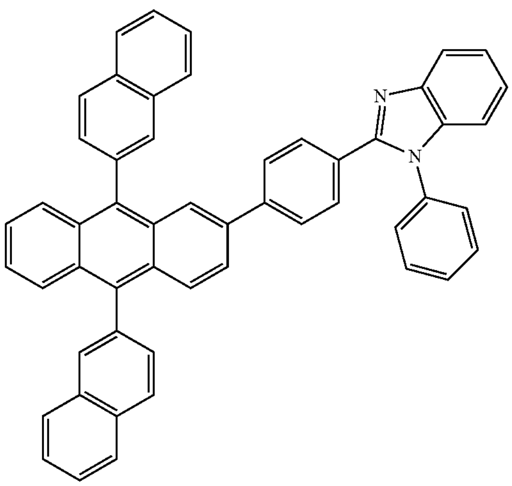

ET16

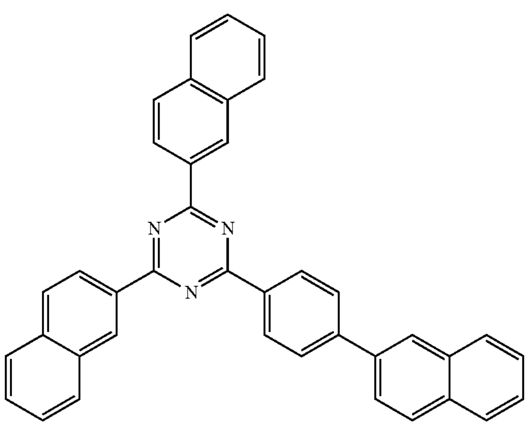

In example embodiments, in the emission layer 15 of the organic light-emitting device 10, the electron-transporting host is Compound EH3-81, the hole-transporting host comprises a compound satisfying 0.1≤Type (Compound EH3-81)≤1.2 (e.g., 0.23≤Type (Compound EH3-81)≤1.15), wherein a volume ratio of the electron-transporting host to the hole-transporting host may be selected from a range of 0.1≤Type (Compound EH3-81)≤1.2 (e.g., 0.23≤Type (Compound EH3-81)≤1.15), and Type (Compound EH3-81) is defined by Equation 11 below:

$$\text{Type(Compound } EH3\text{-81)} = \log(J_{HOD}(\text{at } 11.5\text{ V})/J_{EOD}(\text{at } 4\text{ V})) \quad \text{<Equation 11>}$$

In Equation 11, $J_{HOD}$(at 11.5V) refers to a current density value (mA/cm$^2$) at a voltage of 11.5 V of a hole-only device having a structure of ITO (1,500 Å)/Compound HT3:TC-NPQ (3 wt %) (100 Å)/Compound HT3 (1,000 Å)/host: Compound PD79 (10 wt %) (600 Å)/Compound ET1 (100 Å)/Al (100 Å) (wherein the host consists of Compound EH3-81 and the hole-transporting host), and $J_{EOD}$ (at 4 V) refers to a current density value (mA/cm$^2$) at a voltage of 4 V of an electron-only device having a structure of ITO (1,500 Å)/Mg:Ag (10 wt %) (300 Å)/Liq (10 Å)/Compound ET16:Liq (50 wt %) (200 Å)/host:Compound PD79 (10 wt %) (600 Å)/Compound ET16:Liq (50 wt %) (200 Å)/Liq (10 Å)/Mg:Ag (10 wt %) (300 Å) (wherein the host consists of Compound EH3-81 and the hole-transporting host).

EH3-81

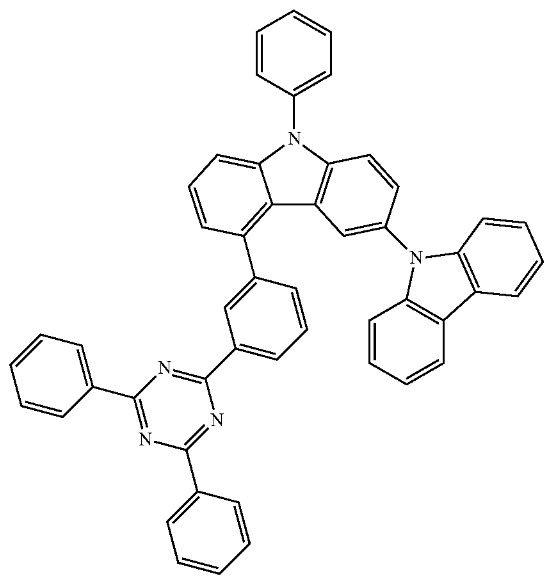

In the emission layer 15 of the organic light-emitting device 10, i) when the electron-transporting host is Compound EH1-401 and the hole-transporting host comprises a compound satisfying −0.1≤Type (Compound EH1-401) ≤0.6, or ii) when the electron-transporting host is Compound EH3-81 and the hole-transporting host comprises a compound satisfying 0.1≤Type (Compound EH3-81)≤1.2, and in this regard, the electrons and the holes in the emission layer 15 may be balanced well enough to improve the efficiency of the organic light-emitting device 10.

The emission layer 15 may further include a dopant in addition to the electron-transporting host and the hole-transporting host described above. The dopant may be selected from materials known as a fluorescent dopant and a phosphorescent dopant in the art.

In example embodiments, the dopant may be a phosphorescent dopant.

The phosphorescent dopant may include an organometallic compound represented by Formula 81 below:

<Formula 81>

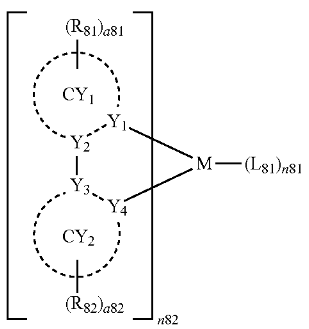

In Formula 81, M may be iridium (Ir), platinum (Pt), osmium (Os), titanium (Ti), zirconium (Zr), hafnium (Hf), europium (Eu), terbium (Tb) or thulium (Tm); each of $Y_1$ to $Y_4$ may be independently one of carbon (C) and nitrogen (N); $Y_1$ 와 $Y_2$ may be linked with each other via a single bond or a double bond, and $Y_3$ and $Y_4$ may be linked with each other via a single bond or a double bond; each of $CY_1$ and $CY_2$ may be independently one of a benzene, a naphthalene, a fluorene, a spiro-fluorene, an indene, a pyrrole, a thiophene, a furan, an imidazole, a pyrazole, a thiazole, an isothiazole, an oxazole, an isoxazole, a pyridine, a pyrazine, a pyrimidine, a pyridazine, a quinoline, an isoquinoline, a benzoquinoline, a quinoxaline, a quinazoline, a carbazole, a benzoimidazole, a benzofuran, a benzothiophene, an isobenzothiophene, a benzoxazole, an isobenzoxazole, a triazole, a tetrazole, an oxadiazole, a triazine, a dibenzofuran, and a dibenzothiophene, wherein $CY_1$ and $CY_2$ may be optionally further linked with each other via an organic linking group; each of $R_{81}$ and $R_{82}$ may be independently one of a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, and $—B(Q_6)(Q_7)$; each of a81 and a82 may be independently an integer of 1 to 5; n81 may be an integer of 0 to 4; n82 may be 1, 2, or 3; and $L_{81}$ may be selected from a monovalent organic ligand, a divalent organic ligand, and a trivalent organic ligand.

Descriptions of $R_{81}$ and $R_{82}$ may be understood by referring to the description provided in connection with $R_1$.

For example, the phosphorescent dopant may include at least one of Compounds PD1 to PD79 below, but the phosphorescent dopant is not limited thereto (wherein Compound PD1 is $Ir(ppy)_3$):

PD1

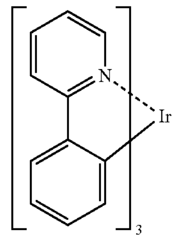

PD2

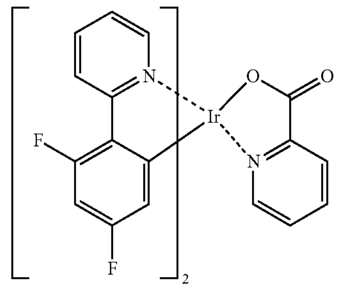

PD3

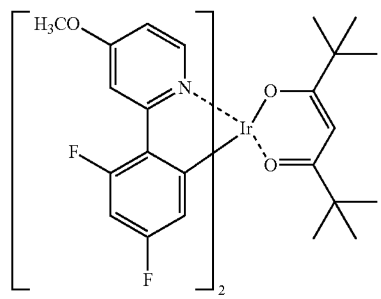

PD4

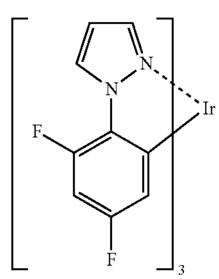

PD5

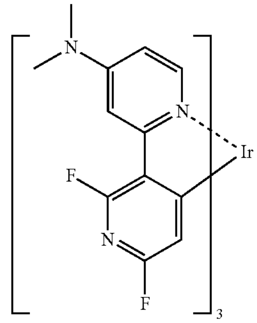

-continued
PD6
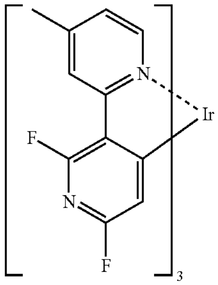
PD7
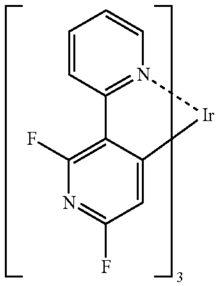
PD8
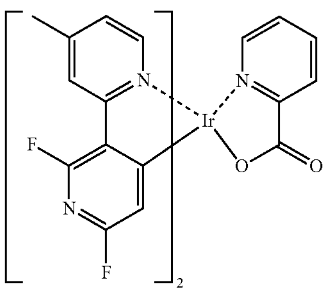
PD9
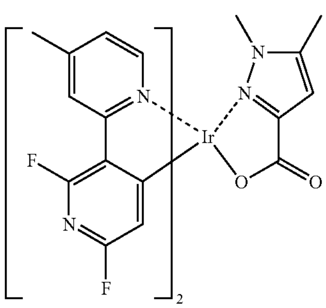
PD10
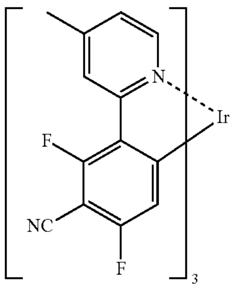
-continued
PD11
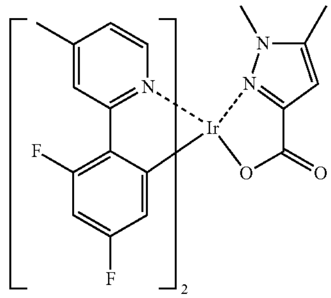
PD12
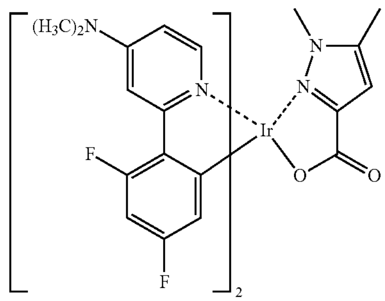
PD13
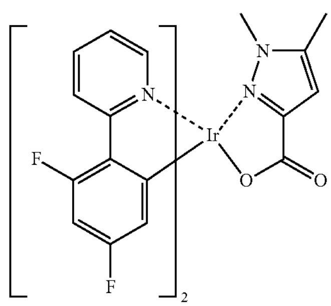
PD14
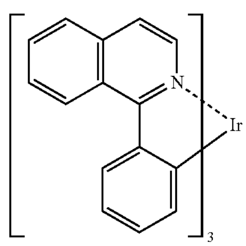
PD15
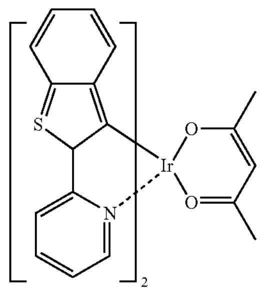

-continued
PD16
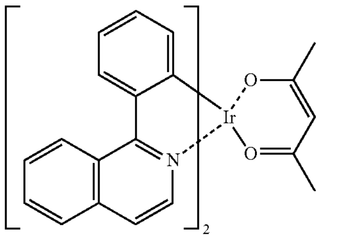
PD17
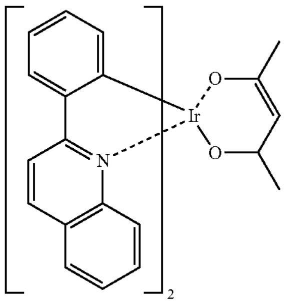
PD18
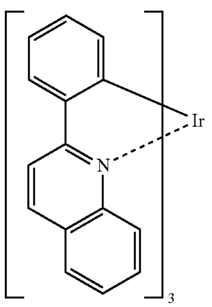
PD19
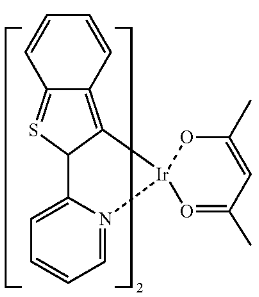
PD20
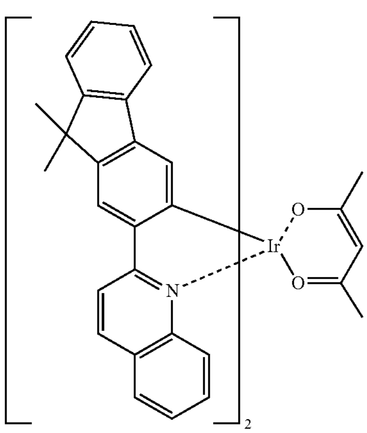
-continued
PD21
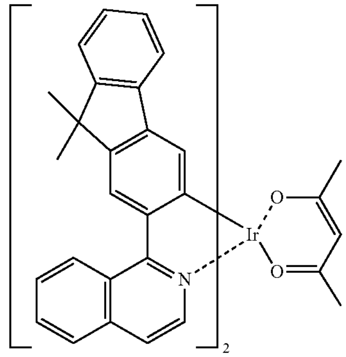
PD22
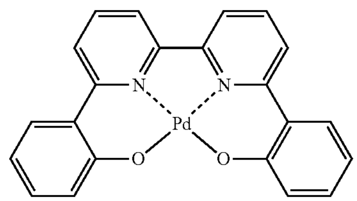
PD23
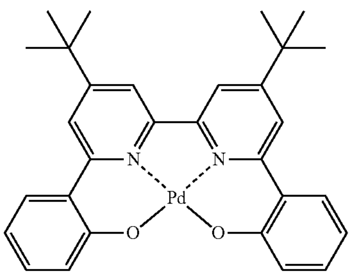
PD24
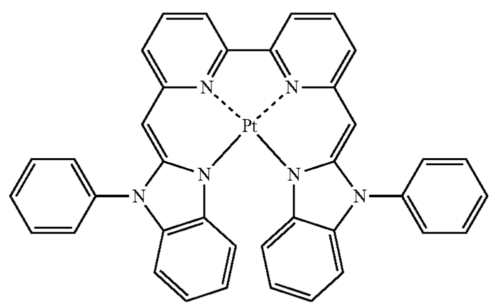
PD25
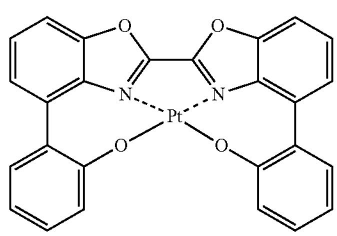
PD26
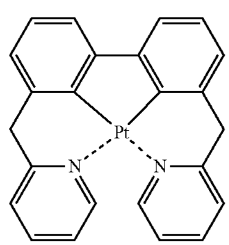

-continued
PD27
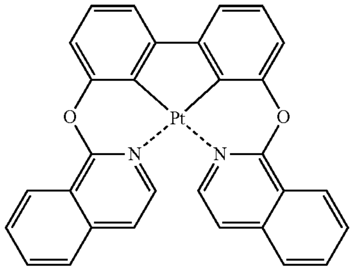
PD28
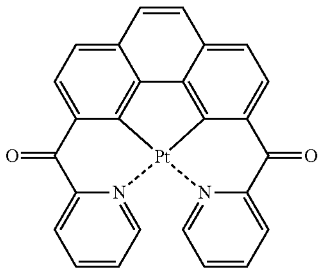
PD29
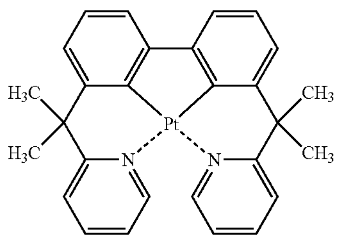
PD30
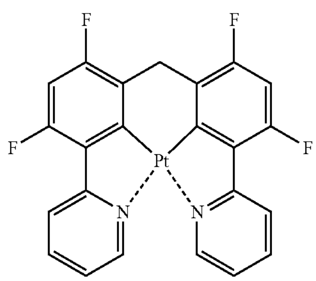
PD31
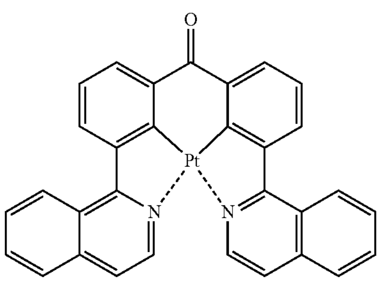
PD32
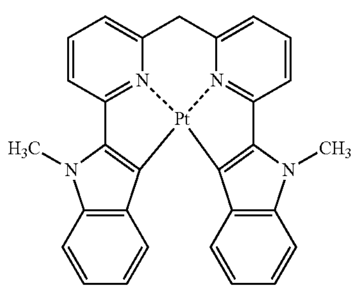
-continued
PD33
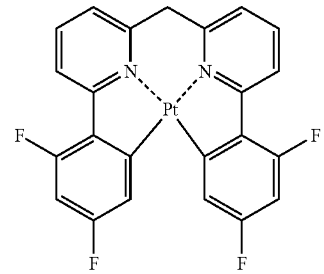
PD34
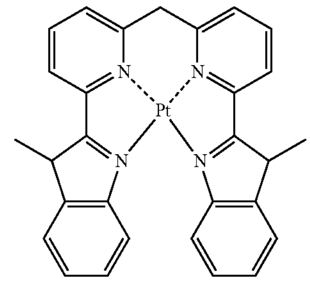
PD35
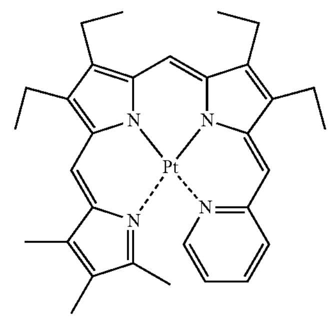
PD36
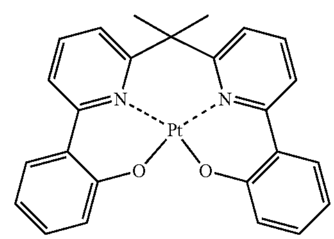
PD37
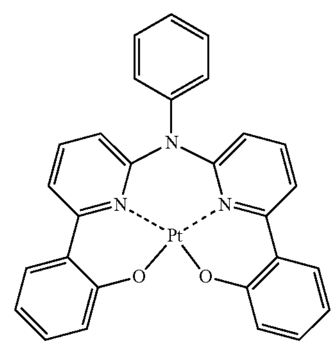

-continued
PD38
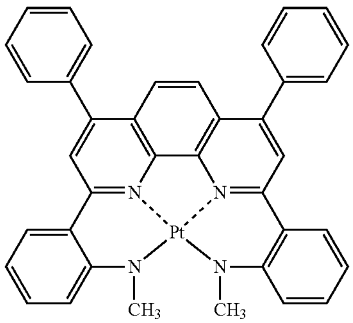
PD39
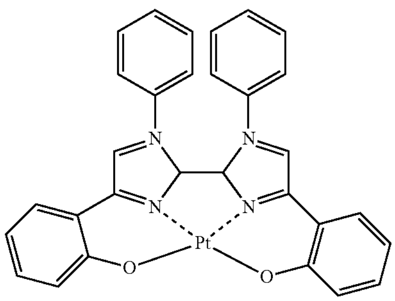
PD40
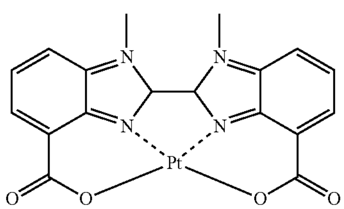
PD41
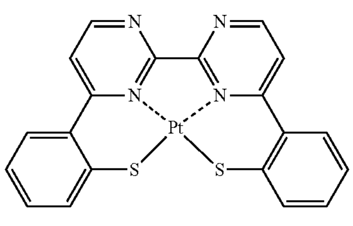
PD42
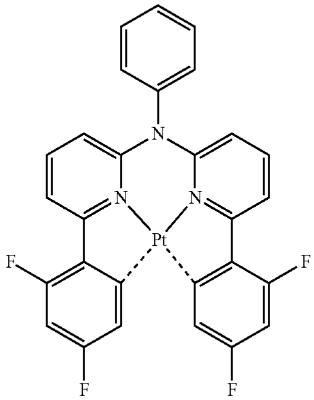
-continued
PD43
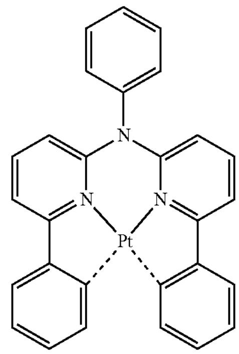
PD44
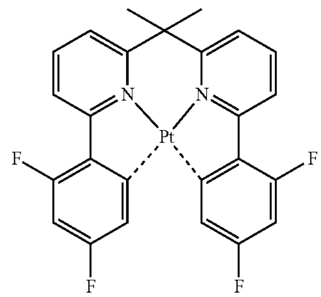
PD45
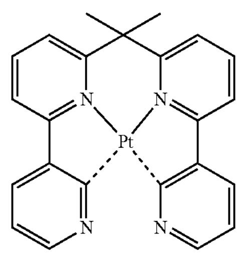
PD46
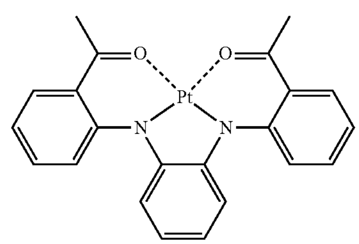
PD47
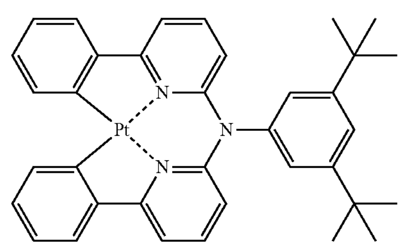
PD48
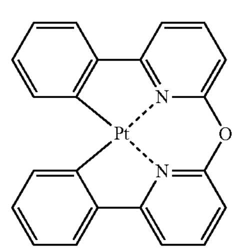

-continued
PD49
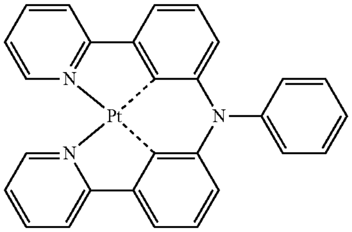
PD50
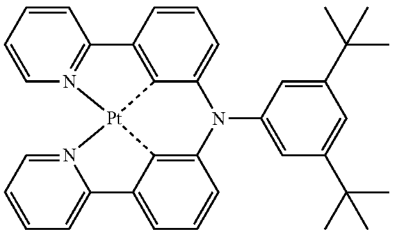
PD51
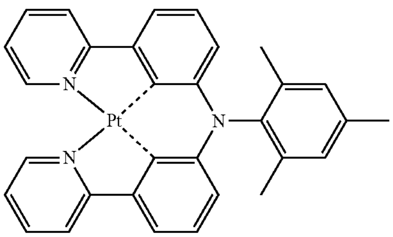
PD52
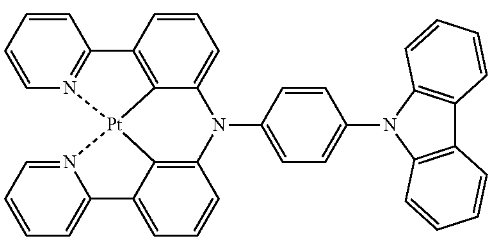
PD53
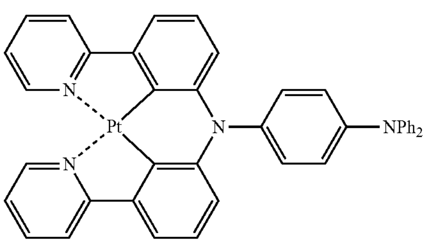
PD54
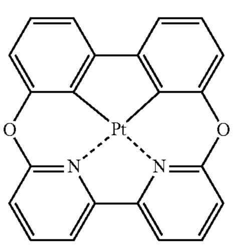
-continued
PD55
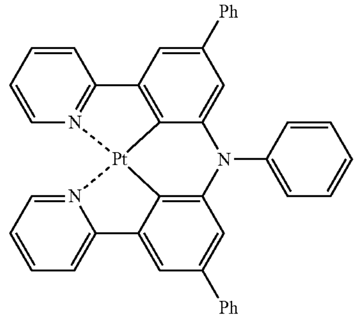
PD56
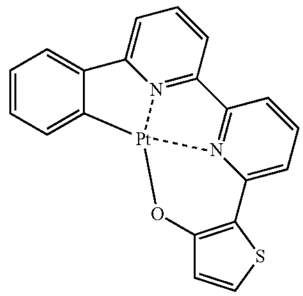
PD57
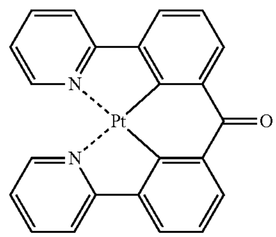
PD58
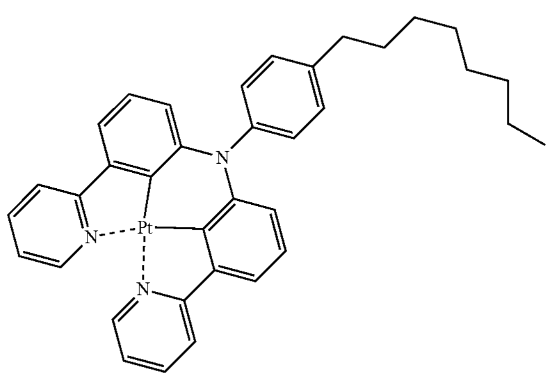
PD59
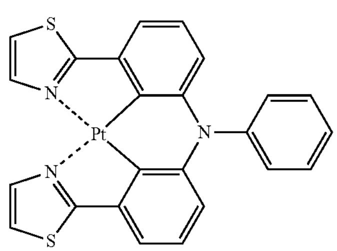

-continued
PD60
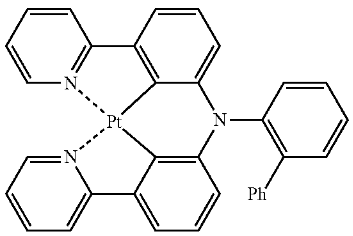
PD61
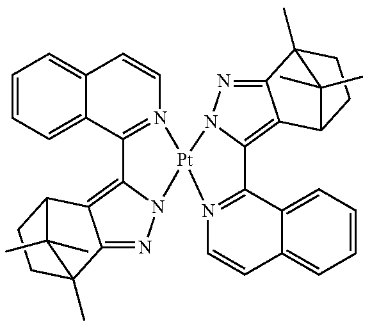
PD62
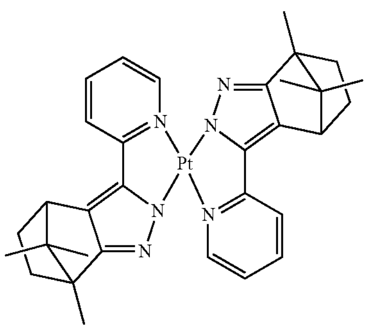
PD63
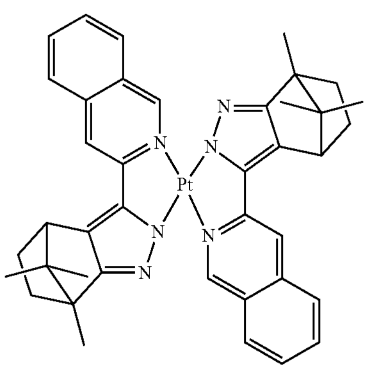
PD64
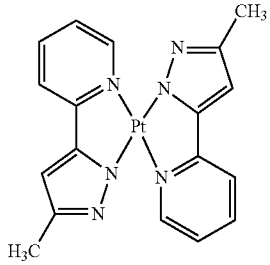
-continued
PD65
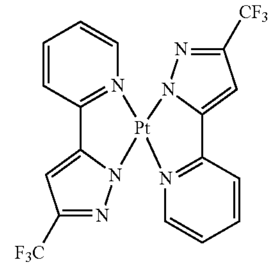
PD66
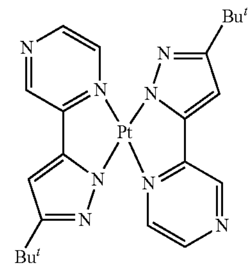
PD67
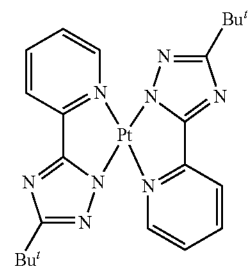
PD68
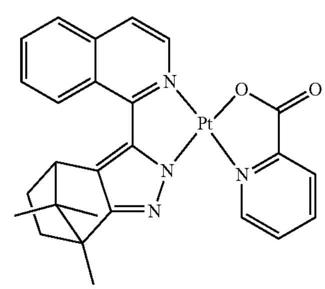
PD69
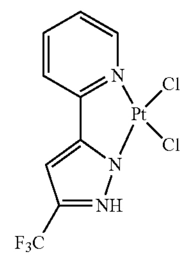

-continued
PD70
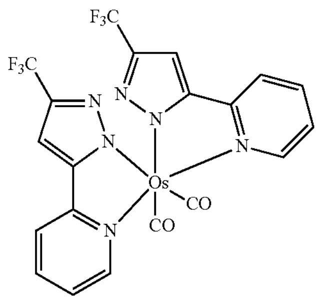
PD71
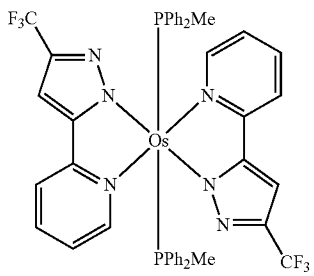
PD72
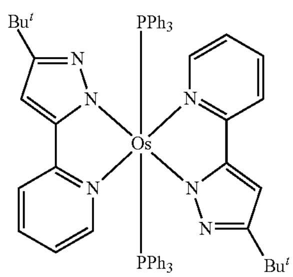
PD73
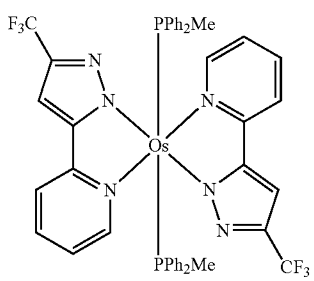
PD74
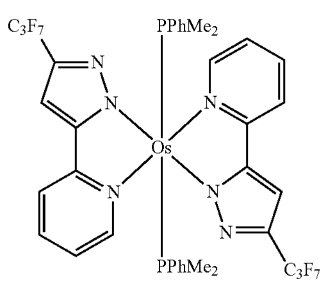
-continued
PD75
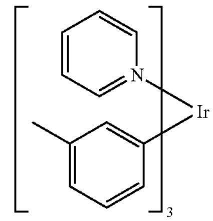
PD76
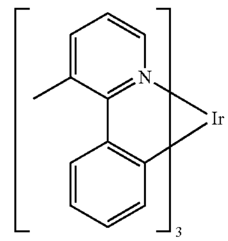
PD77
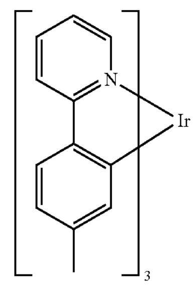
PD78
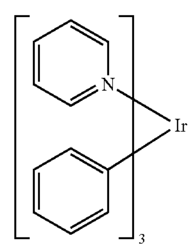
PD79
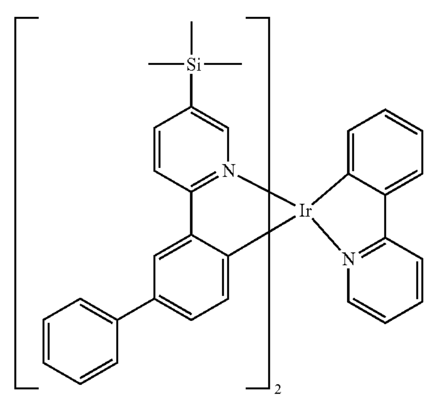

Alternatively, the phosphorescent dopant may include PtOEP below:

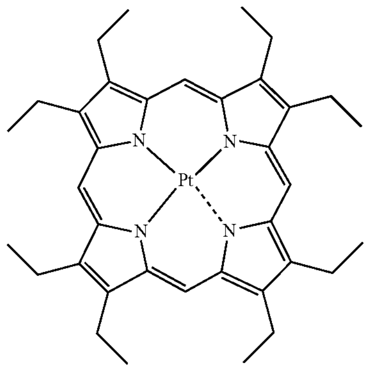

PtOEP

An amount of the dopant included in the emission layer 15 may be, but not limited to, about 0.01 to about 15 parts by weight, based on 100 parts by weight of the host (e.g., the electron-transporting host and the hole-transporting host).

A thickness of the emission layer 15 may be about 100 Å to about 1,000 Å, e.g., 200 Å to about 600 Å. When the thickness of the emission layer 15 is within these ranges, improved emission characteristics may be obtained without a substantial increase in driving voltage.

The host transport region 13 of the organic light-emitting device 10 may further include at least one of a hole injection layer, an electron blocking layer, and a buffer layer, in addition to the hole transport layer.

For example, the hole transport region 13 may include a hole transport layer only, or may have a structure of hole injection layer/hole transport layer or a structure of hole injection layer/hole transport layer/electron blocking layer, each of which layers are sequentially stacked in the stated order from the first electrode 11.

When the hole transport region 13 includes the hole injection layer, the hole injection layer may be formed on the first electrode 11 using various methods, for example, vacuum deposition, spin coating, casting, or Langmuir-Blodgett (LB) deposition.

When the hole injection layer is formed by vacuum deposition, deposition conditions may vary according to a compound used to form the hole injection layer and the structure and thermal characteristics of the hole injection layer, and for example, the deposition conditions include a deposition temperature in a range of about 100° C. to about 500° C., a vacuum pressure in a range of about $10^{-8}$ torr to about $10^{-3}$ torr, and a deposition rate in a range of about 0.01 Å/sec to about 100 Å/sec, but the conditions are not limited thereto.

When the hole injection layer is formed by spin coating, spin coating conditions may vary according to a compound used to form the hole injection layer and the structure and thermal characteristics of the hole injection layer, and for example, the spin conditions include a coating speed in a range of about 2,000 rpm to about 5,000 rpm, and a temperature at which a heat treatment is performed to remove a solvent after coating may be in a range of about 80° C. to about 200° C., but the conditions are not limited thereto.

Conditions for forming the hole transport layer and the electron blocking layer may be understood by referring to the conditions for forming the hole injection layer.

The hole transport region 13 may include, e.g., at least one of m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid:polyaniline/dodecylbenzene sulfonic acid (Pani/DBSA), poly(3,4-ethylene dioxythiophene)/poly(4-styrene sulfonate) (PEDOT/PSS), polyaniline/camphor sulfonic acid:polyaniline (Pani/CSA), polyaniline/poly(4-styrene sulfonate) (PANI/PSS), and compounds represented by Formulae 201 and 202 below:

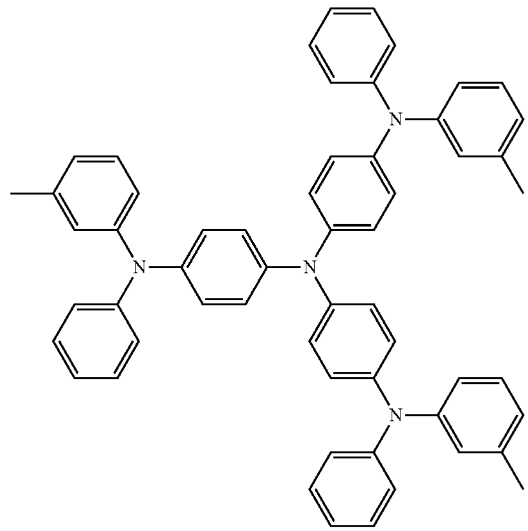

m-MTDATA

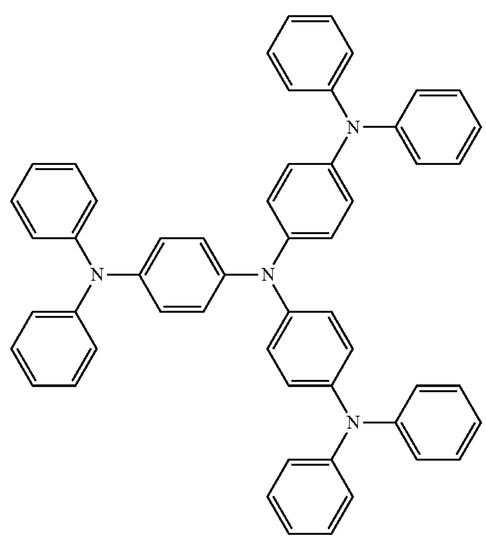

TDATA

-continued
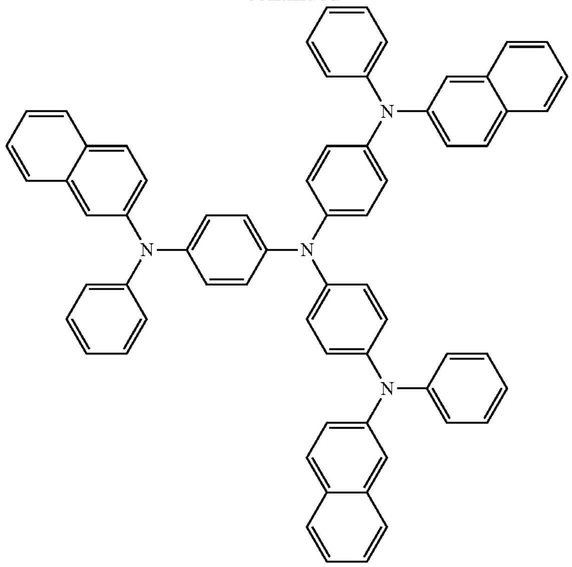
2-TNATA
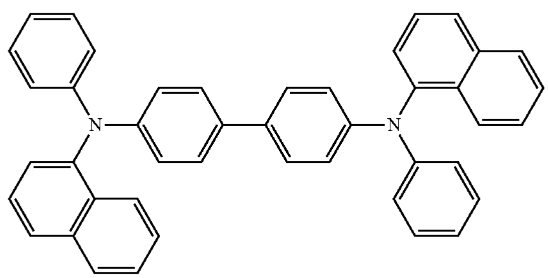
NPB
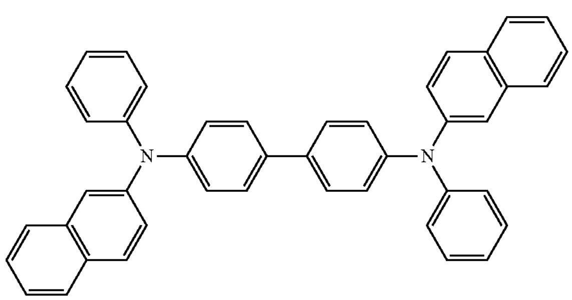
β-NPB
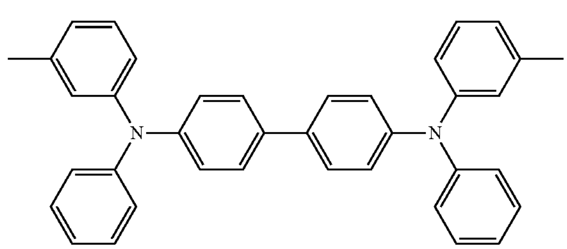
TPD
-continued
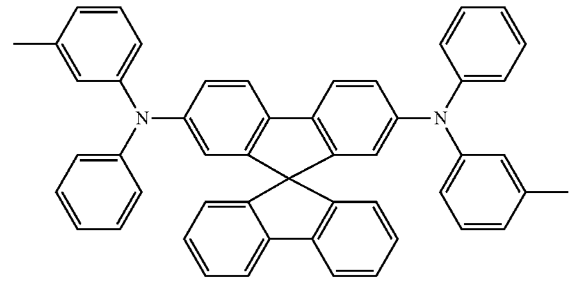
Spiro-TPD
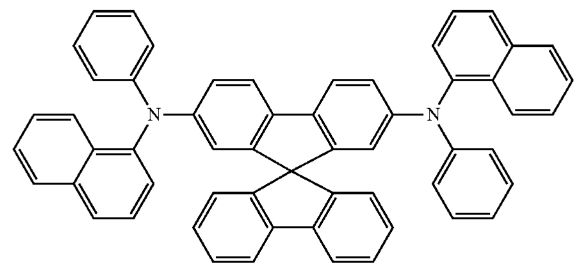
Spiro-NPB
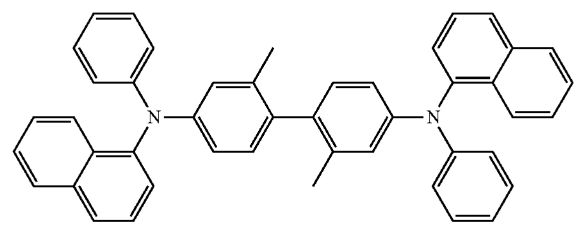
methylated NPB
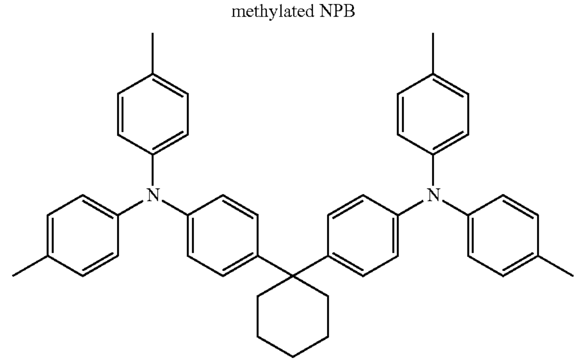
TAPC
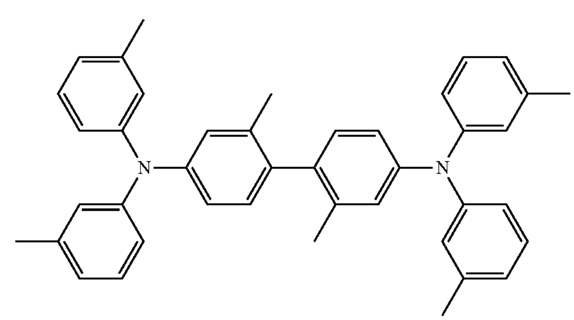
HMTPD -continued <Formula 201>

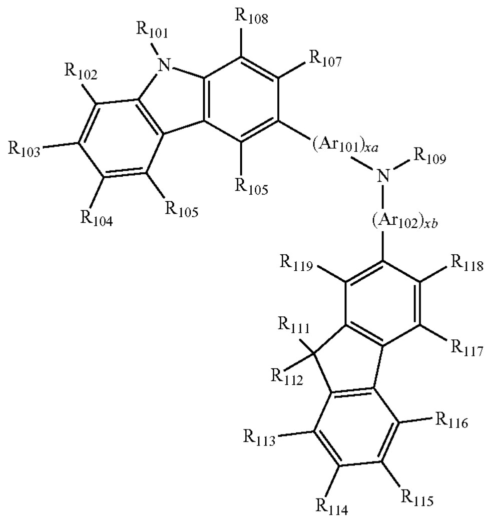

<Formula 202>

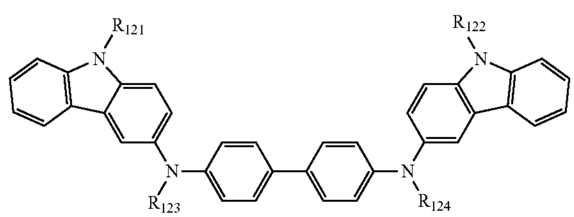

In Formula 201, each of $Ar_{101}$ and $Ar_{102}$ may be independently selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, each of xa and xb may be independently an integer of 0 to 5, or may be one of 0, 1, and 2. For example, xa may be 1 and xb may be 0, but xa and xb are not limited thereto.

In Formulae 201 and 202, each of $R_{101}$ to $R_{108}$, $R_{111}$ to $R_{119}$, and $R_{121}$ to $R_{124}$ may be independently selected from, but not limited to, a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, or a hexyl group), and a $C_1$-$C_{10}$ alkoxy group (e.g., a methoxy group, an ethoxy group, a propoxy group, a butoxy group, or a pentoxy group); a $C_1$-$C_{10}$ alkyl group and a $C_1$-$C_{10}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 201, $R_{109}$ may be selected from a phenyl group, a naphthyl group, an anthracenyl group, and a pyridinyl group; and a phenyl group, a naphthyl group, an anthracenyl group, and a pyridinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In example embodiments, the compound represented by Formula 201 may be represented by Formula 201A below, but the compound is not limited thereto:

<Formula 201A>

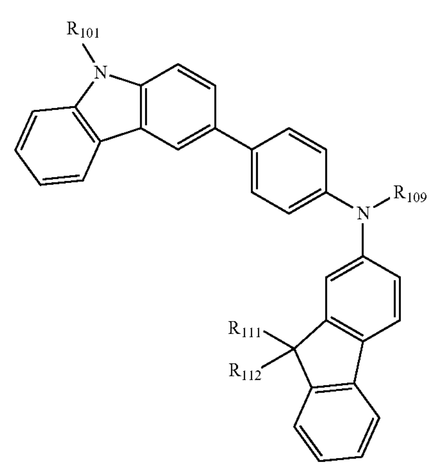

In Formula 201A, descriptions of $R_{101}$, $R_{111}$, $R_{112}$, and $R_{109}$ may be understood by referring to the description provided herein.
For example, the compound represented by Formula 201 and the compound represented by Formula 202 may include Compounds HT1 to HT20 below, but the compounds are not limited thereto:
HT1
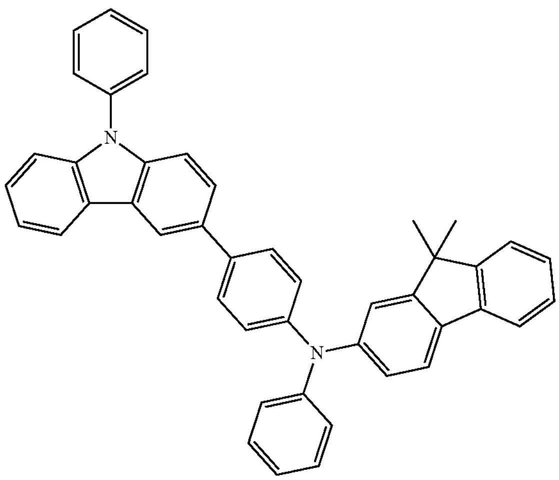
HT2
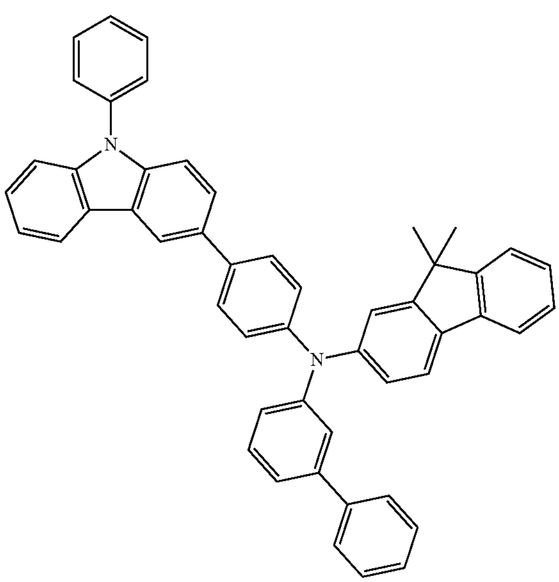
-continued
HT3
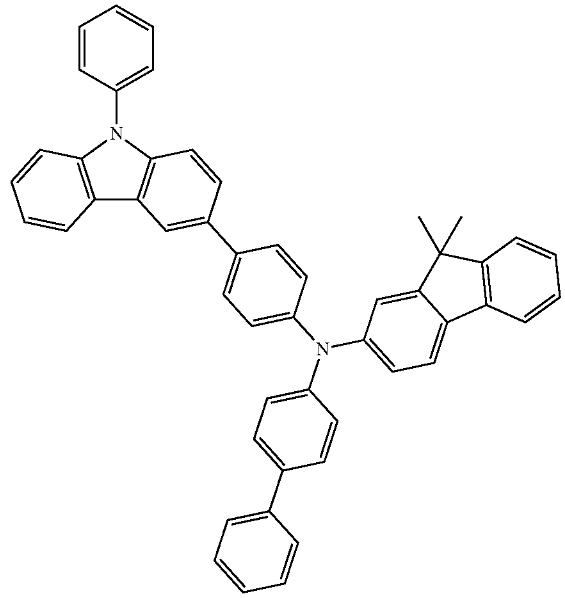
HT4
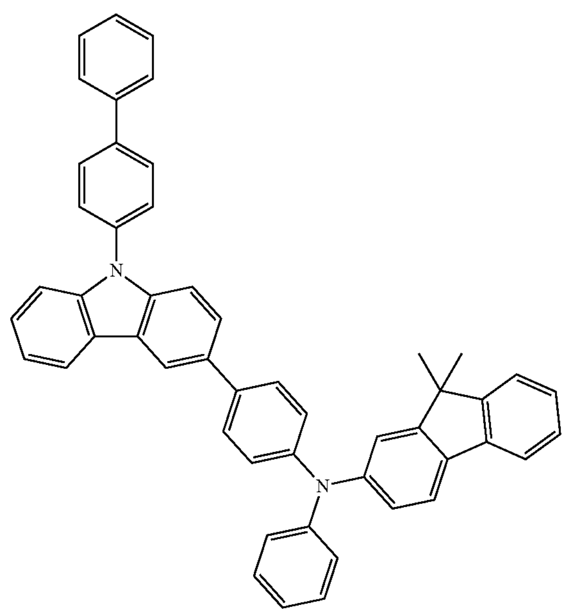

-continued
HT5
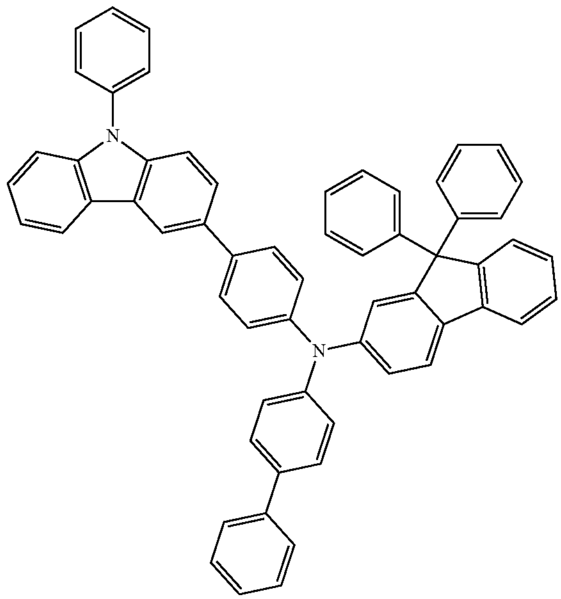
HT6
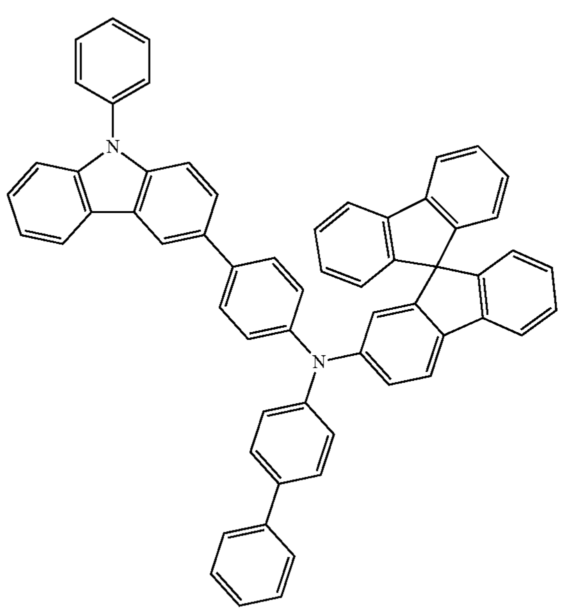
-continued
HT7
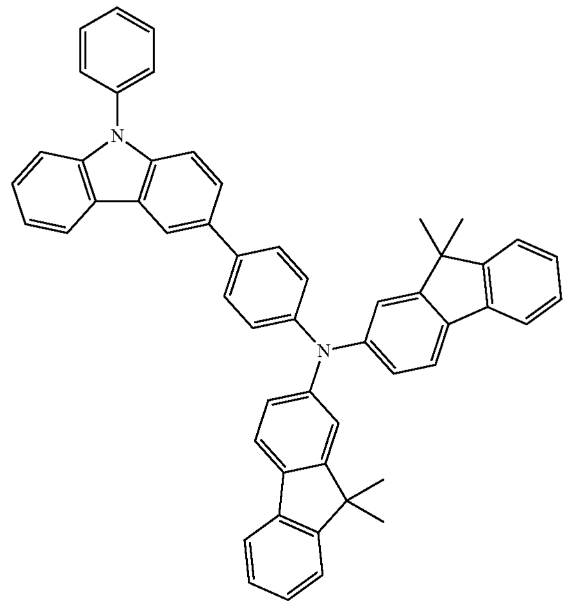
HT8
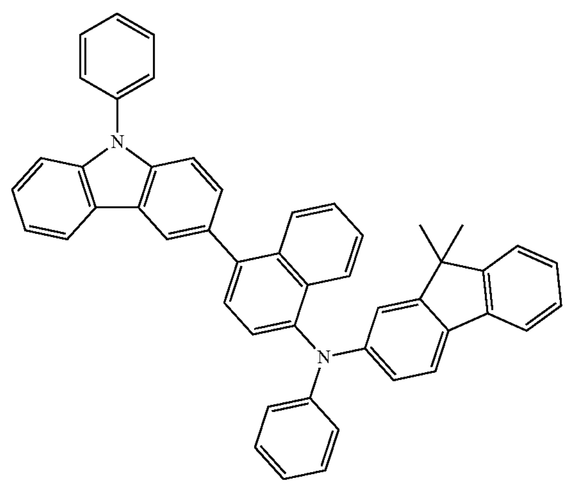
HT9
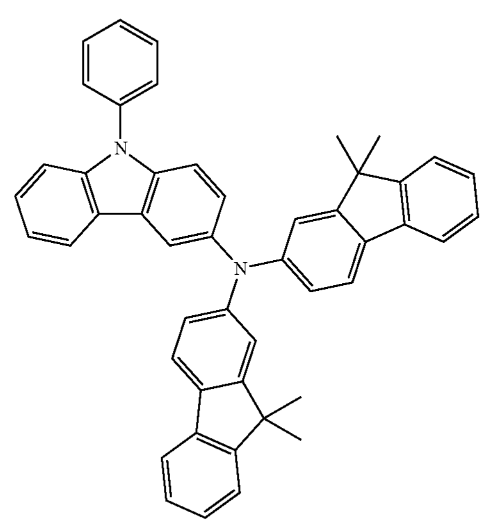

-continued
HT10
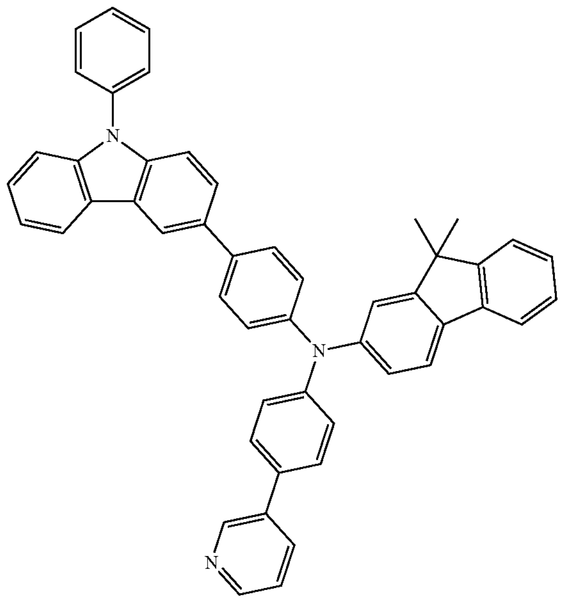
HT11
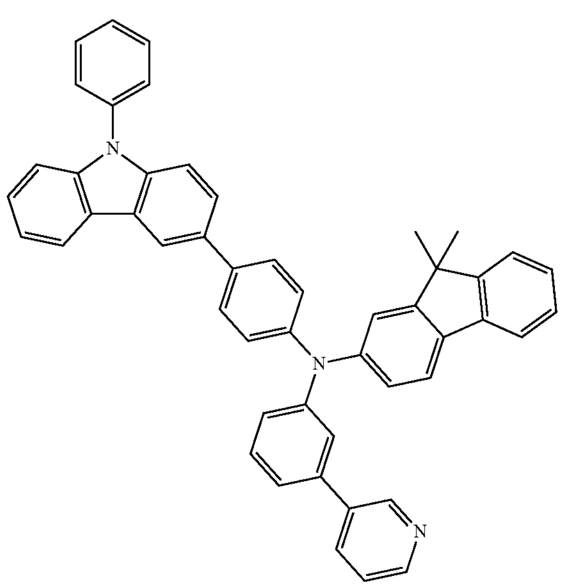
-continued
HT12
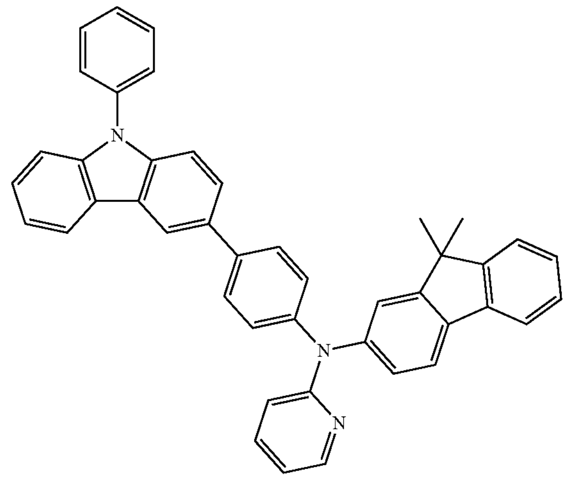
HT13
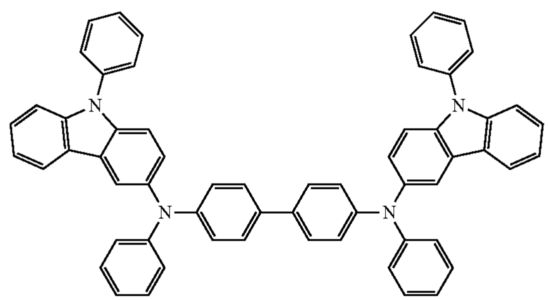
HT14
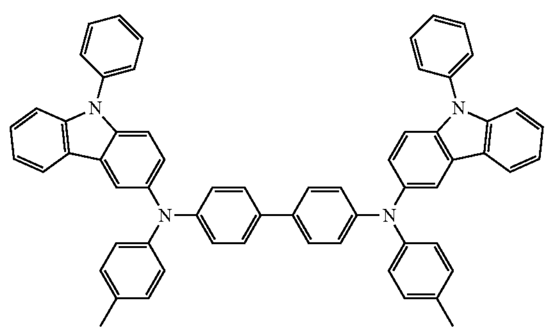
HT15
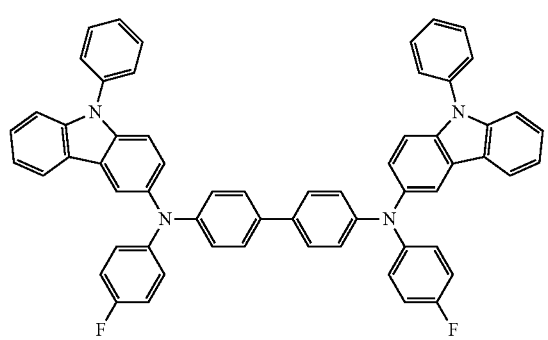

-continued

HT16

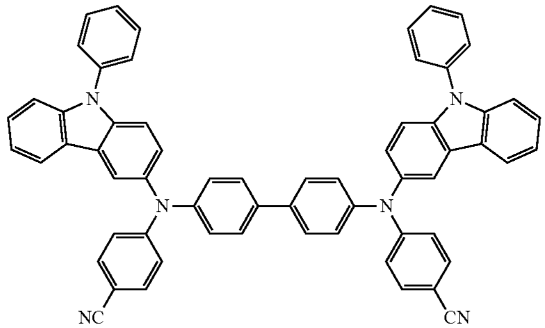

HT17

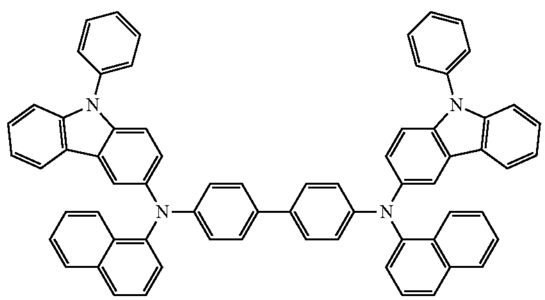

HT18

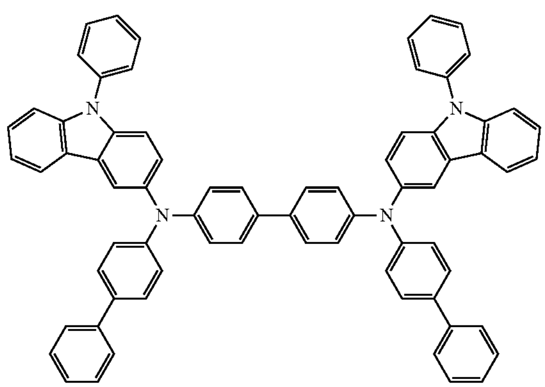

HT19

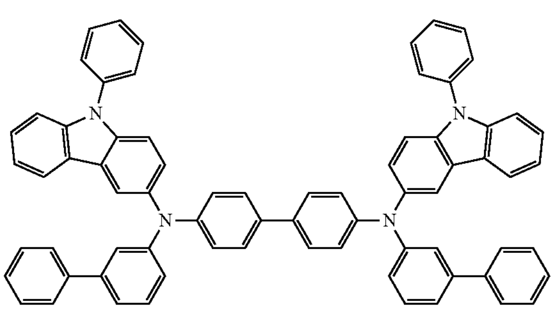

-continued

HT20

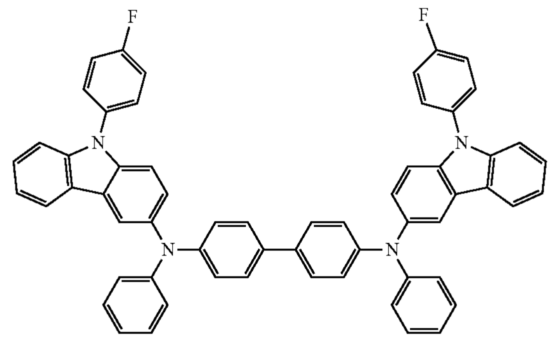

A thickness of the hole transport region 13 may be in a range of about 100 Å to about 10,000 Å, e.g., about 100 Å to about 1,000 Å. When the hole transport region 13 includes both an hole injection layer and an hole transport layer, a thickness of the hole injection layer may be in a range of about 100 Å to about 10,000 Å, e.g., about 100 Å to about 1,000 Å, and a thickness of the hole transport layer may be in a range of about 50 Å to about 2,000 Å, e.g., about 100 Å to about 1,500 Å. When the thicknesses of the hole transport region 13, the hole injection layer, and the hole transport layer are within these ranges, satisfactory hole transporting characteristics may be obtained without a substantial increase in driving voltage.

The hole transport material included in the hole transport layer of the hole transport region 13 may include a compound represented by Formula 201 above.

In example embodiments, the hole transport material included in the hole transport layer of the hole transport region 13 may include a compound represented by Formula 201A above.

In example embodiments, the hole transport material included in the hole transport layer of the hole transport region 13 may include at least one of Compounds HT1 to HT12 above, but the hole transport material is not limited thereto.

In addition to the materials described above, the hole transport region 13 may further include a charge-generation material for the improvement of conductive characteristics. The charge-generation material may be homogeneously or non-homogeneously dispersed in the hole transport region 13.

The charge-generation material may be, e.g., a p-dopant. The p-dopant may be, but not limited to, one of a quinone derivative, a metal oxide, and a cyano group-containing compound. Non-limiting examples of the p-dopant are, but not limited to, a quinone derivative, for example, tetracyanoquinonedimethane (TCNQ) and 2,3,5,6-tetrafluoro-tetracyano-1,4-benzoquinonedimethane (F4-TCNQ); a metal oxide, for example, a tungsten oxide or a molybdenum oxide; and Compound HT-D1 below.

<Compound HT-D1>

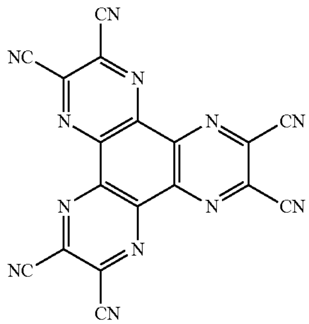

<F4-TCNQ>

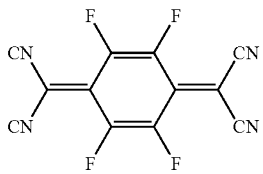

TCNPQ

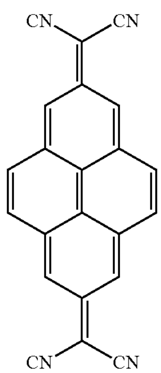

The hole transport region 13 may further include a buffer layer.

The buffer layer may compensate for an optical resonance distance according to a wavelength of light emitted from the emission layer 15, and thus, a light-emission efficiency of a formed organic light-emitting device may be improved.

The electron transport region 17 may further include at least one of a hole blocking layer and an electron injection layer, in addition to the electron transport layer.

For example, electron transport region may have a structure of hole blocking layer/electron transport layer/electron injection layer or a structure of electron transport layer/electron injection layer, but the structure is not limited thereto. The electron transport layer may have a single-layer structure or a multi-layer structure including at least two different materials.

Conditions for forming the hole blocking layer, the electron transport layer, and the electron injection layer included in the electron transport region may be understood by referring to the conditions for forming the hole injection layer.

When the electron transport region includes the hole blocking layer, the hole blocking layer may include, e.g., at least one of BCP, Bphen, and BAlq below, but the material is not limited thereto.

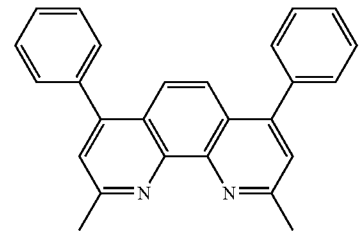

BCP

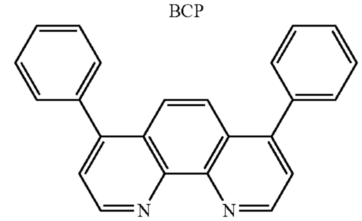

Bphen

A thickness of the hole blocking layer may be in a range of about 20 Å to about 1,000 Å, e.g., about 30 Å to about 3,00 Å. When the thickness of the hole blocking layer is within these ranges, improved hole blocking characteristics may be obtained without substantial increase in driving voltage.

The electron transport material included in the electron transport layer may include a compound represented by Formulae 40 or 41 below:

<Formula 40>

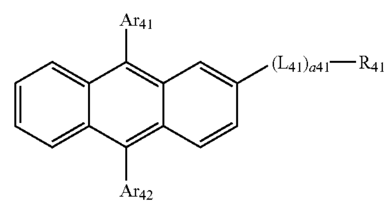

<Formula 41>

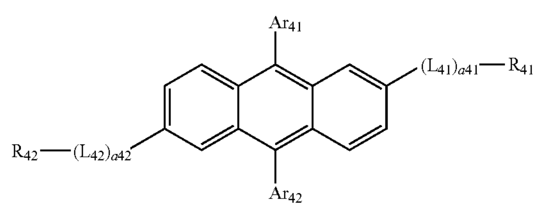

In Formulae 40 and 41, each of $L_{41}$ and $L_{42}$ may be independently selected from a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group; each of a41 and a42 may be independently an integer of 0 to 5; each of $Ar_{41}$ and $Ar_{42}$ may be independently selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group; and each of $R_{41}$ and $R_{42}$ may be independently selected from a benzoimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group; and a benzoimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a benzoimidazolyl group, a benzoxazolyl group, a benzothiazolyl group, a benzopyrimidinyl group, an imidazopyridinyl group, a quinolinyl group, an isoquinolinyl group, a quinazolinyl group, a pyridinyl group, a pyrimidinyl group, a pyrazinyl group, a phenyl group, a naphthyl group, a pyrenyl group, a chrysenyl group, a fluorenyl group, and a phenanthrenyl group.

Descriptions of $L_{41}$ and $L_{42}$ may be understood by referring to the description provided in connection with $L_2$.

Alternatively, the electron transport material included in the electron transport layer may include a compound represented by Formula 42 below:

<Formula 42>

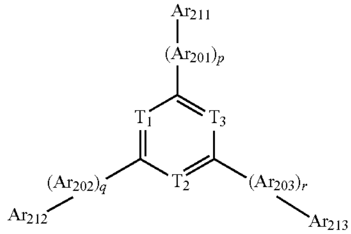

In Formula 42, $T_1$ may be N or $C(R_{201})$, $T_2$ may be N or $C(R_{202})$, and $T_3$ may be N or $C(R_{203})$, wherein at least one of $T_1$ to $T_3$ may be N, each of $R_{201}$ to $R_{203}$ may be independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, each of $Ar_{201}$ to $Ar_{203}$ may be independently selected from a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, each of p, q, and r may be independently 0, 1, or 2; and each of $Ar_{211}$ and $Ar_{213}$ may be independently selected from a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group.

In example embodiments, at least two of $T_1$ to $T_3$ in Formula 42 may be N.

In example embodiments, all of $T_1$ to $T_3$ in Formula 42 may be N.

In Formula 42, each of $Ar_{201}$ to $Ar_{203}$ may be independently selected from a phenylene group, a naphthylene group, an anthrylene group, a pyrenylene group, a fluorenylene group, a triphenylenyl group, a pyridinylene group, and a pyrimidinylene group; and a phenylene group, a naphthylene group, an anthrylene group, a pyrenylene group, a fluorenylene group, a triphenylenyl group, a pyridinylene group, and a pyrimidinylene group, each substituted with at least one of a phenyl group, a naphthyl group, an anthryl group, a pyrenyl group, a fluorenyl group, a triphenylenyl group, a pyridinyl group, and a pyrimidinyl group.

In Formula 42, each of p, q, and r may be independently one of 0, 1, and 2. For example, in Formula 42, each of p, q, and r may be independently one of 0 and 1, but p, q, and 4 are not limited thereto.

In Formula 42, each of $Ar_{211}$ to $Ar_{213}$ may be independently selected from a phenyl group, a naphthyl group, a pyrenyl group, a chrysenyl group, a fluorenyl group, a phenanthrenyl group, a benzoimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a phenyl group, a naphthyl group, a pyrenyl group, a chrysenyl group, a fluorenyl group, a phenanthrenyl group, a benzoimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group.

In example embodiments, at least one of $Ar_{211}$ to $Ar_{213}$ in Formula 42 may be independently selected from a benzoimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group; and a benzoimidazolyl group, a benzoxazolyl group, a benzothiazolyl group, a benzopyrimidinyl group, an imidazopyrimidinyl group, a quinolinyl group, an isoquinolinyl group, a quinazolinyl group, a pyridinyl group, a pyrimidinyl group, a pyrazinyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group, but $Ar_{211}$ to $Ar_{213}$ are not limited thereto.

In example embodiments, at least one of Ar211 to Ar213 in Formula 20A may be a substituted or unsubstituted phenanthrenyl group.

For example, the electron transport layer included in the electron transport region 17 may include, but not limited, at least one of Compounds ET1 to ET16 below:

<Compound ET1>

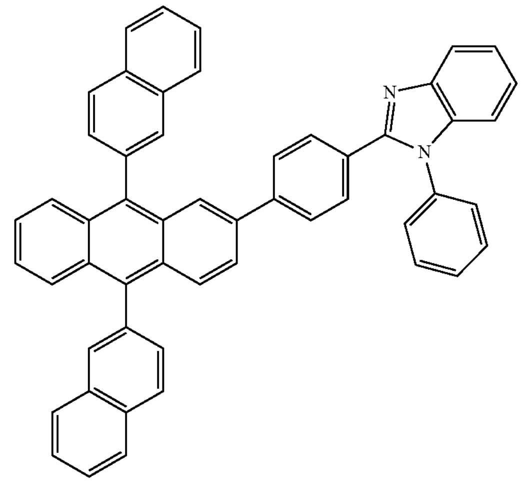

<Compound ET2>

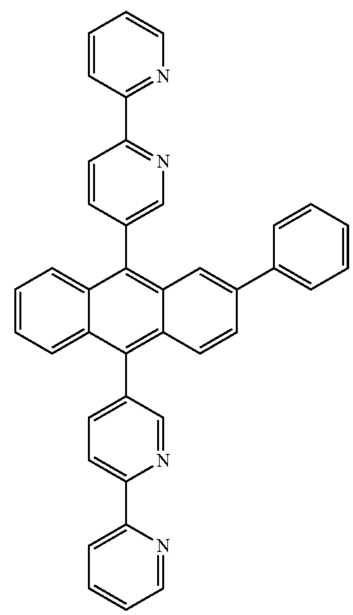

<Compound ET3>

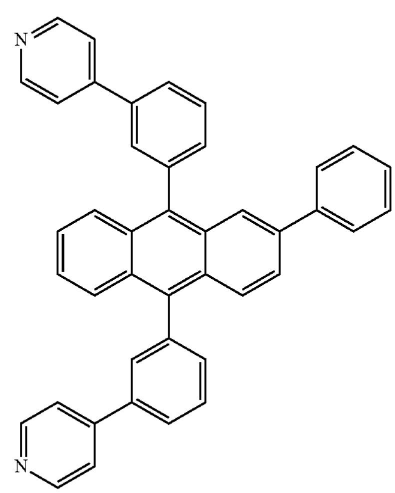

-continued
<Compound ET4>
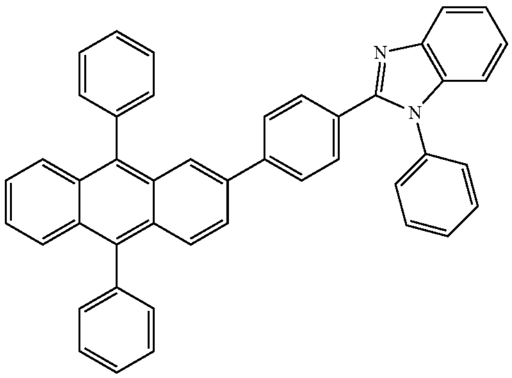
<Compound ET5>
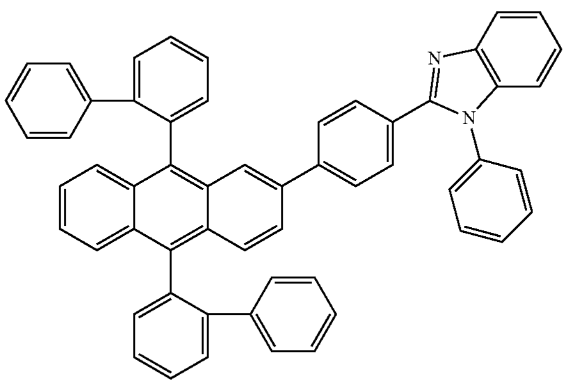
<Compound ET6>
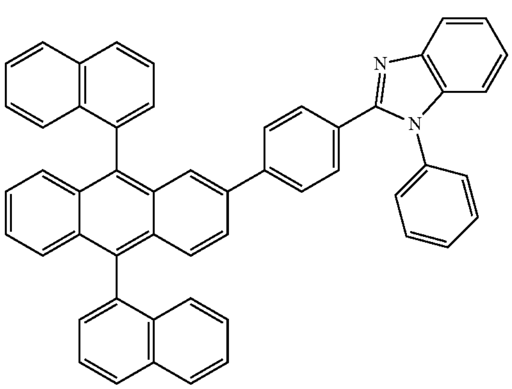
-continued
<Compound ET7>
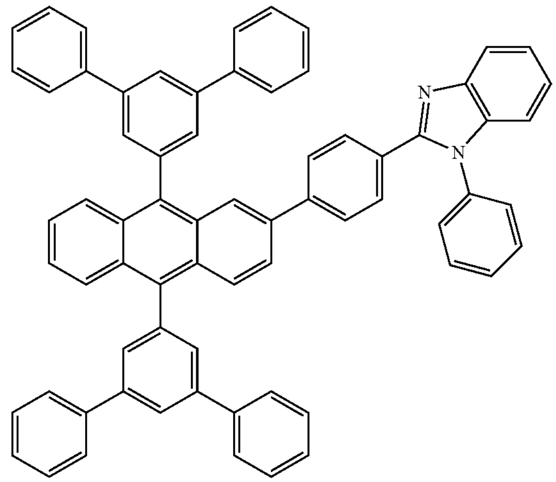
<Compound ET8>
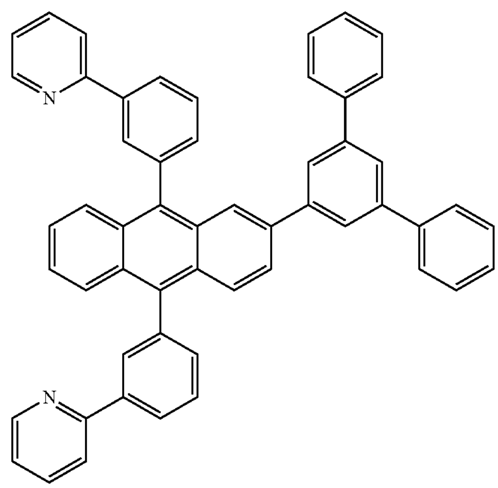
<Compound ET8>
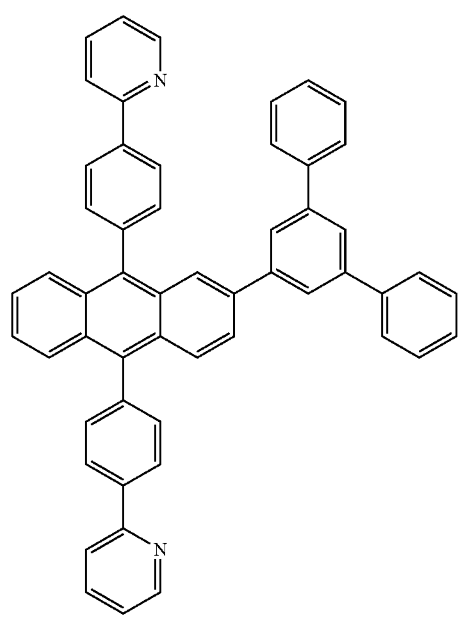

-continued
<Compound ET10>
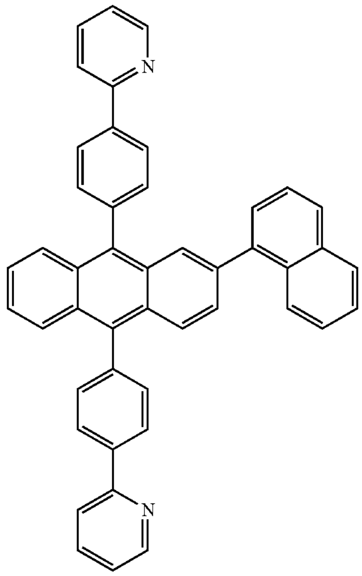
<Compound ET11>
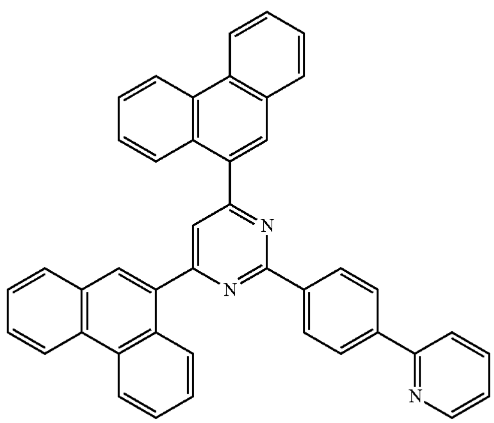
<Compound ET12>
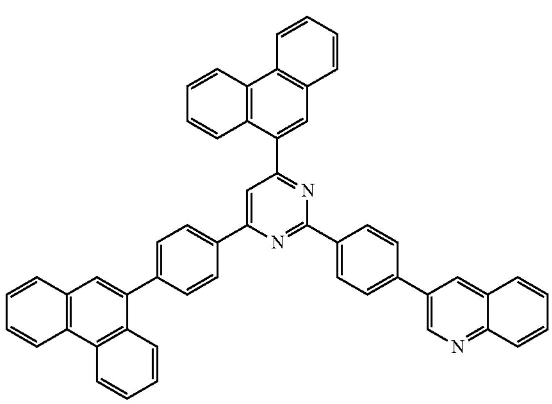
-continued
<Compound ET13>
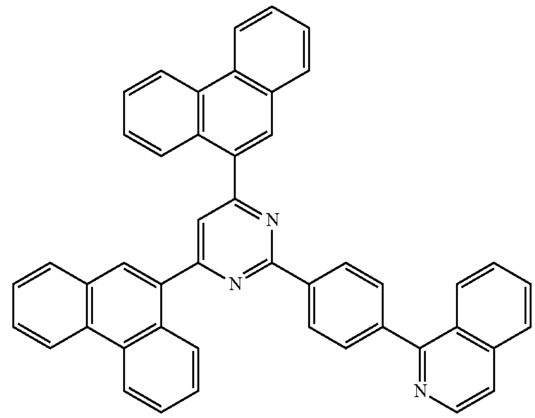
<Compound ET14>
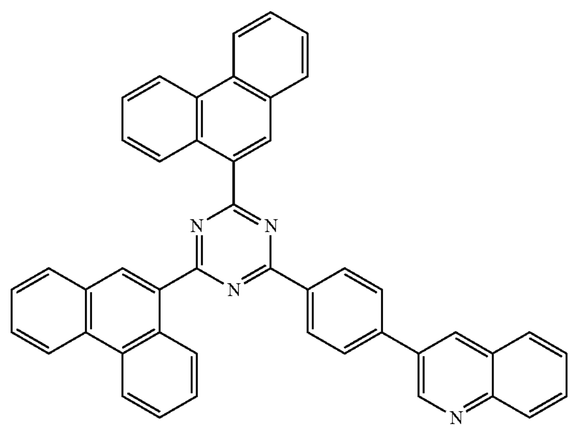
<Compound ET15>
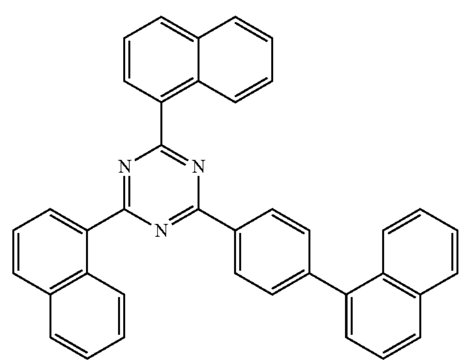

-continued

<Compound ET16>

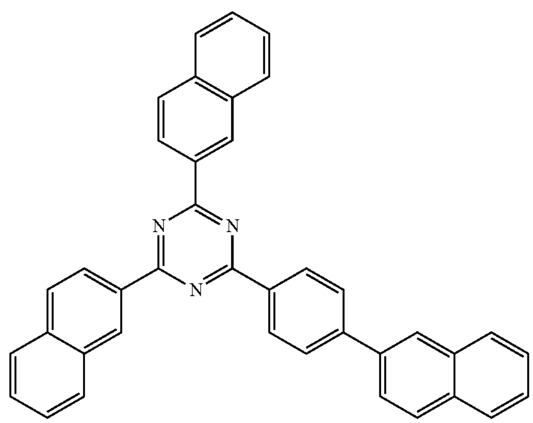

A thickness of the electron transport layer may be about 100 Å to about 1,000 Å, e.g., about 150 Å to about 500 Å. When the thickness of the electron transport layer is within these ranges, satisfactory electron transporting characteristics may be obtained without a substantial increase in driving voltage.

In addition to the materials described above, the electron transport layer may further include a metal-containing material.

The metal-containing material may include a Li complex. The Li complex may include, e.g., Compound ET-D1 (e.g., lithium quinolate (LiQ)) or Compound ET-D2 below.

ET-D1

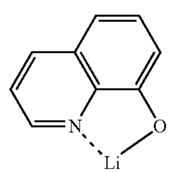

ET-D2

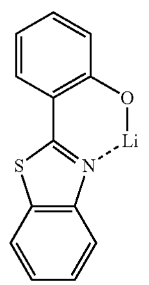

In addition, the electron transport region 17 may include an electron injection layer that facilitates electron injection from the second electrode 19.

The electron injection layer may include at least one selected from LiF, NaCl, CsF, $Li_2O$, and BaO.

A thickness of the electron injection layer may be about 1 Å to about 100 Å, e.g., about 3 Å to about 90 Å. When the thickness of the electron injection layer is within these ranges, satisfactory electron injecting characteristics may be obtained without a substantial increase in driving voltage.

The second electrode 19 may be disposed on top of the organic layer 15. The second electrode 19 may be a cathode. A material for forming the second electrode 19 may be a material having a relatively low work function, for example, a metal, an alloy, an electrically conductive compound, or a mixture thereof. Detailed examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). Alternatively, to fabricate a top emission type light-emitting device, the material for forming the second electrode 10 may be ITO or IZO to form a transmissive second electrode 19.

Hereinafter, the organic light-emitting device 10 has been described with reference to FIG. 1, but is not limited thereto.

A C1-C60 alkyl group used herein refers to a linear or branched aliphatic hydrocarbon monovalent group having 1 to 60 carbon atoms, and detailed examples thereof are a methyl group, an ethyl group, a propyl group, an isobutyl group, a sec-butyl group, a ter-butyl group, a pentyl group, an iso-amyl group, and a hexyl group. A C1-C60 alkylene group used herein refers to a divalent group having the same structure as the C1-C60 alkyl group.

A C1-C60 alkoxy group used herein refers to a monovalent group represented by —OA101 (wherein A101 is the C1-C60 alkyl group), and detailed examples thereof are a methoxy group, an ethoxy group, and an isopropyloxy group.

A C2-C60 alkenyl group used herein refers to a hydrocarbon group having at least one carbon double bond in the middle or terminal of the C2-C60 alkyl group, and detailed examples thereof are an ethenyl group, a prophenyl group, and a butenyl group. A C2-C60 alkenylene group used herein refers to a divalent group having the same structure as the C2-C60 alkenyl group.

A C2-C60 alkynyl group used herein refers to a hydrocarbon group having at least one carbon triple bond in the middle or terminal of the C2-C60 alkyl group, and detailed examples thereof are an ethynyl group and a propynyl group. A C2-C60 alkynylene group used herein refers to a divalent group having the same structure as the $C_2$-$C_{60}$ alkynyl group.

A C3-C10 cycloalkyl group used herein refers a monovalent hydrocarbon monocyclic group having 3 to 10 carbon atoms, and detailed examples thereof are a cyclopropyl group, a cyclobutyl group, a cyclopentyl group, a cyclohexyl group, and a cycloheptyl group. A C3-C10 cycloalkylene group used herein refers to a divalent group having the same structure as the C3-C10 cycloalkyl group.

A C1-C10 heterocycloalkyl group used herein refers a monovalent monocyclic group having at least one heteroatom selected from N, O, P, and S as a ring-forming atom and 1 to 10 carbon atoms, and detailed examples thereof are a tetrahydrofuranyl group and a tetrahydrothiophenyl group. A C1-C10 heterocycloalkylene group used herein refers to a divalent group having the same structure as the C1-C10 heterocycloalkyl group.

A C3-C10 cycloalkenyl group used herein refers to a monovalent monocyclic group that has 3 to 10 carbon atoms and at least one double bond in the ring thereof and does not have aromacity, and detailed examples thereof are a cyclopentenyl group, a cyclohexenyl group, and a cycloheptenyl group. A C3-C10 cycloalkenylene group used herein refers to a divalent group having the same structure as the C3-C10 cycloalkenyl group.

A C1-C10 heterocycloalkenyl group used herein refers to a monovalent monocyclic group that has at least one heteroatom selected from N, O, P, and S as a ring-forming atom, 1 to 10 carbon atoms, and at least one double bond in its ring. Detailed examples of the C1-C10 heterocycloalkenyl group are a 2,3-hydrofuranyl group and a 2,3-hydrothiophenyl group. A C1-C10 heterocycloalkenylene group used herein refers to a divalent group having the same structure as the C1-C10 heterocycloalkenyl group.

A C6-C60 aryl group used herein refers to a monovalent group having a carbocyclic aromatic system having 6 to 60 carbon atoms, and a C6-C60 arylene group used herein refers to a divalent group having a carbocyclic aromatic system having 6 to 60 carbon atoms. Detailed examples of the C6-C60 aryl group are a phenyl group, a naphthyl group, an anthracenyl group, a phenanthrenyl group, a pyrenyl group, and a chrysenyl group. When the C6-C60 aryl group and the C6-C60 arylene group each include two or more rings, the rings may be fused to each other.

A C1-C60 heteroaryl group used herein refers to a monovalent group having a carbocyclic aromatic system that has at least one heteroatom selected from N, O, P, and S as a ring-forming atom, and 1 to 60 carbon atoms. A C1-C60 heteroarylene group used herein refers to a divalent group having a carbocyclic aromatic system that has at least one heteroatom selected from N, O, P, and S as a ring-forming atom, and 1 to 60 carbon atoms. Detailed examples of the C1-C60 heteroaryl group are a pyridinyl group, a pyrimidinyl group, a pyrazinyl group, a pyridazinyl group, a triazinyl group, a quinolinyl group, and an isoquinolinyl group. When the C1-C60 heteroaryl group and the C1-C60 heteroarylene group each include two or more rings, the rings may be fused to each other.

A C6-C60 aryloxy group used herein indicates -OA102 (wherein A102 is the C6-C60 aryl group), and a C6-C60 arylthio group used herein indicates -SA103 (wherein A103 is the C6-C60 aryl group).

A monovalent non-aromatic condensed polycyclic group (e.g., a group having 8 to 60 carbon atoms) used herein refers to a monovalent group that has two or more rings condensed to each other, has carbon atoms only as a ring-forming atom, and has non-aromacity in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group (e.g., a group having 1 to 60 carbon atoms) used herein refers to a monovalent group that has two or more rings condensed to each other, has heteroatoms as a ring-forming atom selected from N, O, P, and S, in addition to C, and has non-aromacity in the entire molecular structure. A detailed example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

At least one of substituents of the substituted C3-C10 cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$); a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —S($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and each of $Q_{31}$ to $Q_{37}$ may be independently selected from a hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that a molar equivalent of A was identical to a molar equivalent of B.

EXAMPLE

Synthesis Example 1

Synthesis of Compound EH1-401

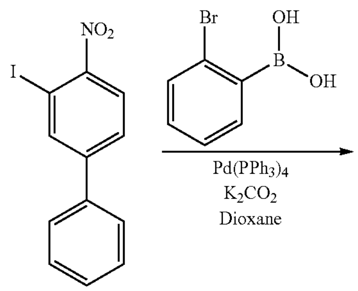

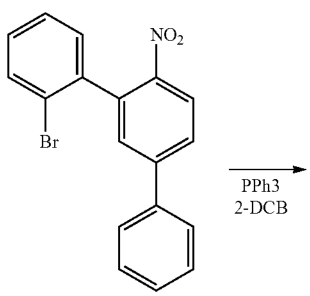

Intermediate (1)

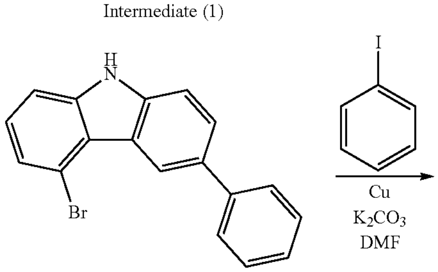

Intermediate (2)

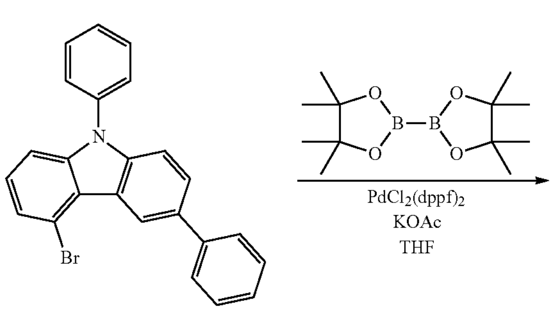

Intermediate (3)

-continued

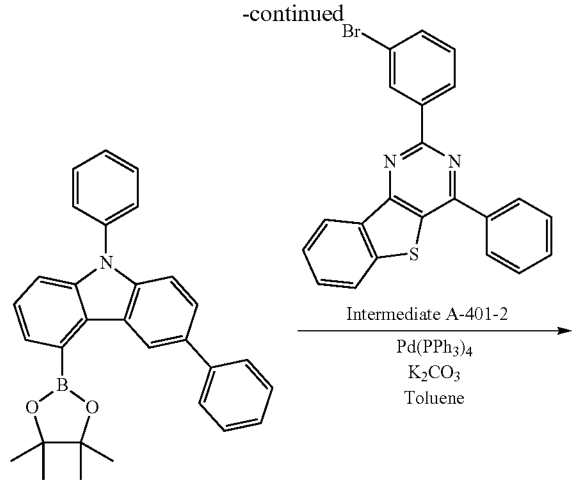

Intermediate A-401-1

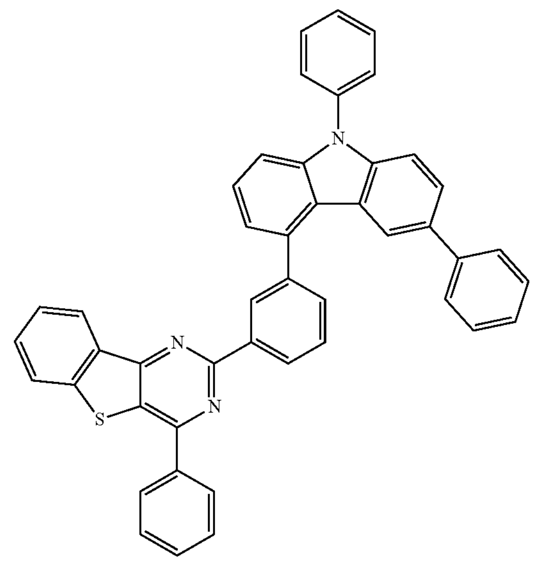

Compound EH1-401

Synthesis of Intermediate (1)

20.1 g (61.8 mmol) of 3-iodo-4-nitro-1,1'-biphenyl, 18.6 g (92.7 mmol) of (2-bromophenyl)boronic acid, 2.4 g (9.2 mmol) of triphenylphosphine, 0.7 g (3.1 mmol) of Tetrakis (triphenylphosphine)palladium(0) ($Pd(PPh_3)_4$), and 17.1 g (123.7 mmol) of potassium carbonate ($K_2CO_3$) were added to a two-necked flask, and then, 800 ml of toluene and 80 ml of $H_2O$ were added thereto. The mixture was refluxed under argon atmosphere. Afterwards, the reaction solution was cooled to room temperature, and then, an organic layer was extracted therefrom using ethyl acetate (EA). The organic layer was dried using magnesium sulfate ($MgSO_4$) to remove moisture therefrom, and then, was concentrated and subjected to a column chromatography (hexane/EA=10/1) to obtain 47 g (yield=75%) of Intermediate (1).

1H NMR (CDCl3, 300 MHz): 8.22 (d, 1H), 7.78 (dd, 1H), 7.70~7.64 (m, 3H), 7.56 (d, 1H), 7.52~7.39 (m, 4H), 7.33-7.26 (m, 2H).

Synthesis of Intermediate (2)

25.8 g (72.9 mmol) of Intermediate (1) and 57.4 g (218.8 mmol) of $PPh_3$ were added to a flask, and then, 80 ml of 1,2-dichlorobenzene (DCB) was added thereto. The mixture was stirred for 12 hours at a temperature of 150° C. under argon atmosphere. DCB was removed therefrom by distillation, and then, was cooled to room temperature and dissolved in a small amount of toluene. The reaction solution was refined by performing a column chromatography (hexane) to obtain 15 g (yield=64%) of Intermediate (2).

$^1$H NMR ($CDCl_3$, 300 MHz): 8.99 (s, 1H), 8.20 (b, 1H), 7.75~7.72 (m, 3H), 7.51~7.46 (m, 3H), 7.43-7.27 (m, 4H).

Synthesis of Intermediate (3)

32.0 g (99.3 mmol) of Intermediate (2), 0.63 g (9.9 mmole) of Cu, and 27.1 g (198.6 mmol) of $K_2CO_3$ were added to a two-necked flask, and then, 320 ml of dimethylformamide (DMF) was added thereto. Under argon atmosphere, 22.5 ml (198.6 mmol) of iodobenzene was added to the mixture. Afterwards, the mixture was refluxed for 12 hours, and then, cooled to room temperature. An organic layer was extracted therefrom using EA and dried using $MgSO_4$ to remove moisture therefrom. The remaining product was concentrated and subjected to a column chromatography (hexane) to obtain 25 g (yield=64%) of Intermediate (3) in a white solid. Intermediate (3) was identified by performing 1H-NMR and liquid chromatography-mass spectrometry (LC/MS).

1H NMR (CDCl3, 300 MHz): 9.07 (d, 1H), 7.75~7.71 (m, 3H), 7.69~7.61 (m, 2H), 7.55~7.40 (m, 7H), 7.37~7.31 (m, 2H), 7.26~7.22 (dd, 1H)

LC/MS, calculated: $C_{24}H_{16}BrN$=398.29. found: m/z=398.1 (M+, 100%).

Synthesis of Intermediate A-401-1

33 g (83 mmol) of Intermediate (3), 25 g (100 mmol) of 4,4,4',4',5,5,5',5'-octamethyl-2,2'-bi(1,3,2-dioxaborolane), 21 g (210 mmol) of potassium acetate (KOAc), and 3.4 g (4.2 mmol) of 1,1'-bis(diphenylphosphino)ferrocene-palladium(II)dichloride ($PdCl_2(dppf)_2$) were added to a two-necked flask, and then, 200 mL of THF was added thereto. Afterwards, the mixture was stirred for 24 hours at a temperature of 70° C. After the completion of the reaction, an organic layer was extracted from the reaction solution using water and EA, and then, dried using $MgSO_4$ to remove moisture therefrom. The reaction solution was refined by performing a column chromatograph (methylene chloride/n-hexane=3/2, silica gel) to obtain 26 g (yield=60%) of Intermediate A-401-1 in a white solid.

$^1$H NMR ($CDCl_3$, 300 MHz): 9.52 (s, 1H), 7.79~7.32 (m, 15H), 1.50 (s, 12H).

Synthesis of Compound EH1-401

16.0 g (36 mmol) of Intermediate A-401-1, 15.0 g (36 mmol) of Intermediate A-401-2, 12 g (89.8 mmol) of $K_2CO_3$, and 2.1 g (1.8 mmol) of $Pd(PPh_3)_4$ were added to 50 mL of toluene and 20 ml of $H_2O$, and then, the mixture was stirred for 24 hours at a temperature of 120° C. After the completion of the reaction, water was added to the reaction solution, and the reaction solution was stirred and filtered. The dark gray solid product obtained therefrom was then dissolved in hot toluene, and filtered. The toluene solution obtained therefrom was mixed with methanol to allow precipitation. After filtration, the solid product obtained therefrom was refined to 1-chlorobenzene by recrystallization, so as to obtain 14.0 g (yield=60%) of Compound EH1-401 in yellow crystals. The structure of Compound EH1-401 obtained therefrom was identified by performing LC/MS.

LC/MS, calculated: $C_{46}H_{29}N_3S$=655.21. found: m/z=655.20 (M+, 100%).

Synthesis Example 2

Synthesis of Compound EH1-402

Compound EH1-402 was synthesized in the same manner as in Synthesis of Intermediate (1) of Synthesis Example 1, except that (3-bromophenyl)boronic acid was used instead of (2-bromophenyl)boronic acid.

EH1-402

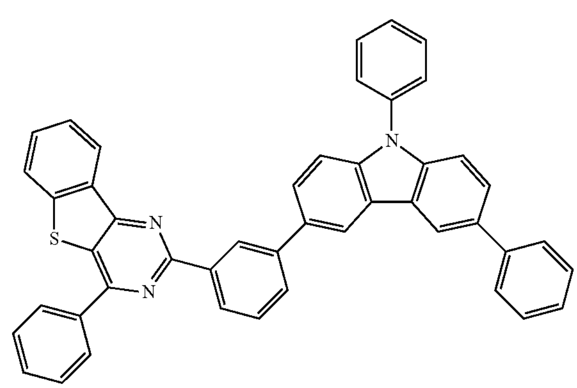

Synthesis Example 3

Synthesis of Compound EH3-2

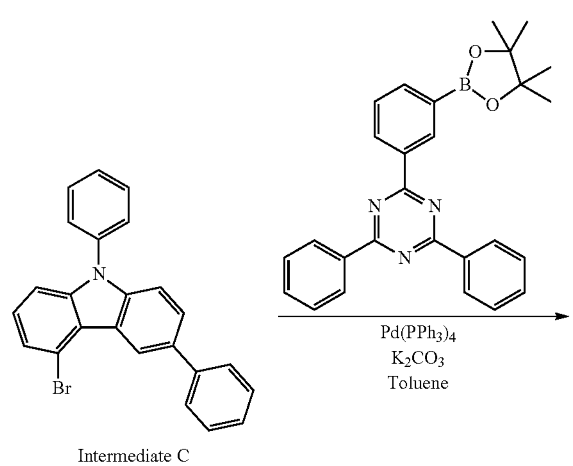

-continued

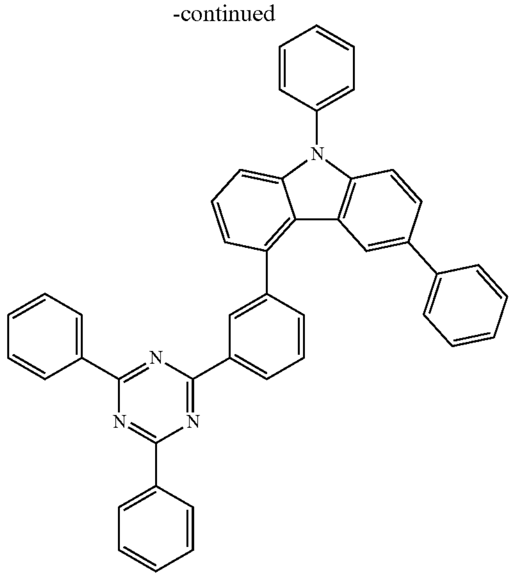

Compound EH3-2

17.5 g (42 mmol) of Intermediate C, 20.0 g (46 mmol) of 2,4-diphenyl-6-(2-(4,4,5,5-tetramethyl-1,3,2-dioxaborolan-2-yl)phenyl)-1,3,5-triazine, 14 g (104 mmol) of $K_2CO_3$, and 2.4 g (2.1 mmol) of $Pd(PPh_3)_4$ were added to 80 mL of toluene, and then, the mixture was stirred for 48 hours at a temperature of 120° C. After the completion of the reaction, water was added to the reaction solution, and the reaction solution was stirred and filtered. The dark gray solid product obtained therefrom was then dissolved in hot toluene, and filtered. The toluene solution obtained therefrom was mixed with methanol to allow precipitation. After filtration, the solid product obtained therefrom was refined to 1-chlorobenzene by recrystallization, so as to obtain 18.0 g (yield=70%) of Compound EH3-2 in white powders. Compound EH3-2 obtained therefrom was identified by performing 1H-NMR and LC/MS.

$^1$H NMR (CDCl3, 300 MHz): 9.17 (s, 1H), 8.92 (d, 1H), 8.77 (dd, 4H), 7.95~7.68 (m, 7H), 7.66~7.40 (m, 14H), 7.27~7.19 (m, 3H).

LC/MS, calculated: $C_{45}H_{30}N_4$=626.75. found: m/z=626.2 (M+, 100%).

Synthesis Example 4

Synthesis of Compound EH3-81

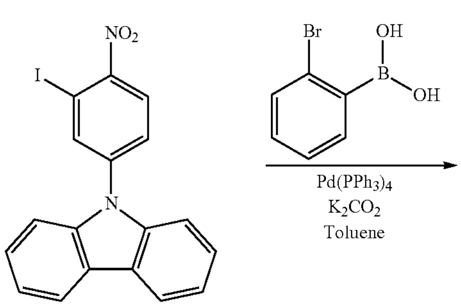

-continued

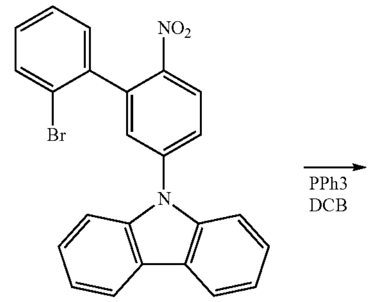

Intermediate E

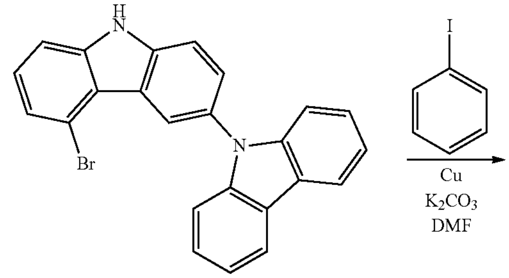

Intermediate F

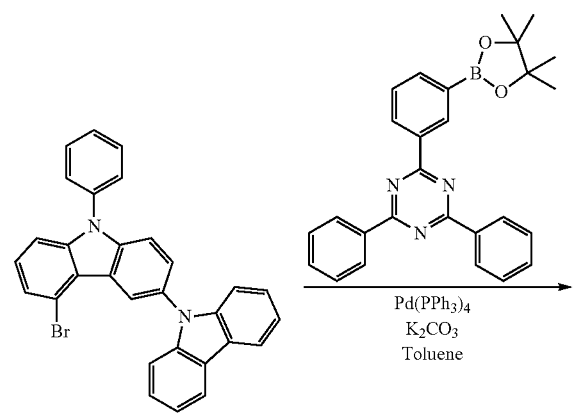

Intermediate G

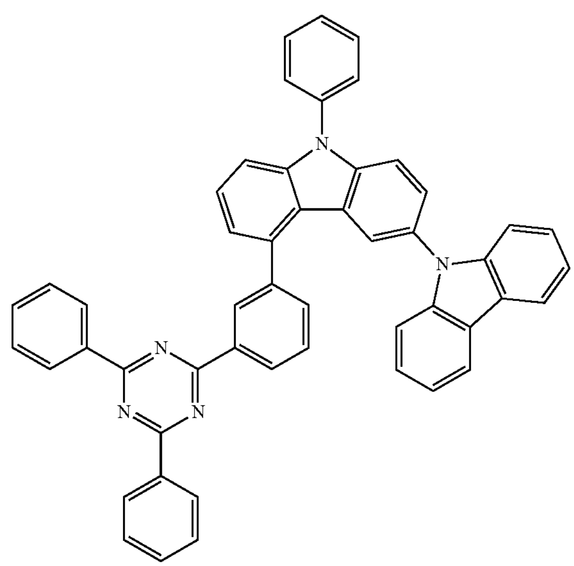

Compound EH3-81

Synthesis of Intermediate E

Intermediate E (in a white solid, yield=60%) was synthesized in the same manner as in Synthesis of Intermediate (1) of Synthesis Example 1, except that 9-(3-iodo-4-nitrophenyl)-9H-carbazole was used instead of 3-iodo-4-nitro-1,1'-biphenyl. Intermediate E synthesized therefrom was identified by performing LC/MS.

LC/MS, calculated: $C_{24}H_{15}N_2O_2$=443.29. found: m/z=442.0 (M+, 100%).

Synthesis of Intermediate F

Intermediate F (in a white solid, yield=55%) was synthesized in the same manner as in Synthesis of Intermediate (2) of Synthesis Example 1, except that Intermediate E was used instead of Intermediate (1). Intermediate F synthesized therefrom was identified by performing LC/MS.

LC/MS, calculated: $C_{24}H_{15}BrN_2$=411.29. found: m/z=410.0 (M+, 100%).

Synthesis of Intermediate G

Intermediate G (in a white solid, yield=62%) was synthesized in the same manner as in Synthesis of Intermediate (3) of Synthesis Example 1, except that Intermediate F was used instead of Intermediate (2). Intermediate G synthesized therefrom was identified by performing LC/MS.

LC/MS, calculated: $C_{30}H_{19}BrN_2$=487.39. found: m/z=486.0 (M+, 100%).

Synthesis of Compound EH3-81

Compound EH3-81 (in a white solid, yield=68%) was synthesized in the same manner as in Synthesis of Compound EH3-2 of Synthesis Example 3, except that Intermediate G was used instead of Intermediate C, and then, the solid product obtained therefrom was refined to N-methyl-2-pyrrolidone (NMP). Compound EH3-81 obtained therefrom was identified by performing LC/MS.

LC/MS, calculated: $C_{51}H_{33}N_5$=715.84. found: m/z=715.2 (M+, 100%).

Synthesis Example 5

Synthesis of Compound EH3-91

Compound EH3-9 was synthesized in the same manner as in Synthesis Example 3, except that 2,4-diphenyl-6-(2-(4,4,5,5-tetramethyl-1,3,2-dioxaborolan-2-yl)-3-methyl-phenyl)-1,3,5-triazine was used instead of 12,4-diphenyl-6-(2-(4,4,5,5-tetramethyl-1,3,2-dioxaborolan-2-yl)phenyl)-1,3,5-triazine

EH3-91

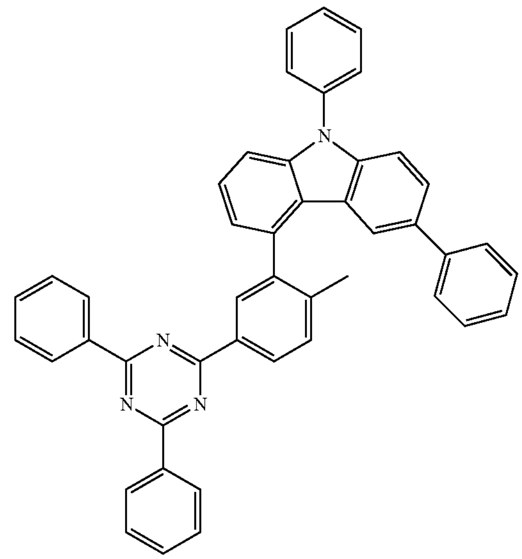

Synthesis Example 6

Synthesis of Compound HH1-1

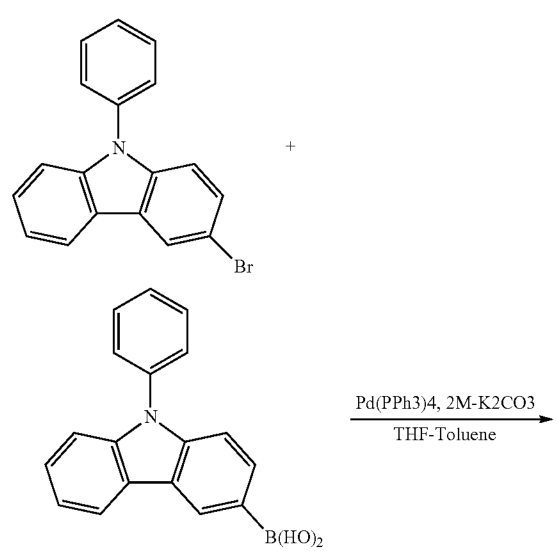

-continued

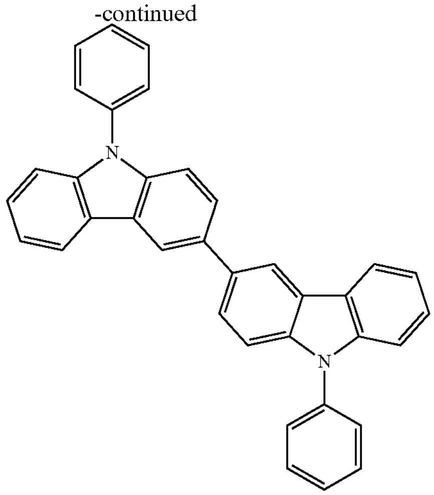

Compound HH1-1

In a 500 mL, round-bottom flask equipped with a stirring device, 16.62 g (51.59 mmol) of 3-bromo-N-phenylcarbazole, 17.77 g (61.91 mmol) of N-phenylcarbazole-3-ylboronic acid, 200 mL of tetrahydrofuran:toluene (1:1), and 100 mL of 2M-potassium carbonate solution were mixed under nitrogen atmosphere, and then, 2.98 g (2.58 mmol) of tetrakis triphenylphosphine palladium(0) was added thereto. The mixture was heated under reflux for 12 hours under the nitrogen stream. After the completion of the reaction, the reaction solution was added to methanol and solid products were filtered therefrom. The resulting solid products obtained therefrom were sufficiently washed with water and methanol, dried, and dissolved by heating in 1 L of chlorobenzene. The resulting solution was subjected to silica gel to perform filtration. After the solvent was completely removed therefrom, the remaining product was dissolved by heating in 500 mL of toluene, and then, was refined by recrystallization, so as to obtain 16.05 g (yield=64%) of Compound HH1-1.

calculated. $C_{36}H_{24}N_2$: C, 89.23; H, 4.99; N, 5.78. found: C, 89.45; H, 4.89; N, 5.65.

Synthesis Example 7

Synthesis of Compound HH1-2

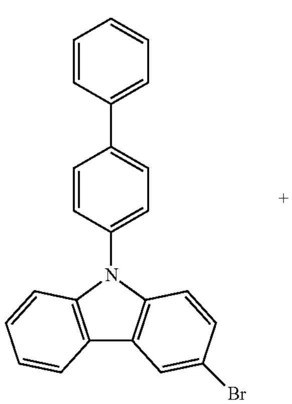

-continued

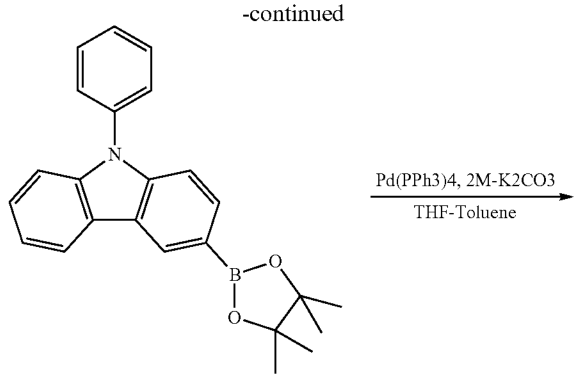

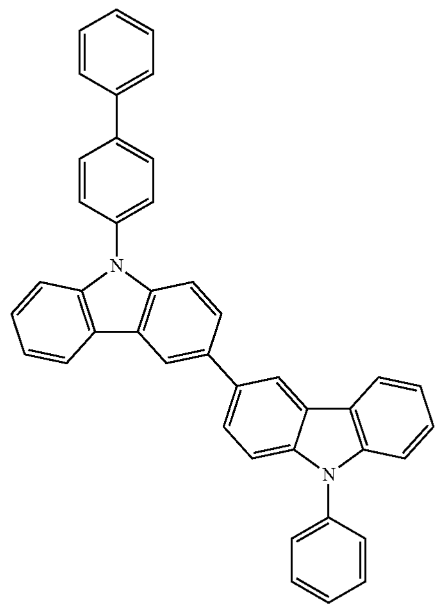

Compound HH1-2

In a 500 mL, round-bottom flask equipped with a stirring device, 20.00 g (50.21 mmol) of 3-bromo-N-biphenylcarbazole, 18.54 g (50.21 mmol) of N-phenylcarbazole-3-boronic ester, 175 mL of tetrahydrofuran:toluene (1:1), and 75 mL of 2M-potassium carbonate solution were mixed under nitrogen atmosphere, and then, 2.90 g (2.51 mmol) of tetrakistri phenylphosphine palladium(0) was added thereto. The mixture was heated under reflux for 12 hours under the nitrogen stream. After the completion of the reaction, the reaction solution was added to methanol and solid products were filtered therefrom. The resulting solid products obtained therefrom were sufficiently washed with water and methanol, dried, and dissolved by heating in 700 mL of chlorobenzene. The resulting solution was subjected to silica gel to perform filtration. After the solvent was completely removed therefrom, the remaining product was dissolved by heating in 400 mL of chlorobenzene, and then, was refined by recrystallization, so as to obtain 9.15 g (yield=68%) of Compound HH1-2 1.

calcd. $C_{42}H_{28}N_2$: C, 89.97; H, 5.03; N, 5.00. found: C, 89.53; H, 4.92; N, 4.89.

Synthesis Example 8

Synthesis of Compound HH1-3

Compound HH1-3 was synthesized in the same manner as in Synthesis Example 7, except that 3-bromo-N-metabiphenylcarbazole was used instead of 3-bromo-N-biphenylcarbazole.

HH1-3

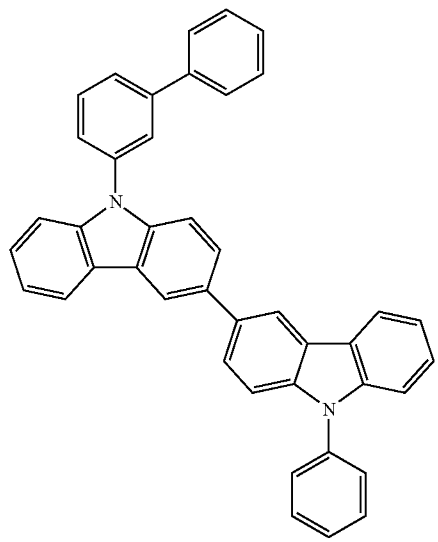

Synthesis Example 9

Synthesis of Compound HH1-7

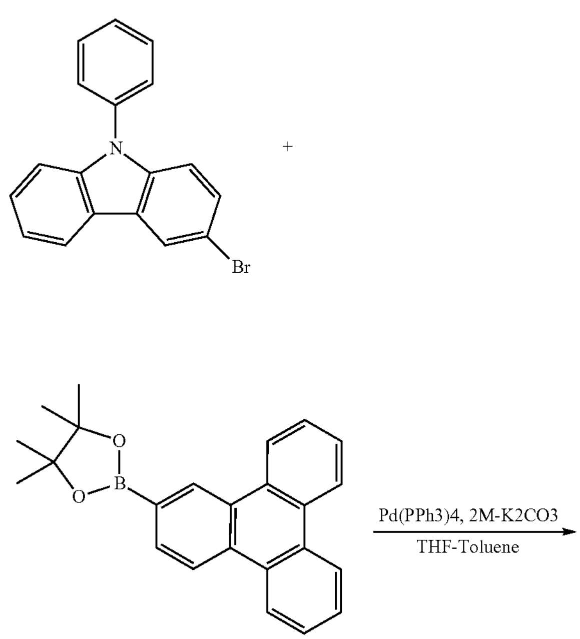

-continued

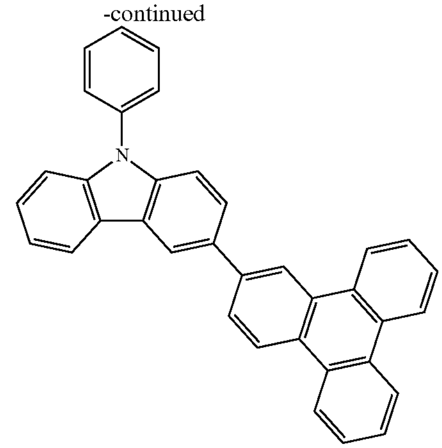

Compound HH1-7

In a 500 mL, round-bottom flask equipped with a stirring device, 10.00 g (31.04 mmol) of 3-bromo-N-phenylcarbazole, 10.99 g (31.04 mmol) of 2-triphenylene boronic ester, 150 mL of tetrahydrofuran:toluene (1:1), and 75 mL of 2M-potassium carbonate solution were mixed under nitrogen atmosphere, and then, 1.79 g (1.55 mmol) of tetrakistri phenylphosphine palladium(0) was added thereto. The mixture was heated under reflux for 12 hours under the nitrogen stream. After the completion of the reaction, the reaction solution was added to methanol and solid products were filtered therefrom. The resulting solid products obtained therefrom were sufficiently washed with water and methanol, dried, and dissolved by heating in 400 mL of chlorobenzene. The resulting solution was subjected to silica gel to perform filtration. After the solvent was completely removed therefrom, the remaining product was dissolved by heating in 300 mL of toluene, and then, was refined by recrystallization, so as to obtain 8.74 g (yield=60%) of Compound HH1-7.

calculated: $C_{36}H_{23}N$: C, 92.08; H, 4.94; N, 2.98. found: C, 92.43; H, 4.63; N, 2.84.

Evaluation Example 1

Evaluation of Photoluminescence (PL) Spectrum

A quartz substrate, which was washed with chloroform and pure water, was prepared, and then, each of predetermined or given compounds shown in Table 1 below was formed thereon by vacuum deposition at a vacuum pressure of $10^{-7}$ torr. Accordingly, Films B, D, F, BD, and BF were formed, each of which films had a thickness of 400 Å.

TABLE 1

| Film No. | Compound in a film |
|---|---|
| Film B | Compound HH1-2 |
| Film D | Compound EH1-401 |
| Film F | Compound EH3-81 |
| Film BD | Compound EH1-401:Compound HH1-2 (at a molar ratio of 7:3) |
| Film BF | Compound EH3-81:Compound HH1-2 (at a molar ratio of 5:5) |

Next, an ISC PC1 spectrofluorometer equipped with a xenon lamp was used to evaluate photoluminecscence (PL) spectrum of each of Films B, D, F, BD, and BF above. The results are shown in FIGS. 2A and 2B.

Figure 2A:
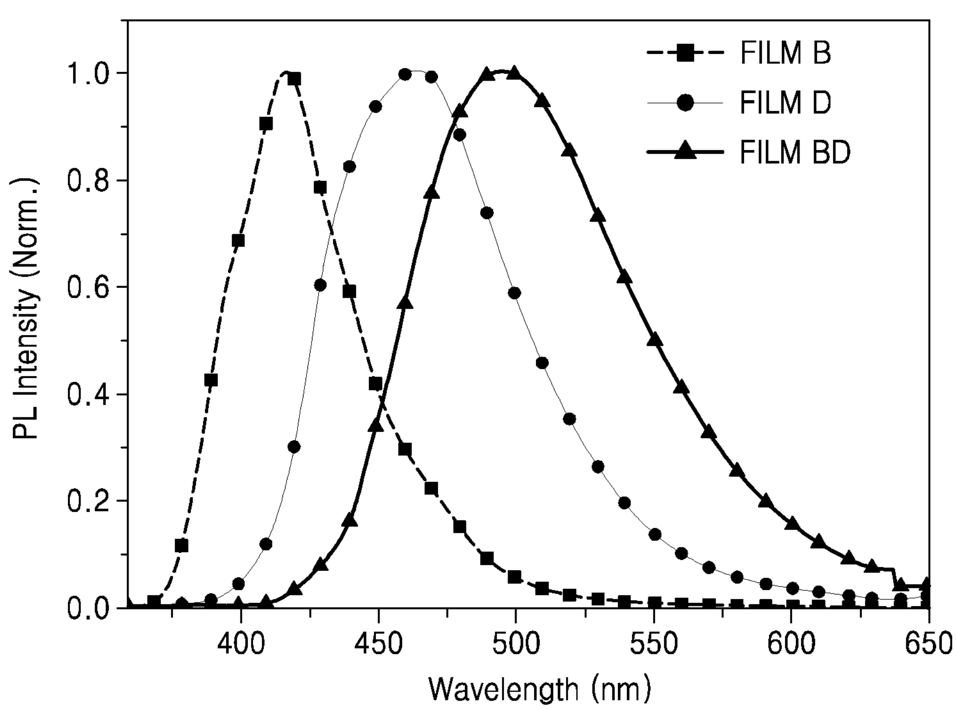
FIGS. 2A and 2B illustrate photoluminescence spectra in films using predetermined or given compounds.
Figure 2B:
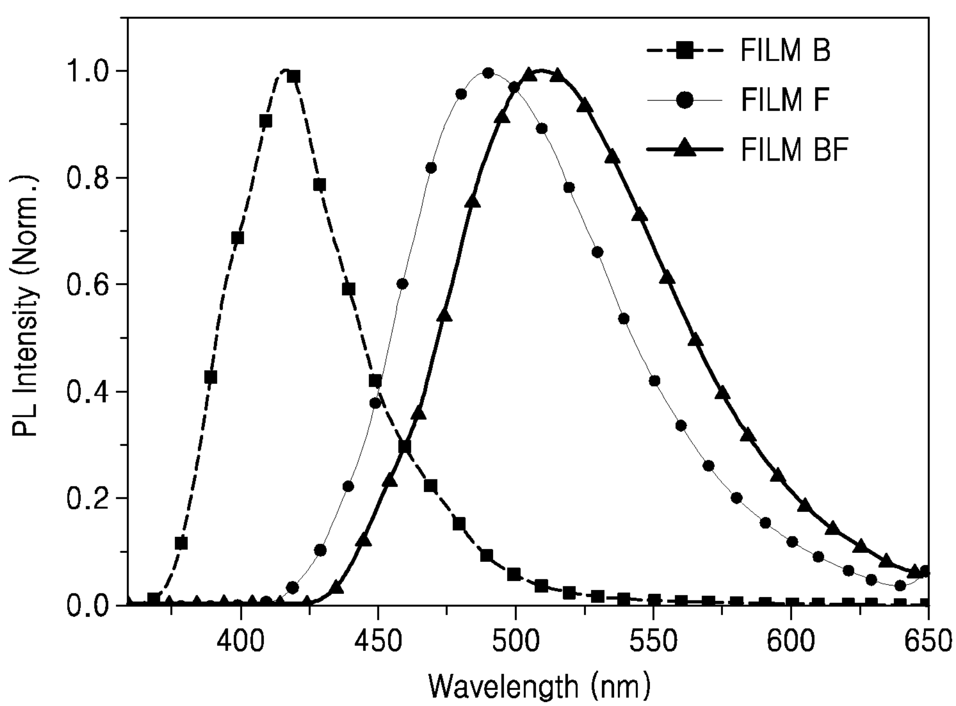

In FIG. 2A, it was confirmed that the PL spectrum of Film BD was shifted in the long wavelength direction as compared with the PL spectra of Films B and D. In FIG. 2B, it was confirmed that the PL spectrum of Film BF was shifted in the long wavelength direction as compared with the PL spectra of Films B and F. That is, it was confirmed that any combination of the compounds used to form Films BD and BF was capable of forming an exciplex.

Example

Manufacture of Organic Light-Emitting Device (OLED)

A glass substrate on which an ITO electrode was formed as an anode was cut into a size of 50 mm×50 mm×0.5 mm, sonicated using acetone isopropyl alcohol and pure water each for 15 minutes, and cleaned by the exposure to UV ozone for 30 minutes.

Compound HT3 and TCNPQ (a concentration of TCNPQ was 3 wt %) were co-deposited on the anode to form a hole injection layer having a thickness of 100 Å. Compound HT3 was deposited on the hole injection layer to form a hole transport layer having a thickness of 1,700 Å.

An electron-transporting host, a hole-transporting host, and Compound PD79 (having a concentration of 10 wt % based on 100 wt % of an emission layer) were co-deposited on the hole transport layer to form an emission layer having a thickness of 400 Å.

Compound ET16 and LiQ were co-deposited on the emission layer at a weight ratio of 5:5 to form an electron transport layer having a thickness of 360 Å. Then, LiQ was deposited on the electron transport layer to form an electron injection layer having a thickness of 5 Å. A MgAg electrode (in which an amount of Ag was 10 wt %) was deposited on the electron injection layer to a thickness of 120 Å. Compound HT13, above, was deposited on the MgAg electrode to form a capping layer having a thickness of 600 Å, thereby completing the manufacture of an organic light-emitting device (OLED). The electron-transporting host, the hole-transporting host, and the volume ratio of the electron-transporting host to the hole-transporting host used in the manufacture of each of OLEDs 1 to 7 and A to C are as shown in Tables 2 and 3 below. In Tables 2 and 3, values of Equations 1 to 7 were evaluated based on each of the HOMO, LUMO and S1 energy levels evaluated by using a density functional theory ("DFT") method of a Gaussian program (structurally optimized or improved at a level of B3LYP, 6-31G(d,p)).

TABLE 2

| OLED No. | Electron-transporting host | Hole-transporting host | Volume ratio[1] | LUMO (eV) Of electron-transporting host (absolute value) | LUMO (eV) Of hole-transporting host (absolute value) | Value of Equation 1 | Value of Equation 6 | Value of Equation 7 | Value of Equation 2 |
|---|---|---|---|---|---|---|---|---|---|
| 1 | Compound EH1-401 | Compound HH1-2 | 5:5 | 1.786 | 0.989 | 0.797 | 0.20 | 0.00 | 0.07 |
| 2 | Compound EH1-401 | Compound HH1-2 | 6:4 | 1.786 | 0.989 | 0.797 | 0.20 | 0.00 | 0.07 |
| 3 | Compound EH1-402 | Compound HH1-2 | 6:4 | 1.775 | 0.989 | 0.786 | 0.20 | 0.00 | 0.08 |
| 4 | Compound EH3-2 | Compound HH1-2 | 4:6 | 1.800 | 0.989 | 0.811 | 0.21 | 0.00 | 0.06 |
| 5 | Compound EH3-2 | Compound HH1-3 | 4:6 | 1.800 | 0.964 | 0.836 | 0.21 | 0.01 | 0.14 |
| 6 | Compound EH3-81 | Compound HH1-2 | 4:6 | 1.809 | 0.989 | 0.820 | 0.20 | 0.00 | 0.06 |
| 7 | Compound EH3-81 | Compound HH1-2 | 5:5 | 1.809 | 0.989 | 0.820 | 0.20 | 0.00 | 0.06 |
| A | Compound A | Compound HH1-1 | 5:5 | 1.816 | 0.690 | 1.126 | 0.05 | 0.06 | 0.27 |
| B | Compound B | Compound HH1-2 | 4:6 | 1.730 | 0.989 | 0.741 | n/a | n/a | n/a |
| C | TATC | B3PYMPM | 5:5 | 2.151 | 0.985 | 1.116 | 0.22 | 0.00 | 0.20 |

[1]A volume ratio of the electron-transporting host: the hole-transporting host.

<Equation 1> $0.75\ eV \leq |LUMO_{H(ET)} - LUMO_{H(HT)}| \leq 0.90\ eV$

<Equation 6> $\min\{E(S_{1,H(HT)}), E(S_{1,H(ET)})\} - E(S_{1,EX}) > 0.15\ eV$

<Equation 7> $E(S_{1,EX}) - E(T_{1,EX}) < 0.15\ eV$

<Equation 2> $|E(S_{1,\ H(ET)}) - E(S_{1,\ H(HT)})| < 0.15\ Ev$

TABLE 3

| OLED No. | Electron-transporting host | Electron-transporting host | Volume ratio[2] | Value of Equation 3 | Value of Equation 4 | Value of Equation 5 |
|---|---|---|---|---|---|---|
| 1 | Compound EH1-401 | Compound HH1-2 | 5:5 | 0.285 | 0.170 | 0.136 |
| 2 | Compound EH1-401 | Compound HH1-2 | 6:4 | 0.285 | 0.170 | 0.136 |

TABLE 3-continued

| OLED No. | Electron-transporting host | Electron-transporting host | Volume ratio[2] | Value of Equation 3 | Value of Equation 4 | Value of Equation 5 |
|---|---|---|---|---|---|---|
| 3 | Compound EH1-402 | Compound HH1-2 | 6:4 | 0.285 | 0.194 | 0.125 |
| 4 | Compound EH3-2 | Compound HH1-2 | 4:6 | 0.285 | 0.250 | 0.150 |
| 5 | Compound EH3-2 | Compound HH1-3 | 4:6 | 0.282 | 0.253 | 0.150 |
| 6 | Compound EH3-81 | Compound HH1-2 | 4:6 | 0.285 | 0.177 | 0.159 |
| 7 | Compound EH3-81 | Compound HH1-2 | 5:5 | 0.285 | 0.177 | 0.159 |

2: A volume ratio of the electron-transporting host:the hole-transporting host.

<Equation 3> $|HOMO_{H(HT)} - HOMO_{HTL}| < 0.3$ eV

<Equation 4> $0.15 \text{ eV} \leq |HOMO_{H(HT)} - HOMO_{H(ET)}| \leq 2.0$ eV

<Equation 5> $|LUMO_{H(ET)} - LUMO_{ETL}| < 0.2$ eV

<Compound A>

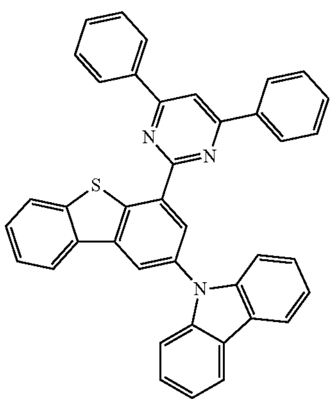 [SMILES: c1ccc(-c2cc(-c3ccccc3)nc(-c3cc(-n4c5ccccc5c5ccccc54)cc4c3sc3ccccc34)n2)cc1]

<Compound B>

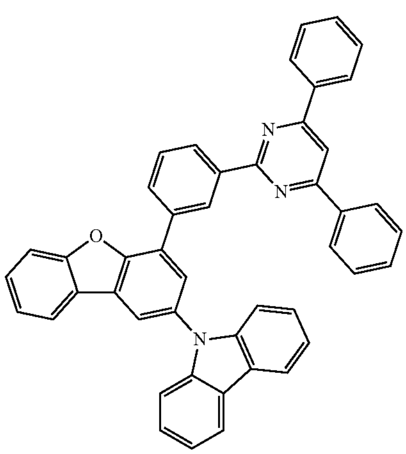 [SMILES: c1ccc(-c2cc(-c3ccccc3)nc(-c3cccc(-c4cc(-n5c6ccccc6c6ccccc65)cc5c4oc4ccccc45)c3)n2)cc1]

TABLE 3-continued
| OLED No. | Electron-transporting host | Electron-transporting host | Volume ratio² | Value of Equation 3 | Value of Equation 4 | Value of Equation 5 |
|---|---|---|---|---|---|---|
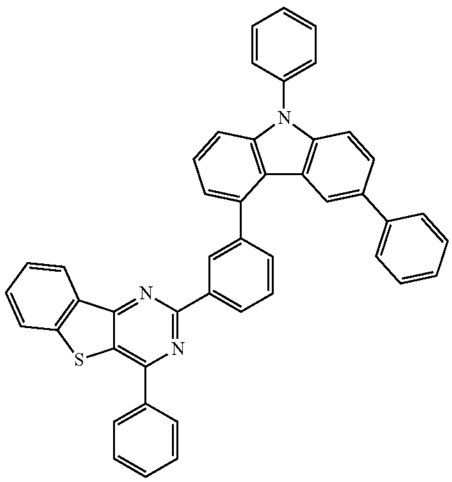 [SMILES: c1ccc(-c2ccc3c(c2)c2c(-c4cccc(-c5nc(-c6ccccc6)c6sc7ccccc7c6n5)c4)cccc2n3-c2ccccc2)cc1]
EH1-401
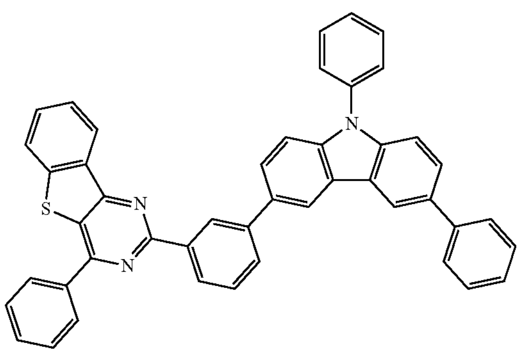 [SMILES: c1ccc(-c2ccc3c(c2)c2cc(-c4cccc(-c5nc(-c6ccccc6)c6sc7ccccc7c6n5)c4)ccc2n3-c2ccccc2)cc1]
EH1-402
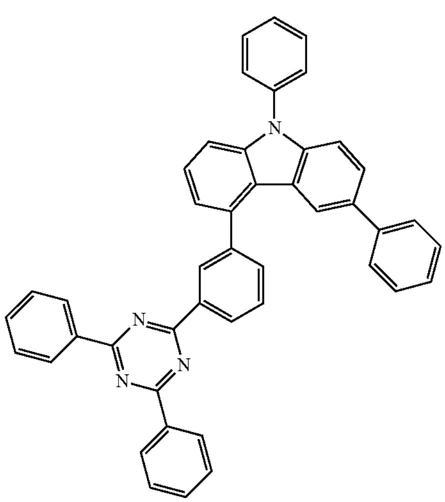 [SMILES: c1ccc(-c2ccc3c(c2)c2c(-c4cccc(-c5nc(-c6ccccc6)nc(-c6ccccc6)n5)c4)cccc2n3-c2ccccc2)cc1]

TABLE 3-continued
| OLED No. | Electron-transporting host | Electron-transporting host | Volume ratio[2] | Value of Equation 3 | Value of Equation 4 | Value of Equation 5 |
|---|---|---|---|---|---|---|
EH3-2
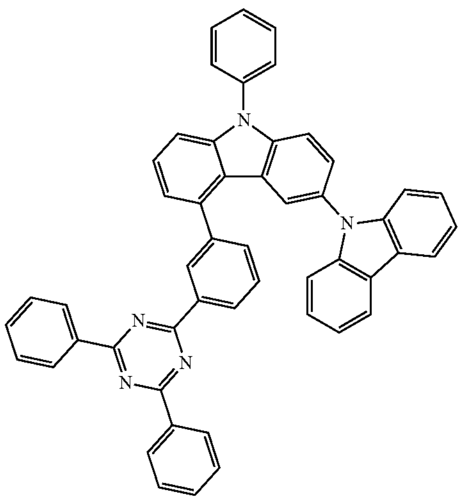 [SMILES: c1ccc(-c2nc(-c3ccccc3)nc(-c3cccc(-c4cccc5c4c4cc(-n6c7ccccc7c7ccccc76)ccc4n5-c4ccccc4)c3)n2)cc1]
EH3-81
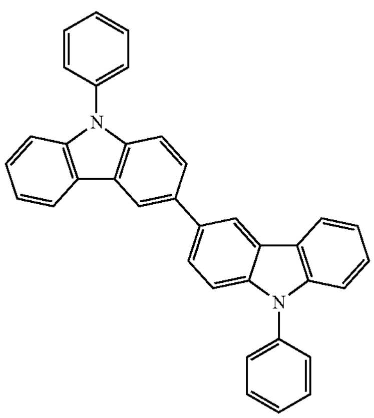 [SMILES: c1ccc(-n2c3ccccc3c3cc(-c4ccc5c(c4)c4ccccc4n5-c4ccccc4)ccc32)cc1]
HH1-1
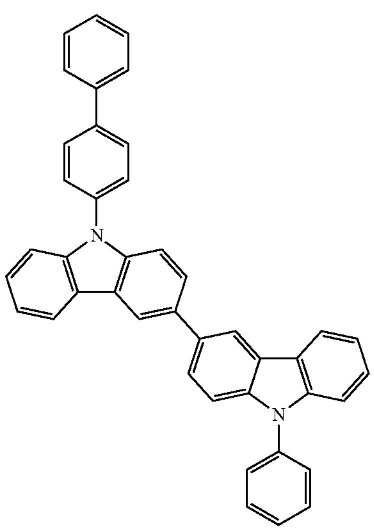 [SMILES: c1ccc(-c2ccc(-n3c4ccccc4c4cc(-c5ccc6c(c5)c5ccccc5n6-c5ccccc5)ccc43)cc2)cc1]

TABLE 3-continued

| OLED No. | Electron-transporting host | Electron-transporting host | Volume ratio[2] | Value of Equation 3 | Value of Equation 4 | Value of Equation 5 |
|---|---|---|---|---|---|---|

HH1-2

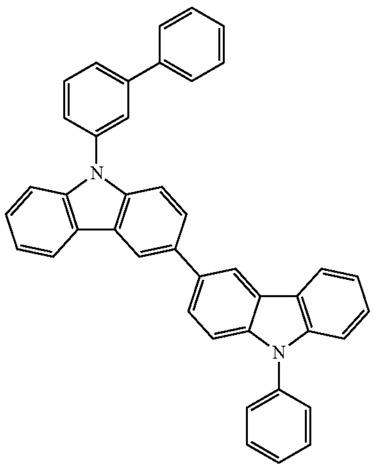 [SMILES: c1ccc(-c2cccc(-n3c4ccccc4c4cc(-c5ccc6c(c5)c5ccccc5n6-c5ccccc5)ccc43)c2)cc1]

HH1-3

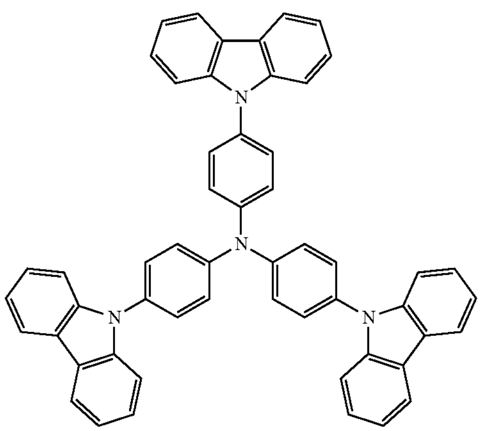 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]

TCTA

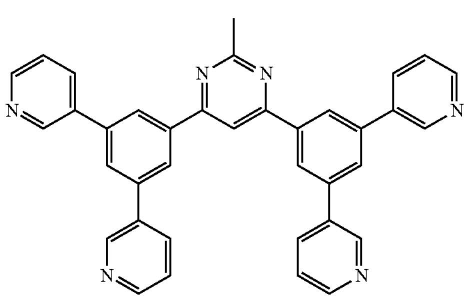 [SMILES: Cc1nc(-c2cc(-c3cccnc3)cc(-c3cccnc3)c2)cc(-c2cc(-c3cccnc3)cc(-c3cccnc3)c2)n1]

B3PYMPM

Evaluation Example 2

The OLEDs 1 to 7 and A to C were evaluated in terms of lifespan ($T_{95}$) characteristics, and the OLEDs 1, 2, 6, and 7 were evaluated using a current-voltage meter (Keithley 2400) and a brightness photometer (Minolta Cs-1000A) in terms of driving voltage, brightness, power efficiency, color purity, roll off ratios, and life span ($T_{95}$) characteristics. The results are shown in Tables 4 and 5 below. Referring to the tables, $T_{95}$ (at 9,000 nit) refers to lifespan data in view of times taken to reach 95% of brightness if the initial brightness was considered as 100%. The roll off ratios was calculated according to <Equation 20> below:

Roll off={1−(efficiency(at 9,000 nit)/maximum efficiency in light emission)}×100% <Equation 20>

TABLE 4

| OLED No. | Electron-transporting host | Hole-transporting host | Volume ratio | Lifespan ($T_{95}$) (hr) |
|---|---|---|---|---|
| 1 | Compound EH1-401 | Compound HH1-2 | 5:5 | 531 |
| 2 | Compound EH1-401 | Compound HH1-2 | 6:4 | 473 |
| 3 | Compound EH1-402 | Compound HH1-2 | 6:4 | 800 |
| 4 | Compound EH3-2 | Compound HH1-2 | 4:6 | 750 |
| 5 | Compound EH3-2 | Compound HH1-3 | 4:6 | 655 |
| 6 | Compound EH3-81 | Compound HH1-2 | 4:6 | 453 |
| 7 | Compound EH3-81 | Compound HH1-2 | 5:5 | 440 |
| A | Compound A | Compound HH1-1 | 5:5 | 200 |
| B | Compound B | Compound HH1-2 | 4:6 | 70 |
| C | TATC | B3PYMPM | 5:5 | 50 |

of 3 wt %) (100 Å)/Compound HT3 (1,000 Å) host:Compound PD79 (10 wt %) (600 Å)/Compound ET1 (100 Å)/Al (100 Å), electron-only devices (EGDs) 11 to 18 having a structure of ITO (1,500 Å)/Mg:Ag (10 wt %) (300 Å)/Liq (10 Å)/Compound ET16:Liq (50 wt %) (200 Å)/host:Compound PD79 (10 wt %) (600 Å)/Compound ET16:Liq (50 wt %) (200 Å)/Liq (10 Å)/Mg:Ag (10 wt %) (300 Å), and OLEDs 11 to 18 (wherein OLEDs 14 and 15 were the same as the OLEDs 1 and 2, respectively) having a structure of ITO (1,500 Å)/Compound HT3:TCNPQ (3 wt %) (100 Å)/Compound HT3 (1,700 Å) host:Compound PD79 (10 wt %) (400 Å)/Compound ET16:Liq (50 wt %) (360 Å)/Liq (5 Å)/Mg:Ag (10 wt %) (120 Å)/HT13 (600 Å) were each manufactured by referring to Examples described above. The host compositions of the HODs 11 to 18, the EODs 11 to 18, and the OLEDs 11 to 18 were shown in Table 6 below.

TABLE 5

| OLED No. | Electron-transporting host | Hole-transporting host | Volume ratio | Driving voltage (V) | Brightness (cd/A) | Current efficiency (lm/W) | CIE_x | CIE_y | Roll off ratio (%) | Lifespan ($L_{95}$) (hr) |
|---|---|---|---|---|---|---|---|---|---|---|
| 1 | Compound EH1-401 | Compound HH1-2 | 5:5 | 4.8 | 88.7 | 57.9 | 0.279 | 0.687 | 14 | 531 |
| 2 | Compound EH1-401 | Compound HH1-2 | 6:4 | 4.7 | 86.6 | 57.6 | 0.259 | 0.699 | 17 | 473 |
| 6 | Compound EH3-81 | Compound HH1-2 | 4:6 | 4.7 | 88.2 | 59.3 | 0.239 | 0.712 | 13 | 453 |
| 7 | Compound EH3-81 | Compound HH1-2 | 5:5 | 4.6 | 93.1 | 64.1 | 0.232 | 0.717 | 14 | 440 |

Referring to Tables 4 and 5, it was confirmed that the OLEDs 1 to 7 satisfying both <Equation 1> and <Equation 2> provided in the present inventive concept had improved lifespan as compared with the OLEDs A to C not satisfying at least one of <Equation 1> and <Equation 2> provided in the present inventive concept.

Evaluation Example 5

Hole-only devices (HODs) 11 to 18 having a structure of ITO (1,500 Å)/Compound HT3:TCNPQ (in a concentration Next, $J_{HOD}$s referring to current density values (mA/cm$^2$) of the HODs 11 to 18 at a voltage of 11.5 V and $J_{EOD}$s referring to current density values (mA/cm$^2$) of the EODs 11 to 18 at a voltage of 4 V were each evaluated using a current-voltage meter (Keithley 2400), and then, calculated by log($J_{HOD}$ (at 11.5 V)/$J_{EOD}$ (at 4 V)). The results are shown in Table 6 below. In addition, the lifespan ($L_{95}$) characteristics of the OLEDs 11 to 18 was evaluated and shown in Table 6 below.

TABLE 6

| HOD, EOD, and OLED No. | Electron-transporting host | Hole-transporting host | Volume ratio of electron-transporting host to hole-transporting host | $J_{HOD}$ (at 11.5 V) (mA/cm$^2$) | $J_{EOD}$ (at 4 V) mA/cm$^2$) | log ($J_{HOD}$ (at 11.5 V)/ $J_{EOD}$ (at 4 V)) (i.e., Type (Compound EH1-401) | Lifespan ($T_{95}$) (hr) |
|---|---|---|---|---|---|---|---|
| 11 | Compound EH1-401 | Compound HH1-2 | 2:8 | 60 | 1 | 1.78 | 92 |
| 12 | Compound EH1-401 | Compound HH1-2 | 3:7 | 46.6 | 2.42 | 1.28 | 291 |
| 13 | Compound EH1-401 | Compound HH1-2 | 4:6 | 38 | 10 | 0.58 | 437 |
| 14 | Compound EH1-401 | Compound HH1-2 | 5:5 | 32.6 | 19 | 0.23 | 531 |
| 15 | Compound EH1-401 | Compound HH1-2 | 6:4 | 25 | 31 | −0.09 | 473 |
| 16 | Compound EH1-401 | Compound HH1-2 | 7:3 | 18.7 | 47.1 | −0.4 | 353 |
| 17 | Compound EH1-401 | Compound HH1-2 | 8:2 | 10 | 60 | −0.78 | 273 |

TABLE 6-continued

| HOD, EOD, and OLED No. | Electron-transporting host | Hole-transporting host | Volume ratio of electron-transporting host to hole-transporting host | $J_{HOD}$ (at 11.5 V) (mA/cm$^2$) | $J_{EOD}$ (at 4 V) mA/cm$^2$) | log ($J_{HOD}$ (at 11.5 V)/ $J_{EOD}$ (at 4 V)) (i.e., Type (Compound EH1-401) | Lifespan ($T_{95}$) (hr) |
|---|---|---|---|---|---|---|---|
| 18 | Compound EH1-401 | Compound HH1-2 | 10:0 | 2.43 | 79.5 | −1.51 | 90 |

Referring to Table 6, it was confirmed that the OLEDs 13 to 15 including Type (Compound EH1-401) in a range of −0.09 to 0.58 had improved lifespan characteristics.

Evaluation Example 6

Hole-only devices (HODs) 21 to 28 having a structure of ITO (1,500 Å)/Compound HT3:TCNPQ (in a concentration of 3 wt %) (100 Å)/Compound HT3 (1,000 Å) host:Compound PD79 (in a concentration of 10 wt %) (600 Å)/Compound ET1 (100 Å)/Al (100 Å), electron-only devices (EGDs) 21 to 28 having a structure of ITO (1,500 Å)/Mg:Ag (10 wt %) (300 Å)/Liq (10 Å)/Compound ET16:Liq (50 wt %) (200 Å)/host:Compound PD79 (10 wt %) (600 Å)/Compound ET16:Liq (50 wt %) (200 Å)/Liq (10 Å)/Mg:Ag (10 wt %) (300 Å), and OLEDs 21 to 28 (wherein OLEDs 23 and 24 were the same as the OLEDs 6 and 7) having a structure of ITO (1,500 Å)/Compound HT3:TCNPQ (3 wt %) (100 Å)/Compound HT3 (1,700 Å) host:Compound PD79 (10 wt %) (400 Å)/Compound ET16:Liq (50 wt %) (360 Å)/Liq (5 Å)/Mg:Ag (10 wt %) (120 Å)/HT13 (600 Å) were each manufactured by referring to Examples described above. The host compositions of the HODs 21 to 28, the EODs 21 to 28, and the OLEDs 21 to 28 were shown in Table 7 below.

Next, $J_{HOD}$s referring to current density values (mA/cm$^2$) of the HODs 21 to 28 at a voltage of 11.5 V and $J_{EOD}$s referring to current density values (mA/cm$^2$) of the EODs 21 to 28 at a voltage of 4 V were each evaluated using a current-voltage meter (Keithley 2400), and then, calculated by log($J_{HOD}$ (at 11.5 V)/$J_{EOD}$ (at 4 V)). The results are shown in Table 7 below. In addition, the lifespan ($L_{95}$) characteristics of the OLEDs 21 to 28 was evaluated and shown in Table 7 below.

TABLE 7

| HOD, EOD, and OLED No. | Electron-transporting host | Hole-transporting host | Volume ratio of electron-transporting host to hole-transporting host | $J_{HOD}$ (at 11.5 V) (mA/cm$^2$) | $J_{EOD}$ (at 4 V) mA/cm$^2$) | log ($J_{HOD}$ (at 11.5 V)/ $J_{EOD}$ (at 4 V)) (i.e., Type (Compound EH1-401) | Lifespan ($T_{95}$) (hr) |
|---|---|---|---|---|---|---|---|
| 21 | Compound EH3-81 | Compound HH1-2 | 2:8 | 90 | 0.2 | 2.65 | 80 |
| 22 | Compound EH3-81 | Compound HH1-2 | 3:7 | 50 | 0.8 | 1.80 | 281 |
| 23 | Compound EH3-81 | Compound HH1-2 | 4:6 | 28 | 2 | 1.15 | 453 |
| 24 | Compound EH3-81 | Compound HH1-2 | 5:5 | 12 | 7 | 0.23 | 440 |
| 25 | Compound EH3-81 | Compound HH1-2 | 6:4 | 5 | 20 | −0.60 | 284 |
| 26 | Compound EH3-81 | Compound HH1-2 | 7:3 | 2 | 39 | −1.30 | 145 |
| 27 | Compound EH3-81 | Compound HH1-2 | 8:2 | 1 | 61 | −1.79 | 80 |
| 28 | Compound EH3-81 | Compound HH1-2 | 10:0 | 0.5 | 90 | −2.26 | 41 |

Referring to Table 7, it was confirmed that OLEDs 23 and 24 including Type (Compound EH3-81) in a range of 0.23 to 1.15 had improved lifespan characteristics.

As described above, according to example embodiments, an organic light-emitting device is characterized by relatively low driving voltage, relatively high efficiency, relatively high brightness, and relatively long lifespan.

It should be understood that example embodiments described therein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. An organic light-emitting device (OLED), comprising
a first electrode;
a second electrode;
an emission layer between the first electrode and the second electrode, the emission layer including an electron-transporting host and a hole-transporting host;
a hole transport region between the first electrode and the emission layer, the hole transport region including a hole transport layer, the hole transport layer including a hole transport material; and
an electron transport region between the emission layer and the second electrode, the electron transport region including an electron transport layer, the electron transport layer includes an electron transport material,
wherein the OLED satisfies Equations 1 to 3 below:

$$0.75\ \text{eV} \leq |LUMO_{H(ET)} - LUMO_{H(HT)}| \leq 0.90\ \text{eV} \qquad \text{<Equation 1>}$$

$$|E(S_{1,H(ET)}) - E(S_{1,H(HT)})| < 0.15\ \text{eV} \qquad \text{<Equation 2>}$$

wherein in Equations 1 and 2,
$LUMO_{H(ET)}$ refers to a lowest unoccupied molecular orbital (LUMO) energy level of the electron-transporting host,
$LUMO_{H(HT)}$ refers to an LUMO energy level of the hole-transporting host,
$E(S_{1,\ H(ET)})$ refers to a singlet energy level of the electron-transporting host,
$E(S_{1,\ H(HT)})$ refers to a singlet energy level of the hole-transporting host, and
the $LUMO_{H(ET)}$, the $LUMO_{H(HT)}$, the $E(S_{1,\ H(ET)})$ and the $E(S_{1,\ H(HT)})$ are evaluated by using a density functional theory method, and $$|HOMO_{H(HT)} - HOMO_{HTL}| < 0.3\ \text{eV} \qquad \text{<Equation 3>}$$

wherein in Equation 3,
$HOMO_{H(HT)}$ refers to a highest occupied molecular orbital of the hole-transporting host,
$HOMO_{HTL}$ refers to an HOMO energy level of the hole transport material, and
the $HOMO_{H(HT)}$ and the $HOMO_{HTL}$ are evaluated by using a density functional theory method, and
wherein the electron-transporting host comprises a compound represented by Formula 1 below:

<Formula 1>

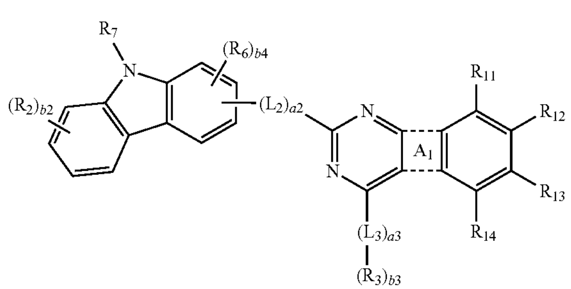

<Formula 1A>

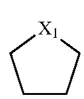

wherein a ring $A_1$ in Formula 1 is represented by Formula 1A above;
$X_1$ in Formula 1A is one of N—[$(L_1)_{a1}$—$(R_1)_{b1}$], S, O, S(═O), S(═O)$_2$, C(═O), Si($R_4$)($R_5$), P($R_4$), P(═O)($R_4$), and C═N($R_4$);
each of $L_1$ to $L_3$ in Formula 1 are independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;
each of a1 to a3 in Formula 1 are independently an integer of 1 to 5, and when a1 is 2 or more, $L_1$s are identical to or different from each other, when a2 is 2 or more, $L_2$s are identical to or different from each other, and when a3 is 2 or more, 2 or more $L_3$s are identical to or different from each other;
each of $R_1$ to $R_7$ and $R_{11}$ to $R_{14}$ in Formula 1 are independently selected from a hydrogen, a deuterium, a fluoro group (—F), a chloro group (—Cl), a bromo group (—Br), an iodo group (—I), a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$);
each of b1 to b4 in Formula 1 are independently an integer of 1 to 3;
provided that, when $L_2$ in Formula 1 is an unsubstituted $C_6$ arylene group and a2 in Formula 2 is 1, $R_2$ is not a hydrogen; and
at least one of substituents of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group are selected from one of:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group; and a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkenyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), and —B($Q_{36}$)($Q_{37}$), wherein each of $Q_1$ to $Q_7$, $Q_{11}$ to $Q_{17}$, $Q_{21}$ to $Q_{27}$, and $Q_{31}$ to $Q_{37}$ are independently selected from a hydrogen, a $C_1$-$C_{60}$ alkyl group, a $C_2$-$C_{60}$ alkenyl group, a $C_2$-$C_{60}$ alkenyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, wherein the hole-transporting host includes a compound represented by Formula 20 below:

<Formula 20>

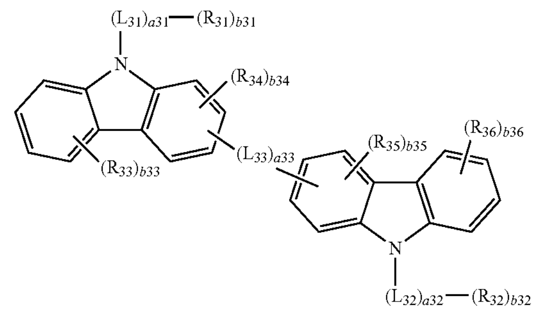

wherein in Formula 20, each of $L_{31}$ to $L_{33}$ are independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, and a substituted or unsubstituted divalent non-aromatic condensed polycyclic group;

each of a31 to a33 are independently an integer of 0 to 5;

each of $R_{31}$ and $R_{32}$ are independently a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, and a substituted or unsubstituted monovalent non-aromatic condensed polycyclic group;

each of $R_{33}$ to $R_{36}$ are independently a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, and a substituted or unsubstituted monovalent non-aromatic condensed polycyclic group;

each of b31 to b36 are independently an integer of 1 to 3;

at least one of substituents of the substituted $C_3$-$C_{10}$ cycloalkylene group, the substituted $C_3$-$C_{10}$ cycloalkenylene group, the substituted $C_6$-$C_{60}$ arylene group, the substituted divalent non-aromatic condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ cycloalkenyl group, the substituted $C_6$-$C_{60}$ aryl group, and the substituted monovalent non-aromatic condensed polycyclic group is selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_6$-$C_{60}$ aryl group, and a monovalent non-aromatic condensed polycyclic group; and the hole-transporting host excludes Compound HH1-1 below:

HH1-1

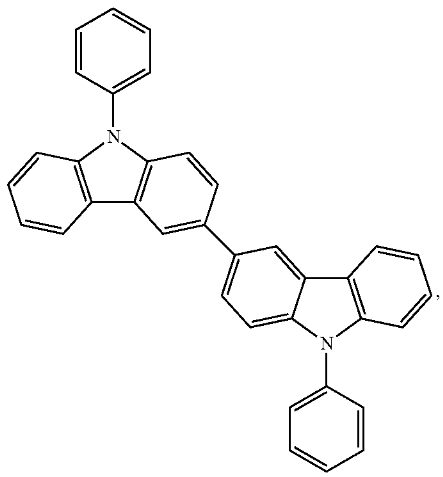

wherein the electron transport material includes a compound represented by Formula 42 below:

<Formula 42>

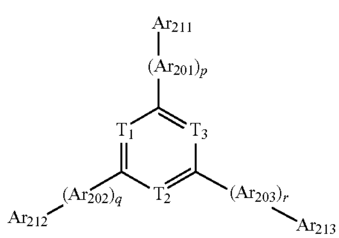

wherein in Formula 42, $T_1$ is one of N and $C(R_{201})$, $T_2$ is one of N and $C(R_{202})$, and $T_3$ is one of N and $C(R_{203})$, wherein at least one of $T_1$ to $T_3$ is N;

each of $R_{201}$ to $R_{203}$ are independently selected from one of:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group;

each of $Ar_{201}$ to $Ar_{203}$ are independently selected from one of:

a $C_6$-$C_{60}$ arylene group, a $C_1$-$C_{60}$ heteroarylene group, a divalent non-aromatic condensed polycyclic group, and a divalent non-aromatic condensed heteropolycyclic group; and a $C_6$-$C_{60}$ arylene group, a $C_1$-$C_{60}$ heteroarylene group, a divalent non-aromatic condensed polycyclic group, and a divalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group;

each of p, q, and r are independently one of 0, 1 and 2; and each of $Ar_{211}$ and $Ar_{213}$ are independently selected from one of:

a $C_6$-$C_{60}$ aryl group, a $C_1$-$C_{60}$ heteroaryl group, a monovalent non-aromatic condensed polycyclic group, and a monovalent non-aromatic condensed heteropolycyclic group; and a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a pyrenyl group, a chrysenyl group, a phenanthrenyl group, a pyridinyl group, a pyrimidinyl group, and a triazinyl group.

2. The OLED of claim 1, wherein the OLED satisfies Equation 4 below:

$$0.15\ \text{eV} \leq |HOMO_{H(HT)} - HOMO_{H(ET)}| \leq 2.0\ \text{eV}$$ <Equation 4> wherein in Equation 4, $HOMO_{H(HT)}$ refers to a highest occupied molecular orbital of the hole-transporting host, $HOMO_{H(ET)}$ refers to an HOMO energy level of the electron-transporting host, and the $HOMO_{H(HT)}$ and the $HOMO_{H(ET)}$ are evaluated by using a density functional theory method.

3. The OLED of claim 1, wherein the OLED satisfies Equation 5 below:

$$|LUMO_{H(ET)}-LUMO_{ETL}|<0.2\text{ eV} \quad \text{<Equation 5>}$$

wherein in Equation 5, $LUMO_{ETL}$ refers to an LUMO energy level of the electron transport material and the $LUMO_{ETL}$ is evaluated by using a density functional theory method.

4. The OLED of claim 1, wherein the OLED satisfies Equations 6 and 7 below:

$$\min\{E(S_{1,H(HT)}),E(S_{1,H(ET)})\}-E(S_{1,EX})>0.15\text{ eV}< \quad \text{<Equation 6>}$$

$$E(S_{1,EX})-E(T_{1,EX})<0.15\text{ eV} \quad \text{<Equation 7>}$$

wherein in Equations 6 and 7, $E(S_{1,H(HT)})$ refers to a singlet energy level of the hole-transporting host, $E(S_{1,H(ET)})$ refers to a singlet energy level of the electron-transporting host, $\min\{E(S_{1,H(HT)}), E(S_{1,H(ET)})\}$ refers to the smallest value between values of $E(S_{1,H(HT)})$ and $E(S_{1,H(ET)})$, $E(S_{1,EX})$ refers to a singlet energy level of an exciplex formed by the hole-transporting host and the electron-transporting host, and $E(T_{1,EX})$ refers to a triplet energy level of the exciplex formed by the electron-transporting host and the hole-transporting host, and the $E(S_{1,H(HT)})$, the $E(S_{1,H(ET)})$, the $E(S_{1,EX})$ and the $E(T_{1,EX})$ are evaluated by using a density functional theory method.

5. The OLED of claim 1, wherein each of $L_1$ to $L_3$ in Formula 1 are independently a condensed cyclic compound selected from groups represented by Formulae 2-1 to 2-17 below:

Formula 2-1

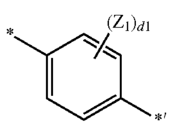

Formula 2-2

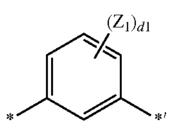

Formula 2-3

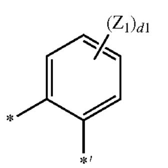

Formula 2-4

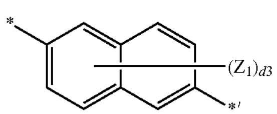

Formula 2-5

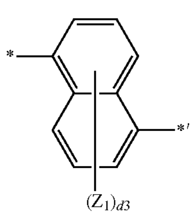

-continued

Formula 2-6

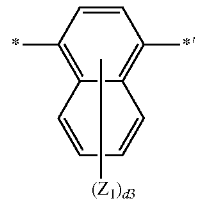

Formula 2-7

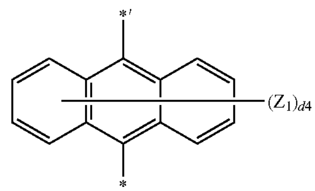

Formula 2-8

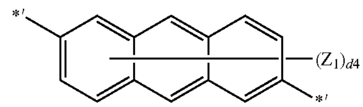

Formula 2-9

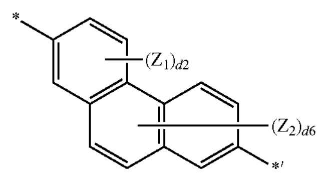

Formula 2-10

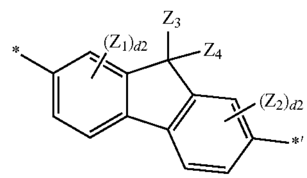

Formula 2-11

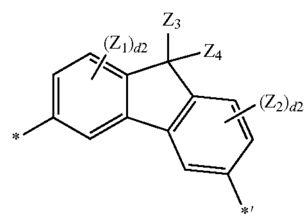

Formula 2-12

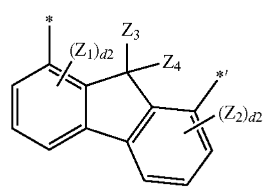

Formula 2-13

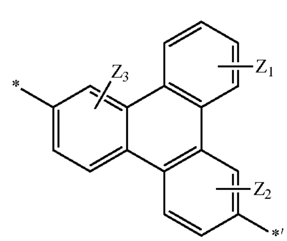

-continued

Formula 2-14

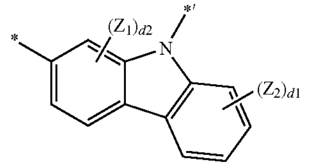

Formula 2-15

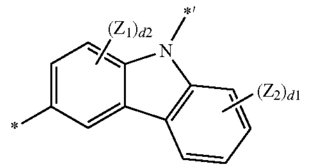

Formula 2-16

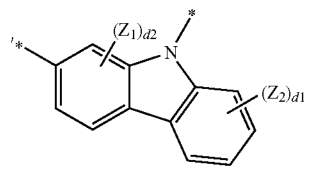

Formula 2-17

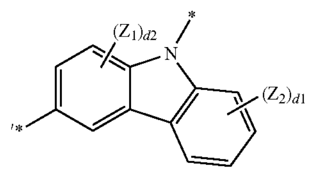

wherein in Formulae 2-1 to 2-17, each of $Z_1$ to $Z_4$ are independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a triphenylenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, a quinoxalinyl group, a biphenyl group, and —Si($Q_{33}$)($Q_{34}$)($Q_{35}$), wherein each of $Q_{33}$ to $Q_{35}$ are independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group; and d1 is an integer of 1 to 4, d2 is an integer of 1 to 3, d3 is an integer of 1 to 6, d4 is an integer of 1 to 8, and d6 is an integer of 1 to 5, and * and *' each indicate a binding site to a neighboring atom.

6. The OLED of claim 1, wherein i) at least one of $R_2$ and $R_3$ and ii) $R_1$ and $R_7$ are independently selected from one of:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, —Si($Q_{33}$)($Q_{34}$)($Q_{35}$), a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, and a biphenyl group.

7. The OLED of claim 1, wherein each of $R_1$ to $R_7$ are independently selected from one of:

- a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;
- a $C_1$-$C_{20}$ alkyl group and a $C_1$-$C_{20}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;
- one of groups represented by Formulae 4-1 to 4-31 below; and
- —Si($Q_3$)($Q_4$)($Q_5$), (but $R_4$ to $R_5$ are not —Si($Q_3$)($Q_4$)($Q_5$)), and
- wherein i) at least one of $R_2$ and $R_3$ and ii) $R_1$ and $R_7$ are independently represented by one of Formulae 4-1 to 4-31 below:

Formula 4-1

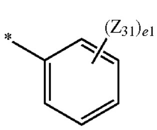

Formula 4-2

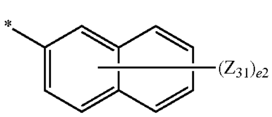

-continued

Formula 4-3

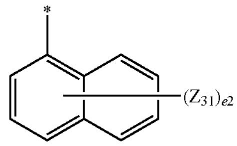

Formula 4-4

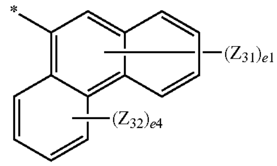

Formula 4-5

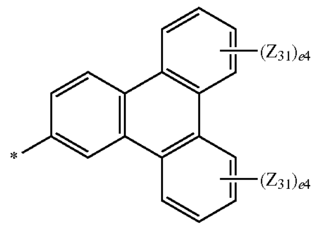

Formula 4-6

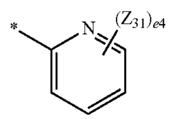

Formula 4-7

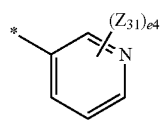

Formula 4-8

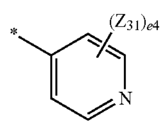

Formula 4-9

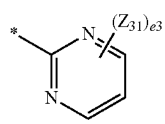

Formula 4-10

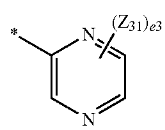

Formula 4-11

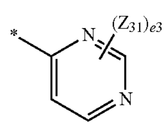

Formula 4-12

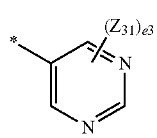

Formula 4-13

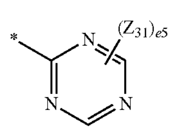

-continued

Formula 4-14

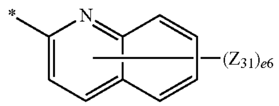

Formula 4-15

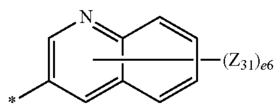

Formula 4-16

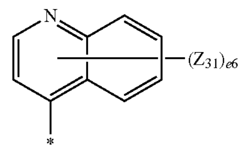

Formula 4-17

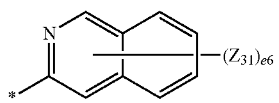

Formula 4-18

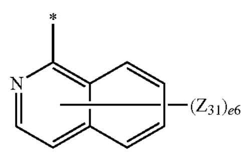

Formula 4-19

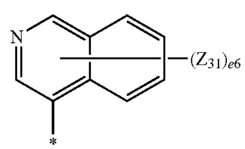

Formula 4-20

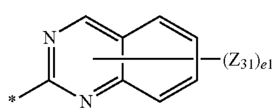

Formula 4-21

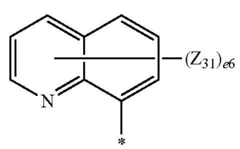

Formula 4-22

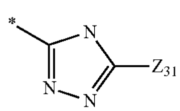

Formula 4-23

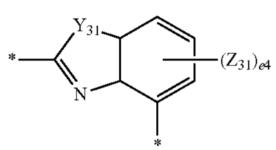

Formula 4-24

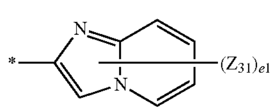

Formula 4-25

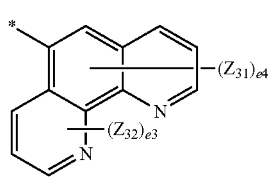

-continued

Formula 4-26

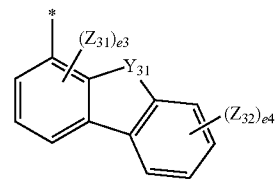

Formula 4-27

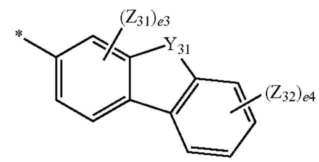

Formula 4-28

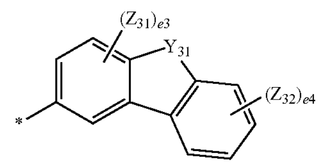

Formula 4-29

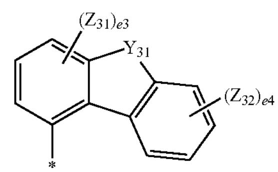

Formula 4-30

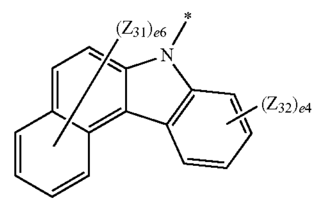

Formula 4-31

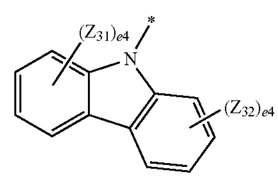

wherein in Formulae 4-1 to 4-31, $Y_{31}$ is one of O, S, $C(Z_{33})(Z_{34})$, $N(Z_{35})$, and $Si(Z_{36})(Z_{37})$ (provided that, $Y_{31}$ in Formula 4-23 is not NH);

each of $Z_{31}$ to $Z_{37}$ are independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, a quinoxalinyl group, a biphenyl group, and —$Si(Q_{33})(Q_{34})(Q_{35})$, wherein each of $Q_3$ to $Q_5$ and $Q_{33}$ to $Q_{35}$ are independently selected from a hydrogen, a $C_1$-$C_{20}$ alkyl group, a $C_1$-$C_{20}$ alkoxy group, a phenyl group, a naphthyl group, an anthracenyl group, a pyrenyl group, a phenanthrenyl group, a fluorenyl group, a chrysenyl group, a carbazolyl group, a benzocarbazolyl group, a dibenzocarbazolyl group, a dibenzofuranyl group, a dibenzothiophenyl group, a pyridinyl group, a pyrimidinyl group, a triazinyl group, a quinolinyl group, an isoquinolinyl group, a quinazolinyl group, and a quinoxalinyl group; and e1 is an integer of 1 to 5 e2 is an integer of 1 to 7, e3 is an integer of 1 to 3, e4 is an integer of 1 to 4, e5 is an integer of one of 1 and 2, and e6 is an integer of 1 to 6, and * is a binding site to a neighboring atom.

8. The OLED of claim 1, wherein the electron-transporting host includes at least one of Compounds EH1-401 to EH1-415 and EH2-1 to EH2-30 below:

EH1-401

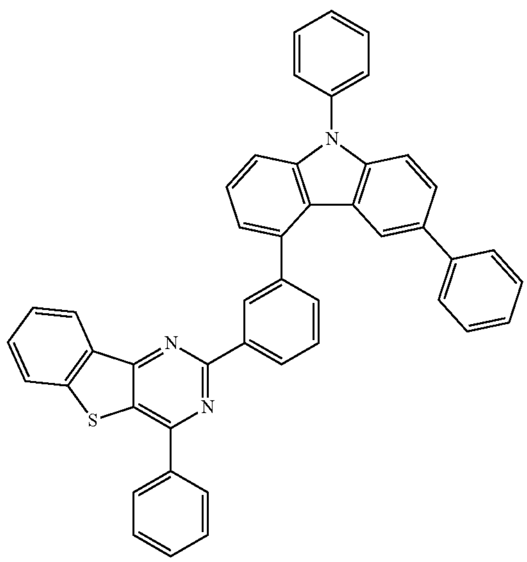

EH1-402

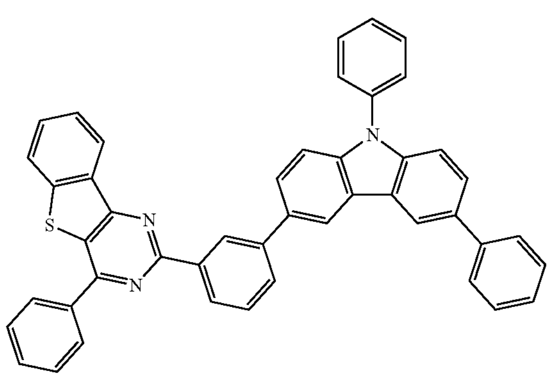

-continued

EH1-403

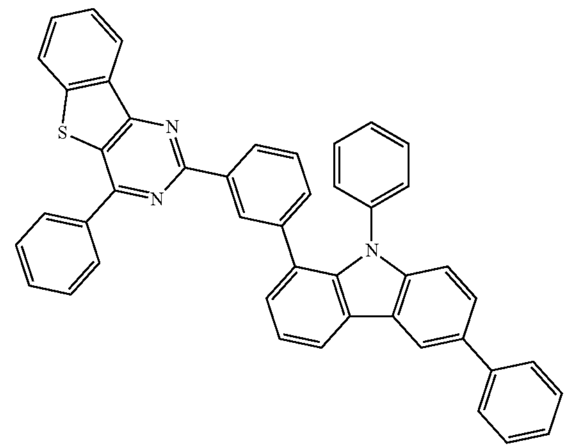

EH1-404

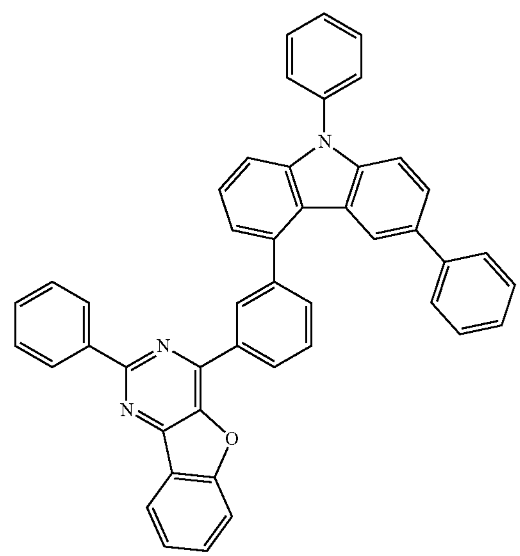

EH1-405

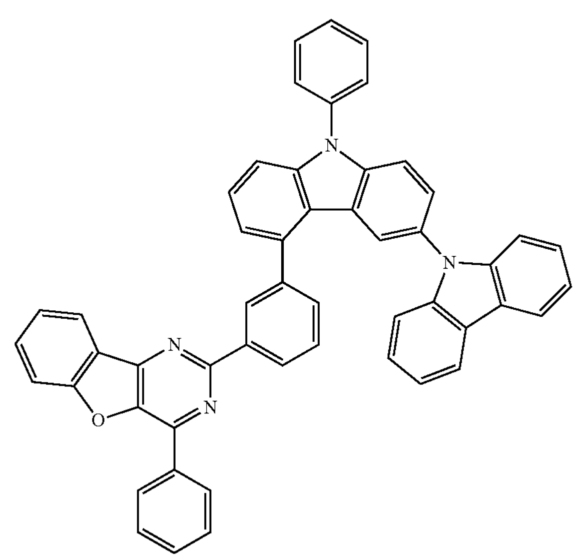

-continued
EH1-406
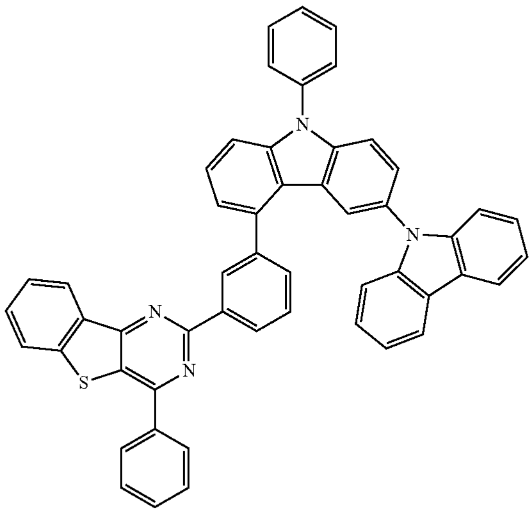
EH1-407
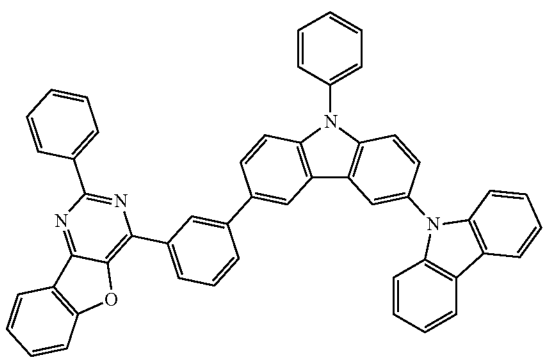
EH1-408
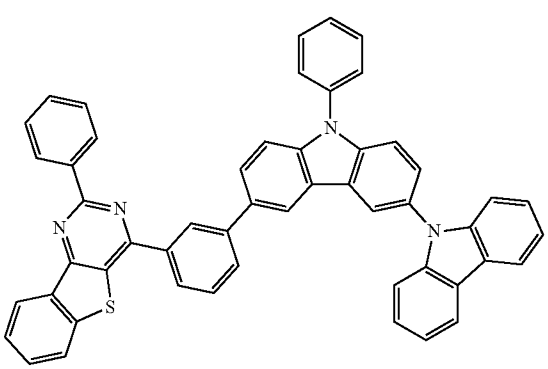
-continued
EH1-409
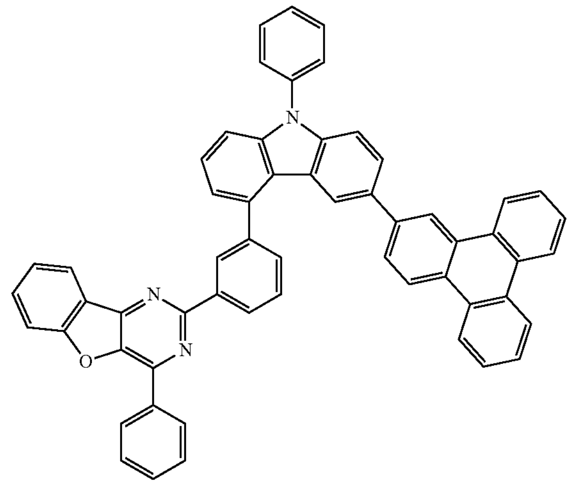
EH1-410
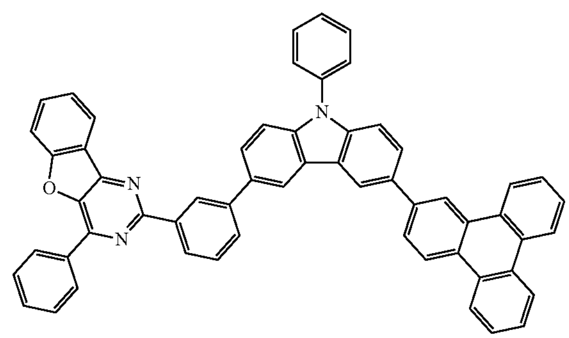
EH1-411
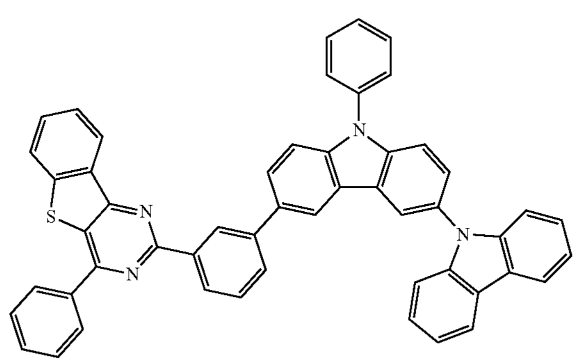

EH1-412
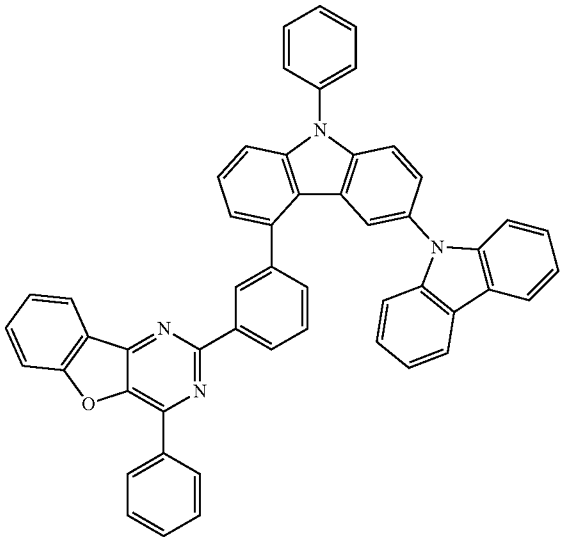
EH1-413
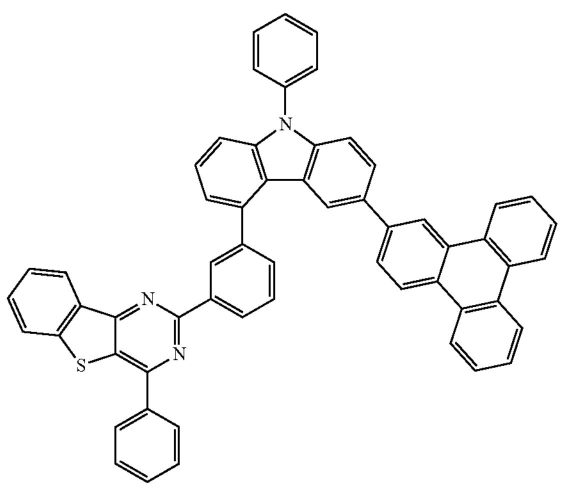
EH1-414
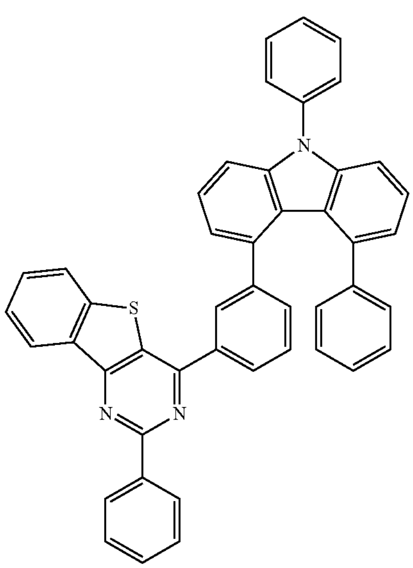
EH1-415
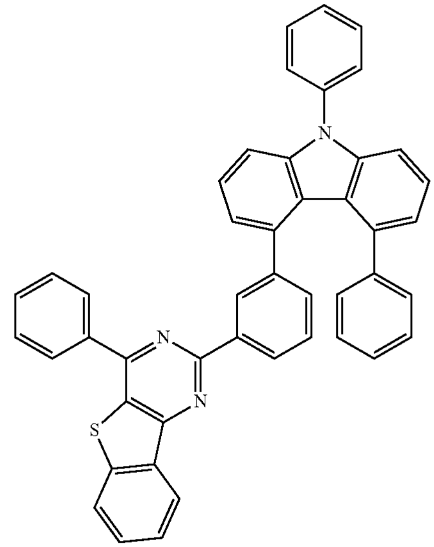
EH2-1
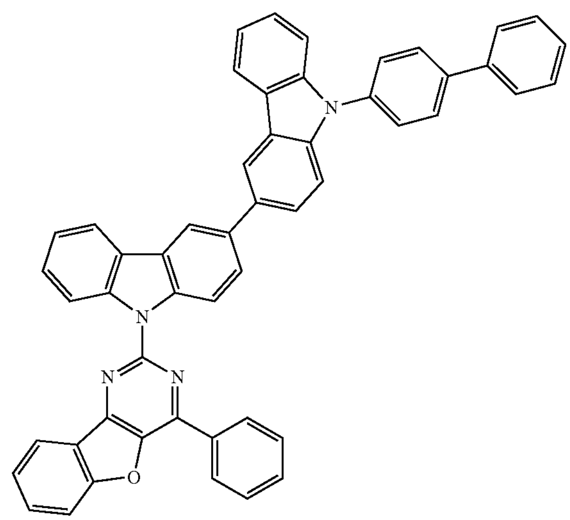
EH2-2
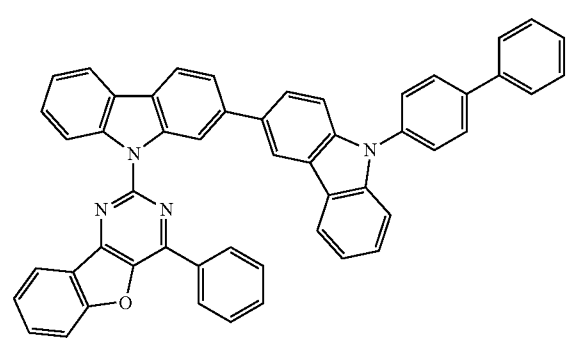

-continued
EH2-3
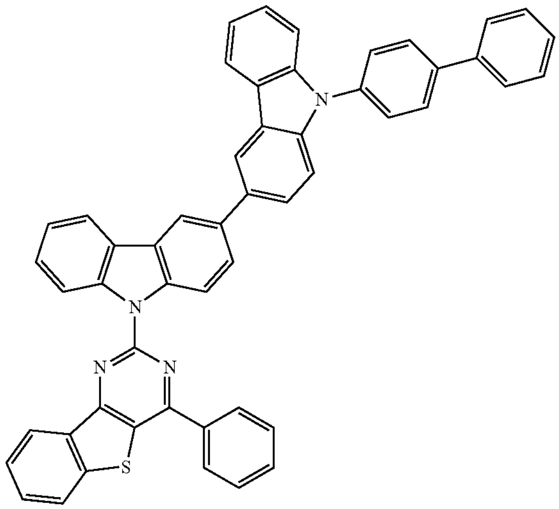
EH2-4
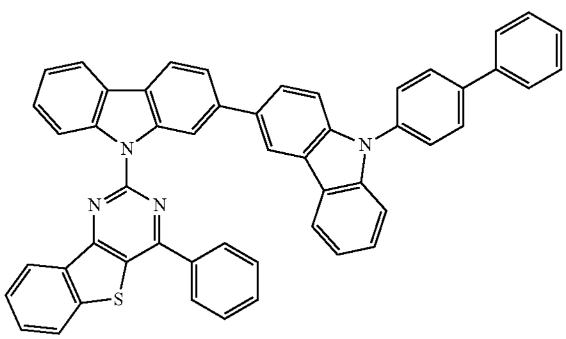
EH2-5
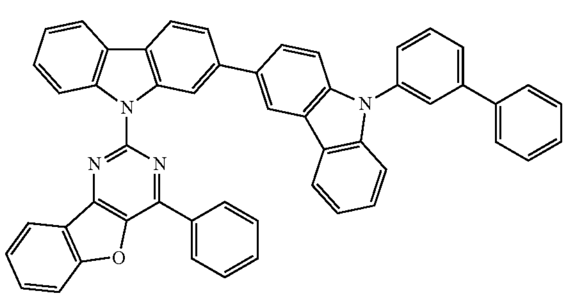
-continued
EH2-6
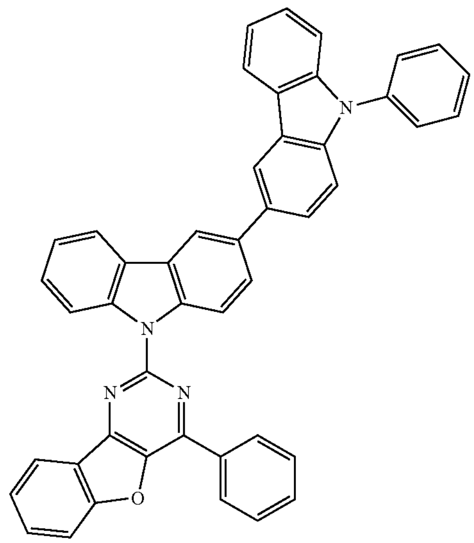
EH2-7
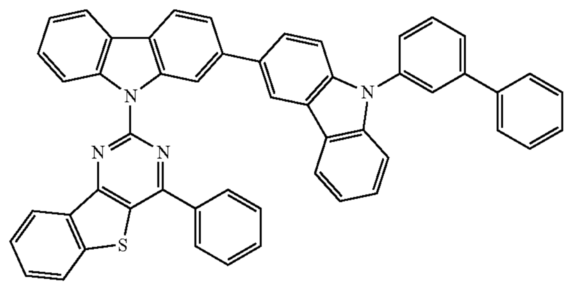
EH2-8
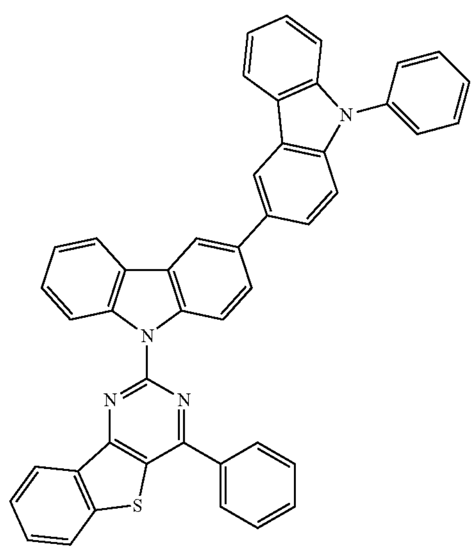

-continued
EH2-9
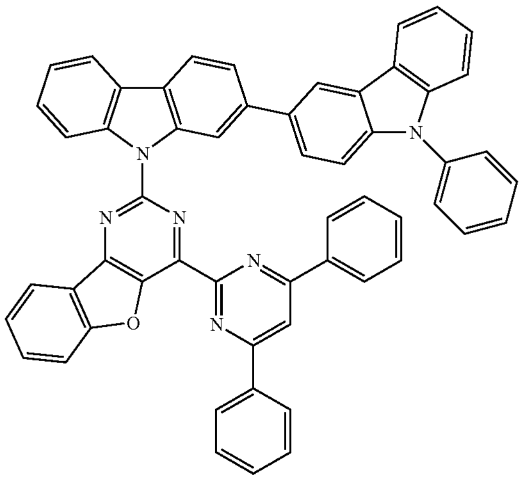
EH2-10
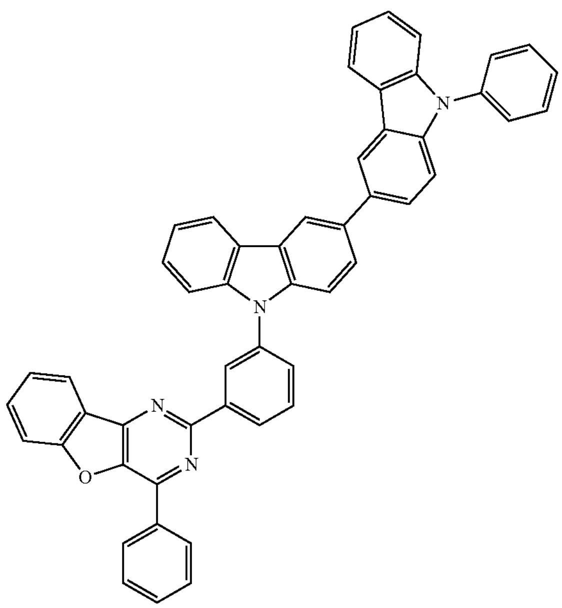
EH2-11
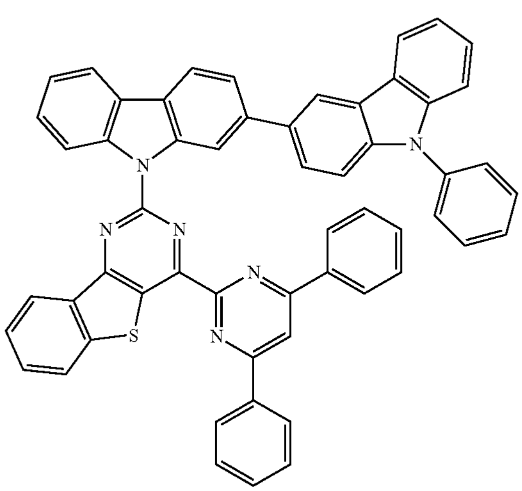
-continued
EH2-12
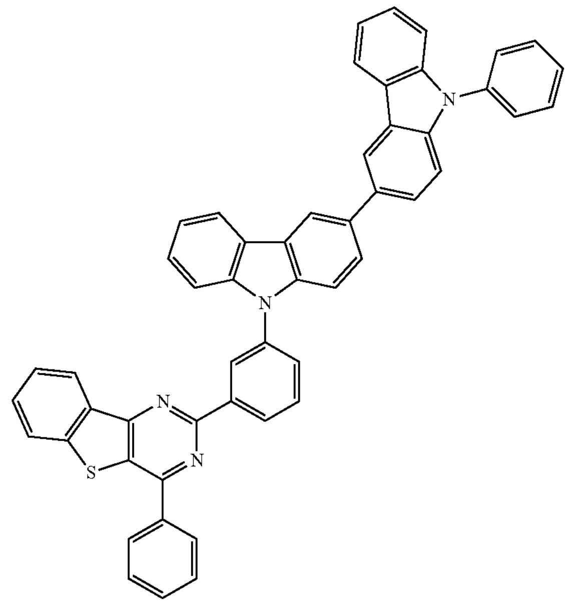
EH2-13
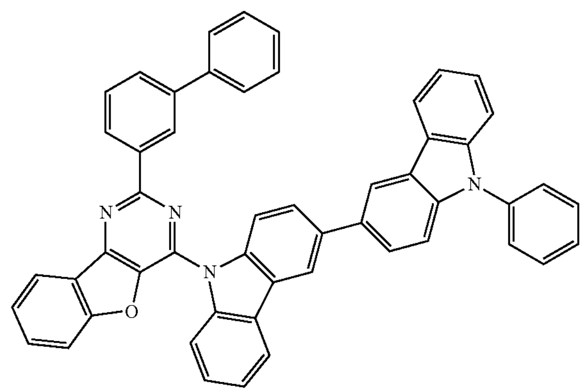
EH2-14
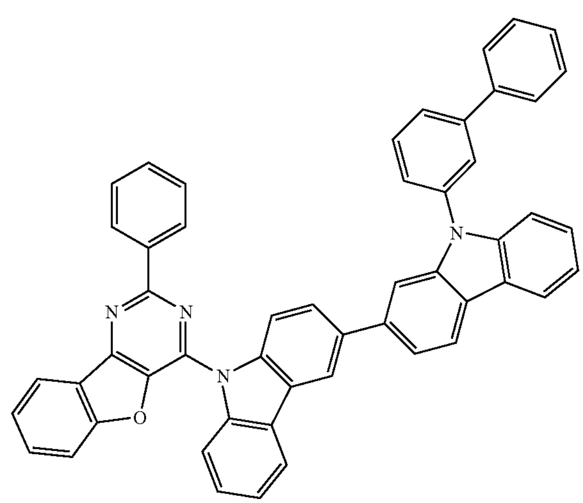

-continued
EH2-15
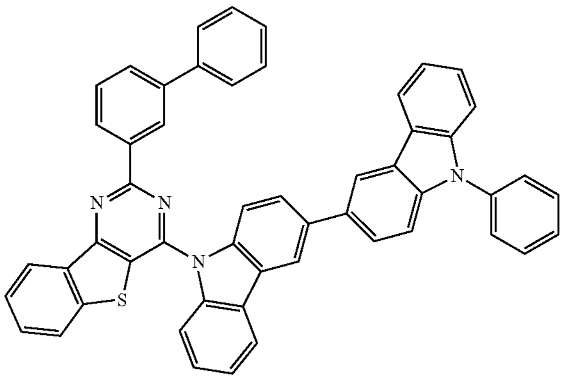
EH2-16
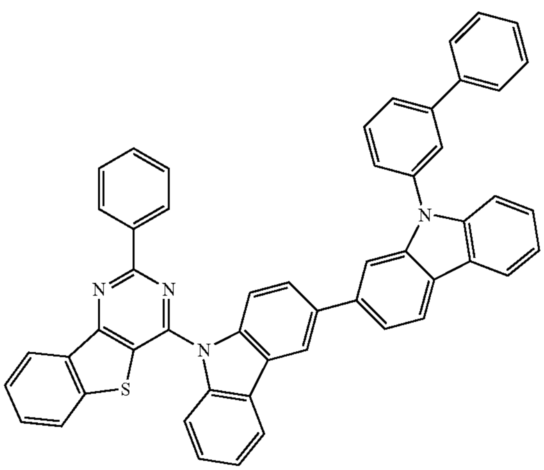
EH2-17
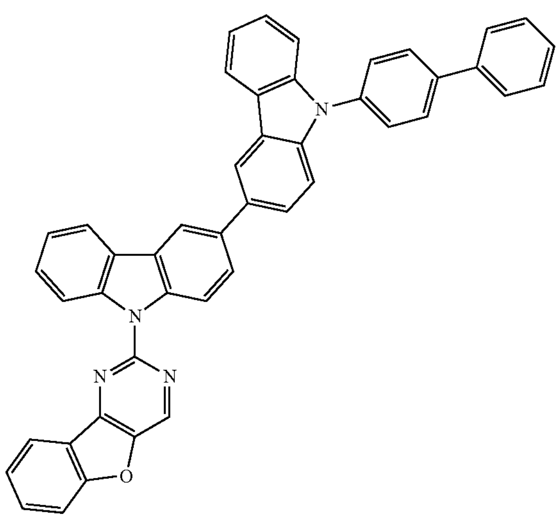
-continued
EH2-18
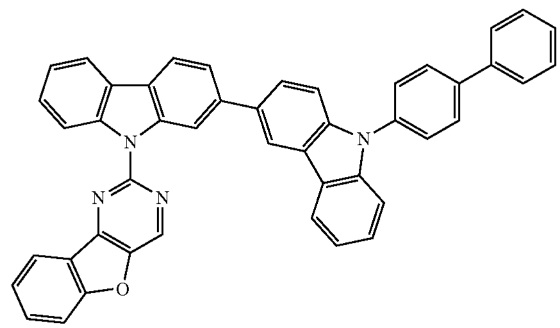
EH2-19
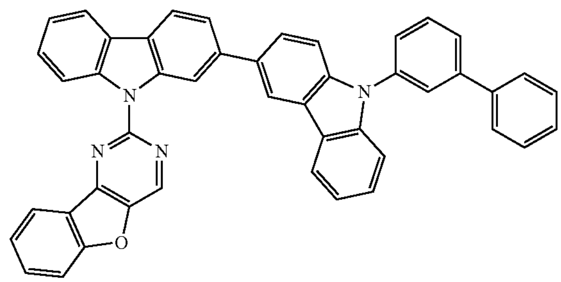
EH2-20
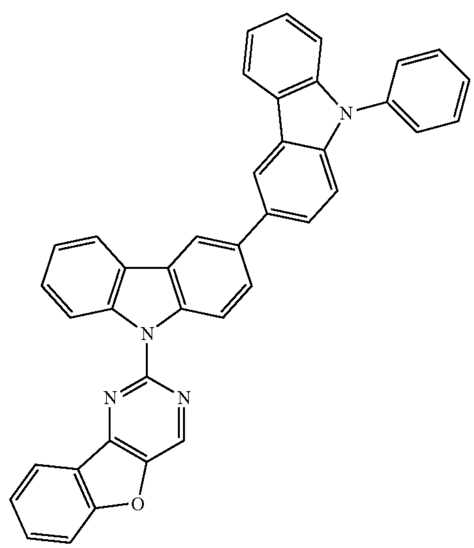
EH2-21
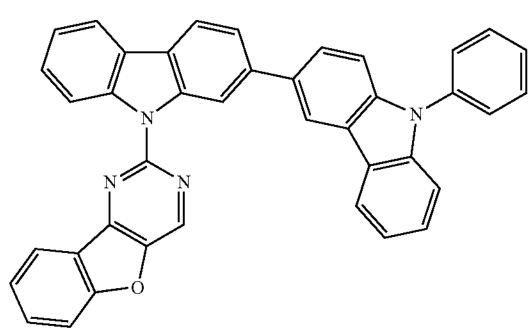

-continued
EH2-22
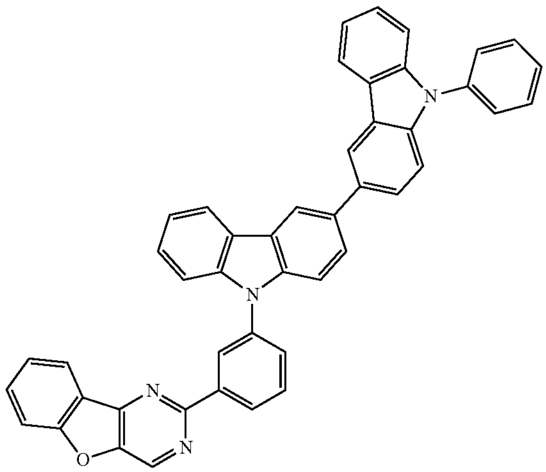
EH2-23
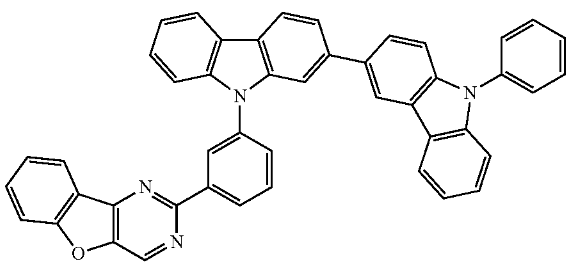
EH2-24
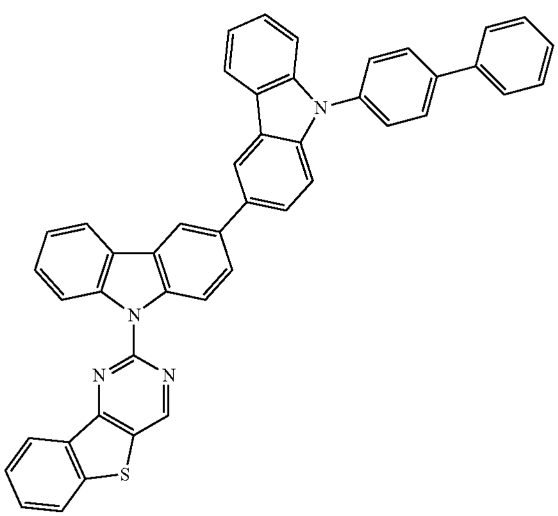
EH2-25
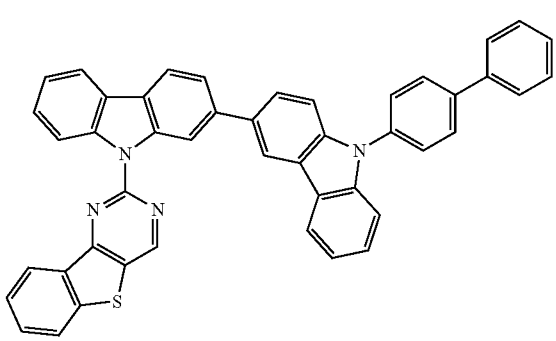
-continued
EH2-26
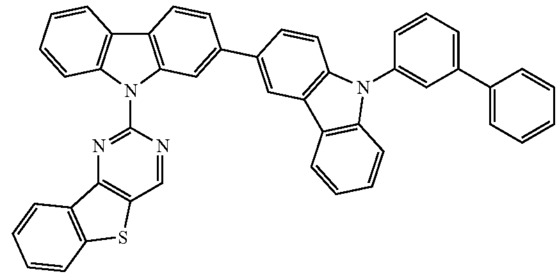
EH2-27
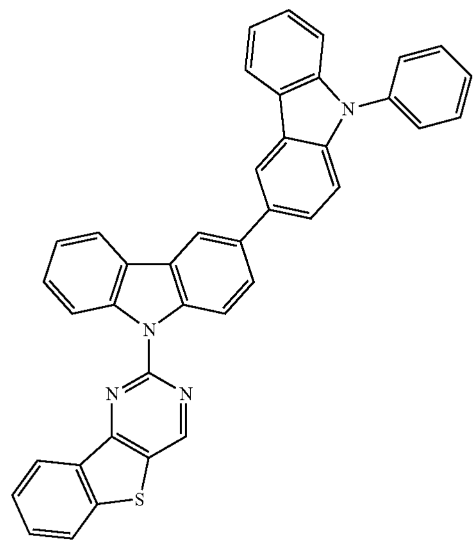
EH2-28
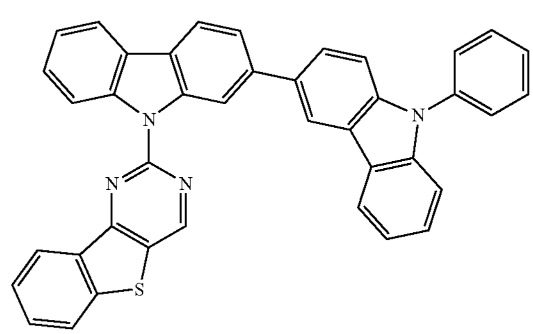

-continued

EH2-29

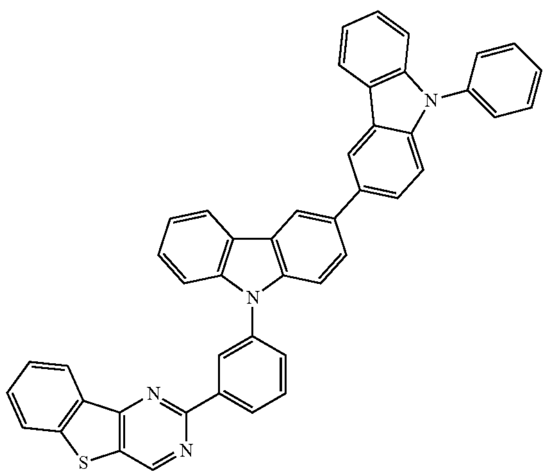

EH2-30

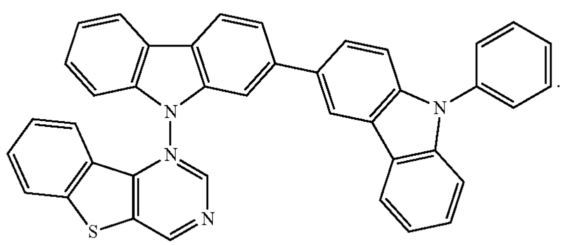

9. The OLED of claim 1, wherein each of $L_{31}$ to $L_{33}$ are independently selected from one of:

a phenylene group, a naphthylene group, a fluorenylene group, a spirofluorenylene group, a phenalenylene group, a phenanthrenylene group, an anthracenylene group, a fluoranthrenylene group, a triphenylenylene group, a pyrenylene group, and a chrysenylene group; and a phenylene group, a naphthylene group, a fluorenylene group, a spirofluorenylene group, a phenalenylene group, a phenanthrenylene group, an anthracenylene group, a fluoranthrenylene group, a triphenylenylene group, a pyrenylene group, and a chrysenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a phenyl group substituted with a phenyl group, a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group;

each of a31 to a33 are independently one of 0, 1, and 2;

each of $R_{31}$ and $R_{32}$ are independently selected from one of:

a phenyl group, a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group; and a phenyl group, a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a phenyl group substituted with a phenyl group, a naphthyl group, a fluorenyl group, a spiro-fluorenyl group, a phenalenyl group, a phenanthrenyl group, an anthracenyl group, a fluoranthrenyl group, a triphenylenyl group, a pyrenyl group, and a chrysenyl group;

each of $R_{33}$ to $R_{36}$ are independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and a phenyl group, a naphthyl group; and each of b31 to b36 are independently one of 1 and 2.

10. The OLED of claim 1, wherein the hole-transporting host includes a compound represented by one of Formulae 20-1 to 20-7 below:

<Formula 20-1>

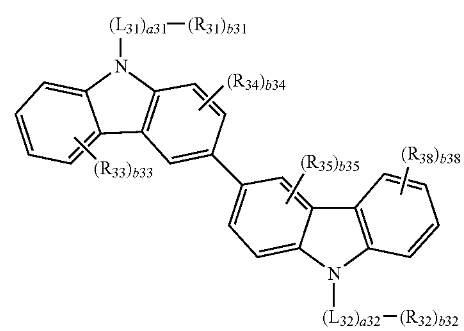

<Formula 20-2>

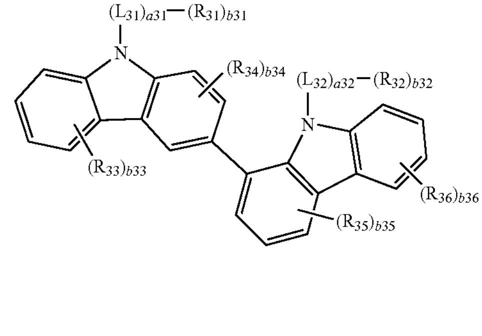

-continued
<Formula 20-3>
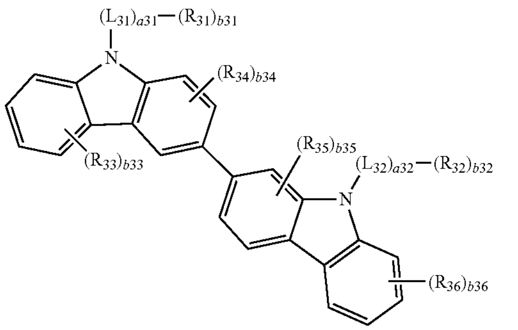
<Formula 20-4>
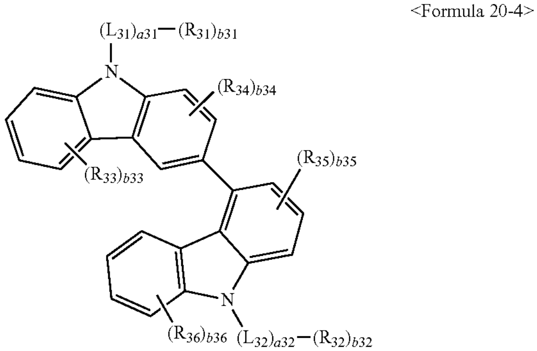
<Formula 20-5>
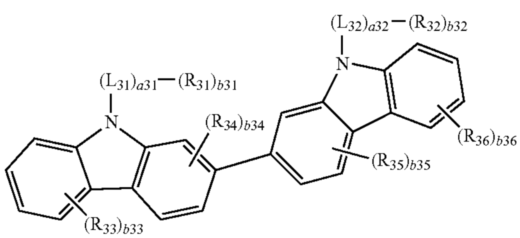
<Formula 20-6>
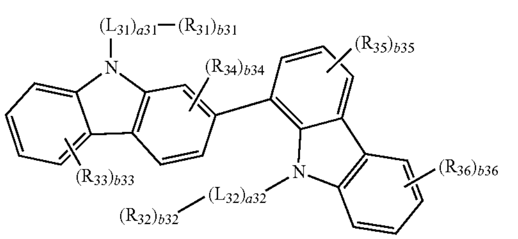
<Formula 20-7>
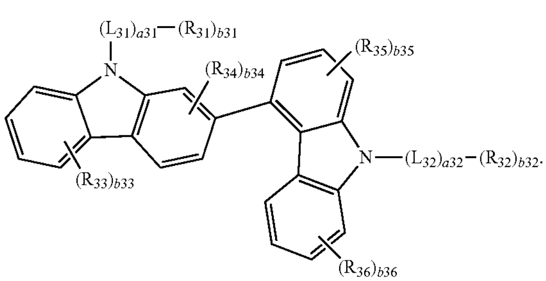
11. The OLED of claim 1, wherein the hole-transporting host includes at least one of Compounds HH1-2 to HH1-51 below:
HH1-2
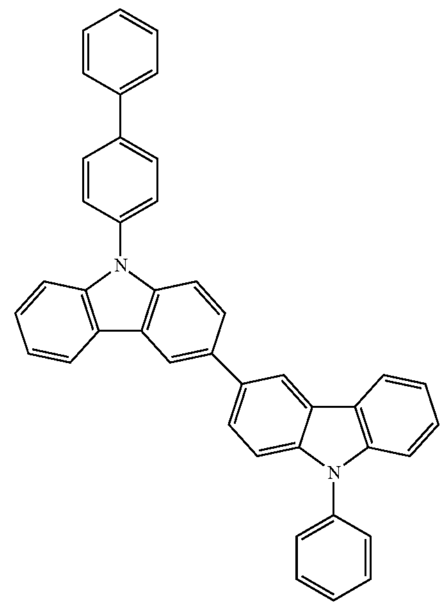
HH1-3
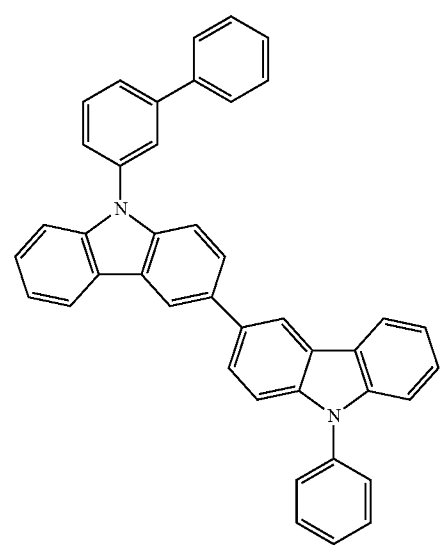

-continued
HH1-4
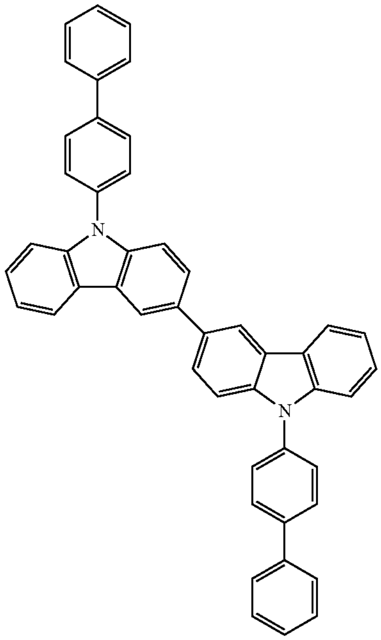
HH1-5
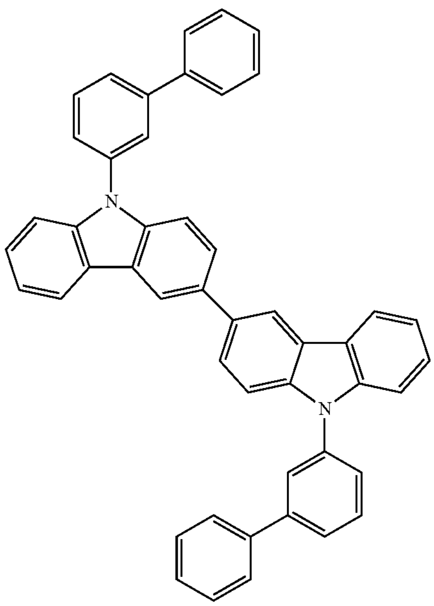
HH1-6
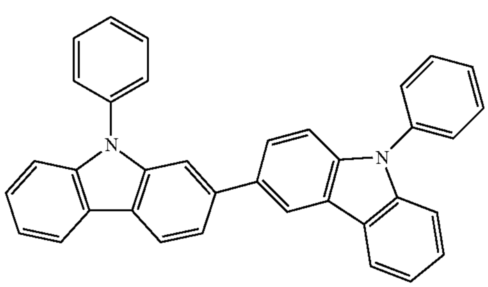
-continued
HH1-7
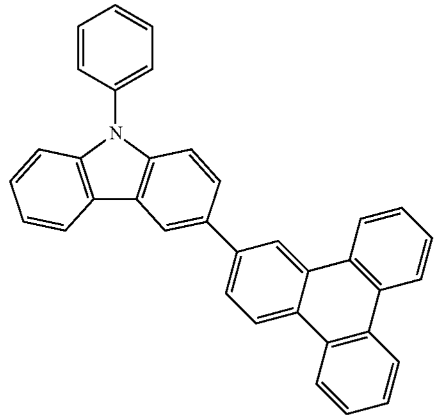
HH1-8
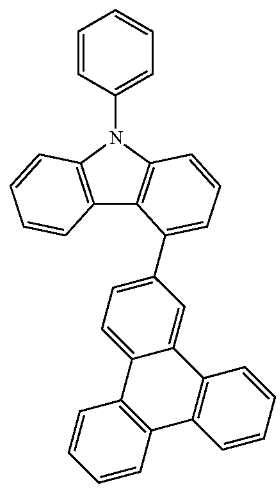
HH1-9
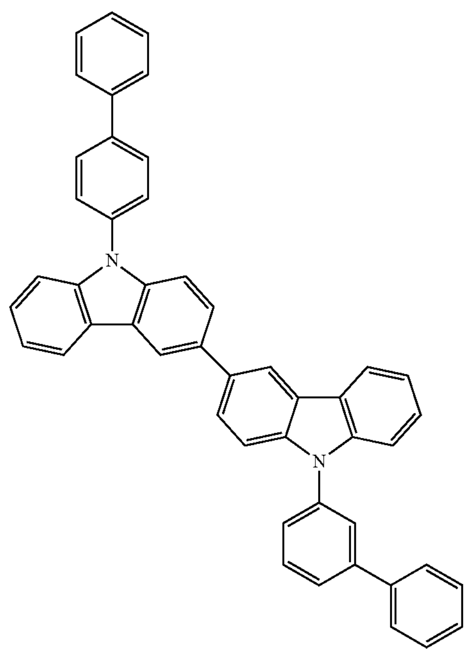

-continued
HH1-10
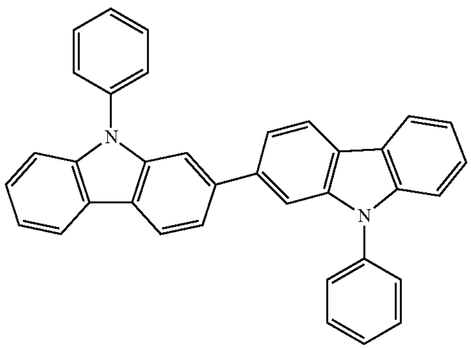
HH1-11
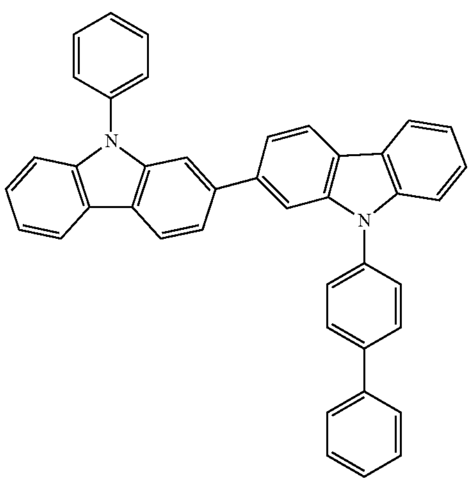
HH1-12
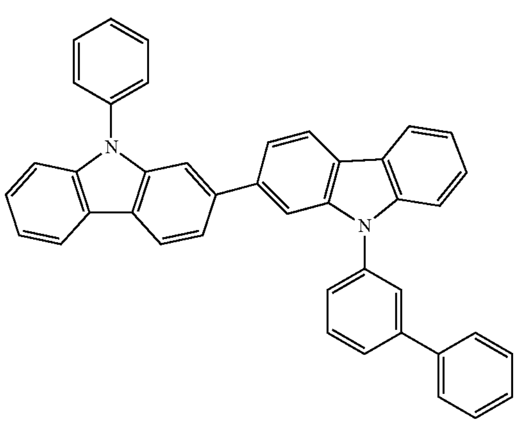
-continued
HH1-13
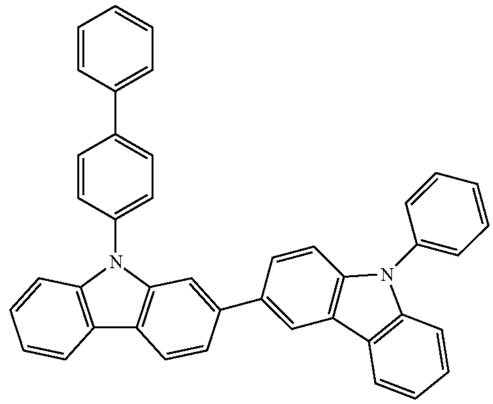
HH1-14
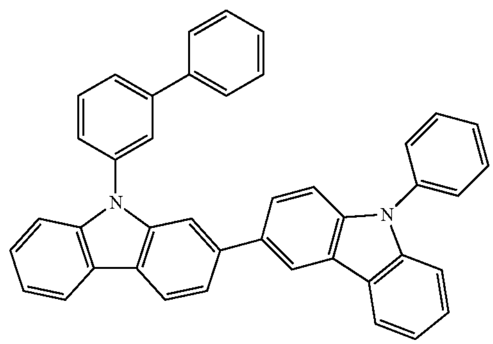
HH1-15
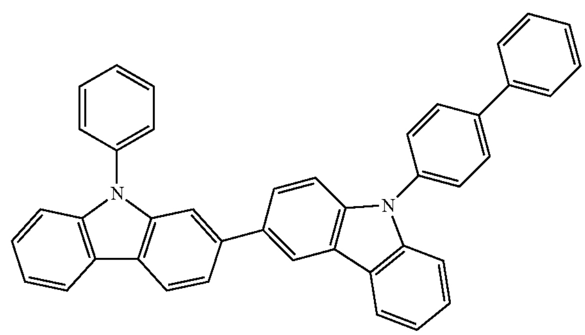
HH1-16
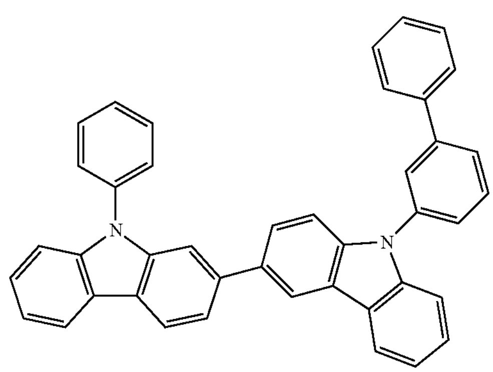

-continued
HH1-17
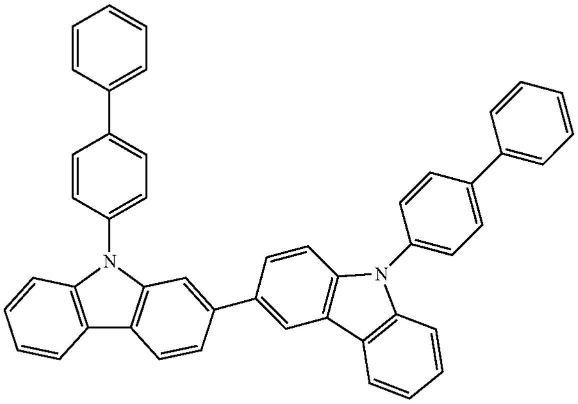
HH1-18
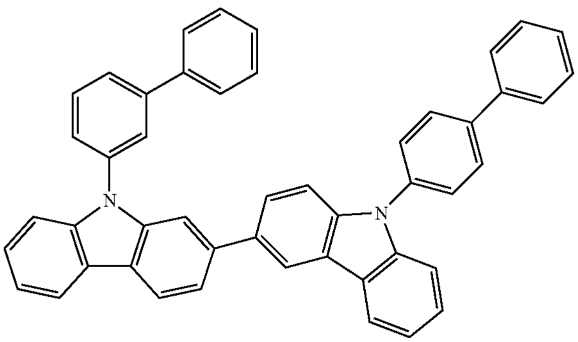
HH1-19
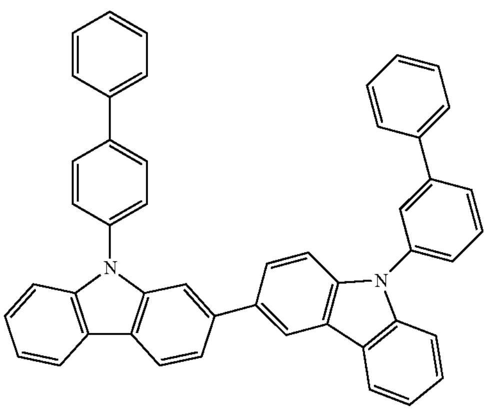
HH1-20
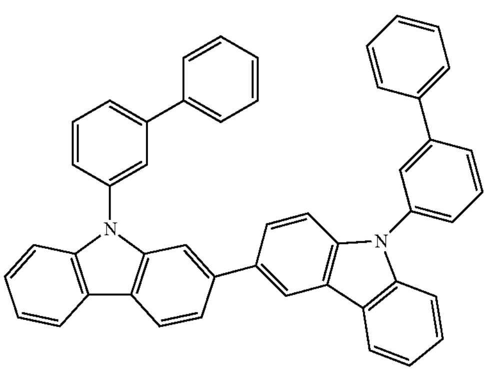
-continued
HH1-21
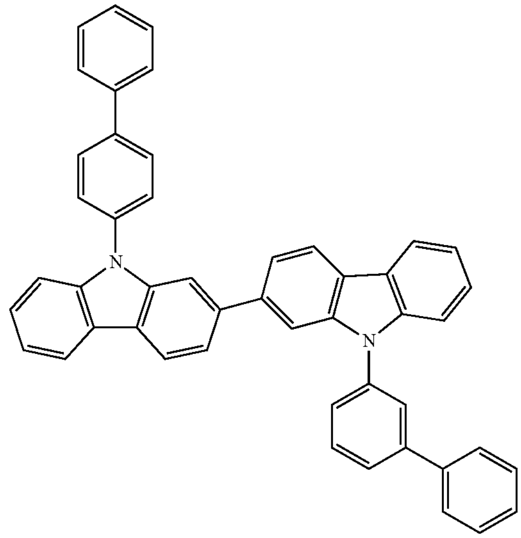
HH1-22
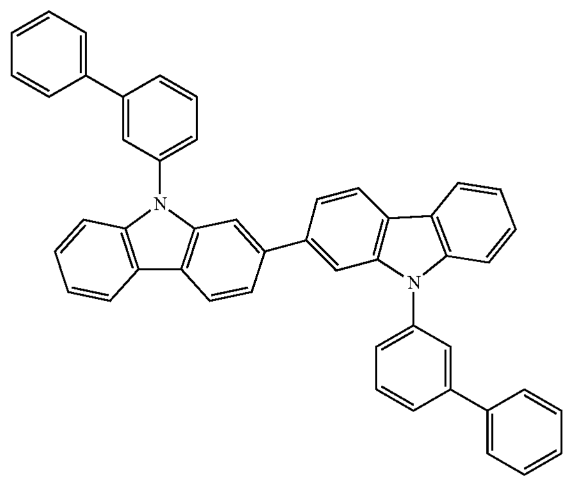
HH1-23
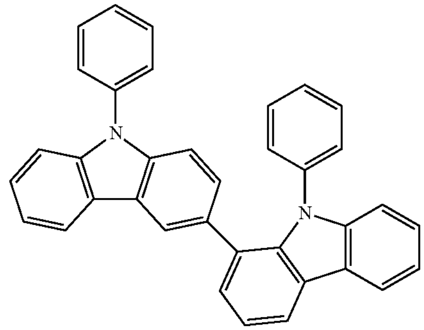

-continued
HH1-24
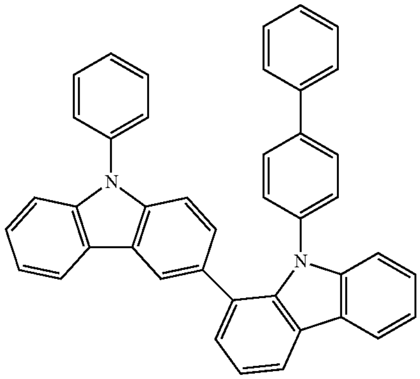
HH1-25
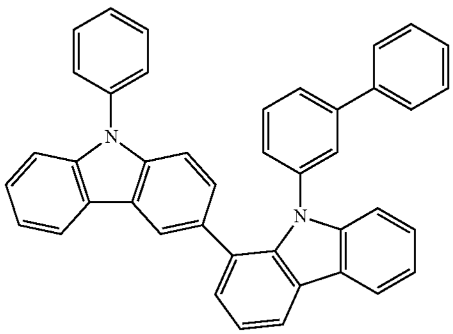
HH1-26
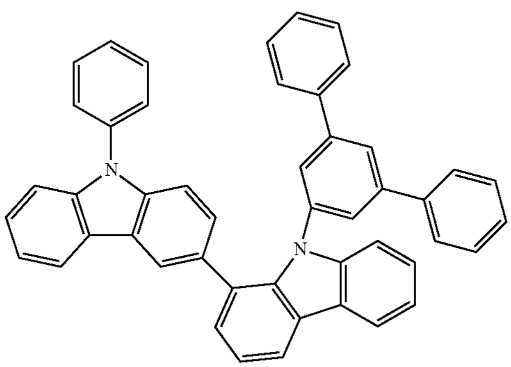
HH1-27
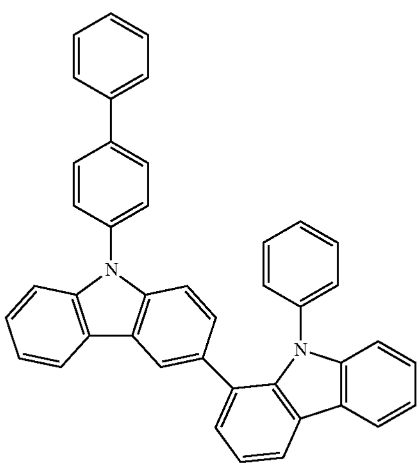
-continued
HH1-28
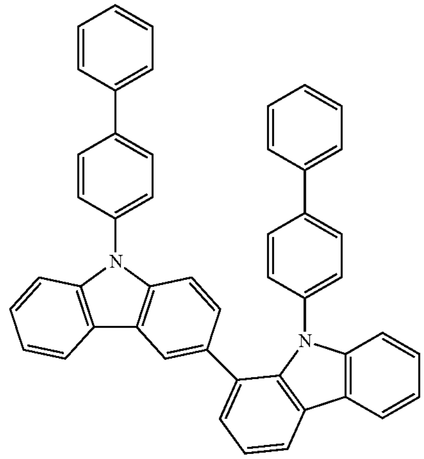
HH1-29
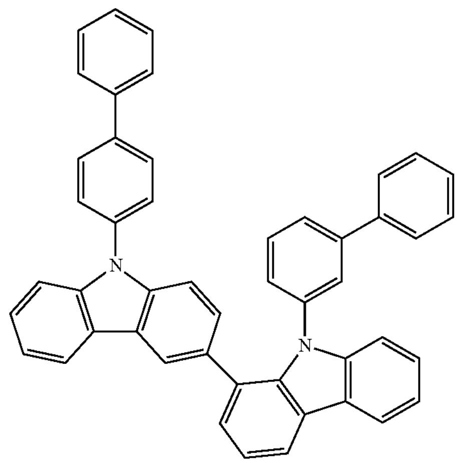
HH1-30
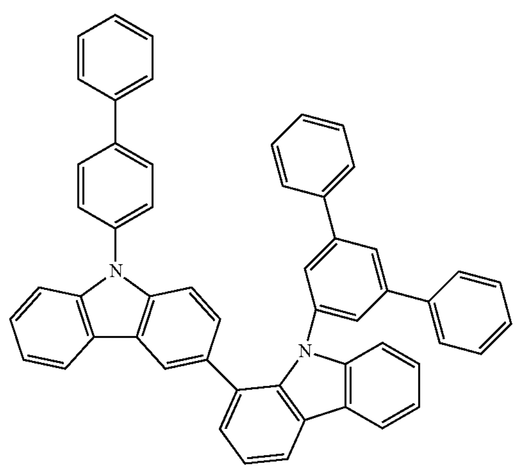

-continued
HH1-31
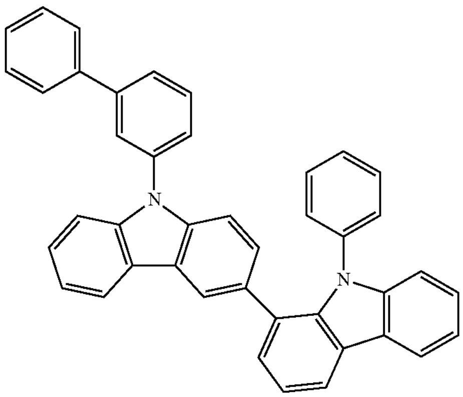
HH1-32
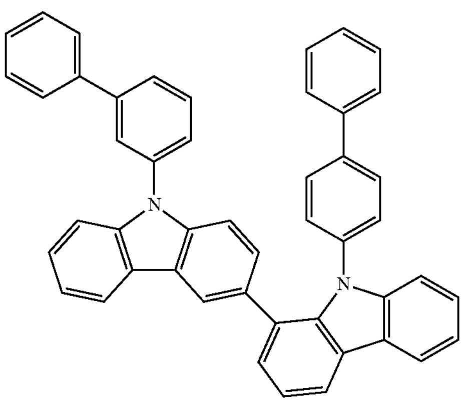
HH1-33
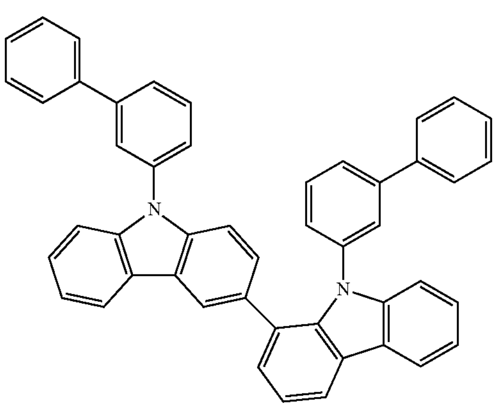
-continued
HH1-34
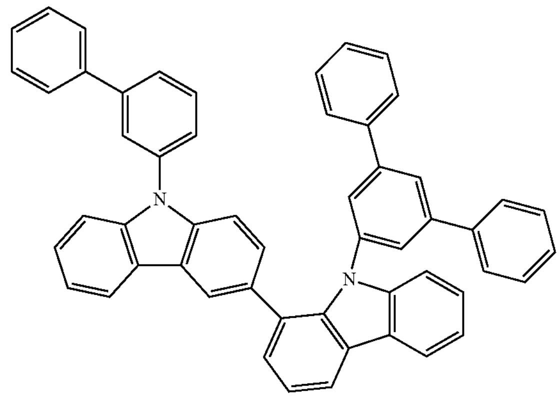
HH1-35
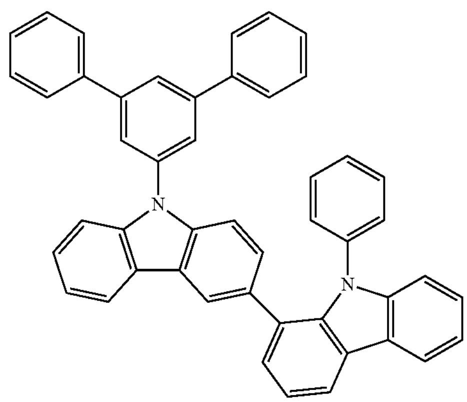
HH1-36
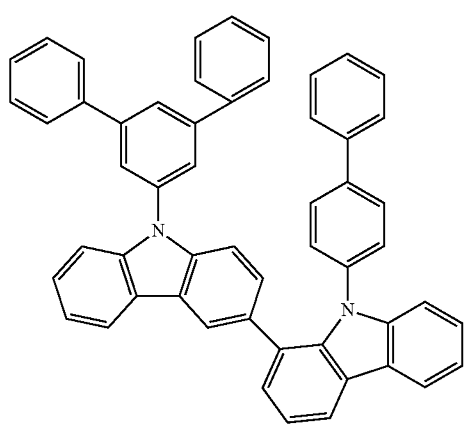

-continued
HH1-37
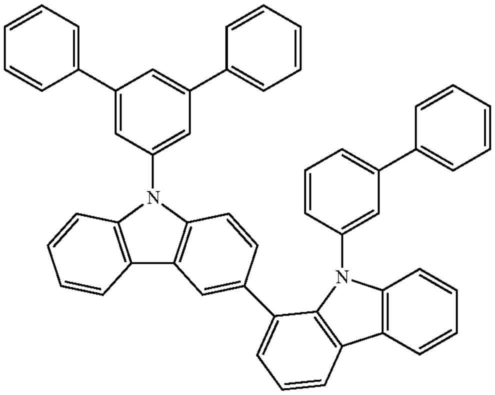
HH1-38
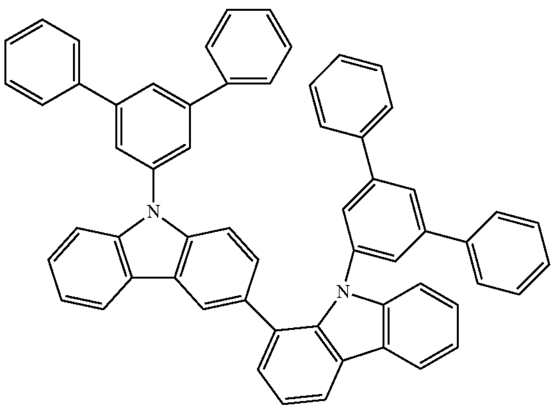
HH1-39
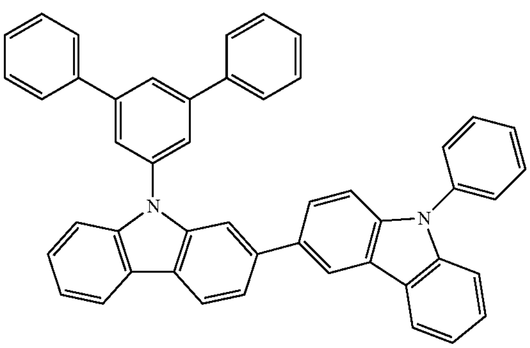
HH1-40
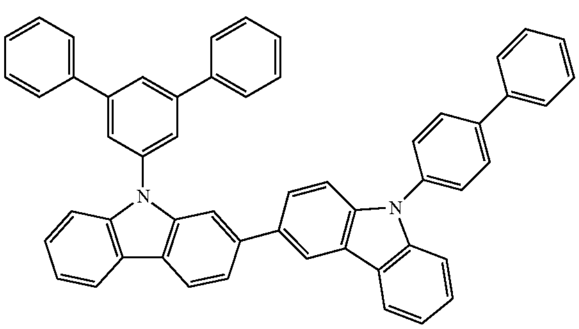
-continued
HH1-41
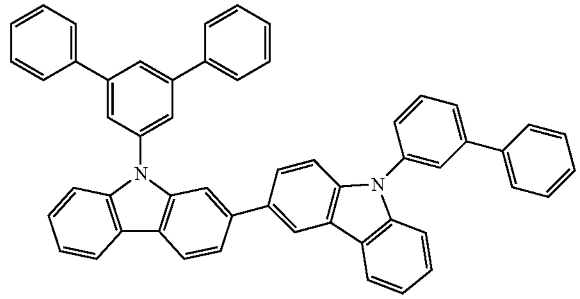
HH1-42
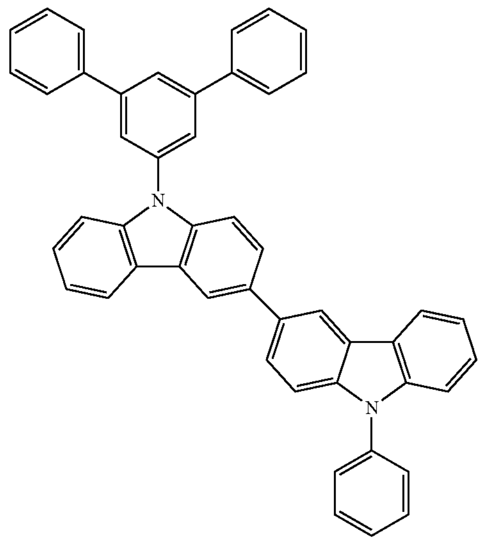
HH1-43
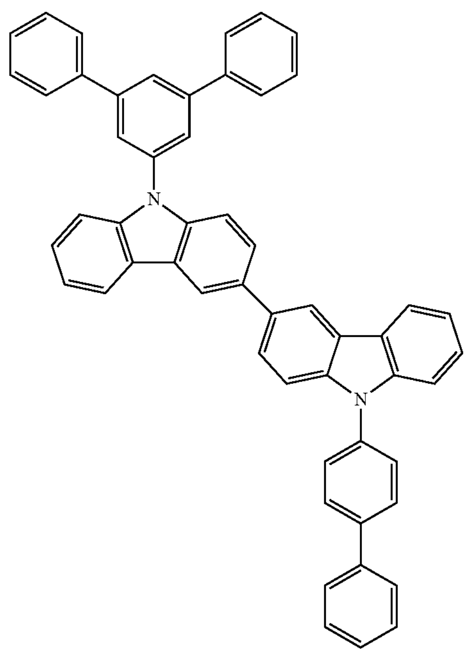

-continued
HH1-44
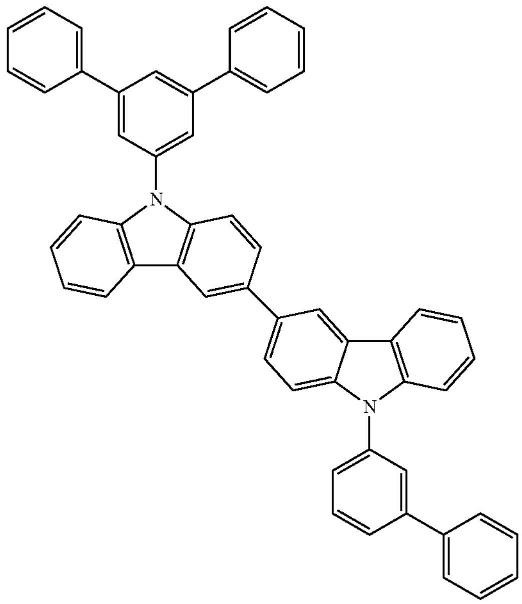
HH1-45
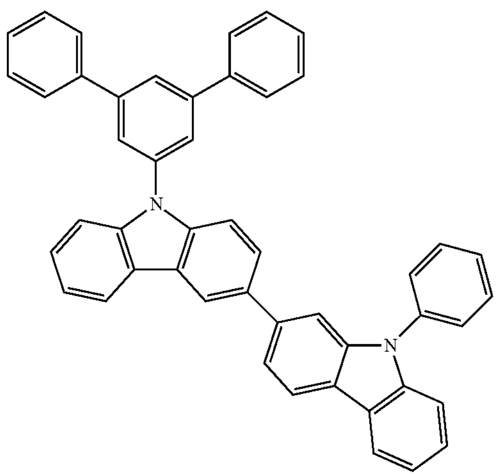
HH1-46
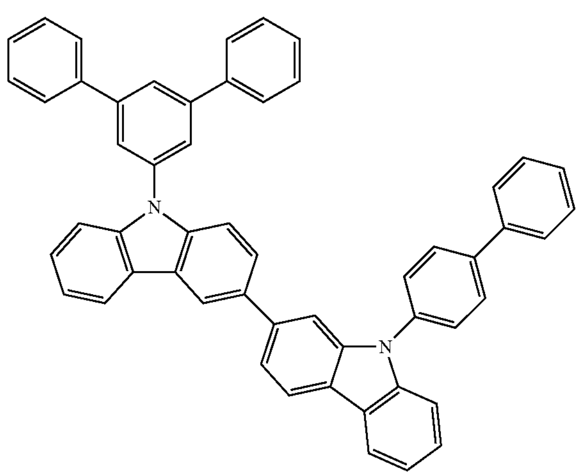
-continued
HH1-47
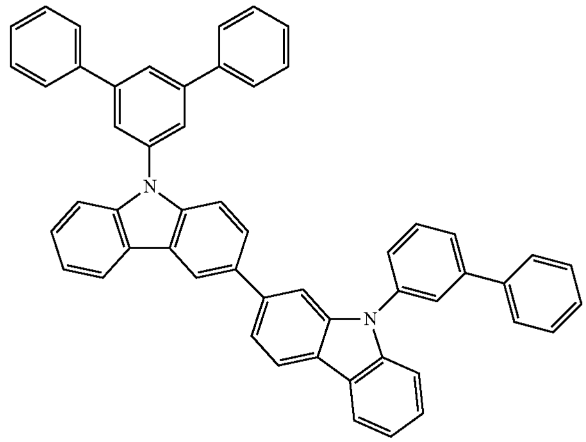
HH1-48
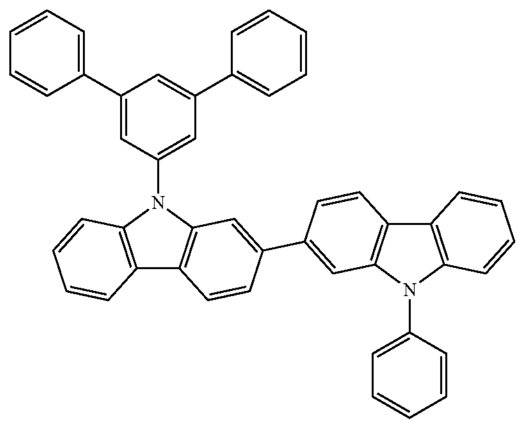
HH1-49
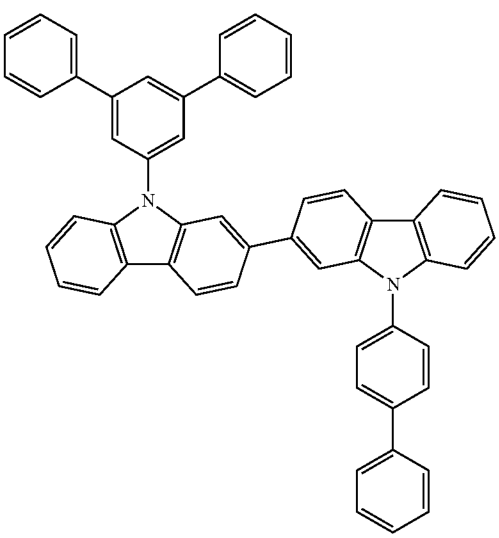

-continued

HH1-50

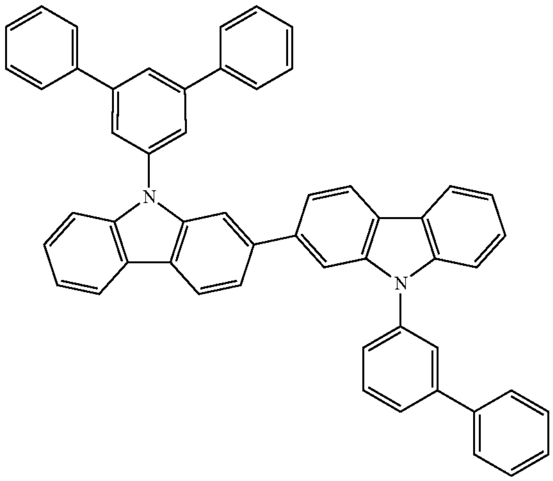

HH1-51

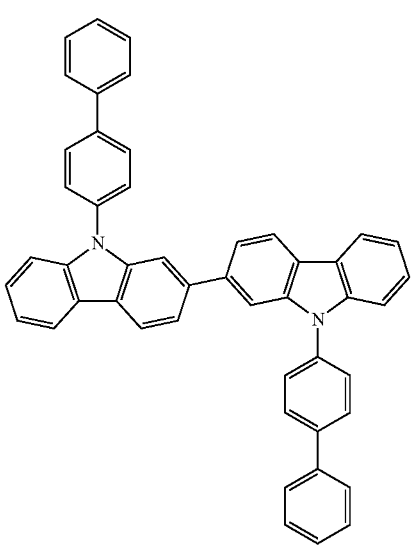

12. The OLED of claim 1, wherein the hole transport material includes a compound represented by Formula 201 below:

<Formula 201>

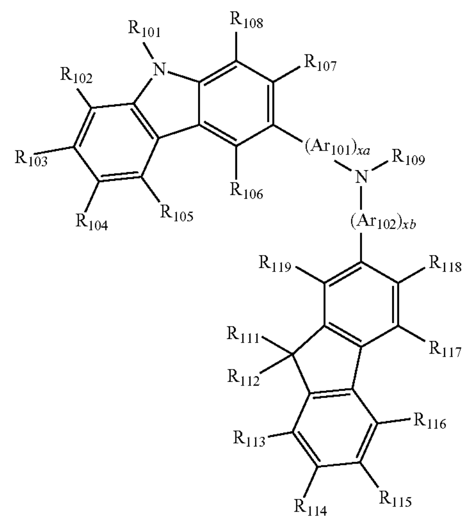

wherein in Formula 201, each of $Ar_{101}$ and $Ar_{102}$ are independently selected from one of:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

each of xa and xb are independently an integer of 0 to 5;

each of $R_{101}$ to $R_{108}$ and $R_{111}$ to $R_{119}$ are independently selected from one of:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group;

a $C_1$-$C_{10}$ alkyl group and a $C_1$-$C_{10}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group; and $R_{109}$ is selected from one of:

a phenyl group, a naphthyl group, an anthracenyl group, and a pyridinyl group; and a phenyl group, a naphthyl group, an anthracenyl group, and a pyridinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and $C_1$-$C_{20}$ alkoxy group.

13. The OLED of claim 1, wherein the hole transport material includes a compound represented by Formula 201A below:

<Formula 201A>

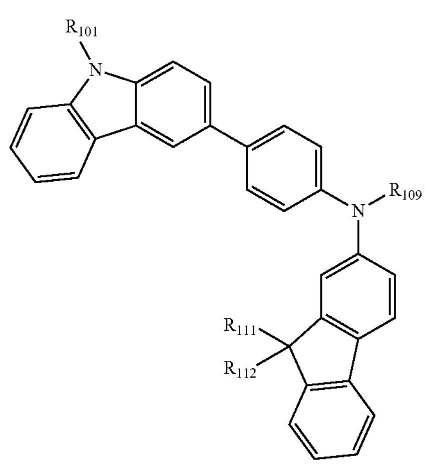

wherein in Formula 201A, each of $R_{101}$ $R_{111}$ and $R_{112}$ are independently selected from one of:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group;

a $C_1$-$C_{10}$ alkyl group and a $C_1$-$C_{10}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group; and $R_{109}$ is selected from one of:

a phenyl group, a naphthyl group, an anthracenyl group, and a pyridinyl group; and a phenyl group, a naphthyl group, an anthracenyl group, and a pyridinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and $C_1$-$C_{20}$ alkoxy group.

14. The OLED of claim 1, wherein the hole transport material includes at least one of Compounds HT1 to HT12 below:

HT1

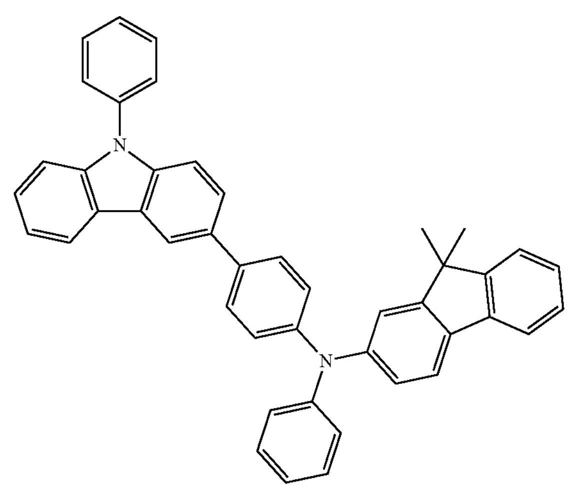 [SMILES: CC1(C)c2ccccc2-c2ccc(N(c3ccc(-c4ccc5c(c4)c4ccccc4n5-c4ccccc4)cc3)c3ccccn3)cc21]

HT2
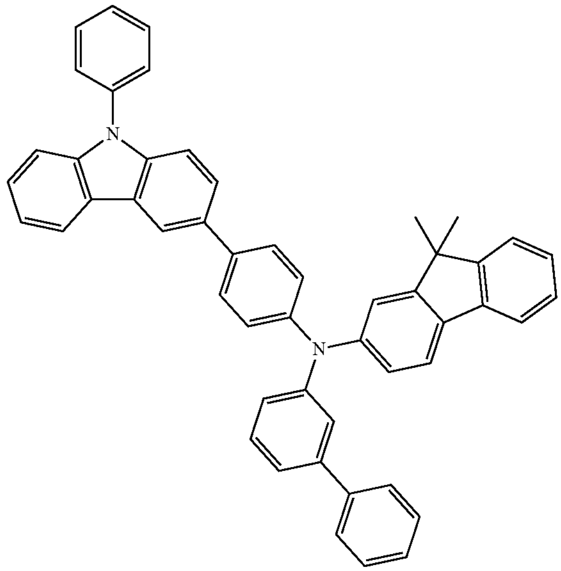
HT3
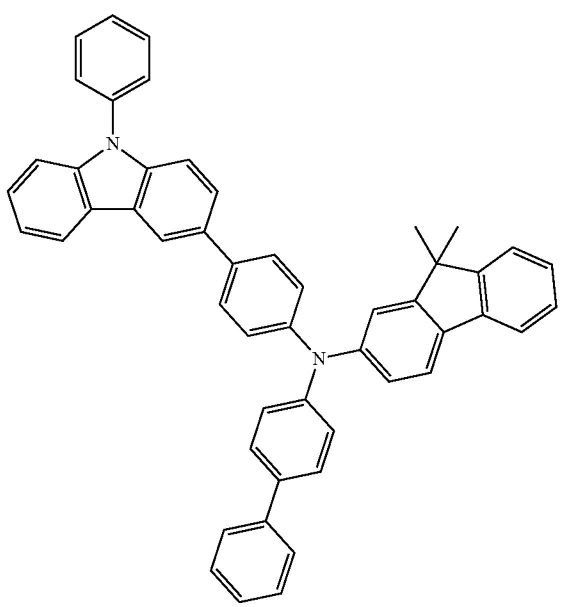
HT4
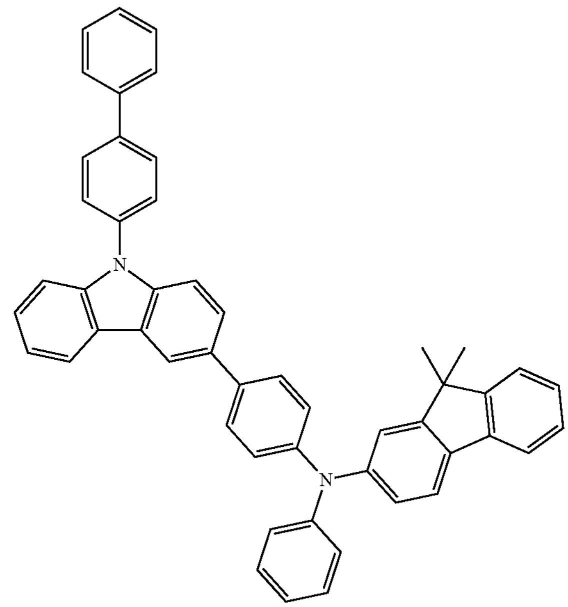
HT5
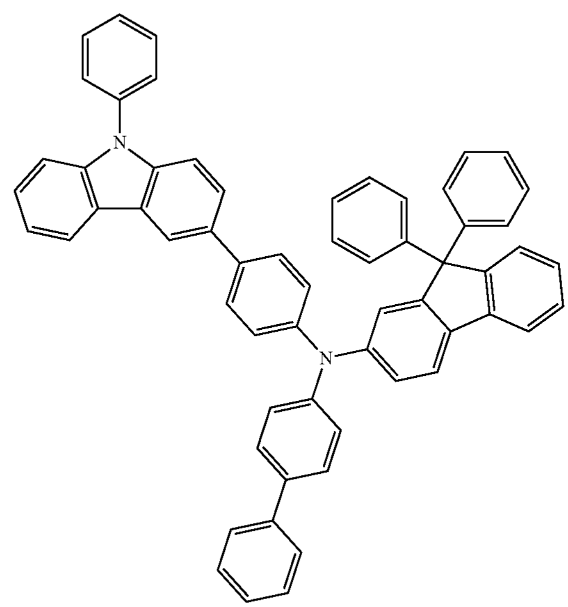

-continued
HT6
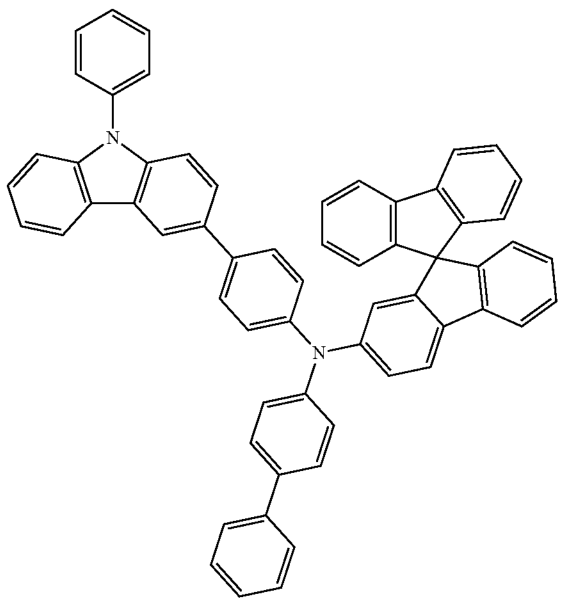
HT7
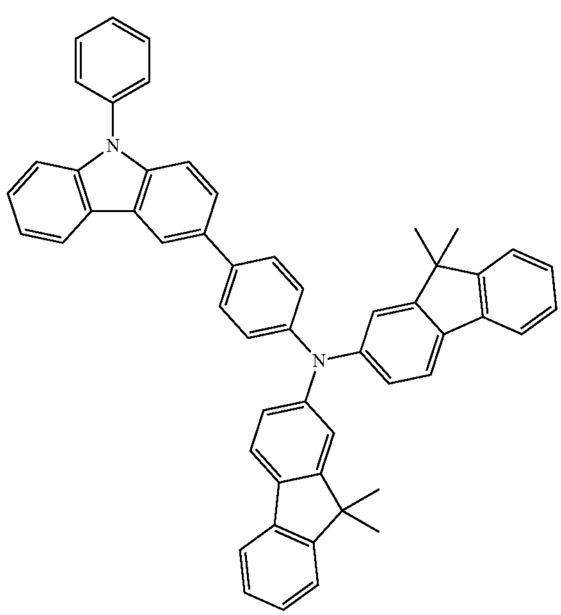
-continued
HT8
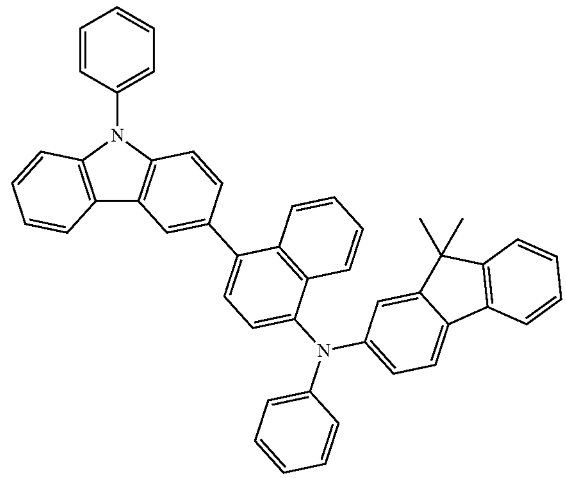
HT9
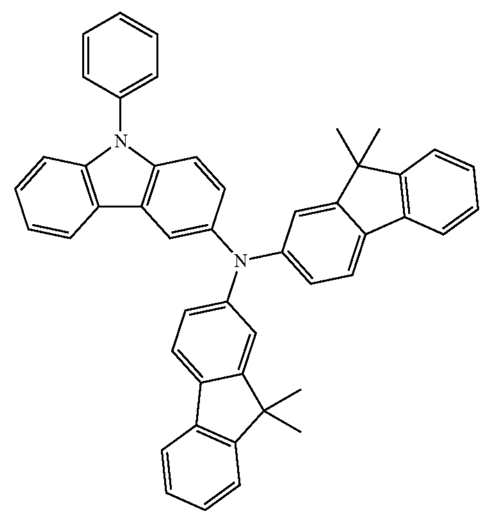
HT10
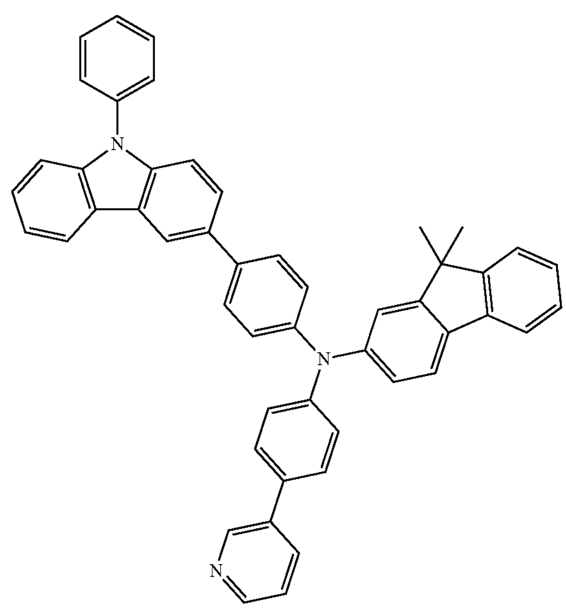

-continued
HT11
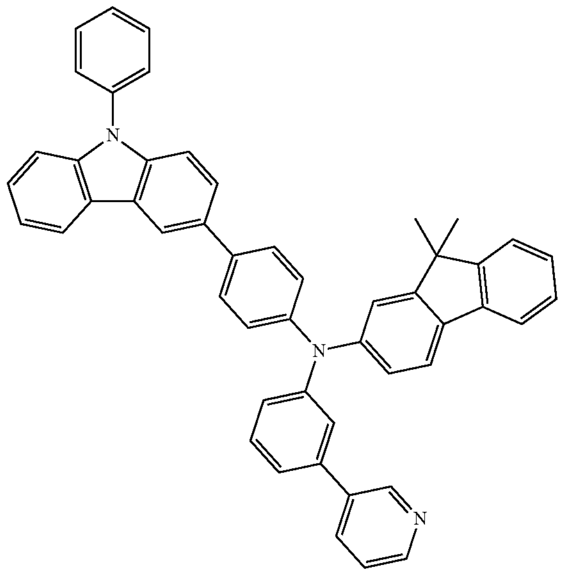
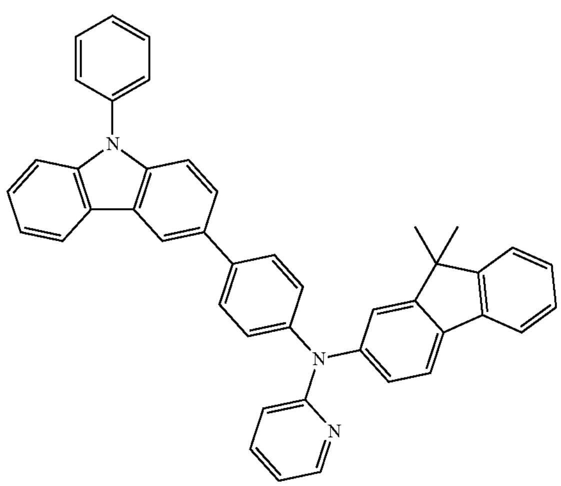
15. The OLED of claim 1, wherein the electron transport material includes at least one of Compounds ET11 to ET16 below:
<Compound ET11>
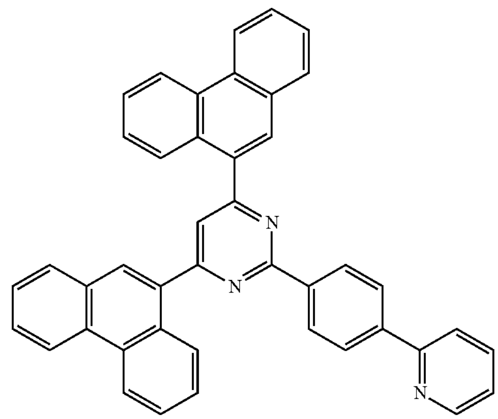
<Compound ET12>
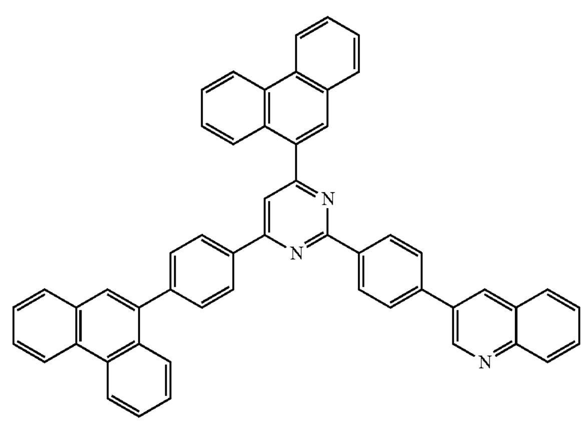

-continued
<Compound ET13>
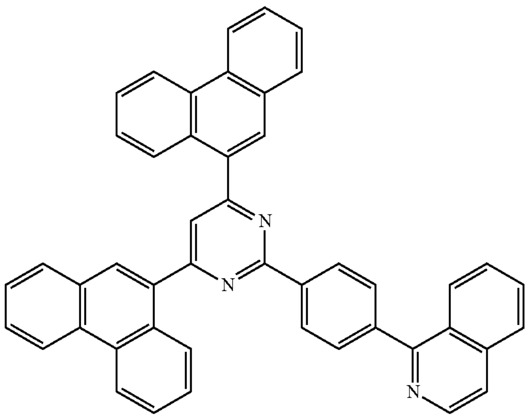
<Compound ET14>
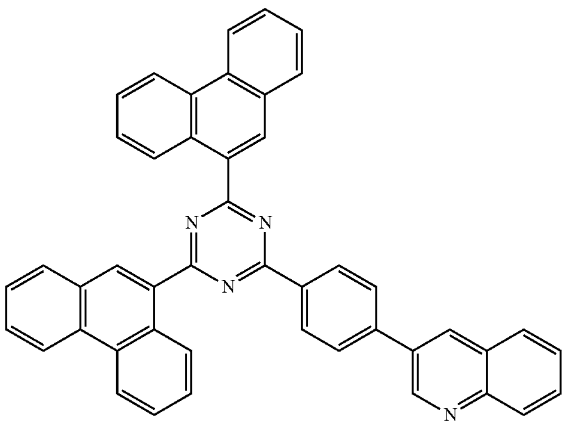
-continued
<Compound ET15>
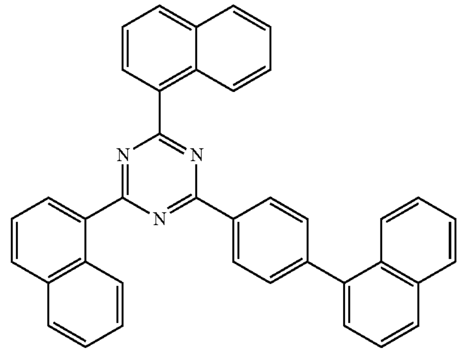
<Compound ET16>
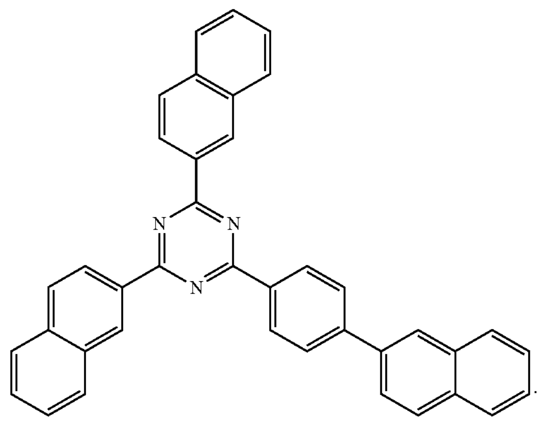
* * * * *